United States Patent
Yu et al.

(10) Patent No.: US 11,709,435 B2
(45) Date of Patent: *Jul. 25, 2023

(54) METHOD OF MANUFACTURING A SEMICONDUCTOR DEVICE AND APPARATUS FOR MANUFACTURING THE SEMICONDUCTOR DEVICE

(71) Applicant: TAIWAN SEMICONDUCTOR MANUFACTURING COMPANY, LTD., Hsinchu (TW)

(72) Inventors: Shinn-Sheng Yu, Hsinchu (TW); Ru-Gun Liu, Zhubei (TW); Hsu-Ting Huang, Hsinchu (TW); Kenji Yamazoe, Campbell, CA (US); Minfeng Chen, Hsinchu (TW); Shuo-Yen Chou, Hualien County (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/733,664

(22) Filed: Apr. 29, 2022

(65) Prior Publication Data

US 2022/0260931 A1    Aug. 18, 2022

Related U.S. Application Data

(60) Continuation of application No. 17/121,542, filed on Dec. 14, 2020, now Pat. No. 11,320,747, which is a
(Continued)

(51) Int. Cl.
*G03F 7/20* (2006.01)
*G03F 7/00* (2006.01)

(52) U.S. Cl.
CPC ........ *G03F 7/70641* (2013.01); *G03F 7/2004* (2013.01); *G03F 7/2022* (2013.01); *G03F 7/70558* (2013.01)

(58) Field of Classification Search
CPC .. G03F 7/70641; G03F 7/2004; G03F 7/2022; G03F 7/70558
See application file for complete search history.

(56) References Cited

U.S. PATENT DOCUMENTS 5,699,260 A    12/1997 Lucas et al.
5,777,744 A    7/1998 Yoshii et al.
(Continued)

OTHER PUBLICATIONS

Notice of Allowance issued in U.S. Appl. No. 16/525,510, dated Aug. 12, 2020.
(Continued)

*Primary Examiner* — Hung V Nguyen
(74) *Attorney, Agent, or Firm* — McDermott Will & Emery LLP

(57) ABSTRACT

A method of manufacturing a semiconductor device includes dividing a number of dies along an x axis in a die matrix in each exposure field in an exposure field matrix delineated on the semiconductor substrate, wherein the x axis is parallel to one edge of a smallest rectangle enclosing the exposure field matrix. A number of dies is divided along a y axis in the die matrix, wherein the y axis is perpendicular to the x axis. Sequences SNx0, SNx1, SNx, SNxr, SNy0, SNy1, SNy, and SNyr are formed. p*(Nbx+1)−2 stepping operations are performed in a third direction and first sequence exposure/stepping/exposure operations and second sequence exposure/stepping/exposure operations are performed alternately between any two adjacent stepping operations as well as before a first stepping operation and after a last stepping operation. A distance of each stepping operation in order follows the sequence SNx.

20 Claims, 110 Drawing Sheets

Related U.S. Application Data division of application No. 16/525,510, filed on Jul. 29, 2019, now Pat. No. 10,866,525.

(60) Provisional application No. 62/712,953, filed on Jul. 31, 2018.

(56) References Cited

U.S. PATENT DOCUMENTS

| | | | |
|---|---|---|---|
| 9,075,313 | B2 | 7/2015 | Yu et al. |
| 9,488,905 | B2 | 11/2016 | Lu et al. |
| 11,320,747 | B2 * | 5/2022 | Yu ................ G03F 7/70641 |
| 2003/0147059 | A1 | 8/2003 | Tokuda et al. |
| 2006/0146310 | A1 | 7/2006 | De Kruif et al. |
| 2008/0138719 | A1 | 6/2008 | Park |
| 2011/0059402 | A1 | 3/2011 | Azuma et al. |
| 2019/0206734 | A1 | 7/2019 | Sekiya |

OTHER PUBLICATIONS

Non-Final Office Action issued in U.S. Appl. No. 17/121,542 dated Aug. 16, 2021.

Notice of Allowance issued in U.S. Appl. No. 17/121,542 dated Jan. 3, 2022.

* cited by examiner

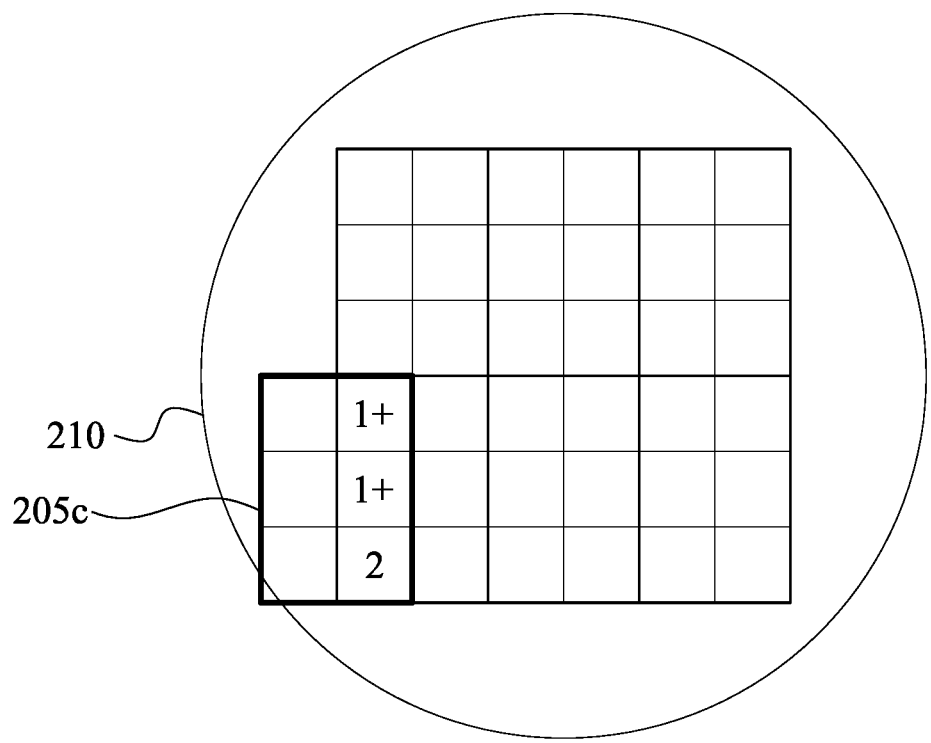
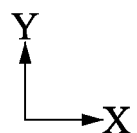
Fig. 16

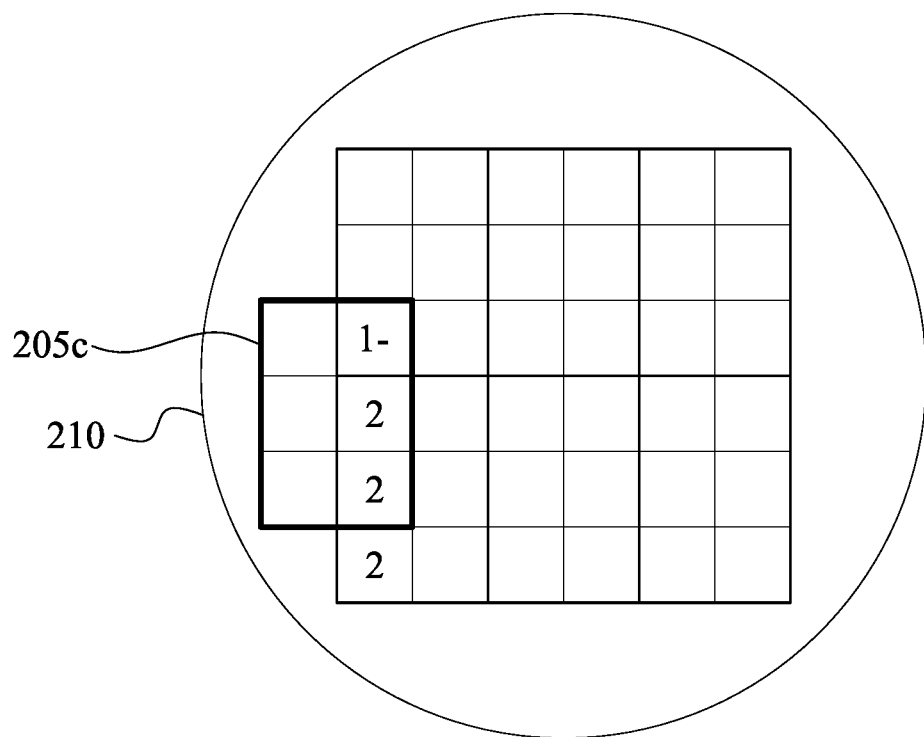
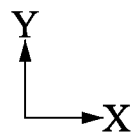
Fig. 17

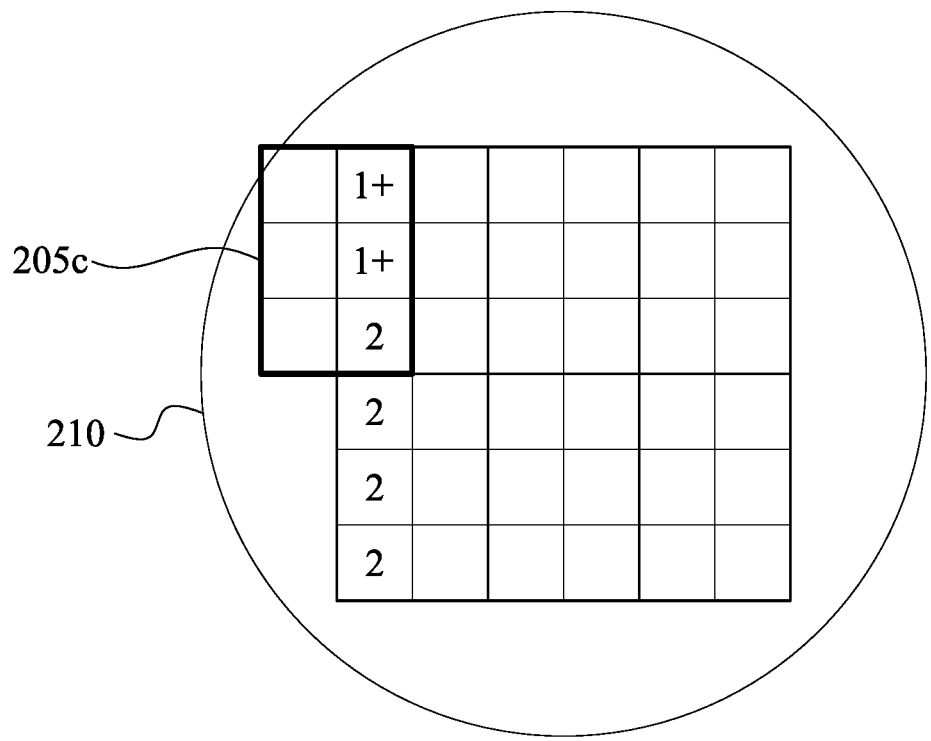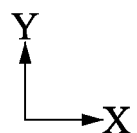
Fig. 18

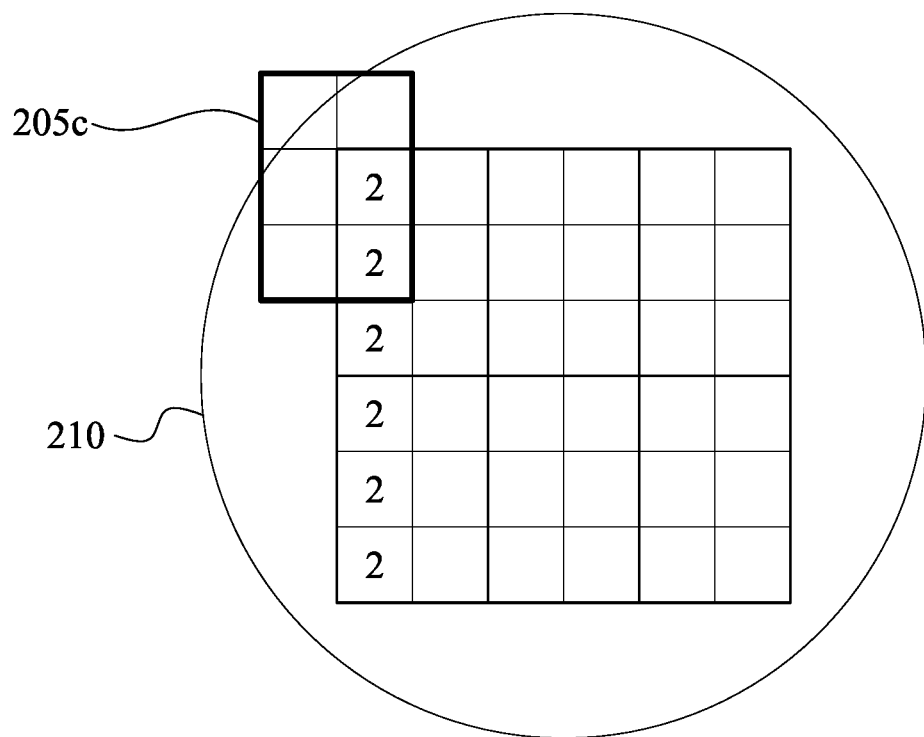
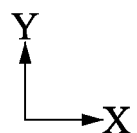
Fig. 19

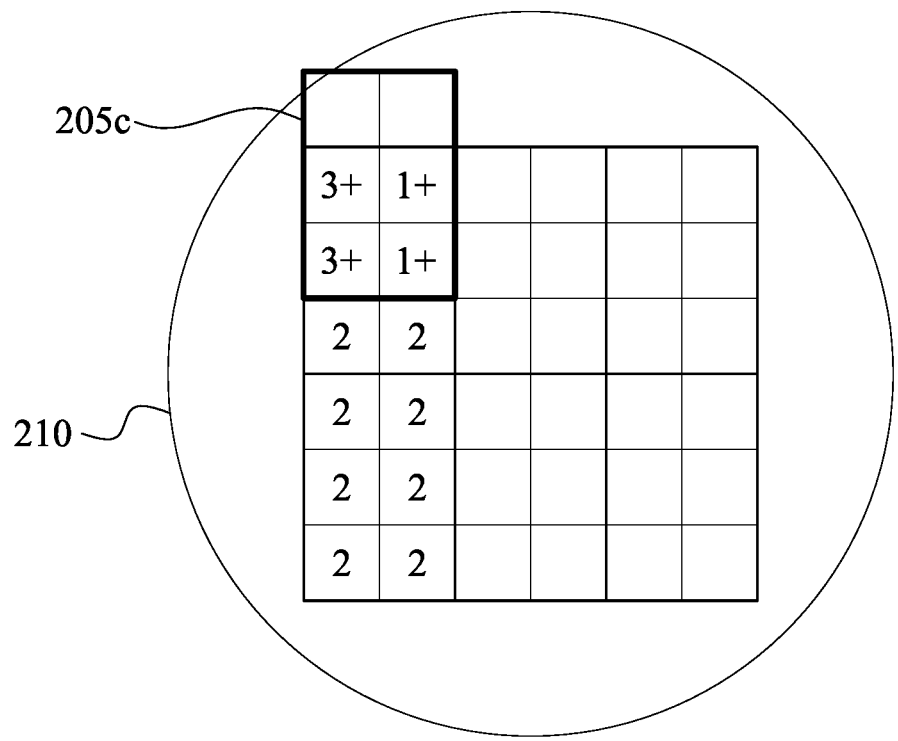
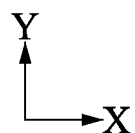
Fig. 20

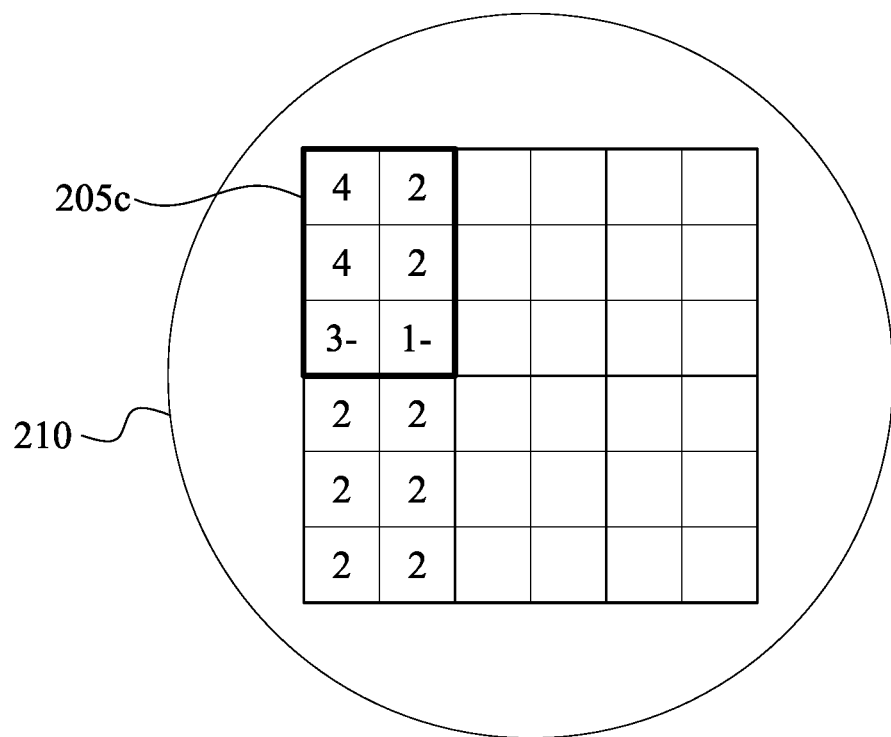
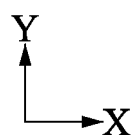
Fig. 21

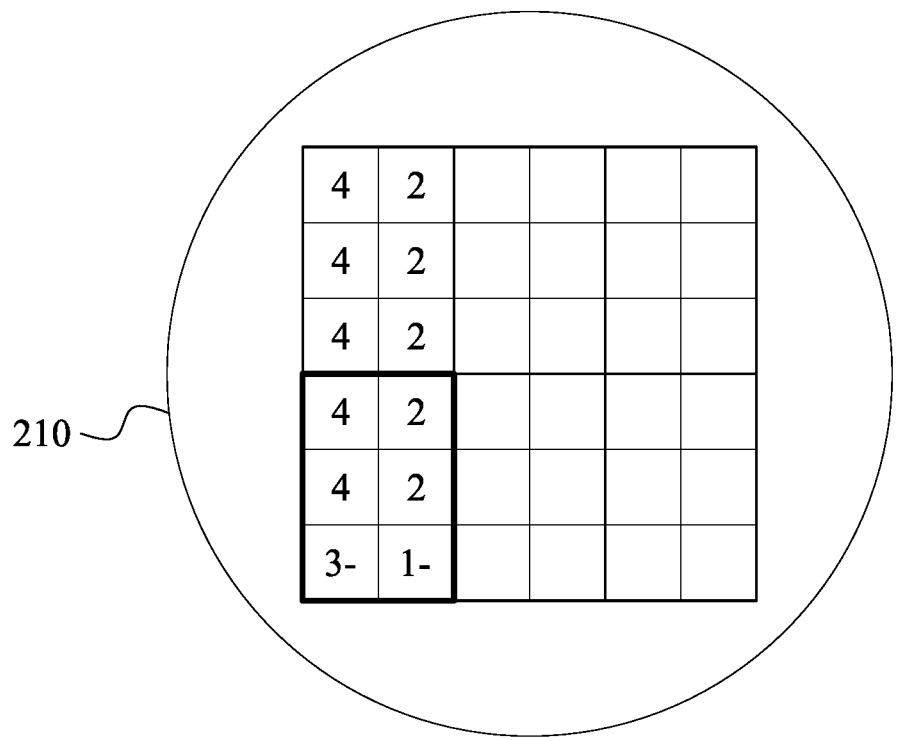
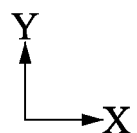
Fig. 23

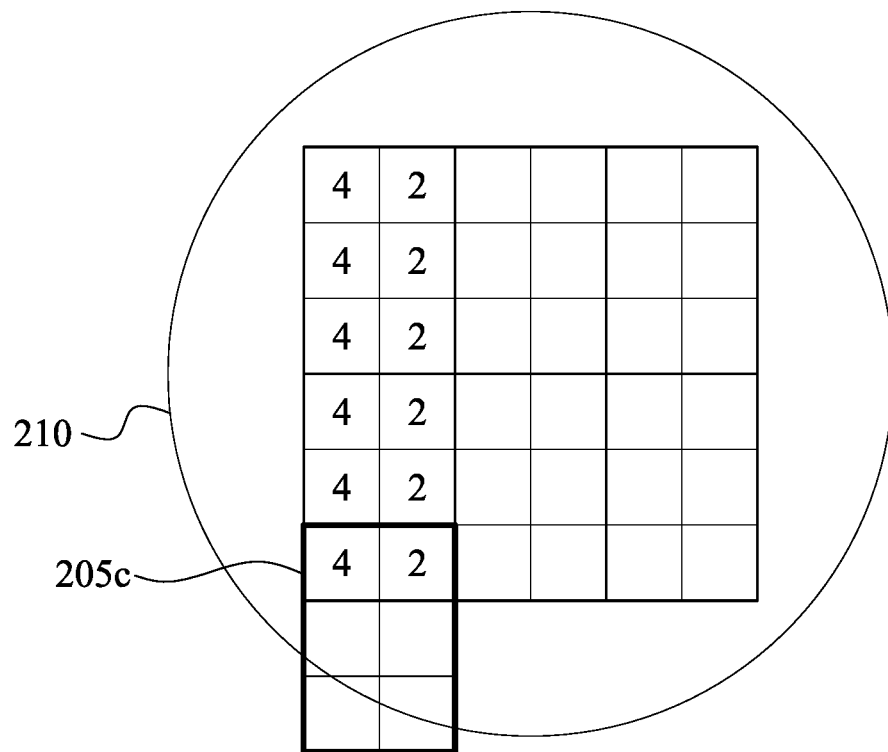
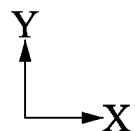
Fig. 24

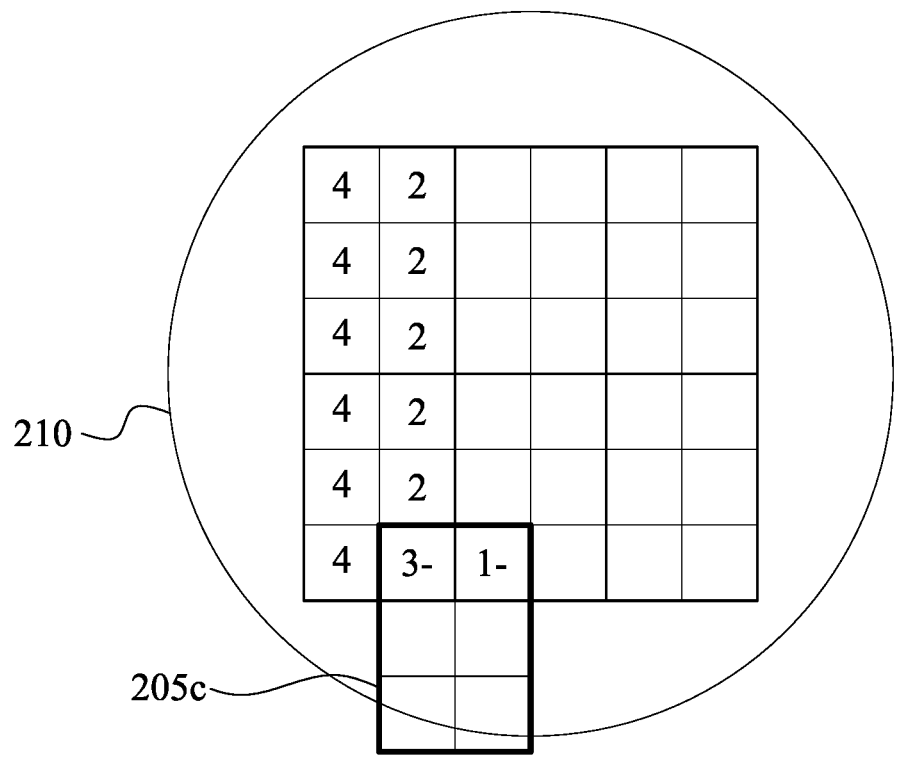
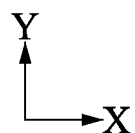
Fig. 25

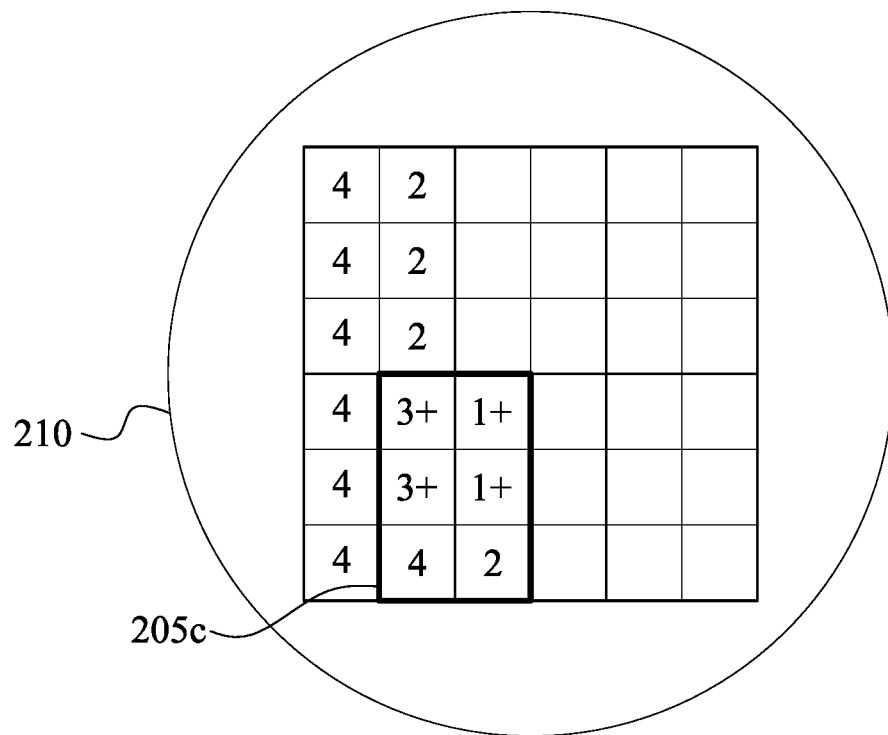
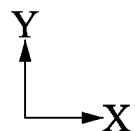
Fig. 26

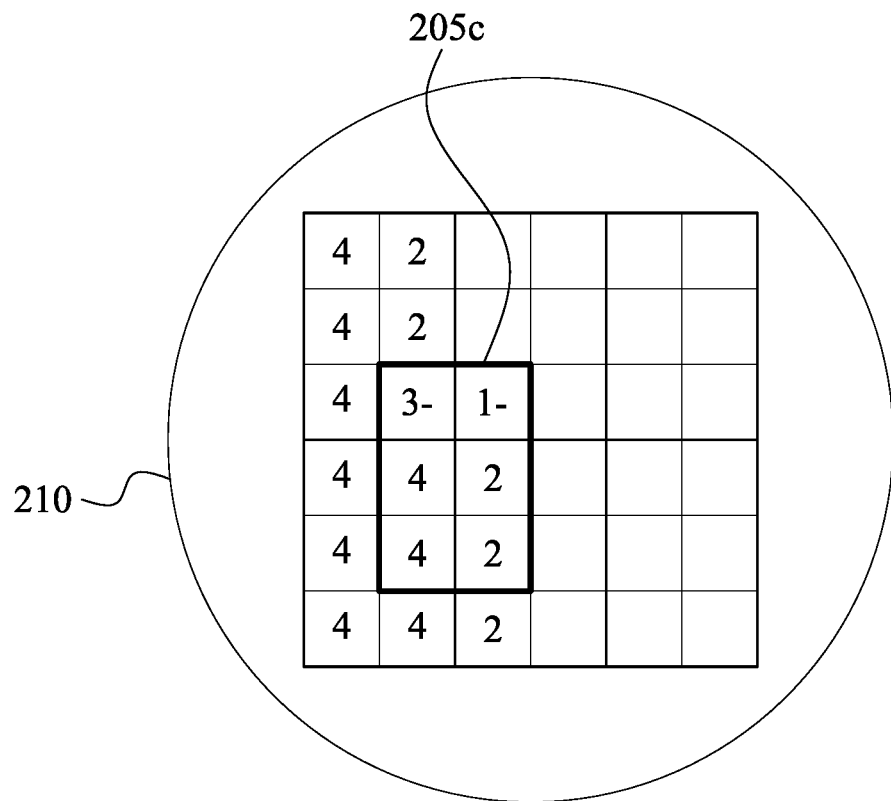
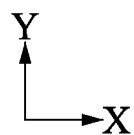
Fig. 27

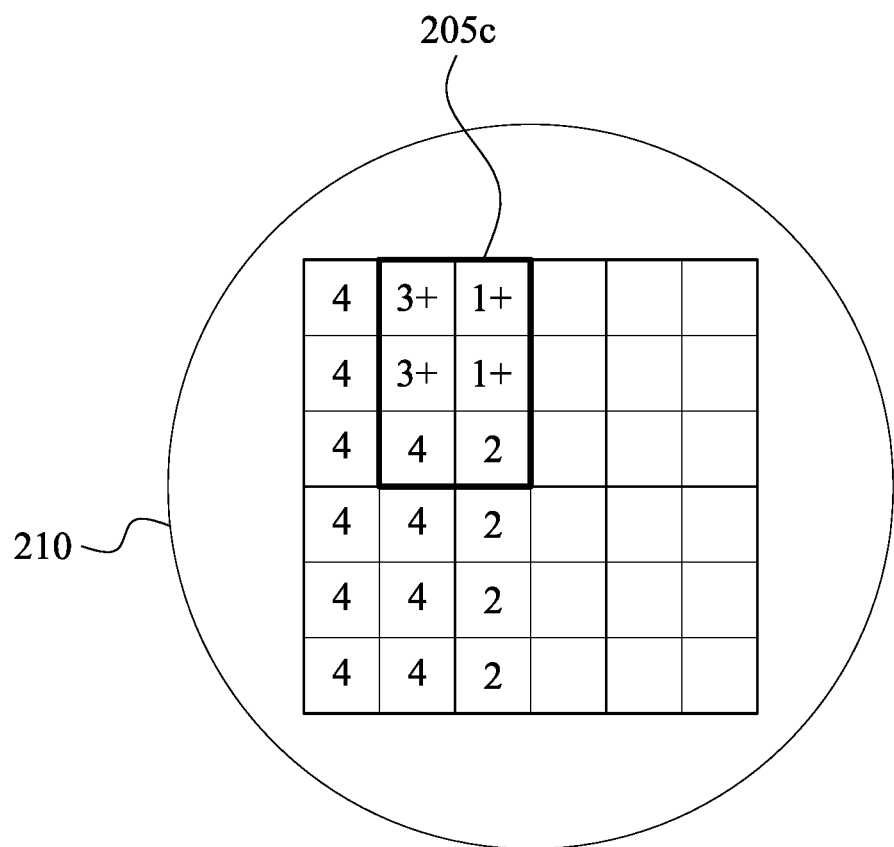
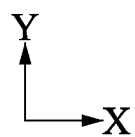
Fig. 28

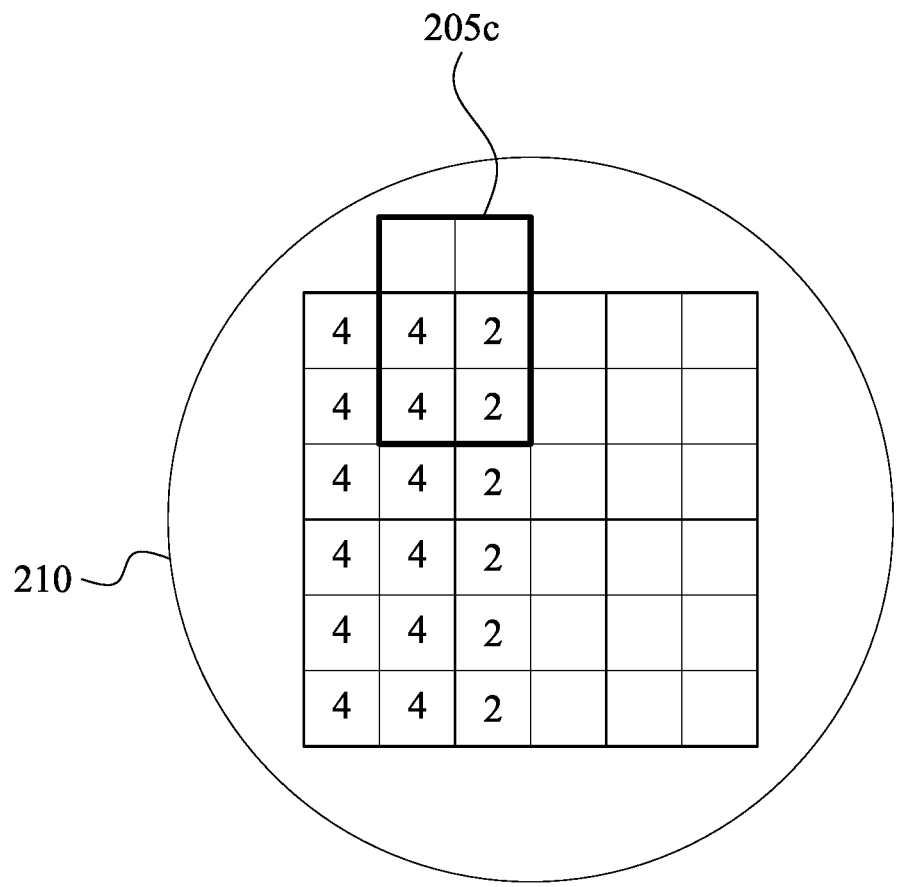
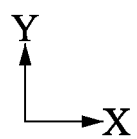
Fig. 29

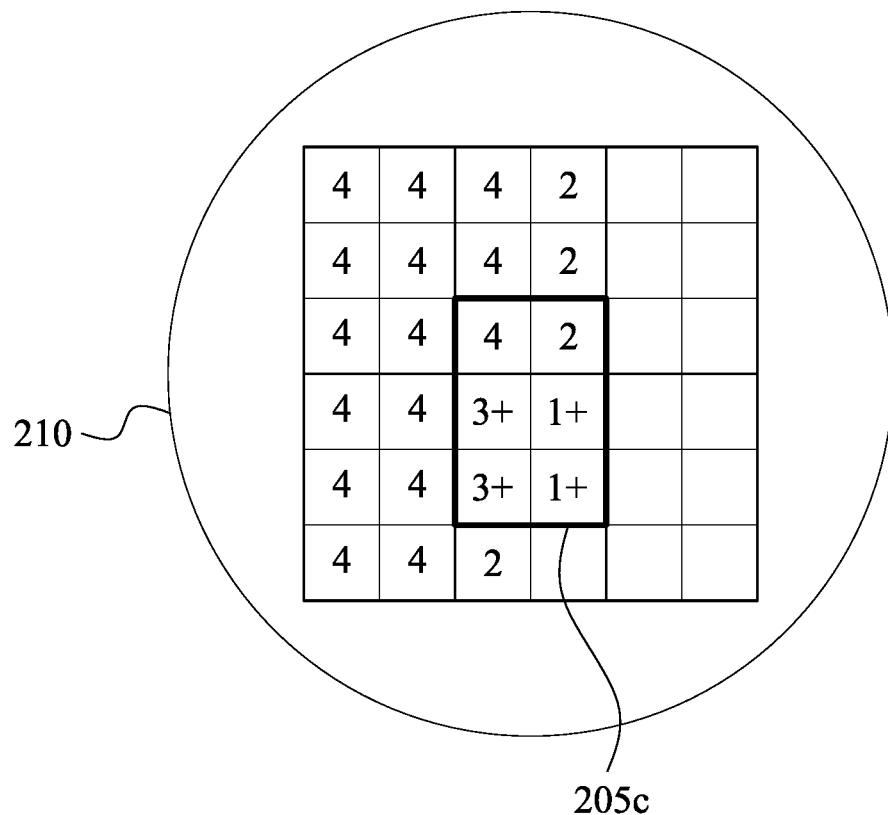
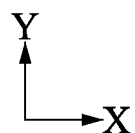
Fig. 32

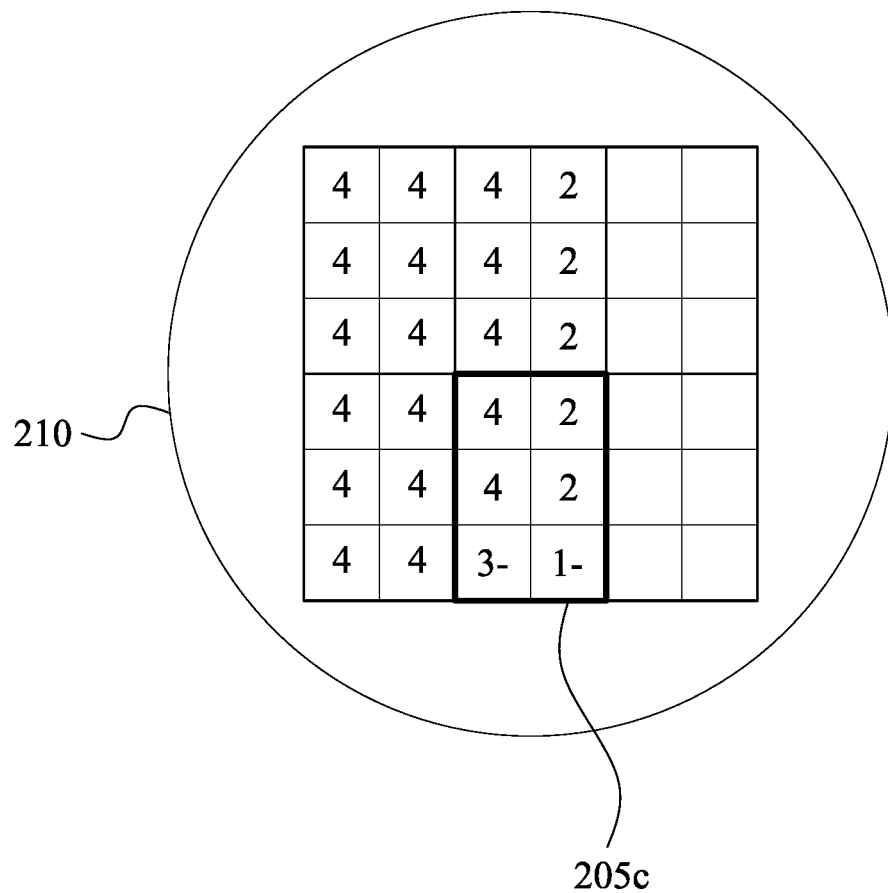
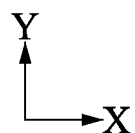
Fig. 33

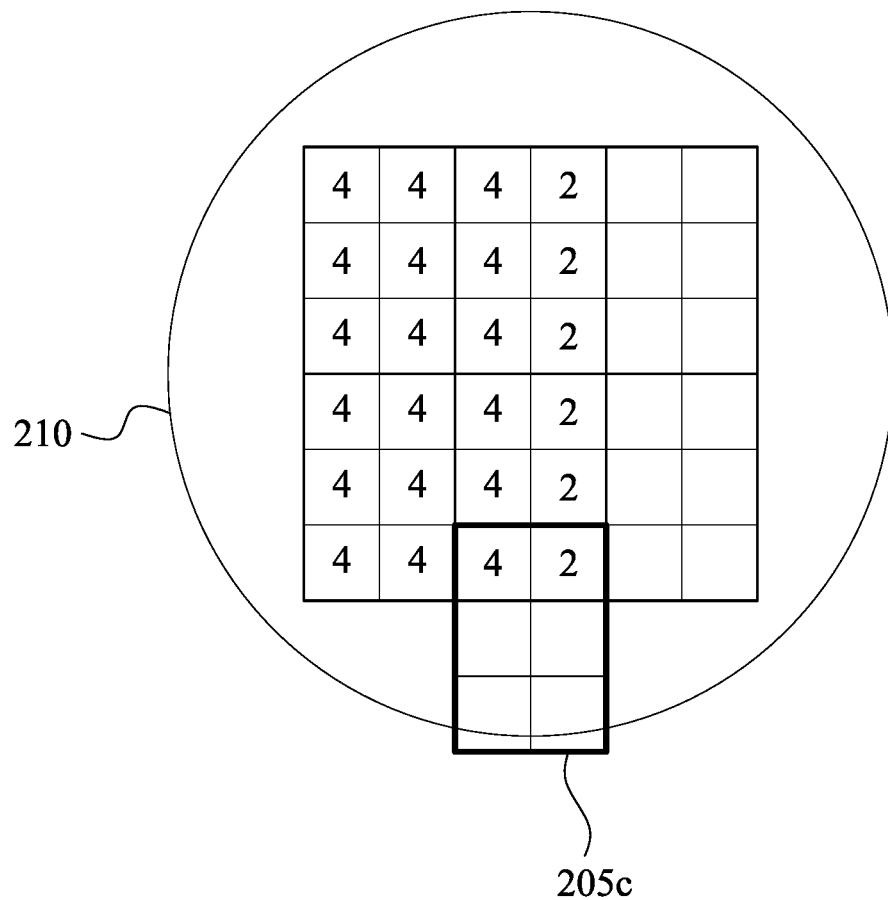
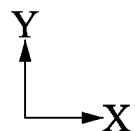
Fig. 34

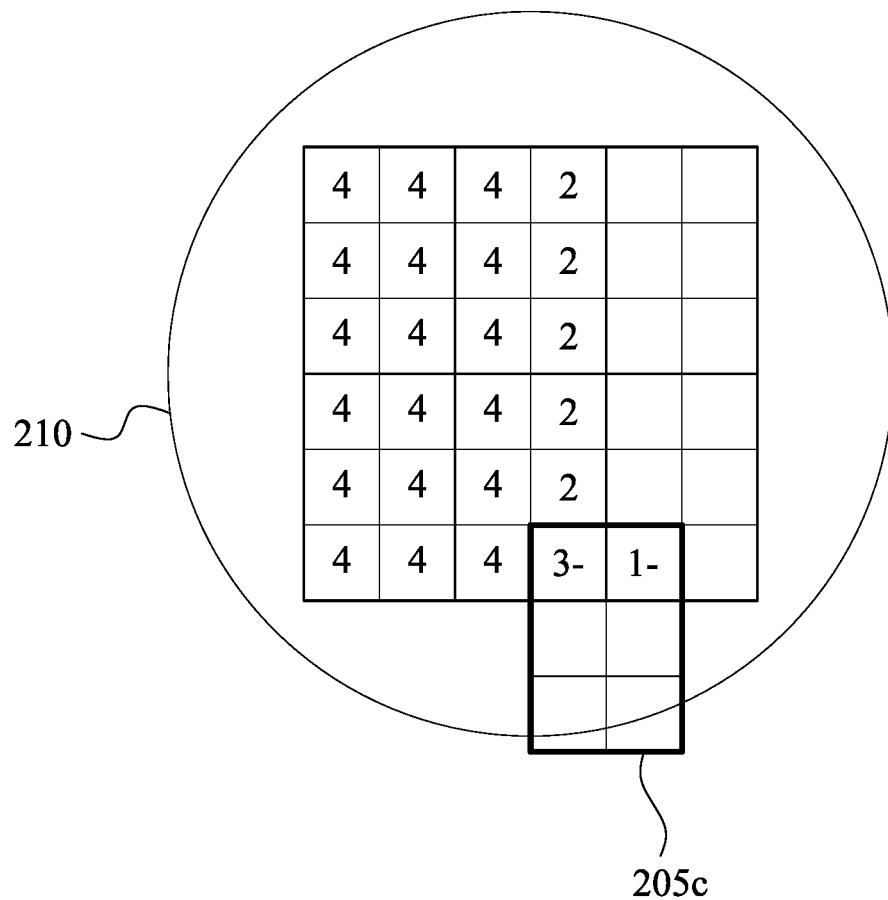
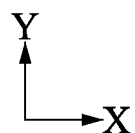
Fig. 35

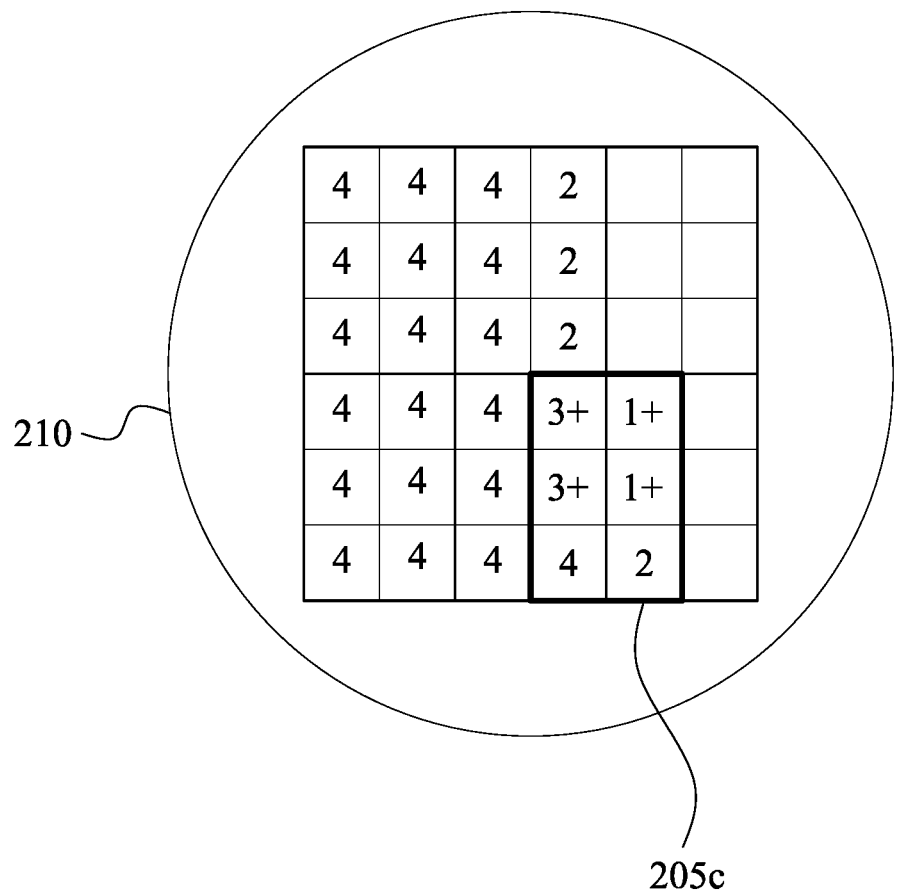
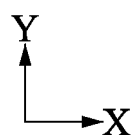
Fig. 36

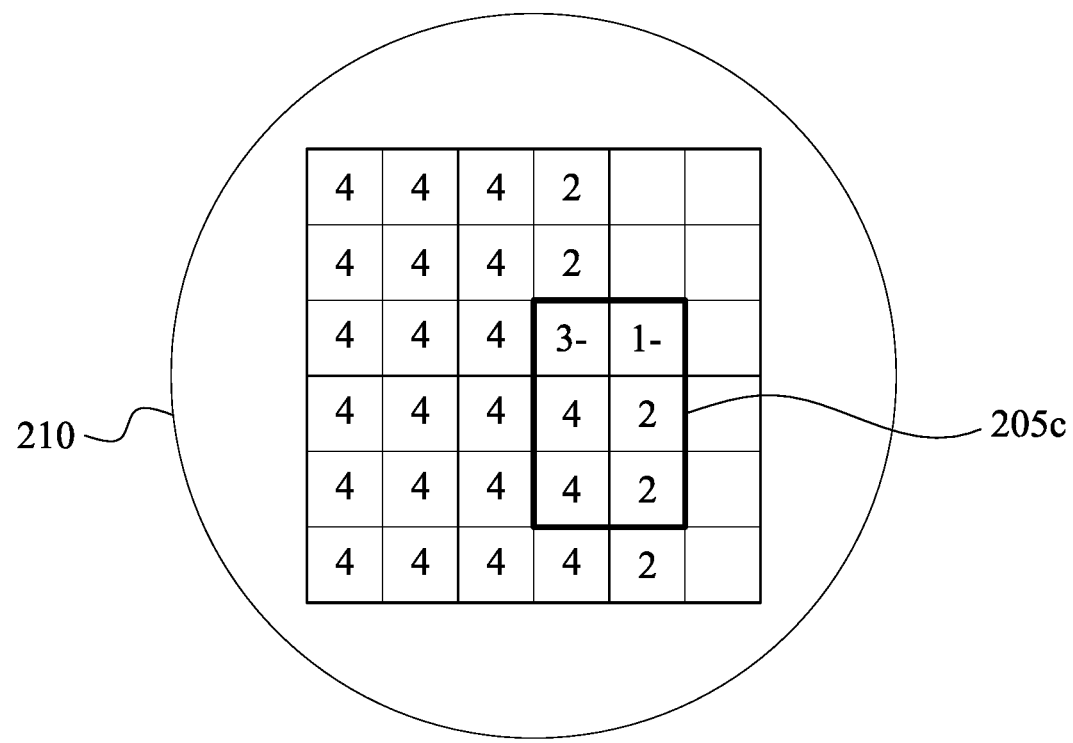
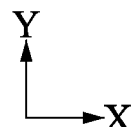
Fig. 37

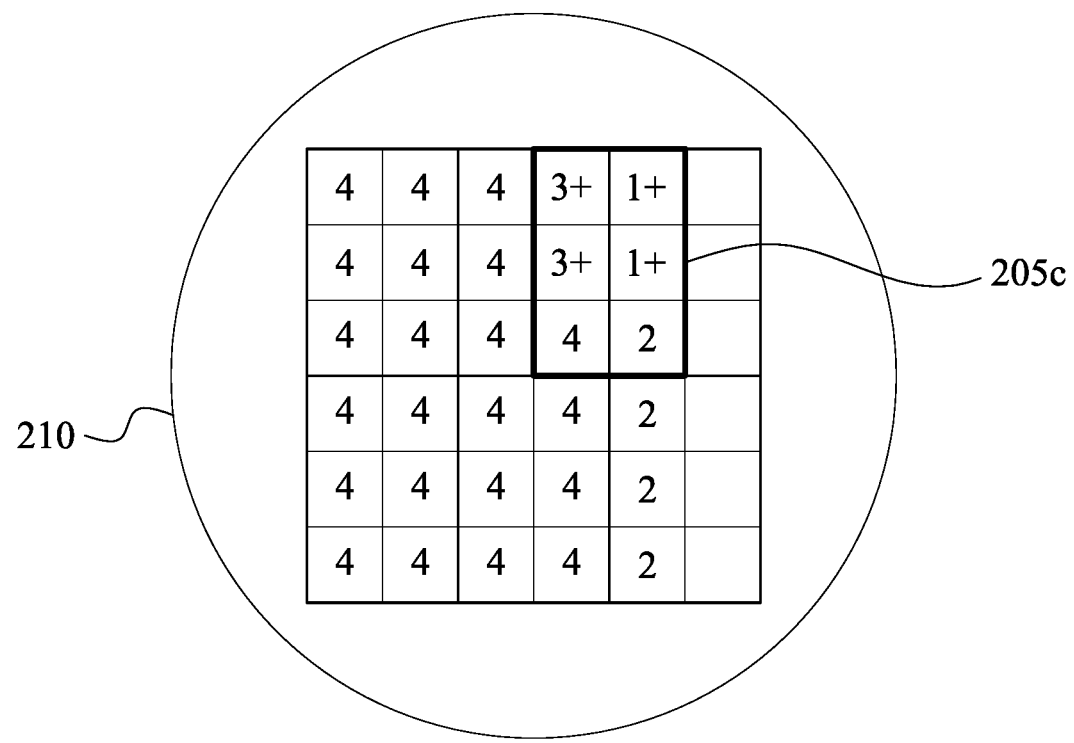
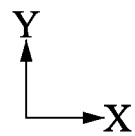
Fig. 38

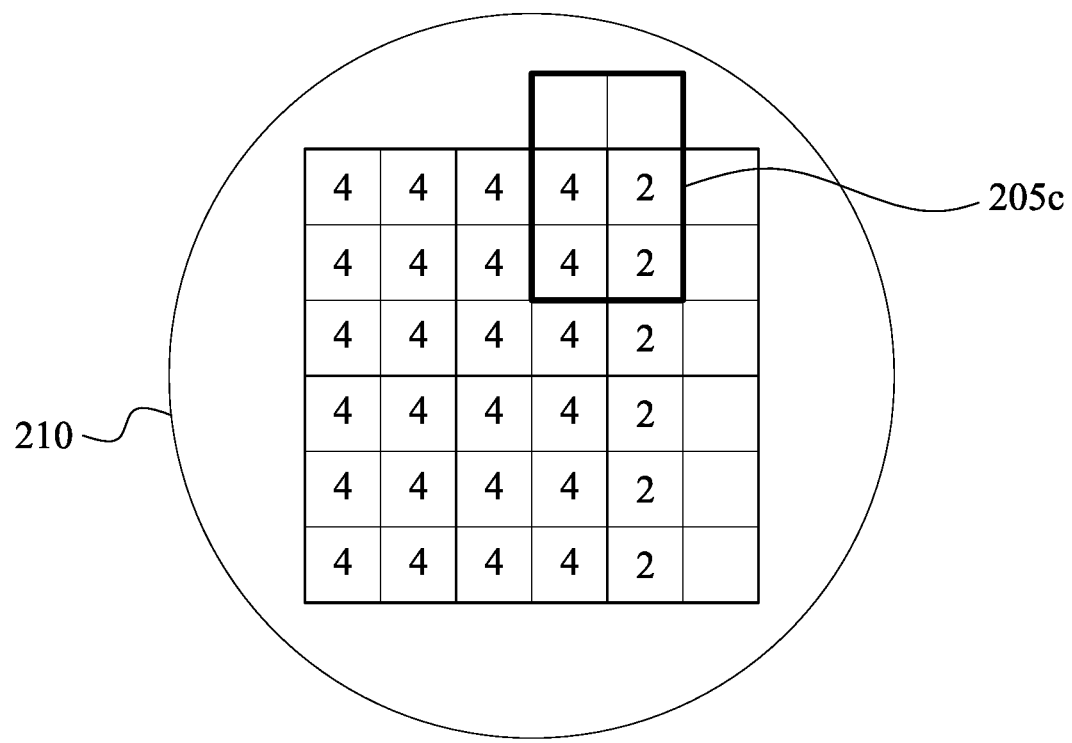
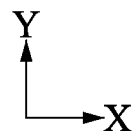
Fig. 39

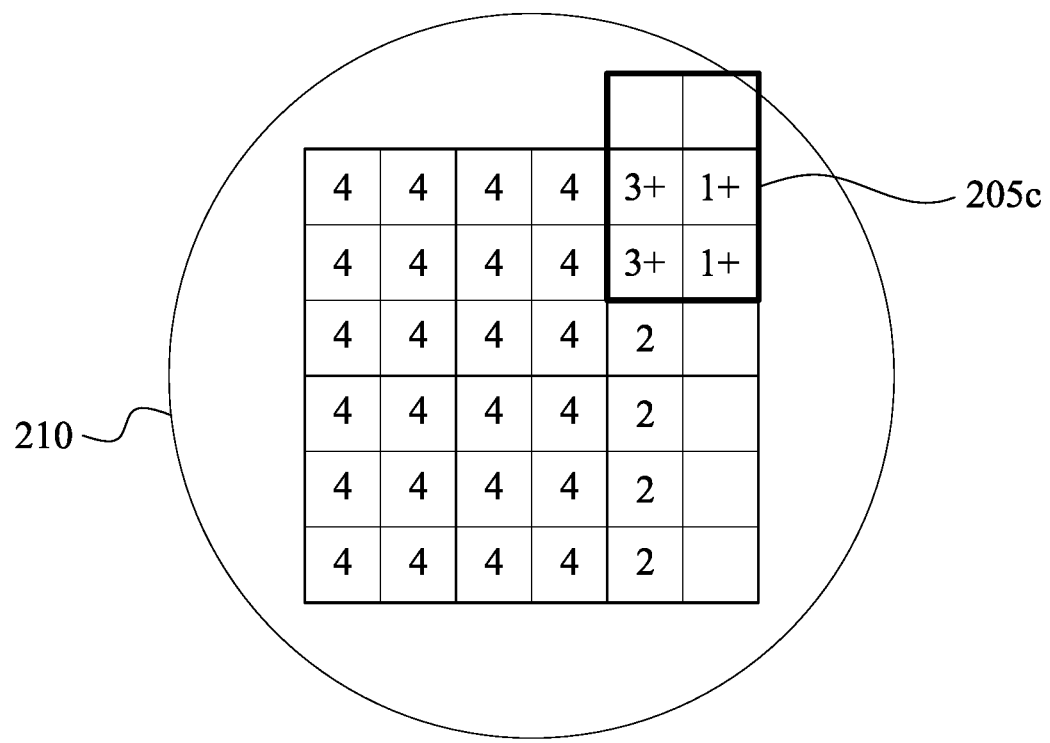
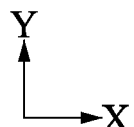
Fig. 40

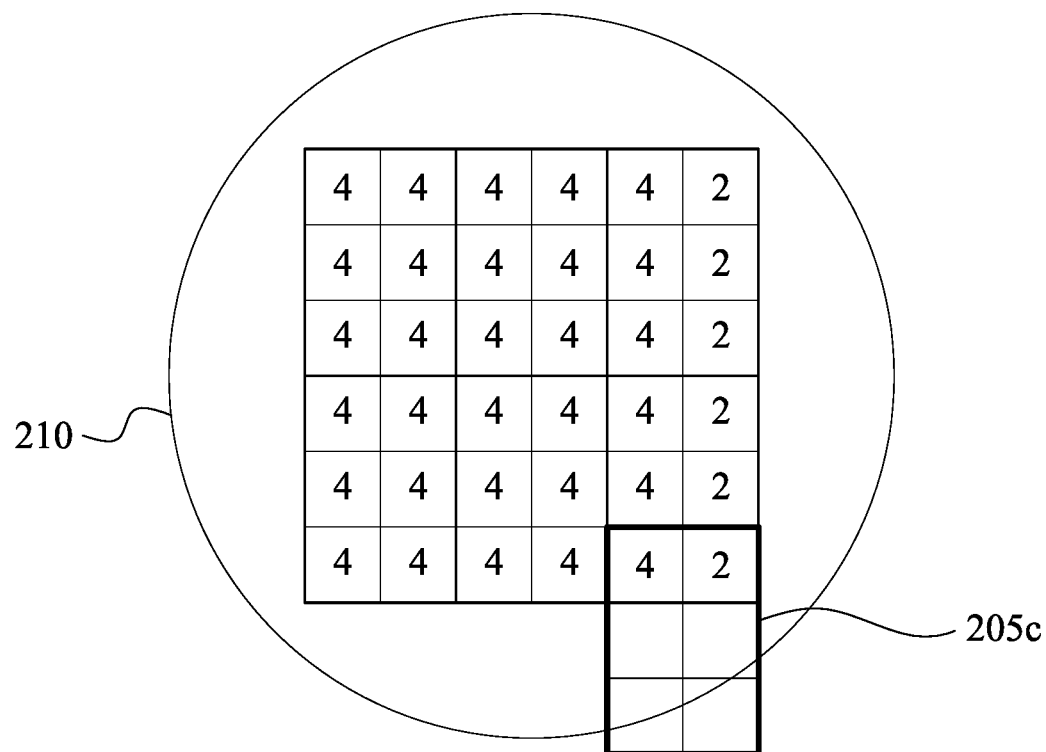
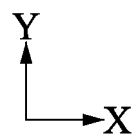
Fig. 44

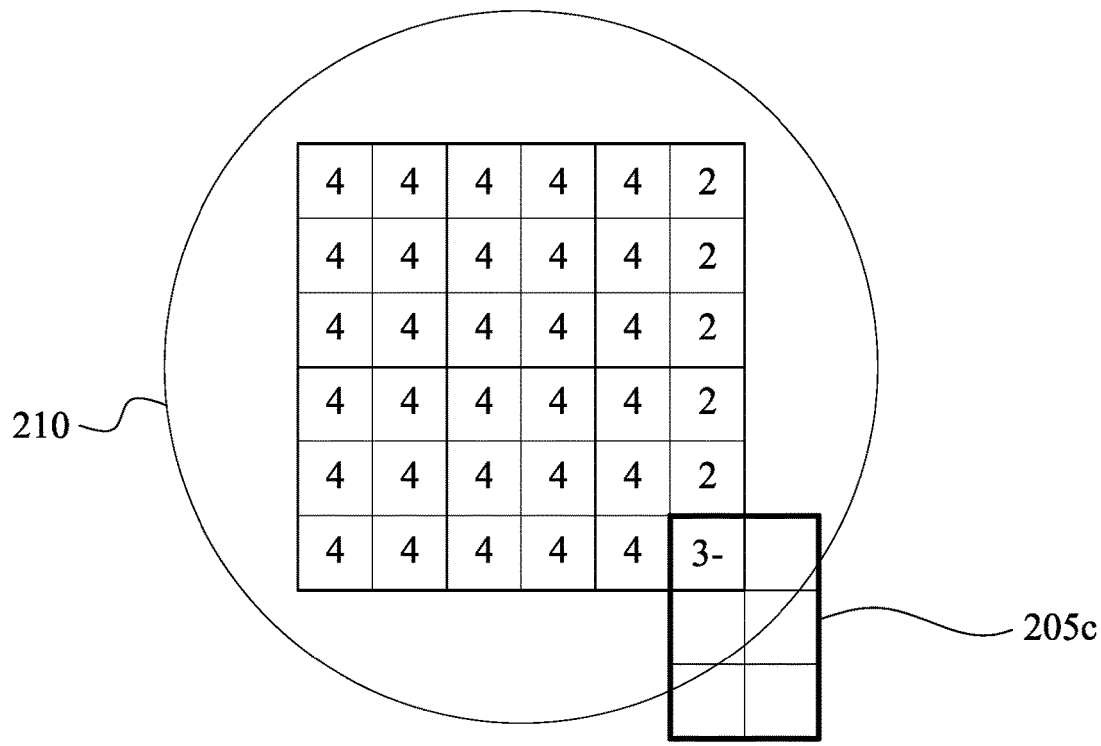
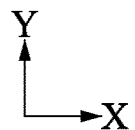
Fig. 45

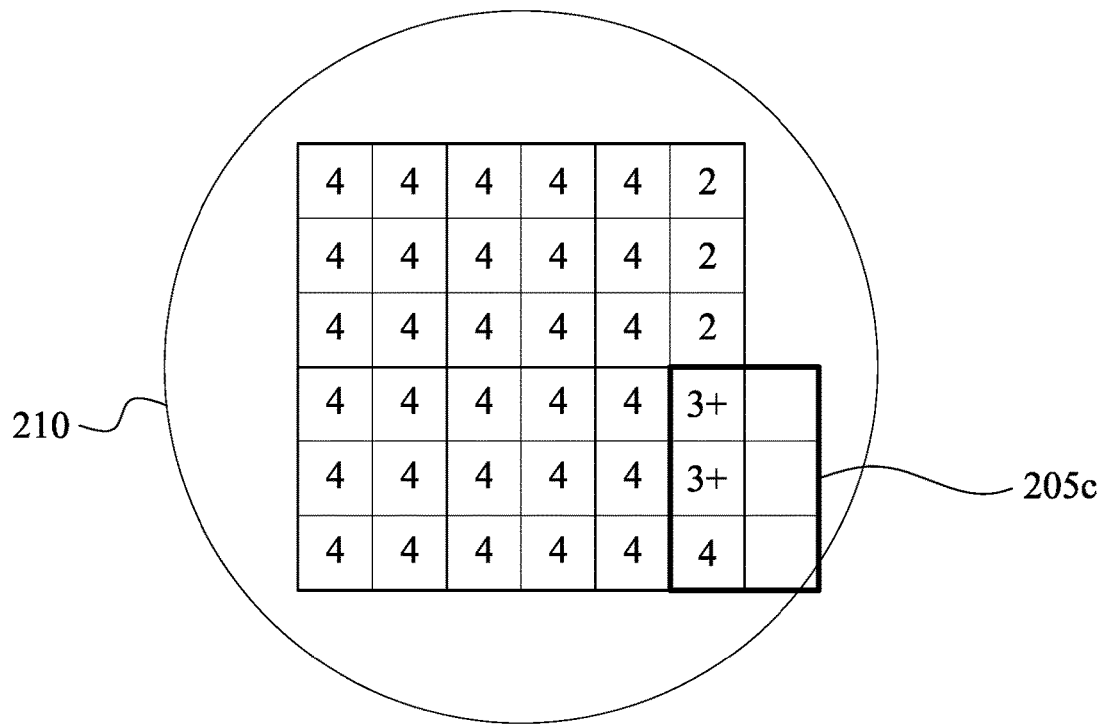
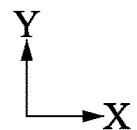
Fig. 46

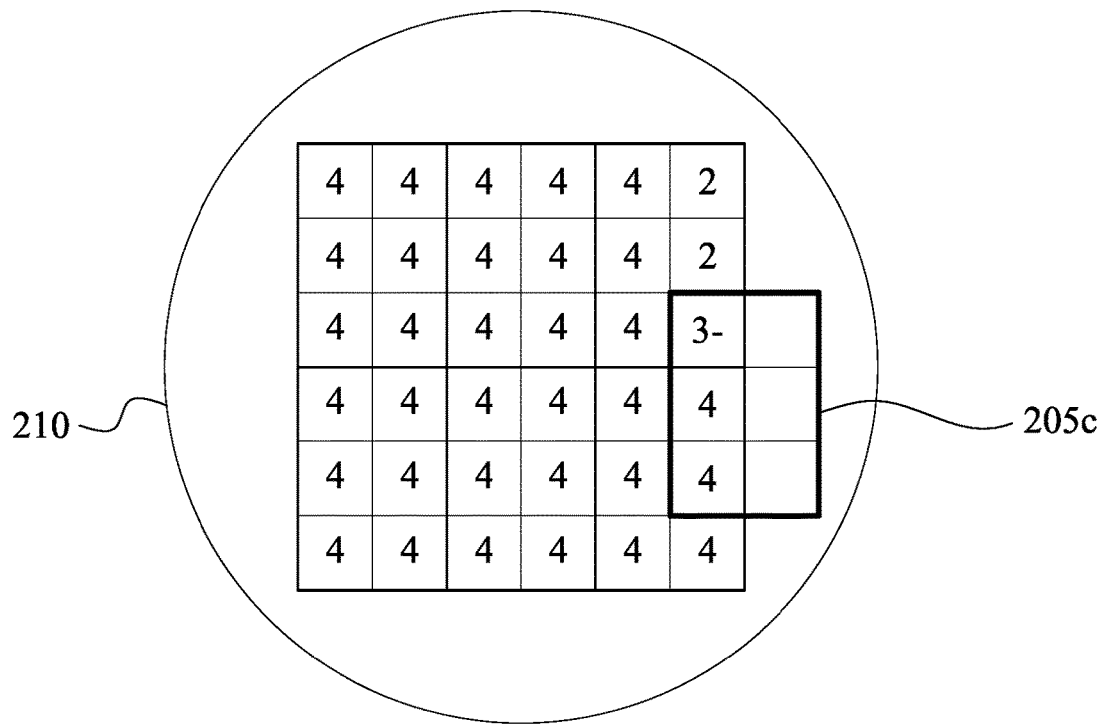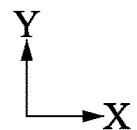
Fig. 47

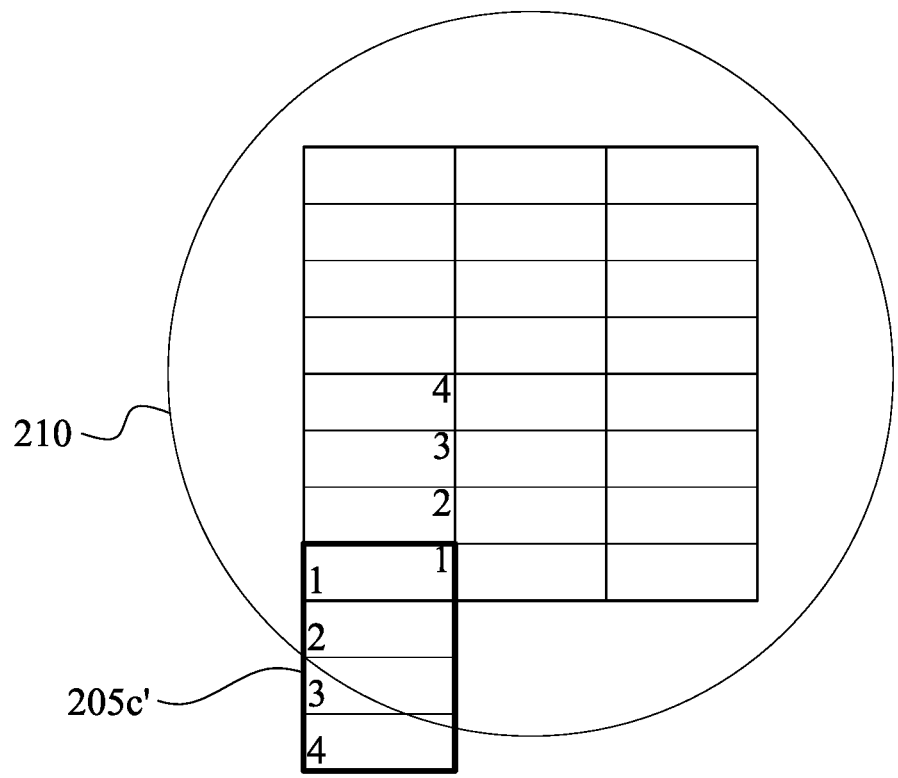
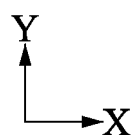
Fig. 50

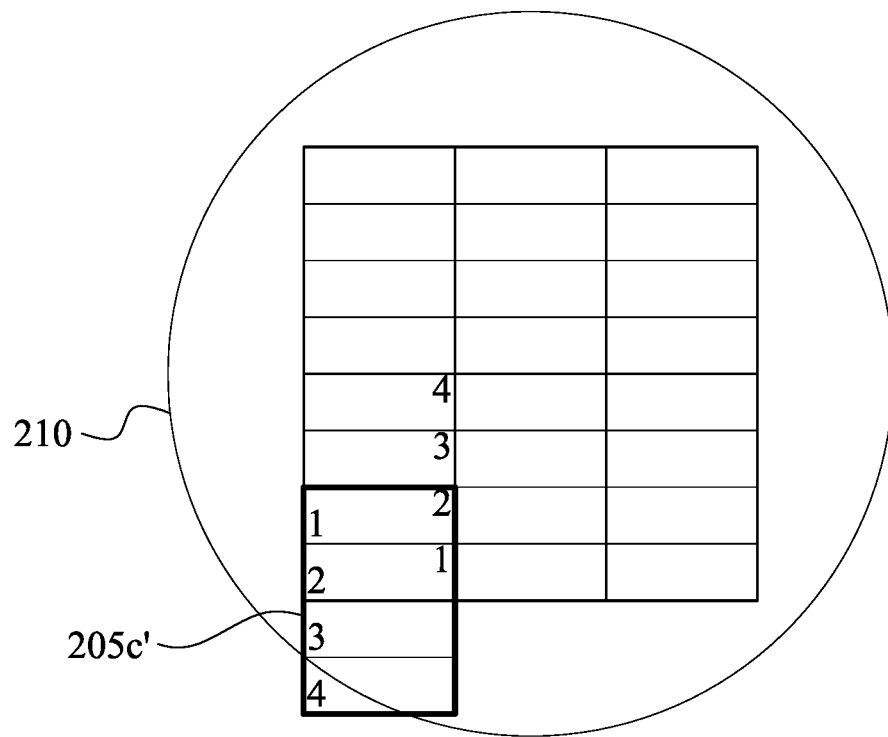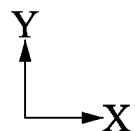
Fig. 51

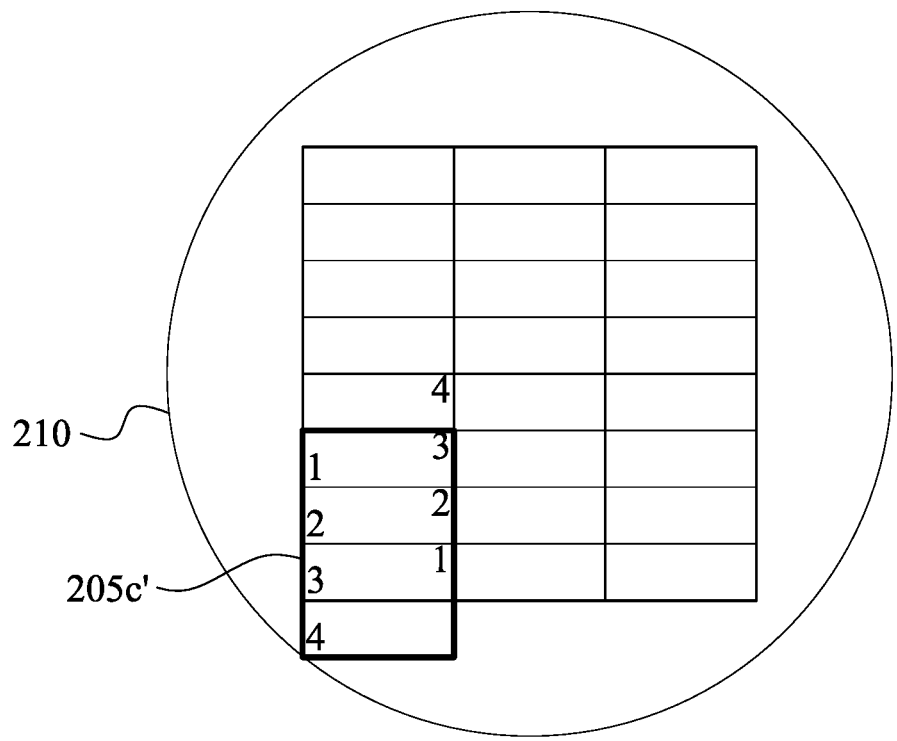
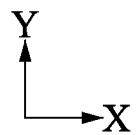
Fig. 52

F-
E*

F+
E*

F+
E2

F-E5

F+
E6

F-E7

F+
E8

F-E9

F+
E*

F-
E*

F-
Ec

F-
Ee

F-
Eg

F+
Eh

F-
Ei

F+
Ej

F+
El

F-
Em

F+
En

F+
Ep

F-Eq

F+
Er

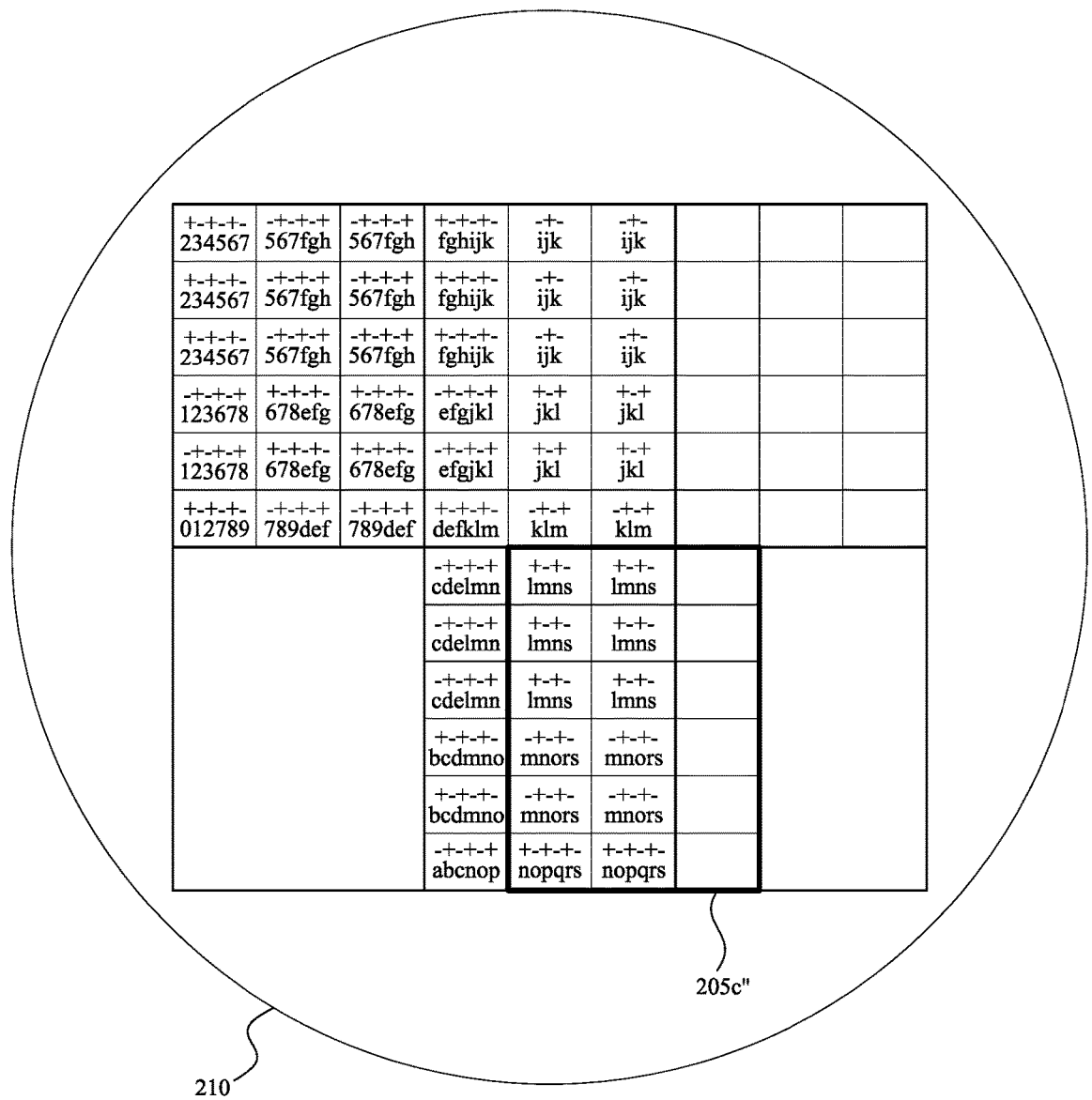
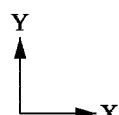
Fig. 89

F+
Et

F+
Ev

F-Ew

F+
Ex

F-
Ey

F+
Ez

F-
Eα

F+
Eβ

F+
E*

F-
E*

F+
E*

F-
E*

F+
E*

F-
E*

| | | | | | | | | |
|---|---|---|---|---|---|---|---|---|
| +-+-+- 234567 | -+-+-+ 567fgh | -+-+-+ 567fgh | +-+-+- fghijk | -+-+-+ ijkvwx | -+-+-+ ijkvwx | +-+-+- vwxyzα | -+- yzα | -+- yzα |
| +-+-+- 234567 | -+-+-+ 567fgh | -+-+-+ 567fgh | +-+-+- fghijk | -+-+-+ ijkvwx | -+-+-+ ijkvwx | +-+-+- vwxyzα | -+- yzα | -+- yzα |
| +-+-+- 234567 | -+-+-+ 567fgh | -+-+-+ 567fgh | +-+-+- fghijk | -+-+-+ ijkvwx | -+-+-+ ijkvwx | +-+-+- vwxyzα | -+- yzα | -+- yzα |
| -+-+-+ 123678 | +-+-+- 678efg | +-+-+- 678efg | -+-+-+ efgjkl | +-+-+- jkluvw | +-+-+- jkluvw | -+-+-+ uvwzαβ | +-+ zαβ | +-+ zαβ |
| -+-+-+ 123678 | +-+-+- 678efg | +-+-+- 678efg | -+-+-+ efgjkl | +-+-+- jkluvw | +-+-+- jkluvw | -+-+-+ uvwzαβ | +-+ zαβ | +-+ zαβ |
| +-+-+- 012789 | -+-+-+ 789def | -+-+-+ 789def | +-+-+- defklm | -+-+-+ klmtuv | -+-+-+ klmtuv | +-+-+- tuvαβγ | -+- αβγ | -+- αβγ |
| | | | -+-+-+ cdelmn | +-+-+- lmnstu | +-+-+- lmnstu | | | |
| | | | -+-+-+ cdelmn | +-+-+- lmnstu | +-+-+- lmnstu | | | |
| | | | -+-+-+ cdelmn | +-+-+- lmnstu | +-+-+- lmnstu | | | |
| | | | +-+-+- bcdmno | -+-+-+ mnorst | -+-+-+ mnorst | | | |
| | | | +-+-+- bcdmno | -+-+-+ mnorst | -+-+-+ mnorst | | | |
| | | | -+-+-+ abcnop | +-+-+- nopqrs | +-+-+- nopqrs | | | |

205c"

210

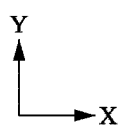

METHOD OF MANUFACTURING A SEMICONDUCTOR DEVICE AND APPARATUS FOR MANUFACTURING THE SEMICONDUCTOR DEVICE

CROSS-REFERENCE TO RELATED APPLICATIONS

This application is a continuation application of U.S. application Ser. No. 17/121,542, filed Dec. 14, 2020, now U.S. Pat. No. 11,320,747, which is a divisional application of U.S. application Ser. No. 16/525,510, filed Jul. 29, 2019, now U.S. Pat. No. 10,866,525, which claims priority to U.S. Provisional Patent Application No. 62/712,953, filed Jul. 31, 2018, the entire disclosures of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 16 shows one of various sequential operations in a method of exposing a photoresist layer on a semiconductor substrate according to an embodiment of the present disclosure.

FIG. 17 shows one of various sequential operations in a method of exposing a photoresist layer on a semiconductor substrate according to an embodiment of the present disclosure.

FIG. 18 shows one of various sequential operations in a method of exposing a photoresist layer on a semiconductor substrate according to an embodiment of the present disclosure.

FIG. 19 shows one of various sequential operations in a method of exposing a photoresist layer on a semiconductor substrate according to an embodiment of the present disclosure.

FIG. 20 shows one of various sequential operations in a method of exposing a photoresist layer on a semiconductor substrate according to an embodiment of the present disclosure.

FIG. 21 shows one of various sequential operations in a method of exposing a photoresist layer on a semiconductor substrate according to an embodiment of the present disclosure.

FIG. 23 shows one of various sequential operations in a method of exposing a photoresist layer on a semiconductor substrate according to an embodiment of the present disclosure.

FIG. 24 shows one of various sequential operations in a method of exposing a photoresist layer on a semiconductor substrate according to an embodiment of the present disclosure.

FIG. 25 shows one of various sequential operations in a method of exposing a photoresist layer on a semiconductor substrate according to an embodiment of the present disclosure.

FIG. 26 shows one of various sequential operations in a method of exposing a photoresist layer on a semiconductor substrate according to an embodiment of the present disclosure.

FIG. 27 shows one of various sequential operations in a method of exposing a photoresist layer on a semiconductor substrate according to an embodiment of the present disclosure.

FIG. 28 shows one of various sequential operations in a method of exposing a photoresist layer on a semiconductor substrate according to an embodiment of the present disclosure.

FIG. 29 shows one of various sequential operations in a method of exposing a photoresist layer on a semiconductor substrate according to an embodiment of the present disclosure.

FIG. 32 shows one of various sequential operations in a method of exposing a photoresist layer on a semiconductor substrate according to an embodiment of the present disclosure.

FIG. 33 shows one of various sequential operations in a method of exposing a photoresist layer on a semiconductor substrate according to an embodiment of the present disclosure.

FIG. 34 shows one of various sequential operations in a method of exposing a photoresist layer on a semiconductor substrate according to an embodiment of the present disclosure.

FIG. 35 shows one of various sequential operations in a method of exposing a photoresist layer on a semiconductor substrate according to an embodiment of the present disclosure.

FIG. 36 shows one of various sequential operations in a method of exposing a photoresist layer on a semiconductor substrate according to an embodiment of the present disclosure.

FIG. 37 shows one of various sequential operations in a method of exposing a photoresist layer on a semiconductor substrate according to an embodiment of the present disclosure.

FIG. 38 shows one of various sequential operations in a method of exposing a photoresist layer on a semiconductor substrate according to an embodiment of the present disclosure.

FIG. 39 shows one of various sequential operations in a method of exposing a photoresist layer on a semiconductor substrate according to an embodiment of the present disclosure.

FIG. 40 shows one of various sequential operations in a method of exposing a photoresist layer on a semiconductor substrate according to an embodiment of the present disclosure.

FIG. 44 shows one of various sequential operations in a method of exposing a photoresist layer on a semiconductor substrate according to an embodiment of the present disclosure.

FIG. 45 shows one of various sequential operations in a method of exposing a photoresist layer on a semiconductor substrate according to an embodiment of the present disclosure.

FIG. 46 shows one of various sequential operations in a method of exposing a photoresist layer on a semiconductor substrate according to an embodiment of the present disclosure.

FIG. 47 shows one of various sequential operations in a method of exposing a photoresist layer on a semiconductor substrate according to an embodiment of the present disclosure.

FIG. 50 shows one of various sequential operations in a method of exposing a photoresist layer on a semiconductor substrate according to an embodiment of the present disclosure.

FIG. 51 shows one of various sequential operations in a method of exposing a photoresist layer on a semiconductor substrate according to an embodiment of the present disclosure.

FIG. 52 shows one of various sequential operations in a method of exposing a photoresist layer on a semiconductor substrate according to an embodiment of the present disclosure.

FIG. 89 shows one of various sequential operations in a method of exposing a photoresist layer on a semiconductor substrate according to an embodiment of the present disclosure.

FIG. 105 shows one of various sequential operations in a method of exposing a photoresist layer on a semiconductor substrate according to an embodiment of the present disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography systems and methods. In an EUVL tool, a laser-produced plasma (LPP) generates extreme ultraviolet radiation which is used to image a photoresist-coated substrate. In an EUV tool, an excitation laser heats metal (e.g., tin, lithium, etc.) target droplets in the LPP chamber to ionize the droplets to plasma which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source.

Figure 1:
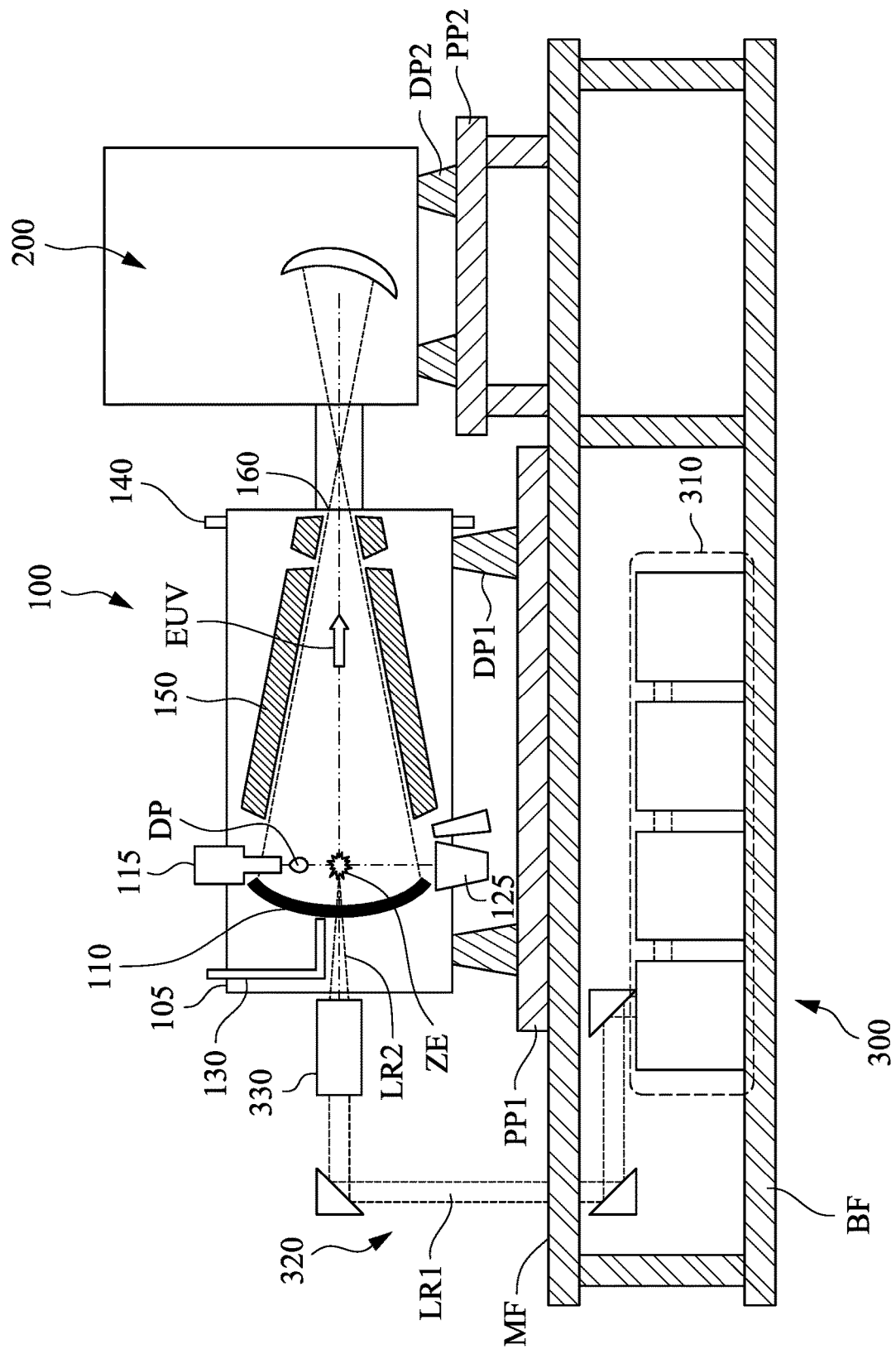
FIG. 1 shows an extreme ultraviolet lithography tool according to an embodiment of the disclosure.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
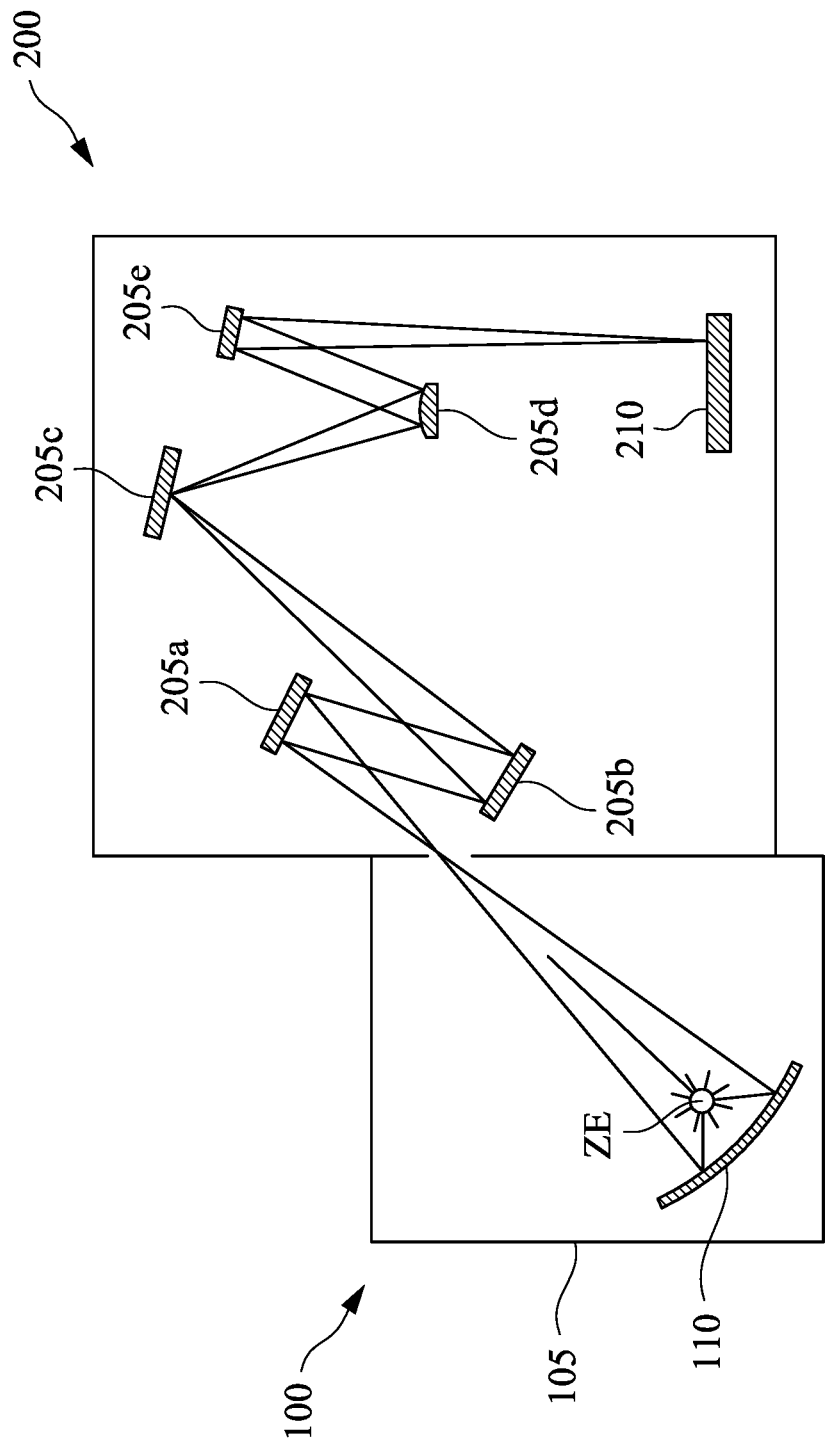
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a mask, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

Figure 3:
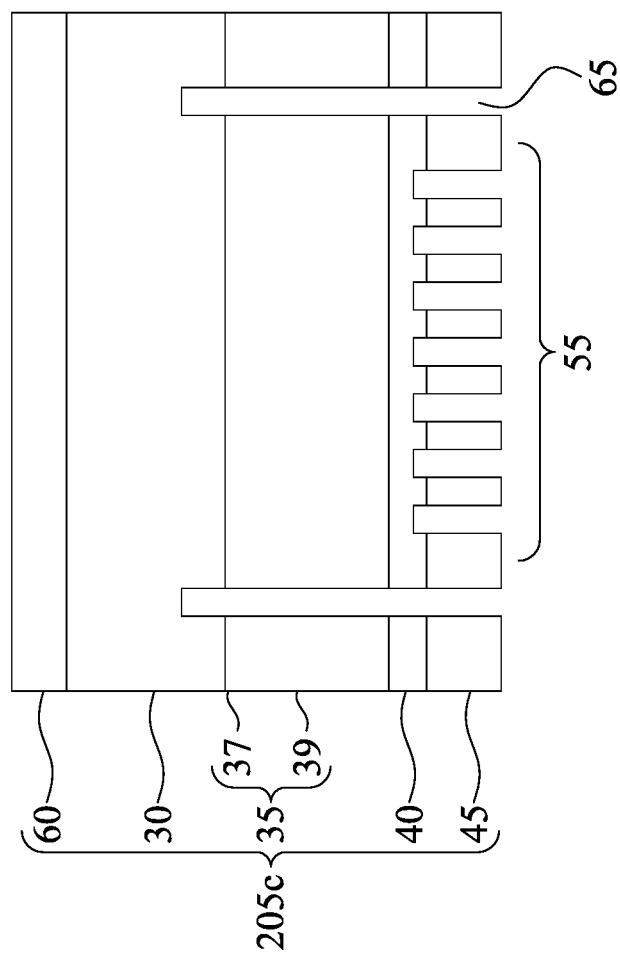
FIG. 3 is a cross-sectional view of a reflective mask according to embodiments of the disclosure.

In the present disclosure, the terms mask, photomask, and reticle are used interchangeably. In the present embodiment, the patterning optic 205c shown in FIG. 3 is a reflective mask. In an embodiment, the reflective reticle 205c includes a substrate 30 with a suitable material, such as a low thermal expansion material or fused quartz, as shown in FIG. 3. In various examples, the material includes $TiO_2$ doped $SiO_2$, or other suitable materials with low thermal expansion. The reflective reticle 205c includes multiple reflective multiple layers (ML) 35 deposited on the substrate. The ML 35 includes a plurality of film pairs, such as molybdenum-silicon (Mo/Si) film pairs (e.g., a layer of molybdenum 39 above or below a layer of silicon 37 in each film pair). Alternatively, the ML 35 may include molybdenum-beryllium (Mo/Be) film pairs, or other suitable materials that are configured to highly reflect the EUV light. The mask 205c may further include a capping layer 40, such as ruthenium (Ru), disposed on the ML for protection. The mask further includes an absorption layer (or absorber) 45, such as a tantalum boron nitride (TaBN) layer, and/or a tantalum boron oxide (TaBO) layer, deposited over the ML 35. The absorption layer 45 is patterned to define a layer of an integrated circuit (IC). The reflective mask 205c includes a conductive backside coating 60. Alternatively, another reflective layer may be deposited over the ML 35 and is patterned to define a layer of an integrated circuit, thereby forming an EUV phase shift reticle. In some embodiments, the reflective mask 205c includes a border 65 etched down to the substrate 30 surrounding the pattern 55, also known as a black border 65, to define a circuit area to be imaged and a peripheral area not to be imaged. The black border reduces light leakage in some embodiments.

In various embodiments of the present disclosure, the photoresist-coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In some embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to about 25 kHz. In other embodiments, the target droplets DP are supplied at an ejection frequency of about 500 Hz to about 10 kHz. The target droplets DP are ejected through the nozzle 127 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases, and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

It is desirable to improve resolution of the EUVL operation in order to increase the yield of semiconductor devices. In some cases, pattern defects in a mask or particulate contamination on a mask surface cause defects in a photoresist layer pattern when the photomask with the defect or contaminant is used to form the pattern in the photoresist layer. To improve exposure resolution in an EUVL operation and to avoid defective patterns due to particles or mask defects, multiple exposures of the photoresist-covered wafer is performed. Methods, according to embodiments of the disclosure, realize the exposure of the patterns of a chip on a wafer by accumulating the mask images from N mask regions, on each of which there are the same mask patterns.

In some embodiments, a p*q folding exposure is performed using a step and scan exposure system. A folding exposure includes repeatedly exposing a full field image, while stepping the mask relative to the photoresist-coated wafer being exposed a stepping distance of a die size or multiples of the die size between each exposure. The folding exposure is column-wise in some embodiments and row-wise in other embodiments. Examples of folding exposures are illustrated in FIGS. 4A to 5D.

Figure 4A:
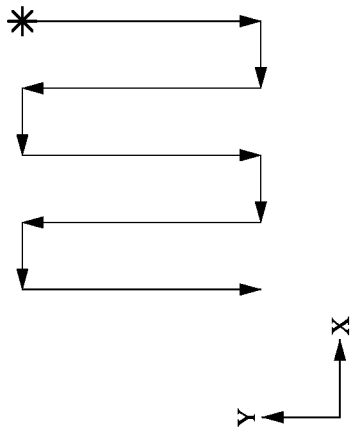
FIGS. 4A, 4B, 4C, and 4D illustrate column-wise folding exposure operations as viewed in plan view.
Figure 4B:
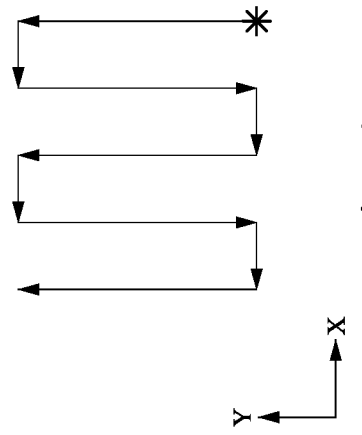
Figure 4C:
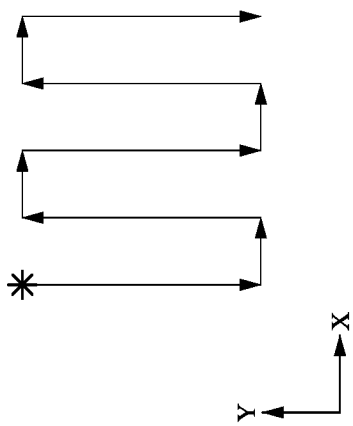
Figure 4D:
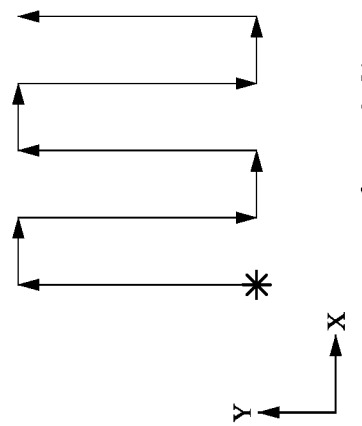

FIGS. 4A to 4D illustrate column-wise folding exposure operations as viewed in plan view over a wafer (not shown). The star indicates the starting point of a sequence of exposure/stepping/exposure operations, and the arrows show the direction of motion of a wafer stage. For example, in FIG. 4A, the exposure/stepping/exposure operation starts in the upper left corner of the wafer (not shown) and the exposure/stepping/exposure proceeds in the direction (y axis) of the vertical arrow. At the end of the exposure/stepping/exposure sequence along the y-axis, the wafer stage is stepped to the right along the x-axis (horizontal arrow), and another sequence of exposure/stepping/exposure operations is performed along the y axis in the opposite direction as the first sequence of exposure/stepping/exposure operations. At the end of exposure/stepping/exposure operations along the y axis, the wafer stage is again stepped to the right. The alternating process of exposure/stepping/exposure operations and stepping to the right is continued until a desired portion of the wafer is exposed. In another embodiment, as shown in FIG. 4B the exposure/stepping/exposure operation starts in the upper right corner of the wafer and an alternating process of exposure/stepping/exposure operations and stepping to the left is performed in a similar manner as explained with reference to FIG. 4A. In another embodiment, as shown in FIG. 4C the exposure/stepping/exposure operation starts in the lower left corner of the wafer and an alternating process of exposure/stepping/exposure operations and stepping to the left is performed in a similar manner as explained with reference to FIG. 4A. In another embodiment, as shown in FIG. 44 the exposure/stepping/exposure operation starts in the lower right corner of the wafer and an alternating process of exposure/stepping/exposure operations and stepping to the left is performed in a similar manner as explained with reference to FIG. 4A.

Figure 5A:
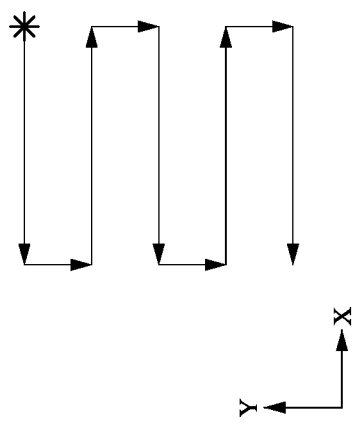
FIGS. 5A, 5B, 5C, and 5D illustrate row-wise folding exposure operations as viewed in plan view.
Figure 5B:
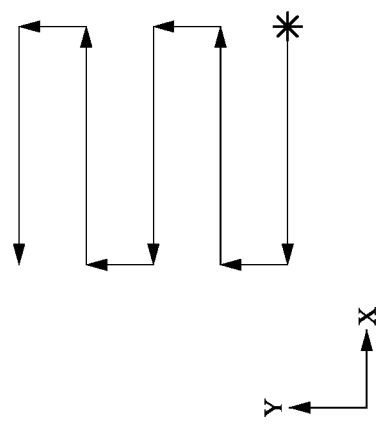
Figure 5C:
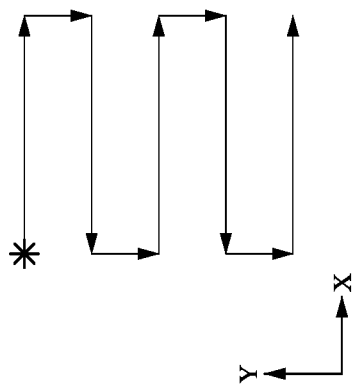
Figure 5D:
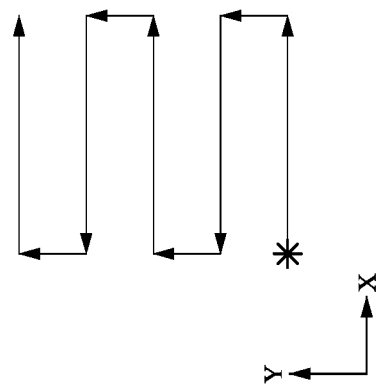

FIGS. 5A to 5D illustrate row-wise folding exposure operations as viewed in plan view over a wafer (not shown). The star indicates the starting point of a sequence of exposure/stepping/exposure operations, and the arrows show the direction of motion of a wafer stage. For example, in FIG. 5A, the exposure/stepping/exposure operation starts in the upper left corner of the wafer (not shown) and the exposure/stepping/exposure proceeds in the direction (x axis) of the horizontal arrow. At the end of the exposure/stepping/exposure sequence along the x-axis, the wafer stage is stepped down along the y-axis (vertical arrow), and another sequence of exposure/stepping/exposure operations is performed along the x axis in the opposite direction as the first sequence of exposure/stepping/exposure operations. At the end of exposure/stepping/exposure operations along the x axis, the wafer stage is again stepped down in the vertical direction. The alternating process of exposure/stepping/exposure operations and stepping down is continued until a desired portion of the wafer is exposed. In another embodiment, as shown in FIG. 5B the exposure/stepping/exposure operation starts in the upper right corner of the wafer and an alternating process of exposure/stepping/exposure operations along the x axis and stepping down along the y axis is performed in a similar manner as explained with reference to FIG. 5A. In another embodiment, as shown in FIG. 5C the exposure/stepping/exposure operation starts in the lower left corner of the wafer and an alternating process of exposure/stepping/exposure operations along the x axis and stepping up along the y axis is performed in a similar manner as explained with reference to FIG. 5A. In another embodiment, as shown in FIG. 5D the exposure/stepping/exposure operation starts in the lower right corner of the wafer and an alternating process of exposure/stepping/exposure operations and stepping up performed in a similar manner as explained with reference to FIG. 5A.

Figure 6:
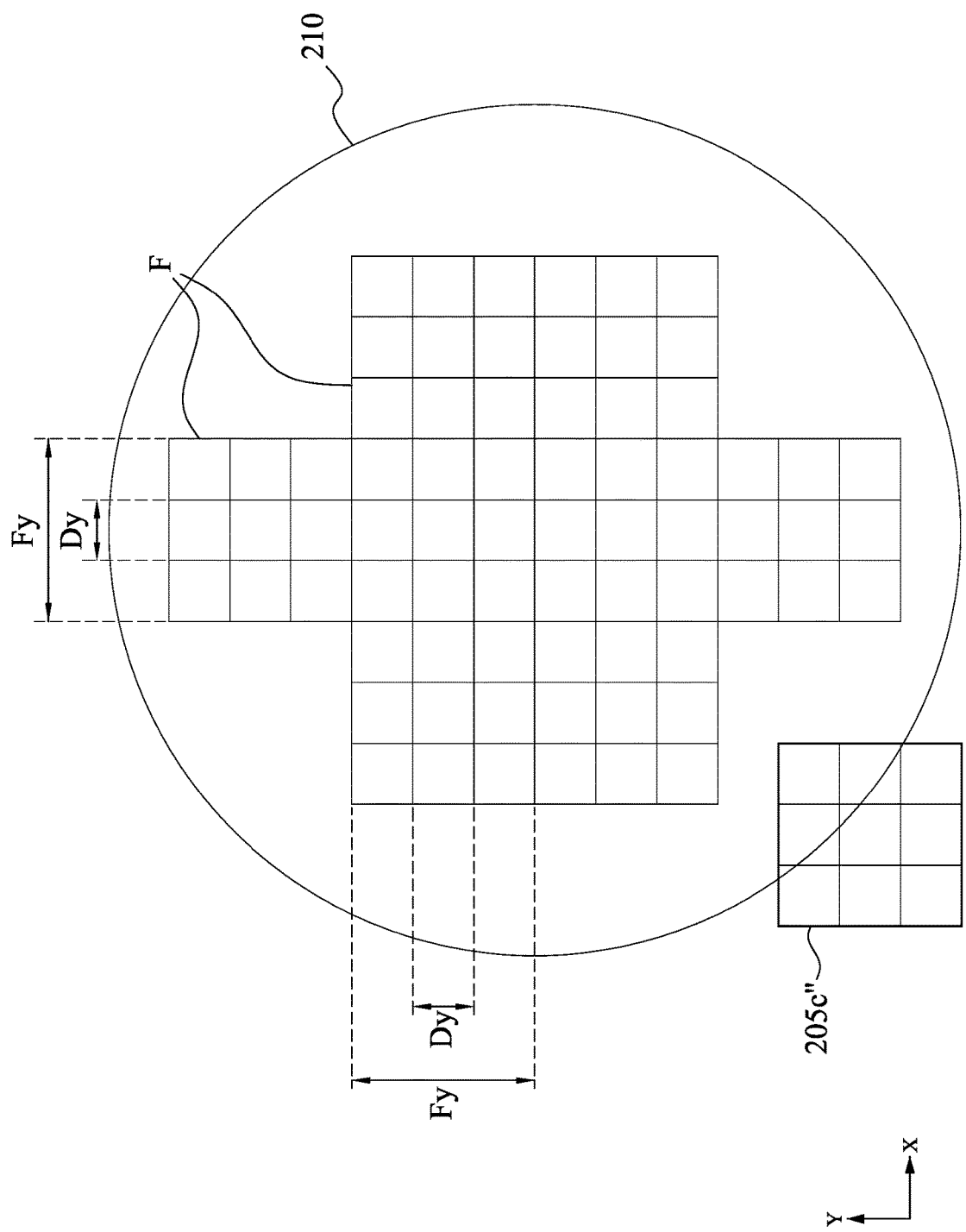
FIG. 6 shows a semiconductor wafer with a plurality of dies according to an embodiment of the disclosure.

Arranging the dies as a matrix there are Nax*Nay dies in an exposure field F (or field, i.e., the one-time exposure region. As shown in FIG. 6, the die size along the x-axis is Dx and the die size along the y-axis is Dy. The fields F are arranged as a matrix on the wafer, however, those rectangular shaped fields completely or partially outside the circular shaped wafer 210 are removed from the matrix.

In the matrix of fields, there are Nbx columns. In the first column (leftmost column, there are Nby fields and in the second column (column next to the first column), there are Nby fields, and so on for each column. The field size along the x-axis is Fx, and the field size along the y-axis column is Fy. In some embodiments, Nax is divided into p terms: Nax_1, Nax_2, ..., Nax_p, where (Nax_1+Nax_2+ ... + Nax_p=Nax). A sequence SNx0 is formed, by repeating Nbx+1 times the p terms in order. Nbx is an integer closest to Rx/Fx, where Rx is a size along the x axis of a smallest rectangle enclosing the exposure field matrix, called the exposure field matrix enclosure, and Fx is an exposure field size along the x axis Eliminating the first and last elements of SNx0 results in a new sequence SNx1. A sequence SNx is formed by multiplying each element of SNx1 by Dx, where Dx is a die size along the x axis. By reversing the order of SNx, a sequence SNxr is formed.

In some embodiments, Nay is divided into q terms: Nay_1, Nay_2, ..., Nay_q, where (Nay_1+Nay_2+ ... + Nay_q=Nay). A sequence SNy0 is formed, by repeating Nby+1 times the q terms in order. Nby is an integer closest to Ry/Fy, where Ry is a size along the y axis of a smallest rectangle enclosing the exposure field matrix, called the exposure field matrix enclosure, and Fy is an exposure field size along the y axis Eliminating the first and last elements of SNy0 results in a new sequence SNy1. A sequence SNy is formed by multiplying each element of SNy1 by Dy, where Dy is a die size along the y axis. By reversing the order of SNy, a sequence SNyr is formed.

To achieve a p*q folding exposure, p≥Nax and q≥Nay are needed in some embodiments.

In some embodiments, a sequence SFy0 is formed, where Sfy0: F−, F+, F−, F+, ..., for a total of q*(Nby[1]+1) terms. Where F− refers to an exposure done at a focus position above the target focus position and F+ refers to an exposure done at a focus position done below the target focus position. Eliminating the last element of SFy0 results in a new sequence SFy1. Similarly, SFy2, SFy3, ..., SFyNbx can be generated.

In some embodiments, a method of exposing a photoresist layer includes moving the wafer stage to a starting position and then performing an exposure such that Nax_1*Nay_1 dies around the staring position, for example a lower-left corner of the lowest field in the first column, are exposed. The wafer stage performs q*(Nby1+1)−2 upward steppings, the distance of each of which in order follows the sequence SNy1. After each stepping, an exposure is performed. The focus setting of each of the exposures follows the sequence SFy1. For example, the focus setting of the first exposure is the first element in SFy1; the focus setting of the second exposure is the second element in SFy1, ..., etc.

Next, the wafer stage is stepped rightward by a distance following the first element of SNx, and then an exposure is performed. After the rightward stepping and exposure, the wafer stage performs q*(Nby1+1)−2 downward steppings, the distance of each of which in order follows the sequence SNyr1. After each stepping, an exposure is performed. The focus setting of each of the exposures order follows the sequence SFy1.

The exposure and stepping operations are continued until the first column of fields is traversed p times, either upward or downward. Then the wafer stage is stepped rightward by a distance following the p-th element of SNx, and an exposure is performed.

In some embodiments, the total dose accumulated in each die is within about 75% to about 125% of the target dose. In some embodiments, the exposure latitude is larger than 25%.

The above-described exposure and stepping operations are performed in a column-wise folding exposure in some embodiments and in a row-wise folding exposure in other embodiments.

For example, in some embodiments, each die on the photoresist-coated wafer is exposed four times with the same pattern, using a different portion of the mask. In some embodiments, the exposure mask includes the same pattern in four adjacent locations on the mask, and as the wafer is moved relative to the exposure beam, each die is exposed four times to the same pattern. To prevent overexposure of a given die, the exposure dose from each exposure is one-fourth the desired total exposure dose. The reduced exposure dose at each exposure is achieved by scanning the exposure beam quicker at each exposure, in some embodiments. Thus, the photoresist-coated wafer is exposed for a shorter period of time during each scanning exposure. For example, the scanning beam can be moved relative to the photoresist layer at four times the normal speed so that at each exposure each die is exposed for one-fourth the total exposure time. In some embodiments, the reduced exposure dose is achieved by moving the wafer stage quicker at each scanning exposure. It is not likely that a defect in or a particle contaminant on one pattern would be found in the same location in another pattern of the mask. Because each exposure is below the desired total exposure, isolated defects or particles on one portion of the mask will not be imaged into the photoresist layer. The cumulative exposure doses of the multiple exposures using different portions of the mask having the same circuit or chip pattern will reproduce the pattern in the photoresist without imaging the isolated defects or particles, according to embodiments of the disclosure.

The exposure mask is not limited to four adjacent same patterns. Other mask arrangements may include more than four adjacent same patterns. In some embodiments, there are five, six, seven, eight, or more adjacent same patterns. The present disclosure is not limited to four exposures of each die, and the multiple number of exposures can be two, three, or five or more. The multiple exposures by different portions of the mask with the same pattern smooths out any defects that may be present in a given position of the mask in some embodiments.

In some embodiments, each of the multiple exposures is performed at a different focus position. The different focus positions are achieved by moving the wafer stage closer to or further away from the imaging light source or mask. In some embodiments, the wafer stage is tilted during scanning exposure to achieve an image formed at a range of focus positions. In some embodiments, the wafer stage is tilted by up to about 50 micro radians with respect to the horizontal direction during the exposing of one field. During a scanning exposure, the wafer stage is either tilted up (+) or tilted down (−), but not both, in some embodiments. In some embodiments, the wafer stage is moved in a vertical direction relative to the imaging light source or mask to move the wafer closer to or further away from the imaging light source or mask. In some embodiments, the wafer stage is moved from −50 nm to +50 nm relative to the target or the best focus position during the exposing of one field.

Exposing the same area of the photoresist-coated wafer 210 at different depths of focus is known as focus latitude enhanced exposure (FLEX). In a FLEX operation, multiple exposures in several different focal planes are used to extend the image contrast of the mask pattern along the light axis. The FLEX operation can provide a 3× to 4× increase in pattern focus position.

In some embodiments, sub resolution assist features (SRAFs) are provided adjacent the desired pattern on the photomask to improve pattern resolution.

Figure 7:
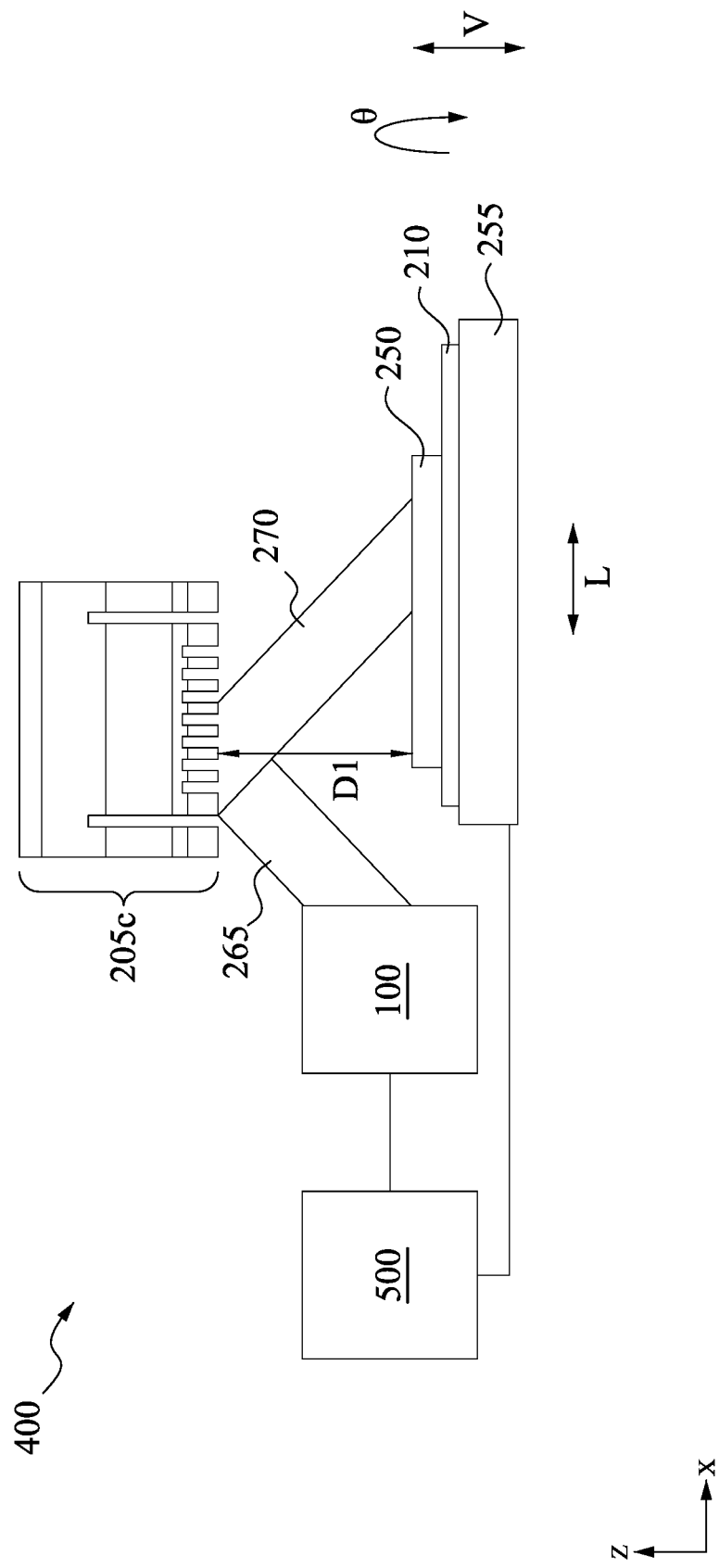
FIG. 7 shows a photolithography apparatus according to an embodiment of the disclosure.

A photolithography apparatus 400 according to an embodiment of the disclosure is illustrated in FIG. 7. A semiconductor substrate 210 having a photoresist layer 250 coated thereon is exposed to radiation in the photolithography apparatus 400. The photoresist coated semiconductor substrate is supported by a wafer stage 255. In some embodiments, the photomask 205c and the photoresist layer are separated by a distance D1. The wafer stage 255 is configured to move laterally L or vertically V relative to a photomask 205c in some embodiments. The lateral motion L includes motion along the X-axis or the Y-axis (into the page). The vertical motion V is along the Z-axis. In some embodiments, the wafer stage 255 is moved from −XX to +XX or from +XX to −XX, where XX is in the range from 10 nm to 200 nm relative to photomask 205c, thereby changing the distance between the photomask 205c and the photoresist layer 250. Thus, in some embodiments, the distance between the photomask 205c and the photoresist layer 250 increases or decreases relative to the initial distance D1. During a scanning exposure, in some embodiments, the wafer stage is configured to tilt about the X-axis when the scanning direction is along the Y-axis. In some embodiments, the angle of tilt about the X-axis is TT, where TT is in the range of about 10 to about 200 micro radians.

In some embodiments, the radiation is extreme ultraviolet radiation, and the photomask 205c is a reflective EUV photomask. In some embodiments, the extreme ultraviolet radiation is generated in an EUV radiation source 100, as previously discussed herein. The EUV radiation source 100 generates EUV radiation 265 that is directed towards the photomask 205 and is reflected off the reflective photomask 205c. The reflected EUV radiation 270 includes pattern information according to the pattern in the photomask 205c. The patterned reflected EUV radiation 270 exposes the photoresist layer 250 in a patternwise manner, thereby forming a latent pattern in the photoresist layer 250 corresponding to the photomask pattern. A pattern is formed in the patternwise exposed photoresist layer by developing the exposed photoresist layer using a suitable developer. The photoresist is a positive-tone resist or a negative-tone resist. In a positive tone photoresist, the exposed portions of the photoresist layer are subsequently removed during the developing operation. In a negative tone photoresist, the unexposed portions of the photoresist layer are subsequently removed during the developing operation.

The pattern in the photoresist is extended into an underlying layer using a suitable etching operation in some embodiments. The etching operation may be a wet etching operation or a dry etching operation. After forming the pattern in the underlying layer, the remaining photoresist is removed by a suitable photoresist stripping or plasma ashing operation.

In some embodiments, there are additional optics between the EUV radiation source 100 and the photomask 205c, or between the photomask 205c and the photoresist layer 250, as needed, to further reduce the size of the pattern on the photoresist layer 250 or focus EUV radiation.

Figure 8A:
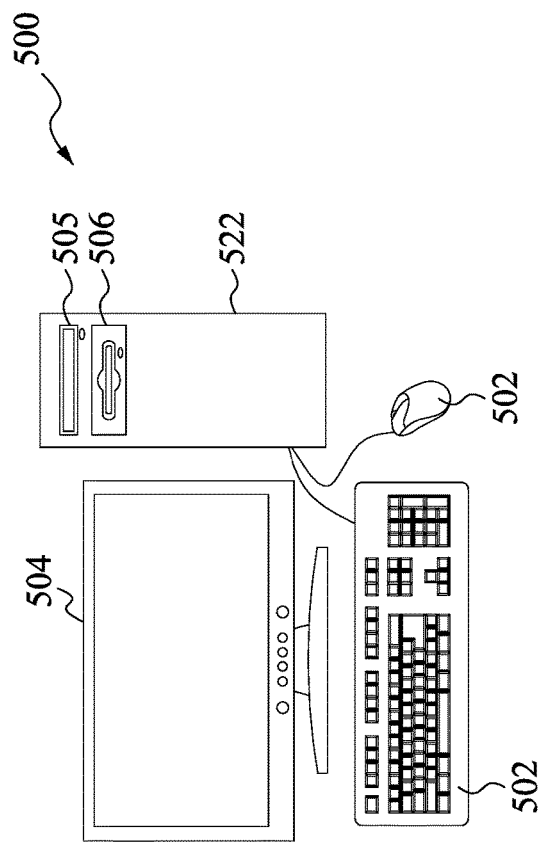
FIGS. 8A and 8B show an embodiment of a controller for a photolithography apparatus according to an embodiment of the disclosure.
Figure 8B:
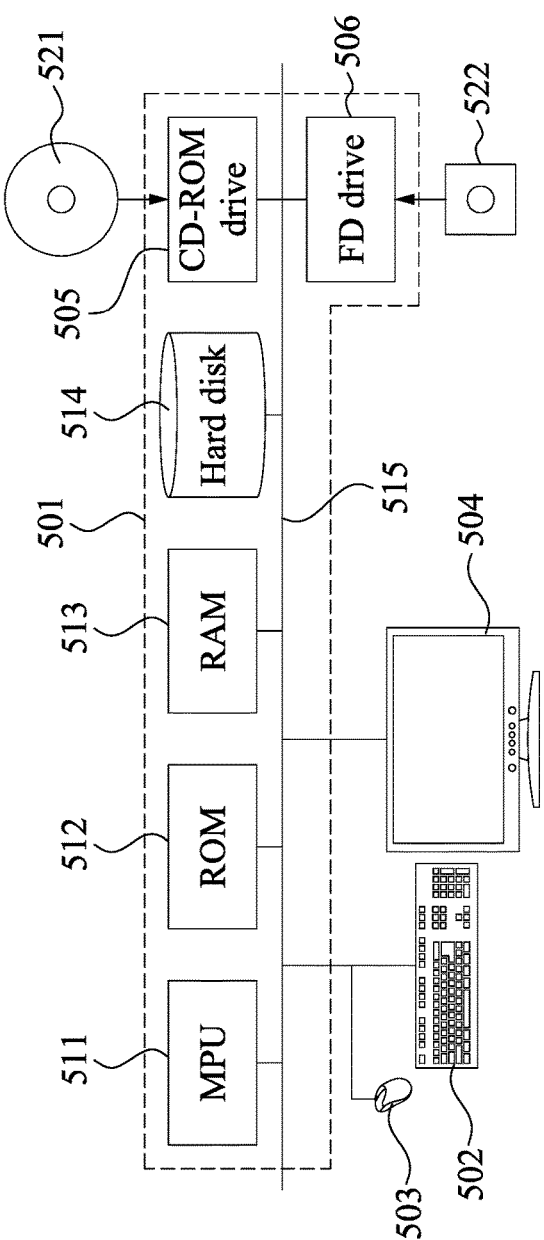

In some embodiments, the motion of the wafer stage 255 and the generation of the exposure radiation is controlled by a controller. FIGS. 8A and 8B illustrate a controller 500 according to some embodiments of the present disclosure. In some of the embodiments, the controller 500 is a computer system. FIG. 8A is a schematic view of a computer system that controls the radiation generation and the wafer stage motion. All of or a part of the processes, method and/or operations of the foregoing embodiments can be realized using computer hardware and computer programs executed thereon. The operations include the motion of the wafer stage, sequence of exposure shots, exposure dose, generation of EUV radiation, including the frequency of Sn droplet generation and timing of the laser pulses. In some embodiments, the computer system is provided with a computer 501 including an optical disk read only memory (e.g., CD-ROM or DVD-ROM) drive 505 and a magnetic disk drive 506, a keyboard 502, a mouse 503, and a monitor 504.

FIG. 8B is a diagram showing an internal configuration of the some embodiments of the controller 500. In FIG. 8B, the computer 501 is provided with, in addition to the optical disk drive 505 and the magnetic disk drive 506, one or more processors 511, such as a microprocessing unit (MPU) 511, a ROM 512 in which a program such as a boot up program is stored, a random access memory (RAM) 513 that is connected to the MPU 511 and in which a command of an application program is temporarily stored and a temporary storage area is provided, a hard disk 514 in which an application program, a system program, and data are stored, and a bus 515 that connects the MPU 511, the ROM 512, and the like. Note that the computer 501 may include a network card (not shown) for providing a connection to a LAN.

The program for causing the controller 500 to execute the functions of the sequence of the exposure shots, exposure dose, and wafer stage movement of the foregoing embodiments may be stored in an optical disk 521 or a magnetic disk 522, which are inserted into the optical disk drive 505 or the magnetic disk drive 506, and transmitted to the hard disk 514. Alternatively, the program may be transmitted via a network (not shown) to the computer 501 and stored in the hard disk 514. At the time of execution, the program is loaded into the RAM 513. The program may be loaded from the optical disk 521 or the magnetic disk 522, or directly from a network. The program does not necessarily have to include, for example, an operating system (OS) or a third party program to cause the computer 501 to execute the functions of the photo mask data generating and merging apparatus in the foregoing embodiments. The program may only include a command portion to call an appropriate function (module) in a controlled mode and obtain desired results.

Figure 9:
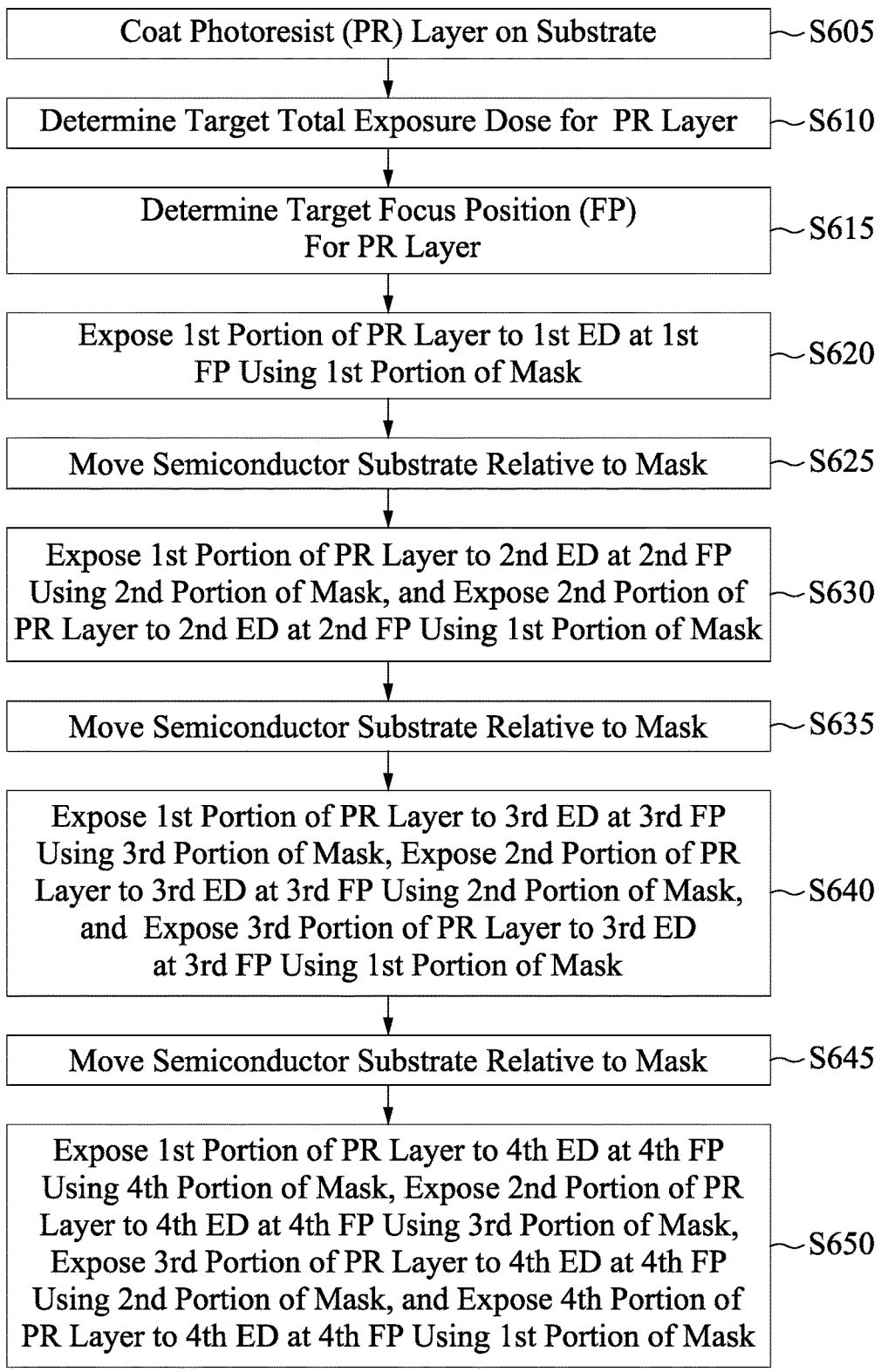
FIG. 9 is a flow chart illustrating a method of manufacturing a semiconductor device according to an embodiment of the present disclosure.

FIG. 9 is a flow chart illustrating a method 600 of manufacturing a semiconductor device according to an embodiment of the present disclosure. In operation S605, a photoresist layer 250 is coated on a semiconductor substrate 210. A target total exposure dose is determined for the photoresist layer 250 in operation S610, and in operation S615 a target focus position is determined of the photoresist layer 250. In some embodiments, the target total exposure dose is an average optimal exposure dose for the photoresist layer 250. In some embodiments, the target focus position is the average optimal focus position for the photoresist layer 250. In some embodiments, the target total exposure dose and target focus position are previously determined, and are stored in a memory. Target total exposure doses and target depths of focus can be determined and stored for various wafer sizes, photoresist compositions, and photoresist layer thicknesses. In some embodiments, the stored target total exposure dose and focus position are input to the controller 500 prior to the exposure operations.

Then, a first portion of the photoresist layer 250 is exposed to a first exposure dose of extreme ultraviolet radiation at a first focus position using a first portion of an extreme ultraviolet mask 205c in operation S620. In some embodiments, the exposure is a scanning exposure, and the semiconductor substrate 210 is moved during the scanning exposure operation so that scanning radiation exposes the desired pattern in the photoresist layer 250. The semiconductor substrate 210 is subsequently moved relative to the extreme ultraviolet mask 205c in operation S625. The first portion of the photoresist layer 250 is subsequently exposed, in operation S630, to a second exposure dose of extreme ultraviolet radiation using a second portion of the mask 205c at a second focus position, and a second portion of the photoresist layer 250 is exposed to the second exposure dose at the second focus position using the first portion of the extreme ultraviolet mask 205c. The moving of the semiconductor substrate 210 relative to the mask 205c between exposure operations includes moving the wafer stage 255 supporting the semiconductor closer to or further away from the mask 205c, e.g.—in a vertical direction, or moving (stepping) the wafer stage 255 in a lateral direction, e.g.—from one die on the semiconductor substrate 210 to another die. During the stepping operation, the wafer stage 255 is stepped so that a same portion of the mask is positioned over a different die in a subsequent exposure operation than in a prior exposure operation. The first portion and second portion of the photoresist layer 250 are exposed simultaneously during the exposure operation in some embodiments.

Then, in some embodiments, the semiconductor substrate 210 is moved relative to the mask 205c, and the first portion of the photoresist layer 250 is exposed to a third exposure dose of extreme ultraviolet radiation at a third focus position using a third portion of the mask 205c, the second portion of the photoresist layer 250 is exposed to the third exposure dose of extreme ultraviolet radiation at the third focus position using the second portion of the mask 205c, and a third portion of the photoresist layer 250 is exposed to the third exposure dose at the third focus position using the first portion of the mask 205c in operation S640. In some embodiments, the first, second, and third portions of the photoresist layer 250 are exposed substantially simultaneously during the exposure operation.

In some embodiments, the semiconductor substrate 210 is then moved relative to the mask 205c in operation S645. In operation S650, the first portion of the photoresist layer 250 is exposed to a fourth exposure dose of extreme ultraviolet radiation at a fourth focus position using a fourth portion of the mask 205c, the second portion of the photoresist layer 250 is exposed to the fourth exposure dose of extreme ultraviolet radiation at the fourth focus position using the third portion of the mask 205c, a third portion of the photoresist layer 250 is exposed to the fourth exposure dose at the fourth focus position using the second portion of the mask 205c, and a fourth portion of the photoresist layer 250 is exposed to the fourth exposure dose of extreme ultraviolet radiation at the fourth focus position using the first portion of the mask 205c. The first, second, third, and fourth portions of the photoresist layer 250 are exposed substantially simultaneously during the exposure operation.

In some embodiments, the first portion of the mask 205c, the second portion of the mask 205c, the third portion of the mask 205c, and the fourth portion of the mask 205c each have a same circuit or chip pattern. Thus, the same pattern images are superimposed in the first portion of the photoresist layer 250.

In some embodiments, the first exposure dose, the second exposure dose, the third exposure dose, and the fourth exposure dose are different. In some embodiments, the first exposure dose and the third exposure dose are the same, and the second exposure dose and the fourth exposure dose are the same, and in some embodiments, the first and third exposure doses are different from the second and fourth exposure doses. In some embodiments, each of the first exposure dose, the second exposure dose, the third exposure dose, and the fourth exposure dose is less than the target exposure dose. In some embodiments, a total of all the exposure doses received by each portion of the photoresist layer is substantially equal to the target exposure dose. In some embodiments, each of the first, second, third, and fourth exposure doses are about one quarter of the target total exposure dose.

In some embodiments, the focus position alternates between above the target focus position and below the target focus position during successive exposures or shots. In some embodiments, the first focus position is above the target focus position, the second focus position is below the target focus position, the third focus position is above the target focus position, and the fourth focus position is below the target focus position. In other embodiments, the first focus position is below the target focus position, the second focus position is above the target focus position, the third focus position is below the target focus position, and the fourth focus position is above the target focus position.

In some embodiments, the method includes performing additional exposure steps (shots) such that each portion of the photoresist layer 250 is exposed the same number of times.

Figure 10:
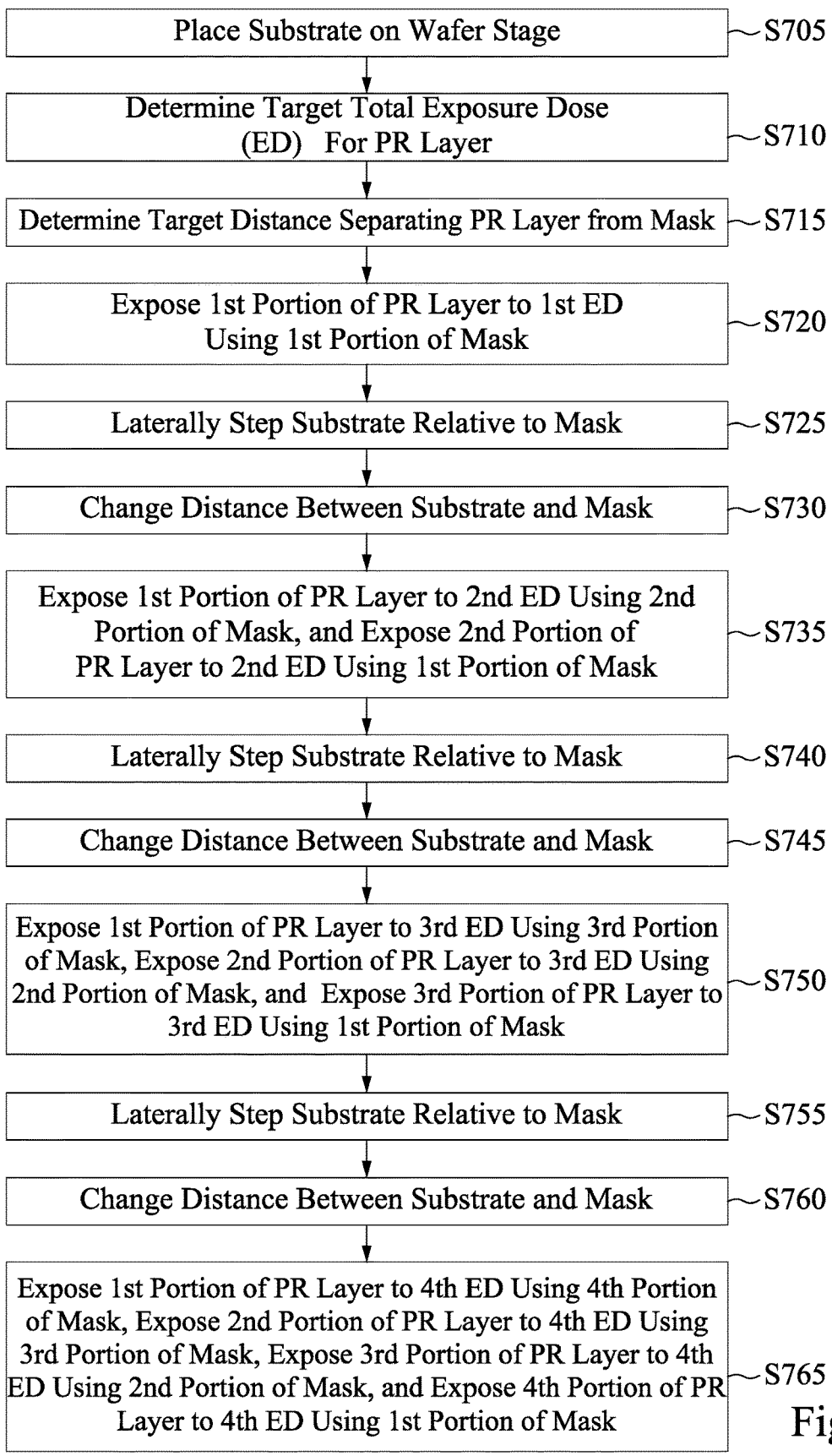
FIG. 10 is a flow chart illustrating a method of manufacturing a semiconductor device according to an embodiment of the present disclosure.

FIG. 10 is a flow chart illustrating a method 700 of manufacturing a semiconductor device according to an embodiment of the present disclosure. In operation S705, a semiconductor substrate 210 with a photoresist layer 250 disposed thereon is placed on a wafer stage. A target total exposure dose is determined for each portion of the photoresist layer 250 in operation S710. A target distance separating the photoresist layer from an extreme ultraviolet mask 205c is determined in operation S715. In some embodiments, the target total exposure dose and target distance are previously determined and stored in a memory. The stored target total exposure dose and distance are then input into the controller 500 prior to the exposure operations. Then, in operation S720, a first portion of the photoresist layer 250 is exposed to a first exposure dose of extreme ultraviolet radiation using a first portion of the extreme ultraviolet mask 205c, wherein the photoresist layer 250 and the extreme ultraviolet mask 205c are separated by a first distance D1. In some embodiments, the exposure is a scanning exposure. The semiconductor substrate 210 is subsequently stepped laterally relative to the extreme ultraviolet mask 205c in operation S725. In operation S730, a distance between the semiconductor substrate 210 and the extreme ultraviolet mask 205c is changed so that the photoresist layer 250 and the extreme ultraviolet mask 205c are separated by a second distance.

Then, in operation S735, the first portion of the photoresist layer 250 is exposed to a second exposure dose of extreme ultraviolet radiation using a second portion of the mask 205c, and a second portion of the photoresist layer 250 is exposed to the second exposure dose using the first portion of the mask 205c. The first portion and second portion of the photoresist layer 250 are exposed substantially simultaneously during the exposure operation. In some embodiments, the semiconductor substrate 210 is then laterally stepped relative to the mask 205c in operation S740. In operation S745, the distance between the semiconductor substrate 210 and the mask 205c is changed so that the photoresist layer 250 and the mask 205c are separated by a third distance. Then, in operation S750, the first portion of the photoresist layer 250 is exposed to a third exposure dose of extreme ultraviolet radiation using a third portion of the mask 205c, the second portion of the photoresist layer 250 is exposed to the third exposure dose of extreme ultraviolet radiation using the second portion of the mask 205c, and a third portion of the photoresist layer is exposed to the third exposure dose using the first portion of the mask 205c. In some embodiments, the first, second, and third portions of the photoresist layer 250 are exposed substantially simultaneously. In some embodiments, the semiconductor substrate 210 is then laterally stepped relative to the mask 205c in operation S755, and the distance between the semiconductor substrate 210 and the mask 205c is changed in operation S760, so that the photoresist layer 250 and the extreme ultraviolet mask 205c are separated by a fourth distance. Then, in operation S765, the first portion of the photoresist layer 250 is exposed to a fourth exposure dose of extreme ultraviolet radiation using a fourth portion of the mask 205c, the second portion of the photoresist layer 250 is exposed to the fourth exposure dose of extreme ultraviolet radiation using the third portion of the mask 205c, a third portion of the photoresist layer 250 is exposed to the fourth exposure dose using the second portion of the mask 205c, and a fourth portion of the photoresist layer 250 is exposed to the fourth exposure dose of extreme ultraviolet radiation using the first portion of the mask 205c. In some embodiments, the first, second, third, and fourth portions of the photoresist layer 250 are exposed substantially simultaneously.

In some embodiments, the first portion of the mask 205c, the second portion of the mask 205c, the third portion of the mask 205c, and the fourth portion of the mask 205c each have the same pattern. In some embodiments, the first distance is greater than the target distance, the second distance is less than the target distance, the third distance is greater than the target distance, and the fourth distance is less than the target distance. In other embodiments, the first distance is less than the target distance, the second distance is greater than the target distance, the third distance is less than the target distance, and the fourth distance is greater than the target distance. In some embodiments, the distance between the photoresist layer 250 and the mask 205c is changed by raising or lowering the wafer stage 255. In some embodiments, a mean distance of the first distance, the second distance, the third distance, and the fourth distance is the target distance. In some embodiments, a total of all the exposure doses received by each portion of the photoresist layer 250 is equal to the target expose dose.

Figure 11:
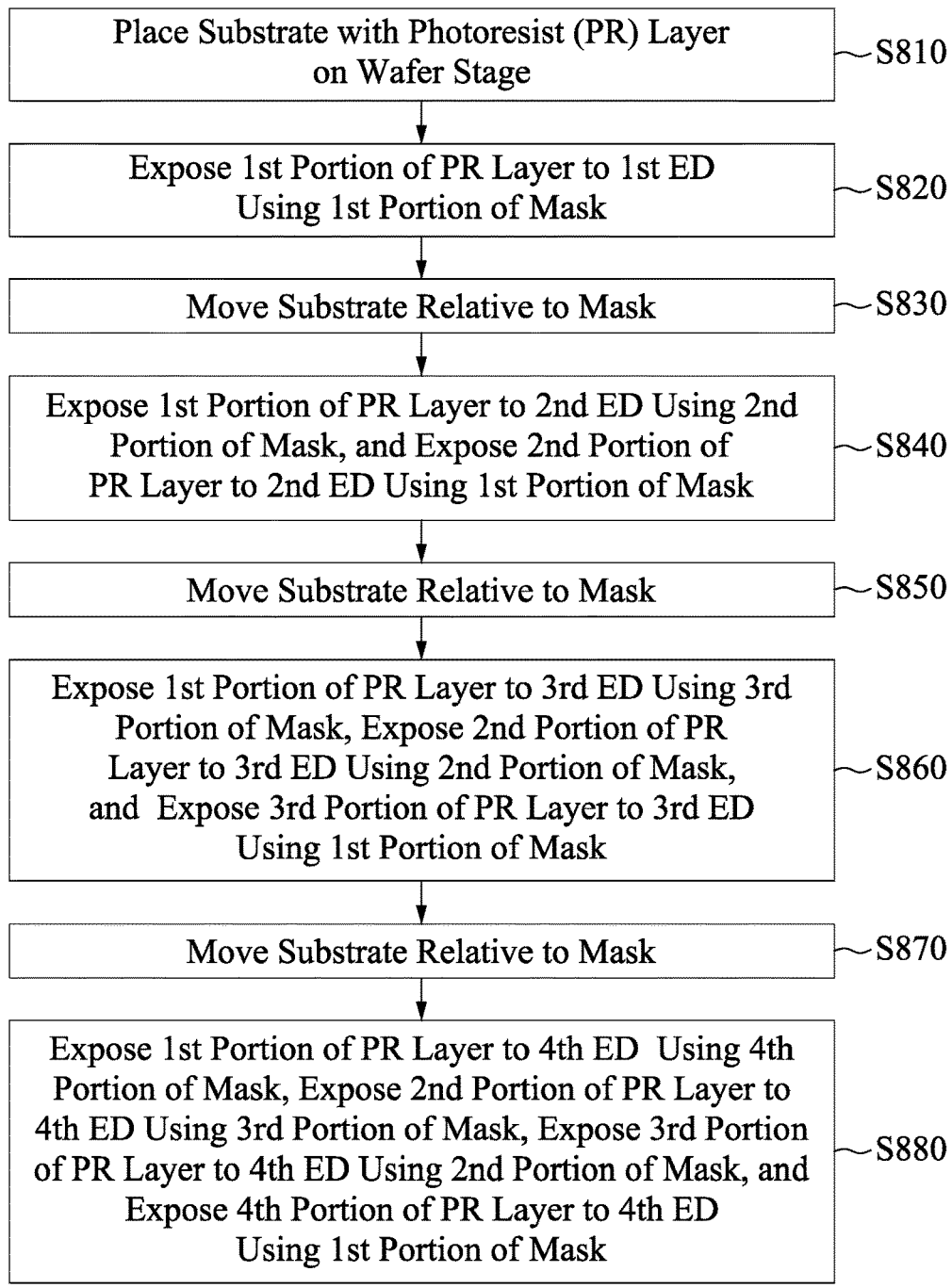
FIG. 11 is a flow chart illustrating a method of manufacturing a semiconductor device according to an embodiment of the present disclosure.

FIG. 11 is a flow chart illustrating a method 800 of manufacturing a semiconductor device according to an embodiment of the present disclosure. The sequential method includes an operation S810 of placing a semiconductor substrate 210 on a wafer stage 255. The semiconductor substrate 210 has a photoresist layer 250 disposed thereon. In operation S820, a first portion of the photoresist layer 250 is exposed to a first exposure dose of extreme ultraviolet radiation using a first portion of an extreme ultraviolet mask 205c. The semiconductor substrate 210 is then moved relative to the extreme ultraviolet mask 205c in operation S830 followed by an operation S840 of exposing the first portion of the photoresist layer 250 to a second exposure dose of extreme ultraviolet radiation using a second portion of the mask 205c, and exposing a second portion of the photoresist layer 250 to the second exposure dose using the first portion of the mask 205c. The moving operation S830 includes laterally stepping the mask 205c so that the same portion of the mask 205 images a first die on the semiconductor substrate 210 in a first exposure operation and then images a second, different die on the semiconductor substrate 210 in a subsequent exposure operation, or changing the distance between the mask 205c and the photoresist layer 250 by moving or tilting the wafer stage 255 in the vertical direction relative to the mask in some embodiments. In some embodiments, the first and second portions of the photoresist layer 250 are exposed substantially simultaneously by a scanning exposure during the exposure operation S820.

Next, in operation S850 the semiconductor substrate 210 is moved relative to the extreme ultraviolet mask 205c. The moving operation S850 includes laterally stepping the mask 205c or changing the distance between the mask 205c and the photoresist layer 250 by moving or tilting the wafer stage 255 in the vertical direction relative to the mask in some embodiments. Following the moving operation S850, the first portion of the photoresist layer 250 is exposed to a third exposure dose of extreme ultraviolet radiation using a third portion of the mask 205c, the second portion of the photoresist layer 250 is exposed to the third exposure dose of extreme ultraviolet radiation using the second portion of the mask 205c, and the third portion of the photoresist layer 250 to is exposed to the third exposure dose using the first portion of the mask 205c in operation S860. In some embodiments, the first, second, and third portions of the photoresist layer 250 are exposed substantially simultaneously by a scanning exposure during the exposure operation S860.

Then, in operation S870 the semiconductor substrate 210 is moved relative to the mask 205c by laterally stepping or vertically moving the wafer stage 255 followed by the operation S880 of exposing the first portion of the photoresist layer 250 to a fourth exposure dose of extreme ultraviolet radiation using a fourth portion of the mask 205c, exposing the second portion of the photoresist layer 250 to the fourth exposure dose of extreme ultraviolet radiation using the third portion of the mask 205c, exposing a third portion of the photoresist layer 250 to the fourth exposure dose using the second portion of the mask 205c, and exposing a fourth portion of the photoresist layer 250 to the fourth exposure dose of extreme ultraviolet radiation using the first portion of the mask 205c. In some embodiments, the first, second, third, and fourth portions of the photoresist layer 250 are exposed substantially simultaneously by a scanning exposure during the exposure operation. The first exposure dose, the second exposure dose, third exposure dose, and fourth exposure dose are each about one quarter of a target total exposure dose.

In some embodiments, moving the semiconductor substrate 210 relative to the mask 205c includes stepping the semiconductor substrate 210 in a lateral direction L relative to the mask 205c. In some embodiments, moving the semiconductor substrate 210 relative to the mask 205c includes moving the semiconductor substrate 210 closer to or further away from the mask 205c in a vertical direction V. In some embodiments, moving the semiconductor substrate 210 relative to the mask 205c includes tilting the semiconductor substrate 210 relative to the mask 205c. In some embodiments, the mask 205c is tilted an angle θ about the X-axis.

In some embodiments, the first portion of the mask 205c, the second portion of the mask 205c, the third portion of the mask 205c, and the fourth portion of the mask 205c each have the same pattern.

Figure 12:
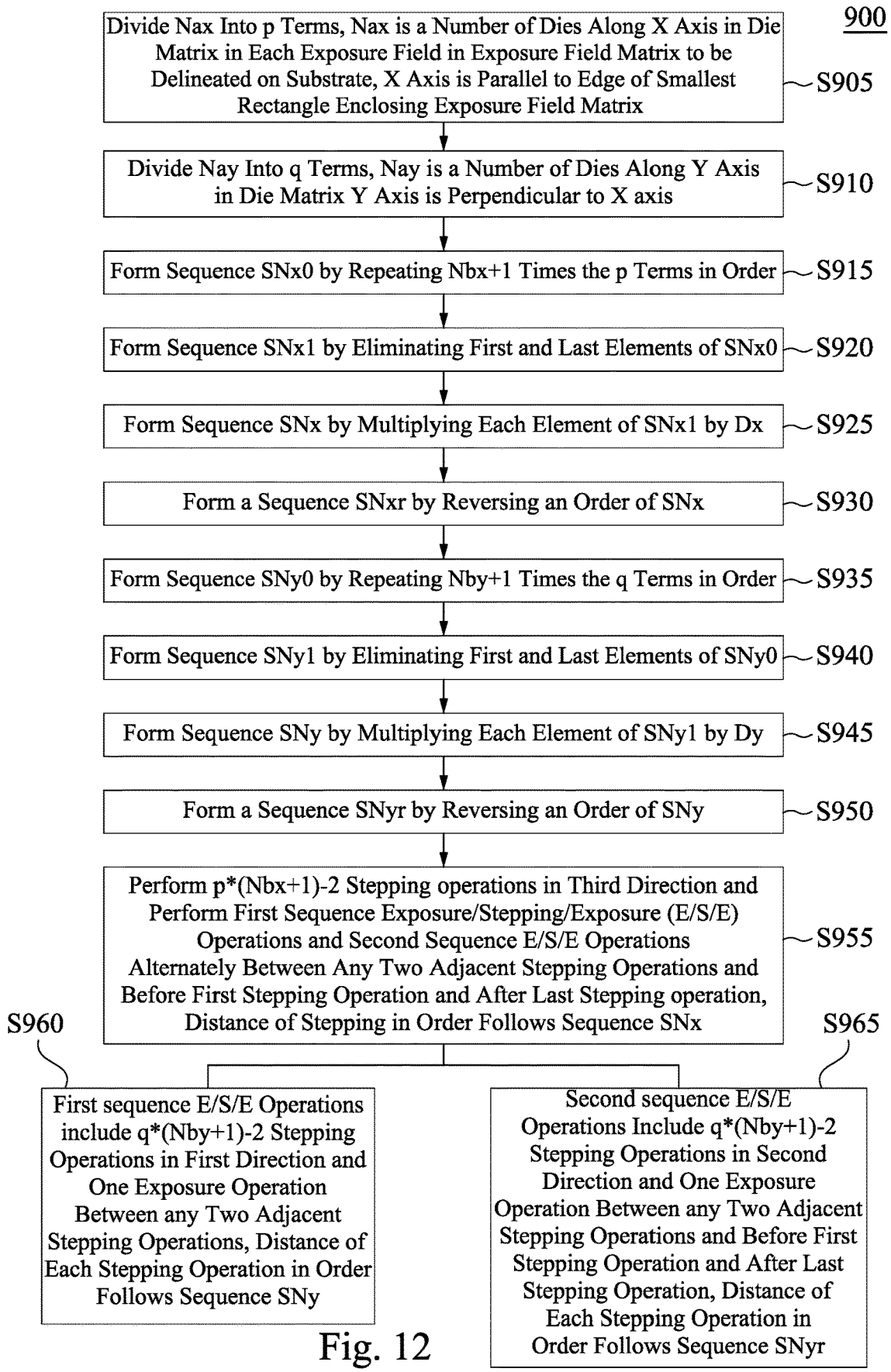
FIG. 12 is a flow chart illustrating a method of manufacturing a semiconductor device according to an embodiment of the present disclosure.

FIG. 12 is a flow chart illustrating a method 900 of manufacturing a semiconductor device according to an embodiment of the present disclosure. The sequential method includes an operation S905 of dividing Nax into p terms, where Nax is a number of dies along an x axis in a die matrix in each exposure field in an exposure field matrix to be delineated on a semiconductor substrate and each of the p terms is at least 1, wherein the x axis is parallel to one edge of a smallest rectangle enclosing the exposure field matrix, called the exposure field matrix. In operation S910, Nay is divided into q terms, where Nay is a number of dies along a y axis in the die matrix and each of the q terms is at least 1, wherein the y axis is perpendicular to the x axis. Then, a sequence SNx0 is formed by repeating Nbx+1 times the p terms in order in operation S915. Nbx is an integer closest to Rx/Fx, where Rx is a size along the x axis of the exposure field matrix enclosure and Fx is an exposure field size along the x axis. In operation S920, a sequence SNx1 is formed by eliminating first and last elements of SNx0, and a sequence SNx is formed by multiplying each element of SNx1 by Dx in operation S925, where Dx is a die size along the x axis. Next, a sequence SNxr is formed by reversing an order of SNx in operation S930.

Then, a sequence SNy0 is formed by repeating Nby+1 times the q terms in order in operation S935. Nby is an integer closest to Ry/Fy, where Ry is a size along the y axis of the exposure field matrix enclosure, and Fy is an exposure field size along the y axis. A sequence SNy1 is formed by eliminating first and last elements of SNy0 in operation S940. In operation S945, a sequence SNy is formed by multiplying each element of SNy1 by Dy, where Dy is a die size along the y axis. Next, a sequence SNyr is formed by reversing an order of SNy in operation S950.

Then, p*(Nbx+1)−2 stepping operations are performed in a third direction and first sequence exposure/stepping/exposure operations and second sequence exposure/stepping/exposure operations are performed alternately between any two adjacent stepping operations as well as before a first stepping operation and after a last stepping operation in operation S955. A distance of each stepping operation in order follows the sequence SNx.

As shown in S960, the first sequence exposure/stepping/exposure operations include q*(Nby+1)−2 stepping operations in a first direction and one exposure operation between any two adjacent stepping operations as well as before the first stepping operation and after the last stepping operation, and the distance of each stepping operation in order follows the sequence SNy. The first exposure operation in the first sequence exposure/stepping/exposure operations exposes Nax_1*Nay_1 dies in a corner of an exposure field in a corner of the exposure field matrix enclosure.

As shown in S965, the second sequence exposure/stepping/exposure operations include q*(Nby+1)−2 stepping operations in a second direction and one exposure operation between any two adjacent stepping operations as well as before the first stepping operation and after the last stepping operation, and the distance of each stepping operation in order follows the sequence SNyr.

In some embodiments, the focus settings of all exposure operations in order alternate between Fo−dF and Fo+dF, where Fo is an optimum focus position, Fo−dF is a focus position above the optimum focus position Fo, and Fo+dF is a focus position below the optimum focus position Fo.

In some embodiments, a total exposure dose accumulated in each die is within 0.9*Eo to 1.1*Eo, where Eo is an optimum exposure dose.

In some embodiments, the method includes skipping exposure operations for missing exposure fields in the exposure field matrix enclosure.

Figure 13:
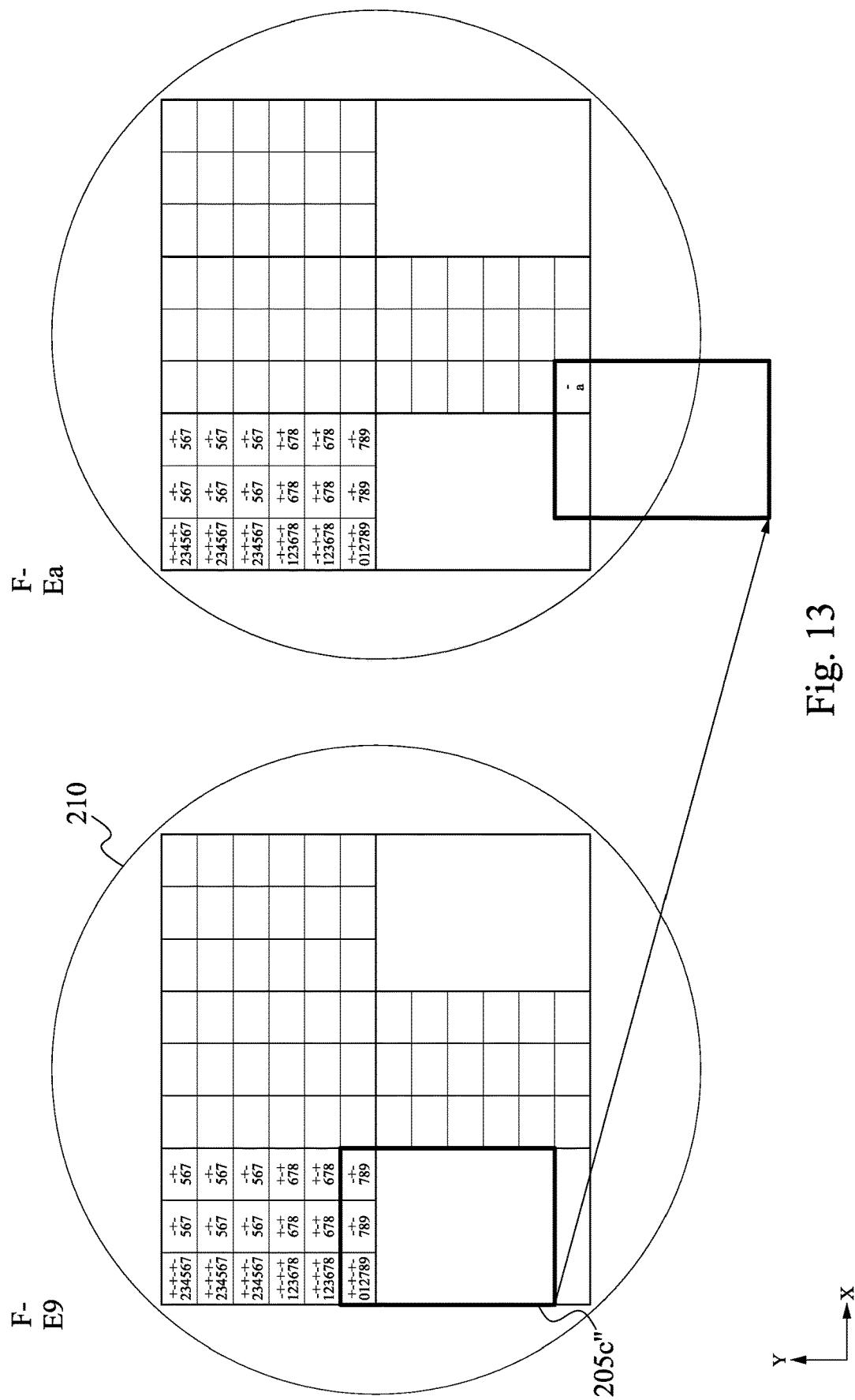
FIG. 13 shows one of various sequential operations in a method of exposing a photoresist layer on a semiconductor substrate according to an embodiment of the present disclosure.

In some embodiments, the method includes merging stepping operations from after a previous exposure operation to before a subsequent exposure operation into one stepping operation which moves directly from a previous exposure location to a subsequent exposure location. As shown in FIG. 13, the wafer stage is directly moved from a previous exposure location so that the mask 205c'' is positioned over a subsequent exposure location, thereby skipping exposure operations where there is no die to be exposed resulting from missing exposure fields in the exposure field matrix enclosure.

In some embodiments, both the exposure field corner and the exposure field matrix enclosure corner are lower left corners as viewed in plan view, the first direction is in the +y direction, the second direction is in the −y direction, and the third direction is in the +x direction.

In some embodiments, both the exposure field corner and the exposure field matrix enclosure corner are upper left corners as viewed in plan view, the first direction is in the −y direction, the second direction is in the +y direction, and the third direction is in the +x direction.

In some embodiments, both the exposure field corner and the exposure field matrix enclosure corner are lower right corners as viewed in plan view, the first direction is in the +y direction, the second direction is in the −y direction, and the third direction is in the −x direction.

In some embodiments, both the exposure field corner and the exposure field matrix enclosure corner are upper right corners as viewed in plan view, the first direction is in the −y direction, the second direction is in the +y direction, and the third direction is in the −x direction.

Figure 14:
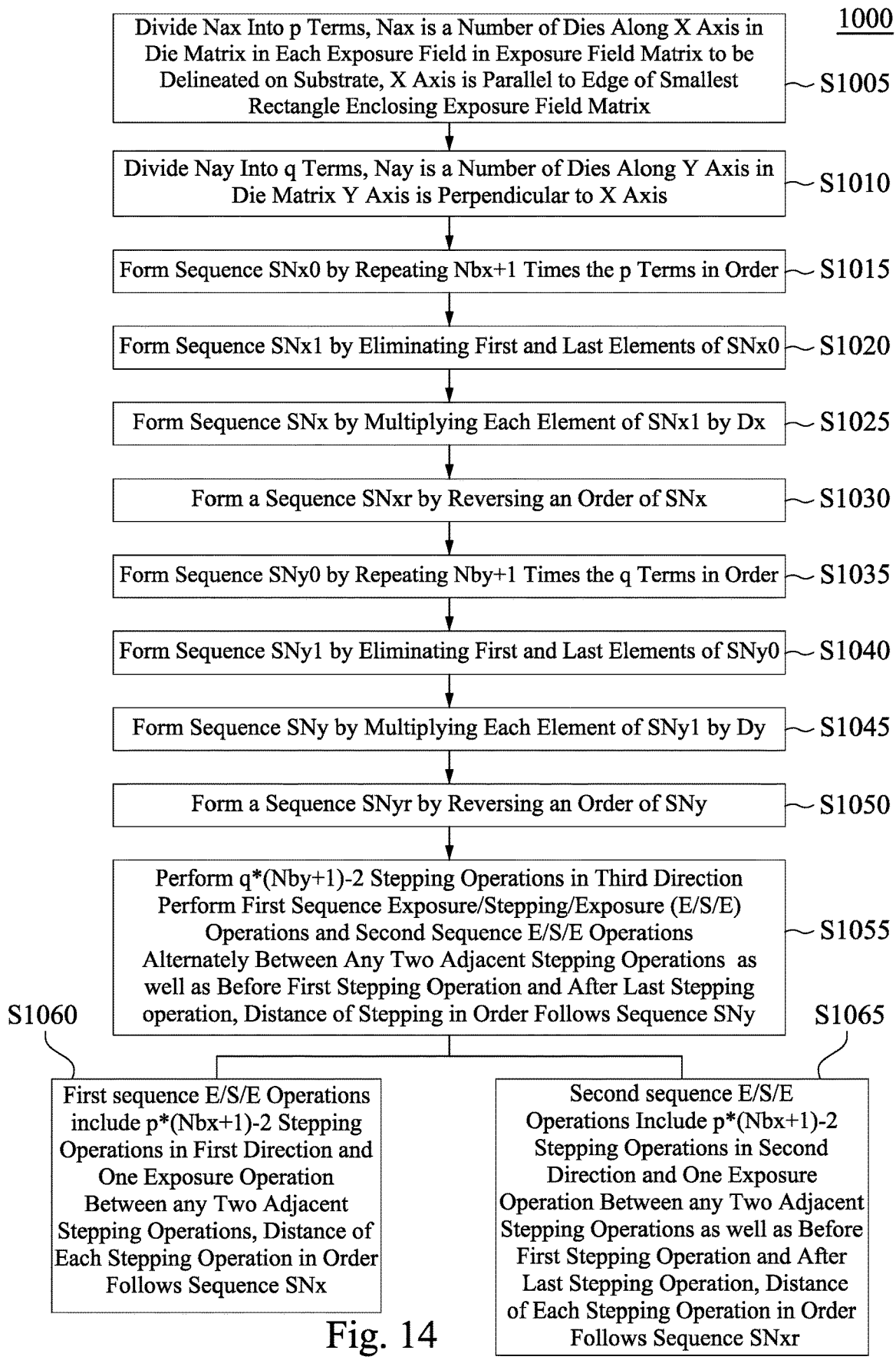
FIG. 14 is a flow chart illustrating a method of manufacturing a semiconductor device according to an embodiment of the present disclosure.

FIG. 14 is a flow chart illustrating a method 1000 of manufacturing a semiconductor device according to an embodiment of the present disclosure. The sequential method includes an operation S1005 of dividing Nax into p terms, where Nax is a number of dies along an x axis in a die matrix in each exposure field in an exposure field matrix to be delineated on a semiconductor substrate and each of the p terms is at least 1, wherein the x axis is parallel to one edge of a smallest rectangle enclosing the exposure field matrix, called the exposure field matrix. In operation S1010, Nay is divided into q terms, where Nay is a number of dies along a y axis in the die matrix and each of the q terms is at least 1, wherein the y axis is perpendicular to the x axis. Then, a sequence SNx0 is formed by repeating Nbx+1 times the p terms in order in operation S1015. Nbx is an integer closest to Rx/Fx, where Rx is a size along the x axis of the exposure field matrix enclosure and Fx is an exposure field size along the x axis. In operation S1020, a sequence SNx1 is formed by eliminating first and last elements of SNx0, and a sequence SNx is formed by multiplying each element of SNx1 by Dx in operation S1025, where Dx is a die size along the x axis. Next, a sequence SNxr is formed by reversing an order of SNx in operation S1030.

Then, a sequence SNy0 is formed by repeating Nby+1 times the q terms in order in operation S1035. Nby is an integer closest to Ry/Fy, where Ry is a size along the y axis of the exposure field matrix enclosure, and Fy is an exposure field size along the y axis. A sequence SNy1 is formed by eliminating first and last elements of SNy0 in operation S1040. In operation S1045, a sequence SNy is formed by multiplying each element of SNy1 by Dy, where Dy is a die size along the y axis. Next, a sequence SNyr is formed by reversing an order of SNy in operation S1050.

Then, q*(Nby+1)−2 stepping operations are performed in a third direction and first sequence exposure/stepping/exposure operations and second sequence exposure/stepping/exposure operations are performed alternately between any two adjacent stepping operations as well as before a first stepping operation and after a last stepping operation in operation S1055. A distance of each stepping operation in order follows the sequence SNy.

As shown in S1060, the first sequence exposure/stepping/exposure operations include p*(Nbx+1)−2 stepping operations in a first direction and one exposure operation between any two adjacent stepping operations as well as before the first stepping operation and after the last stepping operation, and the distance of each stepping operation in order follows the sequence SNx. The first exposure operation in the first sequence exposure/stepping/exposure operations exposes Nax_1*Nay_1 dies in a corner of an exposure field in a corner of the exposure field matrix enclosure.

As shown in S1065, the second sequence exposure/stepping/exposure operations include p*(Nbx+1)−2 stepping operations in a second direction and one exposure operation between any two adjacent stepping operations as well as before the first stepping operation and after the last stepping operation, and the distance of each stepping operation in order follows the sequence SNxr.

Figure 15:
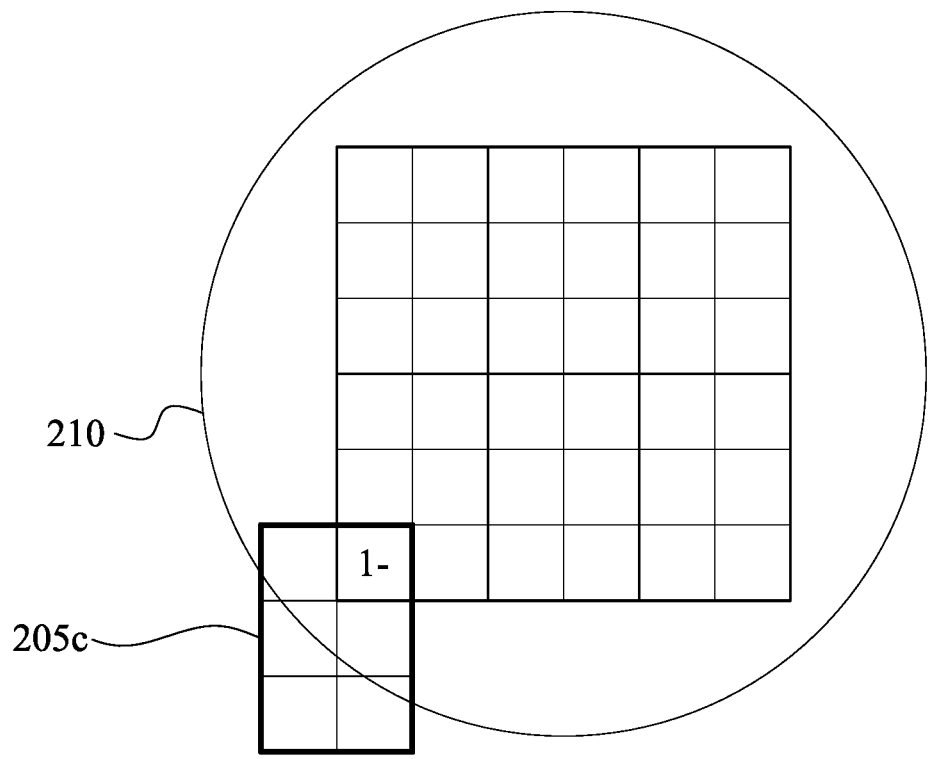
FIG. 15 shows one of various sequential operations in a method of exposing a photoresist layer on a semiconductor substrate according to an embodiment of the present disclosure.

FIGS. 15-49 show a method of exposing a photoresist-coated semiconductor wafer 210 according to an embodiment of the present disclosure. As shown in FIG. 15, a lower left side die is first exposed to radiation at a focus position above a target focus. In this embodiment, a number indicates the total number of accumulated exposures in this die; a negative sign (−) indicates in this die there is an unpaired exposure done at a focus position above the target focus; a positive sign (+) indicates in this die there is an unpaired exposure done at a focus position below the target focus.

The mask 205c is subsequently moved up relative to the wafer 210 in FIG. 16, and three dies are exposed at a focus position below the target focus. Thus, the originally exposed die (lower left die) has been exposed twice, once above the target focus and once below the target focus, resulting in two exposures at the first die. The two dies above the first die have each been exposed once at a focus position below the target focus.

The mask 205c is shown as having six pattern areas having the same pattern, and thus up to six dies can be exposed at once. However, the present disclosure is not limited to masks having six of the same pattern, and in some embodiments, the mask contains two, three, four, five, or more than six of the same pattern enabling two, three, four, five, or more dies on the wafer to be imaged at the same time.

In FIG. 17, the mask 205c is moved up relative to the wafer 210 and the wafer 210 is exposed at a focus position above the target focus. As explained herein, moving the mask 205c relative to the wafer 210 is accomplished by moving the wafer stage 255 in some embodiments.

As shown in FIG. 18, the mask 205c is moved up relative to the wafer 210 and an exposure below the target focus is performed. The two uppermost dies have been exposed once, and the four lower dies have been exposed twice.

As shown in FIG. 19, the mask 205c is moved up relative to the wafer 210 and the two upper lower left side dies are exposed a second time at a focus position below the target focus. Thus, each die in the left side first column of dies have been exposed twice.

The mask 205c is subsequently moved to the right relative to the wafer 210 in FIG. 20, and four dies are exposed at a focus position below the target focus. Thus, the two uppermost dies in the first column have been exposed three times, once above the target focus and twice below the target focus, and the two uppermost dies in the second column have each been exposed once at a focus position below the target focus.

In FIG. 21, the mask 205c is moved down relative to the wafer 210 and the wafer 210 is exposed at a focus position above the target focus. Thus, the two uppermost dies in the first column have been exposed four times, and the two uppermost dies in the second column have been exposed twice. The third dies from the top in the first and second columns have been exposed three times and once, respectively.

Figure 22:
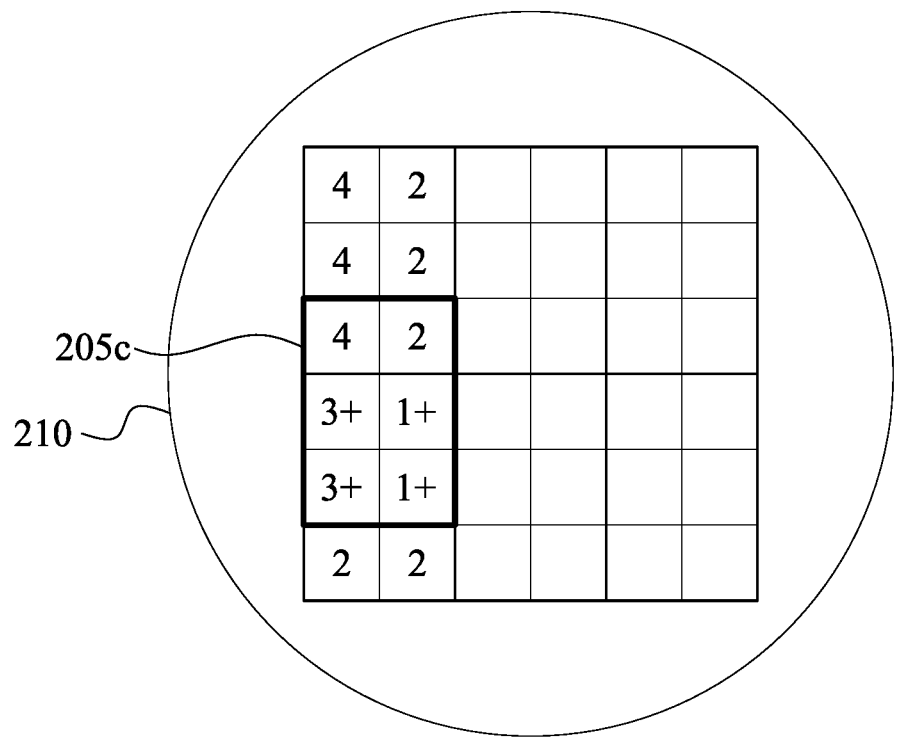
FIG. 22 shows one of various sequential operations in a method of exposing a photoresist layer on a semiconductor substrate according to an embodiment of the present disclosure.

As shown in FIG. 22, the mask 205c is moved down relative to the wafer 210 and an exposure below the target focus is performed. The third die from the top of first column has now been exposed four times, the third die from the top of the second column has been exposed twice, the second and third dies from the bottom of the first column have been exposed three times, and the second and third dies from the bottom of the second column have been exposed once.

The mask 205c is subsequently moved to down relative to the wafer 210 in FIG. 23, and the three lower dies in both the first and second columns are exposed at a focus position above the target focus. Thus, the second and third dies from bottom of the first column have been exposed four times. The second and third dies from bottom of the second columns have been exposed twice. The bottom die in first column has been exposed three times, and the bottom die in the second column has been exposed once.

In FIG. 24, the mask 205c is moved down relative to the wafer 210 and the wafer 210 is exposed at a focus position below the target focus. After this step, all the dies in the first column have been exposed four times and all the dies in the second column have been exposed twice. In embodiments where each exposure is about one-fourth of the total exposure dose, each die in the first column is now fully exposed.

As shown in FIG. 25, the mask 205c is moved to the right relative to the wafer 210 and an exposure above the target focus is performed. The bottom die in the second column has now been exposed three times, and the bottom die in the third column has been exposed once.

The mask 205c is subsequently moved up relative to the wafer 210 in FIG. 26, and six dies are exposed at a focus position below the target focus. Thus, the second and third dies from the bottom of the second column have been exposed three times, once above the target focus and twice below the target focus, and the second and third dies from the bottom of the third column have been exposed once. The bottom dies of the second and third columns have been exposed four times and twice, respectively.

In FIG. 27, the mask 205c is moved up relative to the wafer 210 and the wafer 210 is exposed at a focus position above the target focus. Thus, the second and third dies from the bottom of the second column have been exposed four times, and the third die from the top of the second column has been exposed three times. The second and third dies from the bottom of the third have been exposed twice, and the third die from the top of the third column has been exposed once.

As shown in FIG. 28, the mask 205c is moved up relative to the wafer 210 and an exposure below the target focus is performed. The two uppermost dies in the second column are exposed a third time, and the third die from the top of second column has now been exposed four times. The two uppermost dies in the third column have been exposed once, and the third die from the top of the third column has been exposed twice.

The mask 205c is subsequently moved up relative to the wafer 210 in FIG. 29, and the two uppermost dies in the second and third columns are exposed at a focus position above the target focus. Thus, the two uppermost dies in the second column have been exposed four times, and the two uppermost dies in the third column have been exposed twice.

Figure 30:
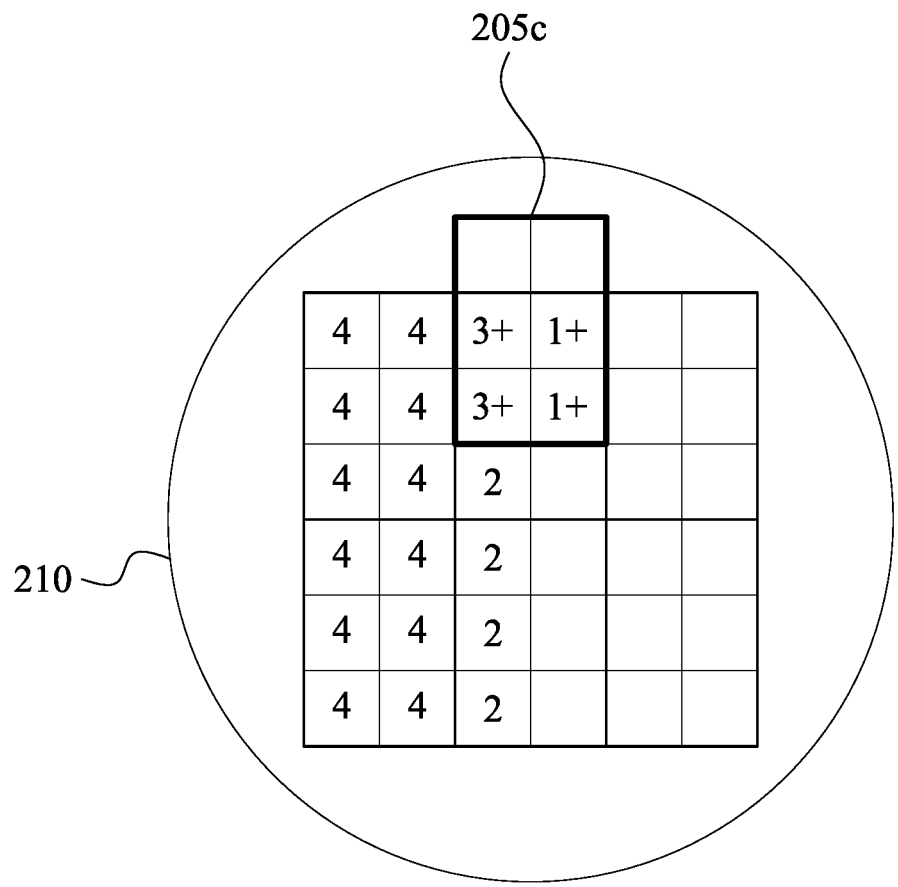
FIG. 30 shows one of various sequential operations in a method of exposing a photoresist layer on a semiconductor substrate according to an embodiment of the present disclosure.

In FIG. 30, the mask 205c is moved to the right relative to the wafer 210 and the wafer 210 is exposed at a focus position below the target focus. Thus, the two uppermost dies in the third column and the two uppermost dies in the fourth column have been exposed three times and once, respectively.

Figure 31:
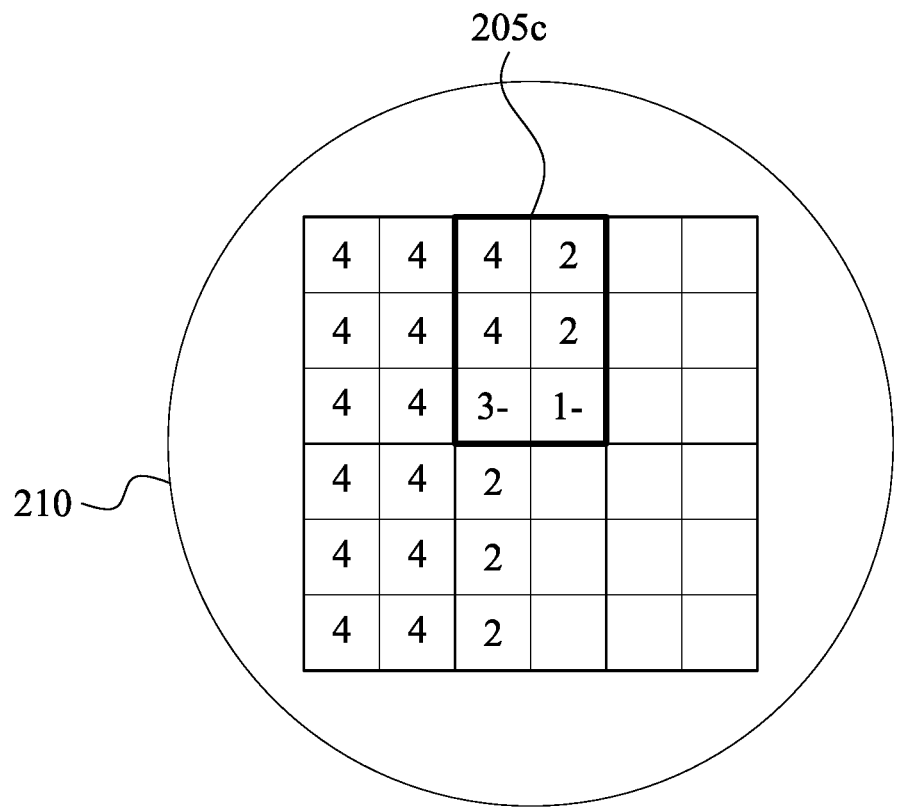
FIG. 31 shows one of various sequential operations in a method of exposing a photoresist layer on a semiconductor substrate according to an embodiment of the present disclosure.

As shown in FIG. 31, the mask 205c is subsequently moved down relative to the wafer 210 and an exposure above the target focus is performed. The two uppermost dies in the third and fourth column have now been exposed four and two times, respectively. The third die from the top of the third column has been exposed three times, and the third die from the top of the fourth column has been exposed once.

As shown in FIG. 32, the mask 205c is moved down relative to the wafer 210 and six dies are exposed at a focus position below the target focus. Thus, the third dies from the top of the third and fourth columns have been exposed four and two times, respectively. The second and third dies from the bottom of the third column have been exposed three times. The second and third dies from the bottom of the fourth column have been exposed once.

The mask 205c is subsequently moved down relative to the wafer 210 in FIG. 33, and six dies are exposed at a focus position above the target focus. Thus, the second and third dies from the bottom of the third column have been exposed four times. The second and third dies from the bottom of the fourth column have been exposed twice. The bottom dies of the third and fourth columns have been exposed three times and once, respectively.

In FIG. 34, the mask 205c is moved down relative to the wafer 210 and the wafer 210 is exposed at a focus position below the target focus. Thus, the bottom dies in the third and fourth column have been exposed four times and twice, respectively.

As shown in FIG. 35, the mask 205c is moved to the right relative to the wafer 210 and an exposure above the target focus is performed. The bottom dies of the fourth and fifth columns have now been exposed three times and once, respectively.

The mask 205c is subsequently moved up relative to the wafer 210 in FIG. 36, and the six lower dies in the fourth and fifth columns are exposed at a focus position below the target focus. Thus, the second and third dies from bottom of the fourth column have been exposed three times. The second and third dies from bottom of the fifth column have been exposed once. The bottom die in fourth column has been exposed four times, and the bottom die in the fifth column has been exposed twice.

In FIG. 37, the mask 205c is moved up relative to the wafer 210 and the wafer 210 is exposed at a focus position above the target focus. The second and third dies from the bottom of the fourth column have now been exposed four times and the second and third dies from the bottom of the fifth column have been exposed twice. The third die from the top of the fourth column has been exposed three times and the third die from the top of the fifth column has been exposed once.

As shown in FIG. 38, the mask 205*c* is moved up relative to the wafer 210 and an exposure below the target focus is performed. The two uppermost dies in the fourth column have now been exposed three times, and the two uppermost dies in the fifth column have been exposed once. The third die from the top of the fourth column has been exposed four times and the third die from the top of the fifth column has been exposed twice.

In FIG. 39, the mask 205*c* is moved up relative to the wafer 210 and four dies are exposed at a focus position above the target focus. The two uppermost dies of the fourth column have been exposed four times, and the two uppermost dies of the fifth column have been exposed twice.

As shown in FIG. 40, the mask 205*c* is moved to the right relative to the wafer 210 and an exposure below the target focus is performed. The two uppermost dies in the fifth column are exposed a third time, and the two uppermost dies in the fifth column have been exposed once.

Figure 41:
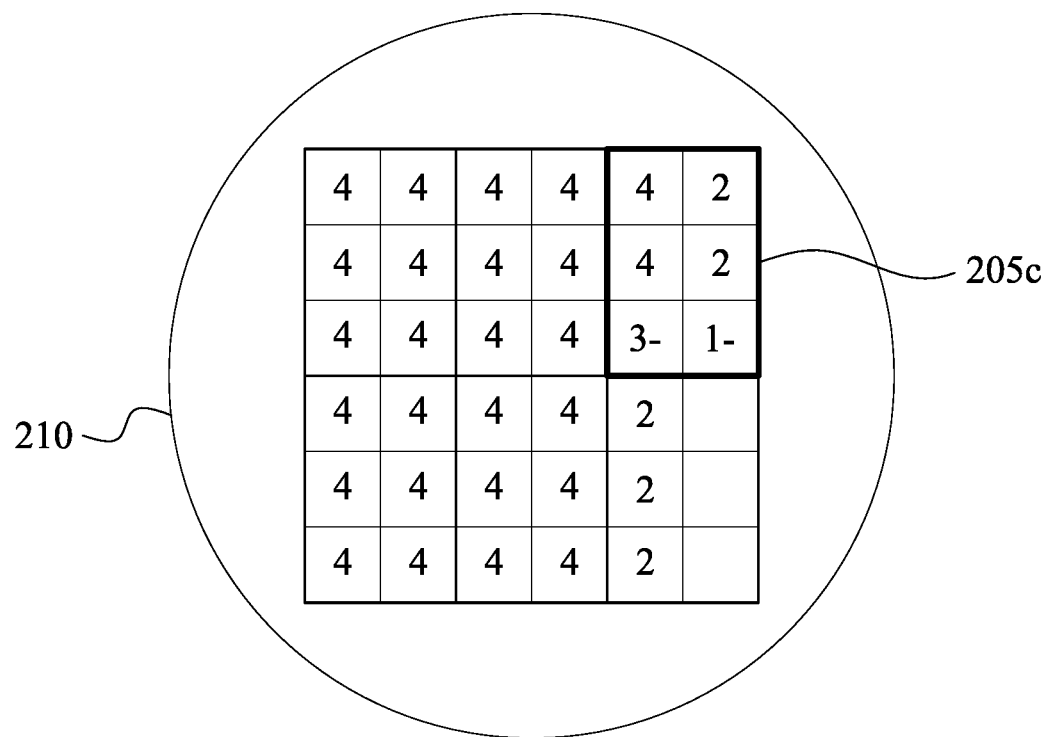
FIG. 41 shows one of various sequential operations in a method of exposing a photoresist layer on a semiconductor substrate according to an embodiment of the present disclosure.

The mask 205*c* is subsequently moved down relative to the wafer 210 in FIG. 41, and the six dies in the upper right corner of the fifth and sixth columns are exposed at a focus position above the target focus. Thus, the two uppermost dies in the fourth column have been exposed four times, and the two uppermost dies in the sixth column have been exposed twice. The third die from the top of the fifth column has been exposed three times and the third die from the top of the sixth column has been exposed once.

Figure 42:
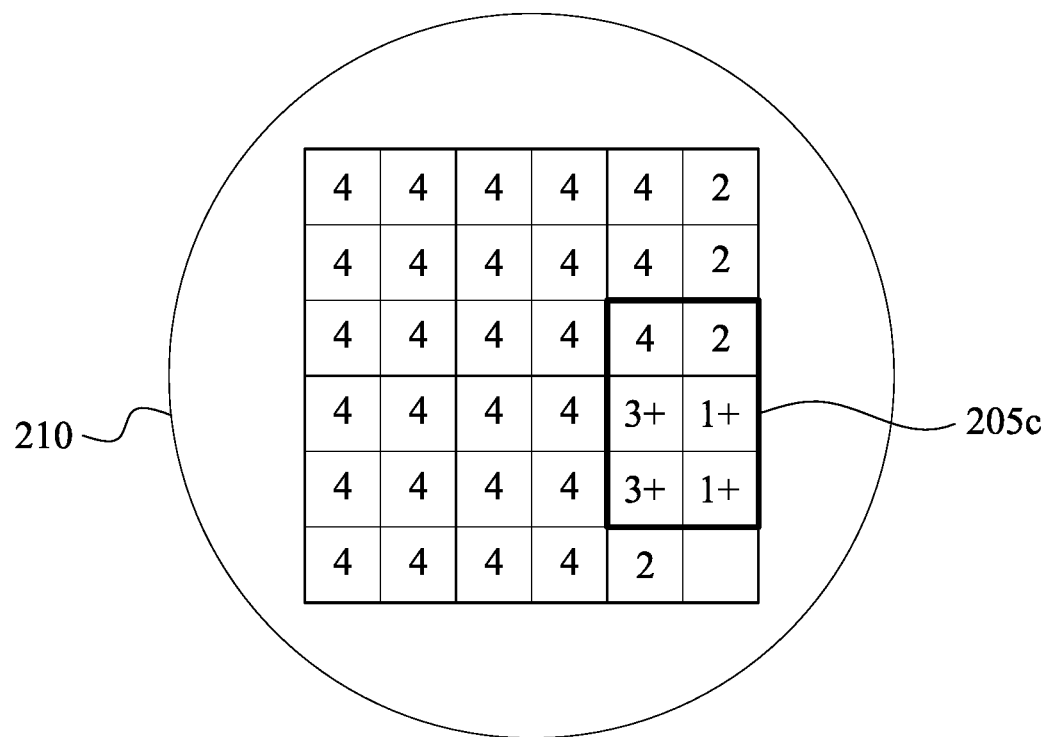
FIG. 42 shows one of various sequential operations in a method of exposing a photoresist layer on a semiconductor substrate according to an embodiment of the present disclosure.

In FIG. 42, the mask 205*c* is moved down right relative to the wafer 210 and the wafer 210 is exposed at a focus position below the target focus. Thus, the second and third dies from the bottom of the fifth column and the second and third dies from the bottom of the have been exposed three times and once, respectively. The third die from the top of the fifth column and third die from the top of the sixth column have been exposed four times and twice, respectively.

Figure 43:
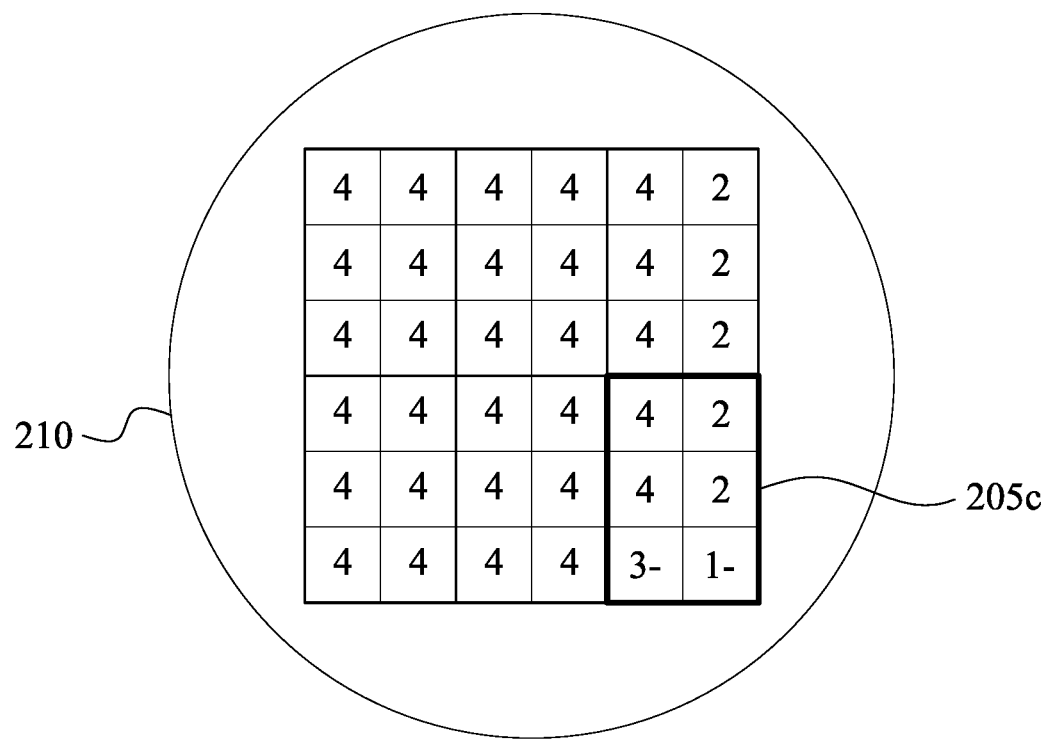
FIG. 43 shows one of various sequential operations in a method of exposing a photoresist layer on a semiconductor substrate according to an embodiment of the present disclosure.

As shown in FIG. 43, the mask 205*c* is subsequently moved down relative to the wafer 210 and an exposure above the target focus is performed. The second and third dies from the bottom of fifth and sixth columns have now been exposed four and two times, respectively. The bottom dies of the fifth and sixth columns have been exposed three times and once, respectively.

As shown in FIG. 44, the mask 205*c* is moved down relative to the wafer 210 and an exposure below the target focus is performed. The two bottom dies in the fifth and sixth columns have now been exposed four times and twice, respectively.

The mask 205*c* is subsequently moved to the right relative to the wafer 210 in FIG. 45, and the bottom die in the sixth column is exposed at a focus position above the target focus. Thus, the bottom die of the sixth column has been exposed three times.

In FIG. 46, the mask 205*c* is moved up relative to the wafer 210 and four dies are exposed at a focus position below the target focus. The bottom die in the sixth column has now been exposed four times, and the second and third dies from the bottom of the sixth column have been exposed three times.

As shown in FIG. 47, the mask 205*c* is moved up relative to the wafer 210 and an exposure above the target focus is performed. The second and third dies from the bottom of the sixth column have been exposed four times and the third die from the top of the sixth column has been exposed once.

Figure 48:
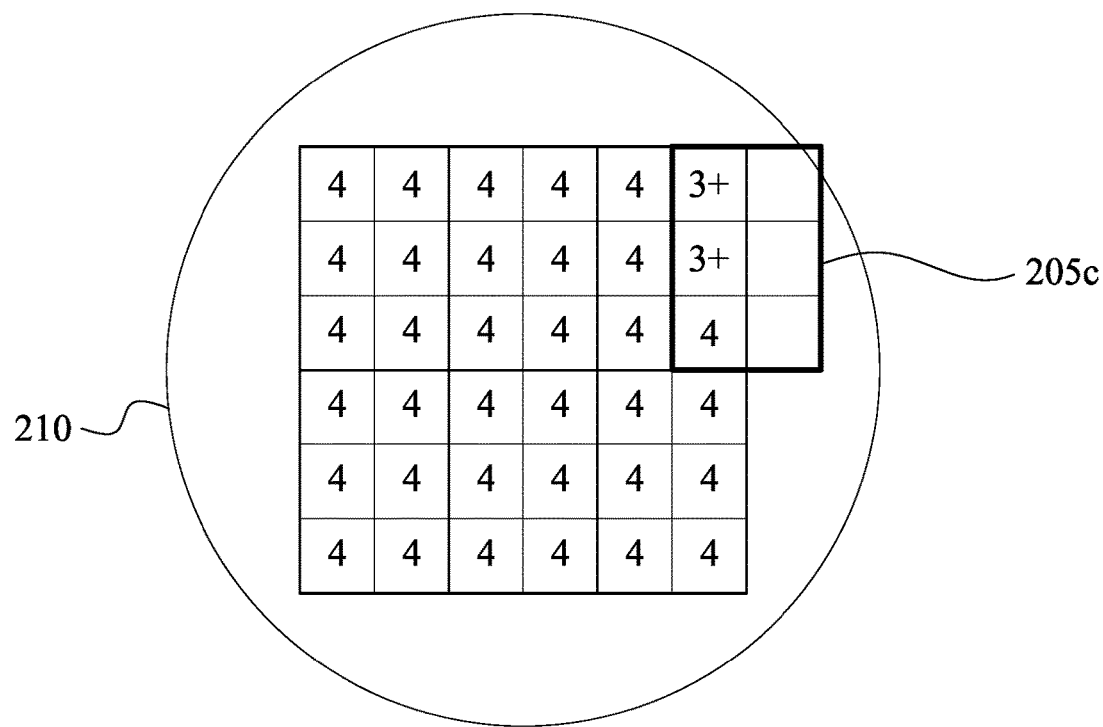
FIG. 48 shows one of various sequential operations in a method of exposing a photoresist layer on a semiconductor substrate according to an embodiment of the present disclosure.

The mask 205*c* is subsequently moved up relative to the wafer 210 in FIG. 48, and an exposure below the target focus is performed. The two uppermost dies in the sixth column have now been exposed three times, and the third die from the top of the sixth column has been exposed four times.

Figure 49:
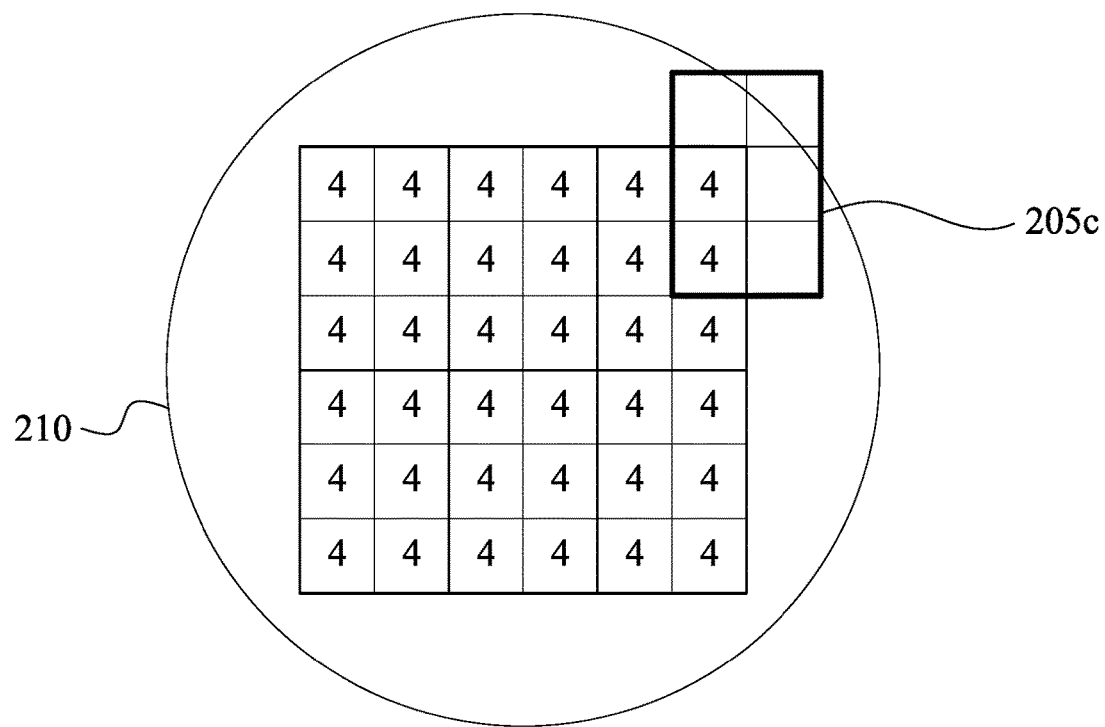
FIG. 49 shows one of various sequential operations in a method of exposing a photoresist layer on a semiconductor substrate according to an embodiment of the present disclosure.

In FIG. 49, the mask 205*c* is moved up relative to the wafer 210 and the wafer 210 is exposed at a focus position above the target focus. The two uppermost dies of the sixth column have been exposed four times, thus, all the dies in the 6×6 array have been exposed four times.

The 6×6 array of dies on the semiconductor wafer 210 or the 2×3 array of dies in one mask of FIGS. 15-49 are examples of the disclosure and the present disclosure is not limited to a wafer with 36 dies or a mask with 6 identical die patterns. In some embodiments, fewer than 36 dies or more than 36 dies are exposed. In the embodiment of FIGS. 15-49, the mask 205*c* was moved or stepped relative to the wafer 210 in a cycle of stepping from one die to an adjacent die, then stepping two dies away, followed by stepping to an adjacent die, and alternating between a one-die step and a two-die step.

In some embodiments, a 3×8 array of dies on the photoresist-coated semiconductor wafer 210 are exposed to radiation using a mask 205*c'* having a 1×4 array of mask areas on the mask, corresponding to a 1×4 exposure field, as shown in FIGS. 50-53. The four mask areas all have the same pattern.

As shown in FIG. 50, a lower left side die is first exposed using a first mask area.

The mask 205*c'* is subsequently moved up relative to the wafer 210 in FIG. 51, and a second die is exposed using the first mask area and the first die is exposed using a second mask area.

In FIG. 52, the mask 205*c'* is moved up relative to the wafer 210 and a third die is exposed using the first mask area, the second die is exposed using the second mask area, and the first die is exposed using a third mask area. As explained herein, moving the mask 205*c'* relative to the wafer 210 is accomplished by moving the wafer stage 255 in some embodiments.

Figure 53:
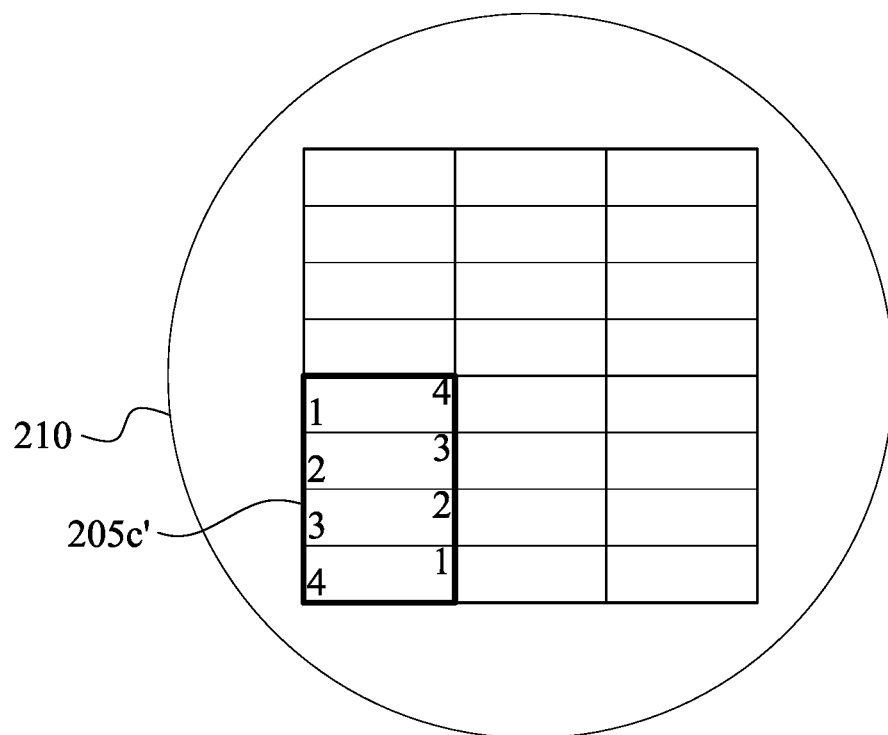
FIG. 53 shows one of various sequential operations in a method of exposing a photoresist layer on a semiconductor substrate according to an embodiment of the present disclosure.

As shown in FIG. 53, the mask 205*c'* is moved up relative to the wafer 210, and a fourth die is exposed using the first mask area, the third die is exposed using the second mask area, the second die is exposed using the third mask area, and the first mask area. The stepping and exposure operations are repeated, stepping the mask 205*c'* relative to the wafer 210 one die at a time until all the dies in a column are exposed the same number of times. Then, the mask is stepped one die to the right relative to the wafer and a second column of dies are exposed in a similar manner as the first column. The stepping and exposure operations are repeated until all the dies are exposed the same number of times.

Figure 54:
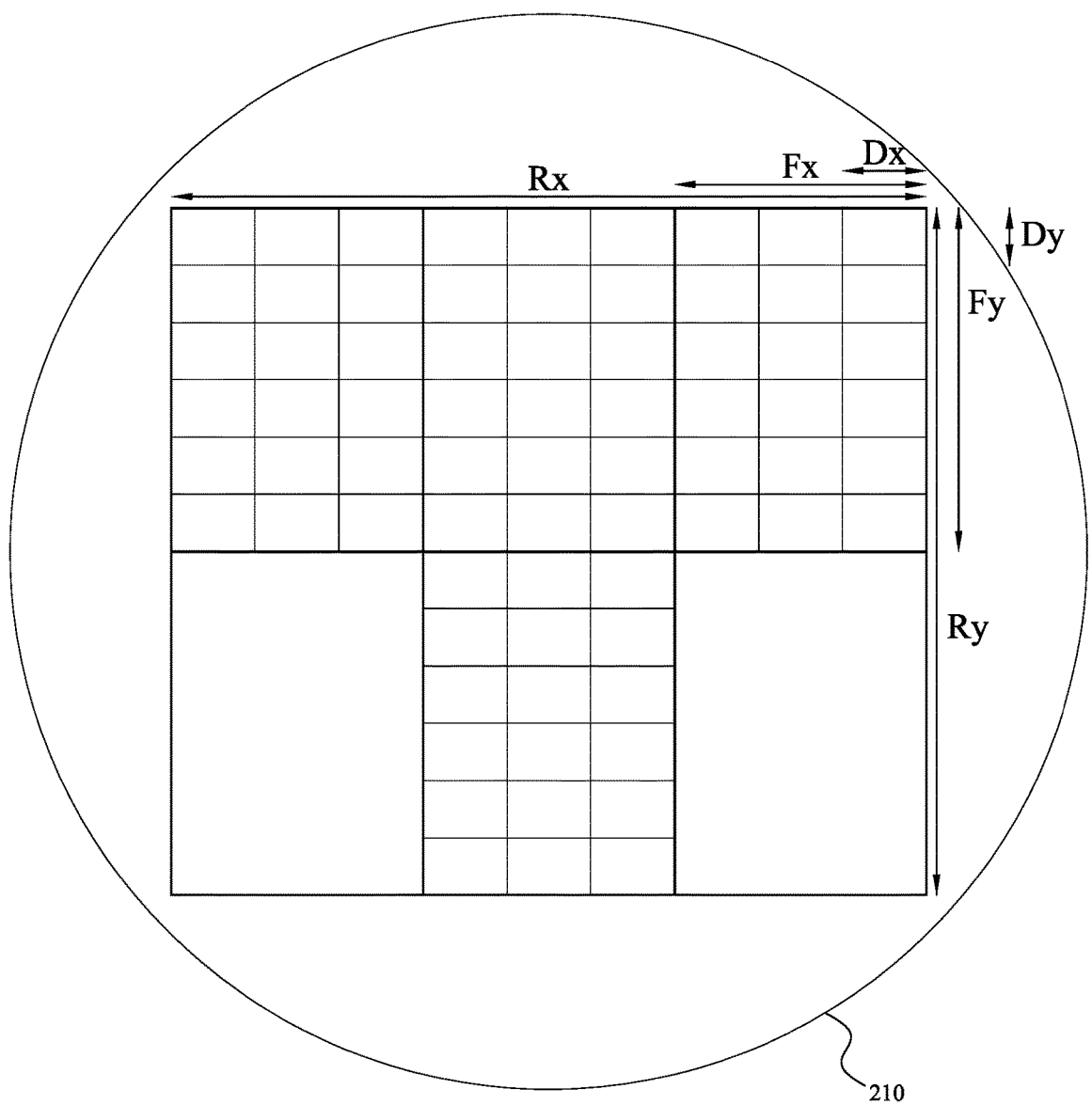
FIG. 54 shows one of various sequential operations in a method of exposing a photoresist layer on a semiconductor substrate according to an embodiment of the present disclosure.
Figure 110:
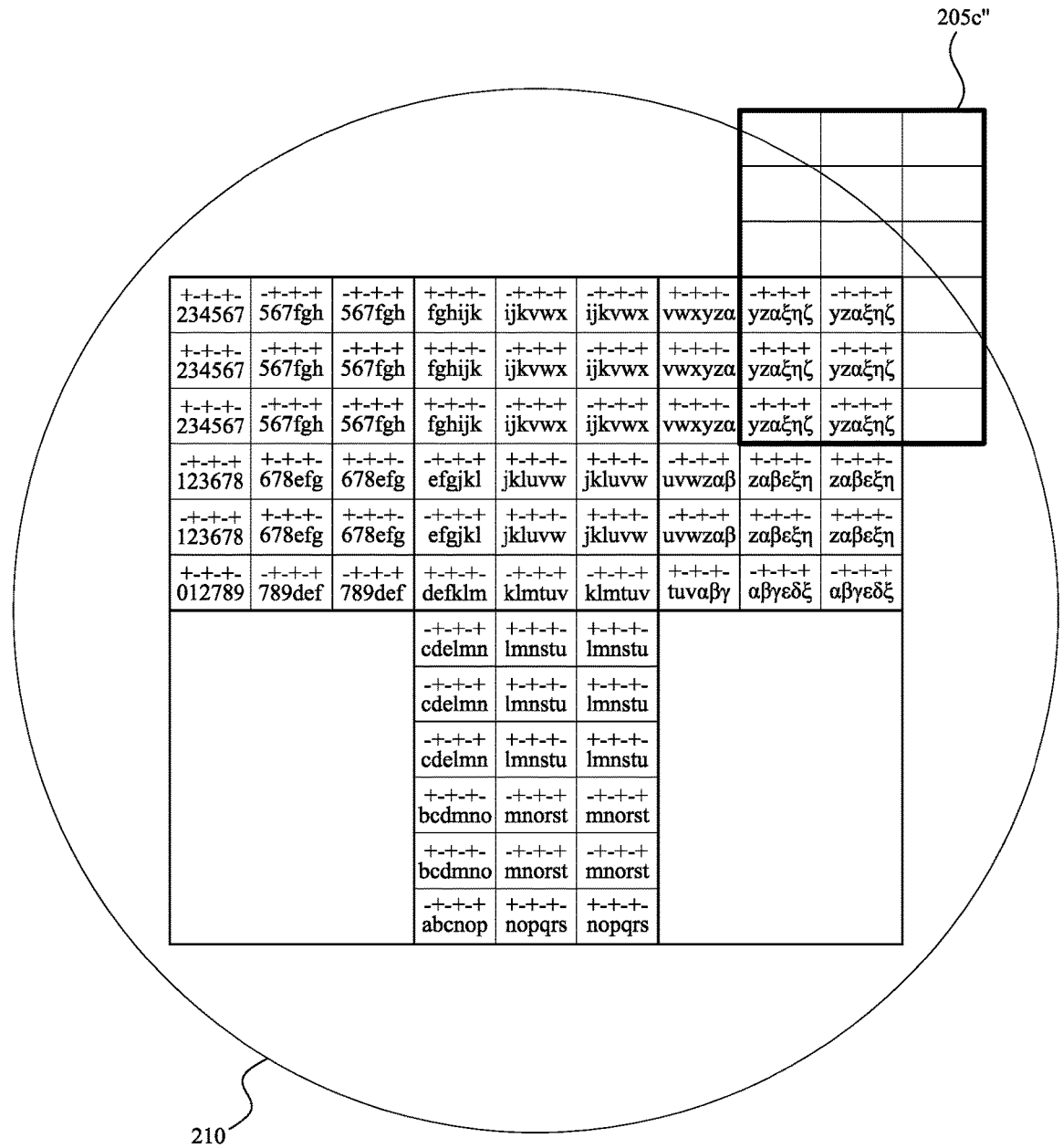
FIG. 110 shows one of various sequential operations in a method of exposing a photoresist layer on a semiconductor substrate according to an embodiment of the present disclosure.

In some embodiments, the array of dies on the photoresist-coated semiconductor wafer 210 is not a rectangular, but rather is made of up of series rectangular exposure fields arranged in manner to make more efficient use of the circular area of a wafer. In an embodiment, a plurality of rectangular exposure fields are arranged, as shown in FIGS. 54-110. In particular, a column-wise 2×3 folding exposure (where p=2 and q=3) for an embodiment having a die matrix of Nax=3 and Nay=6 is illustrated.

As shown in FIG. 54, the number of dies along the x axis of an exposure field is 3 and the number of dies along the y axis of the exposure field is 6. Dx is the die size along the x axis and Dy is the die size along the y axis. Rx is a size along the x axis of the exposure field matrix enclosure and Fx is an exposure field size along the x axis. Ry is a size along the y axis of the exposure field matrix enclosure and Fy is an exposure field size along the y axis.

Figure 55:
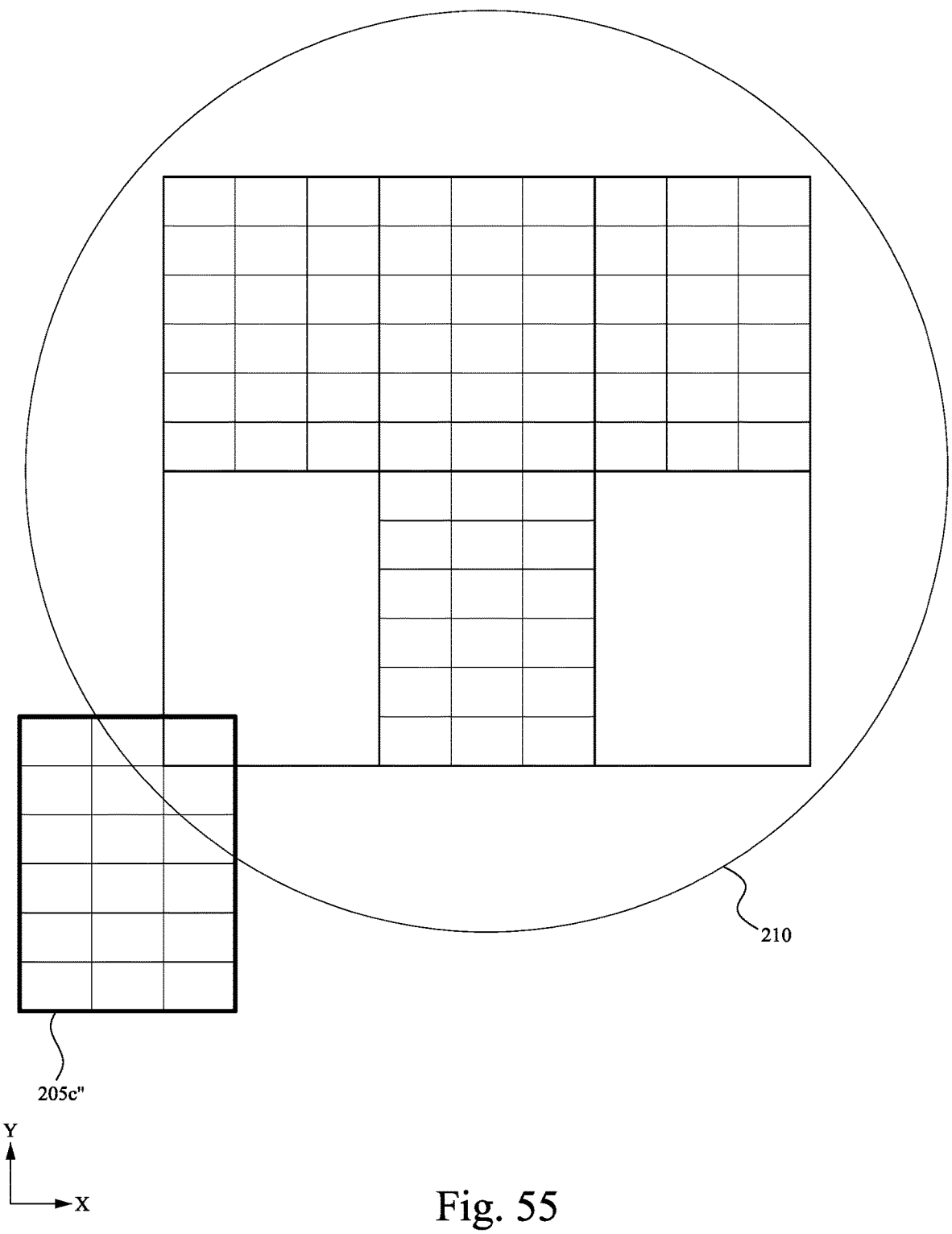
FIG. 55 shows one of various sequential operations in a method of exposing a photoresist layer on a semiconductor substrate according to an embodiment of the present disclosure.

In some embodiments, the matrix of dies on the photoresist-coated semiconductor substrate 210 is exposed to radiation using a mask 205c" having a 3×6 array of mask areas on the mask, corresponding to a 3×6 exposure field, as shown in FIGS. 55-110. The eighteen mask areas all have the same pattern.

Figure 56:
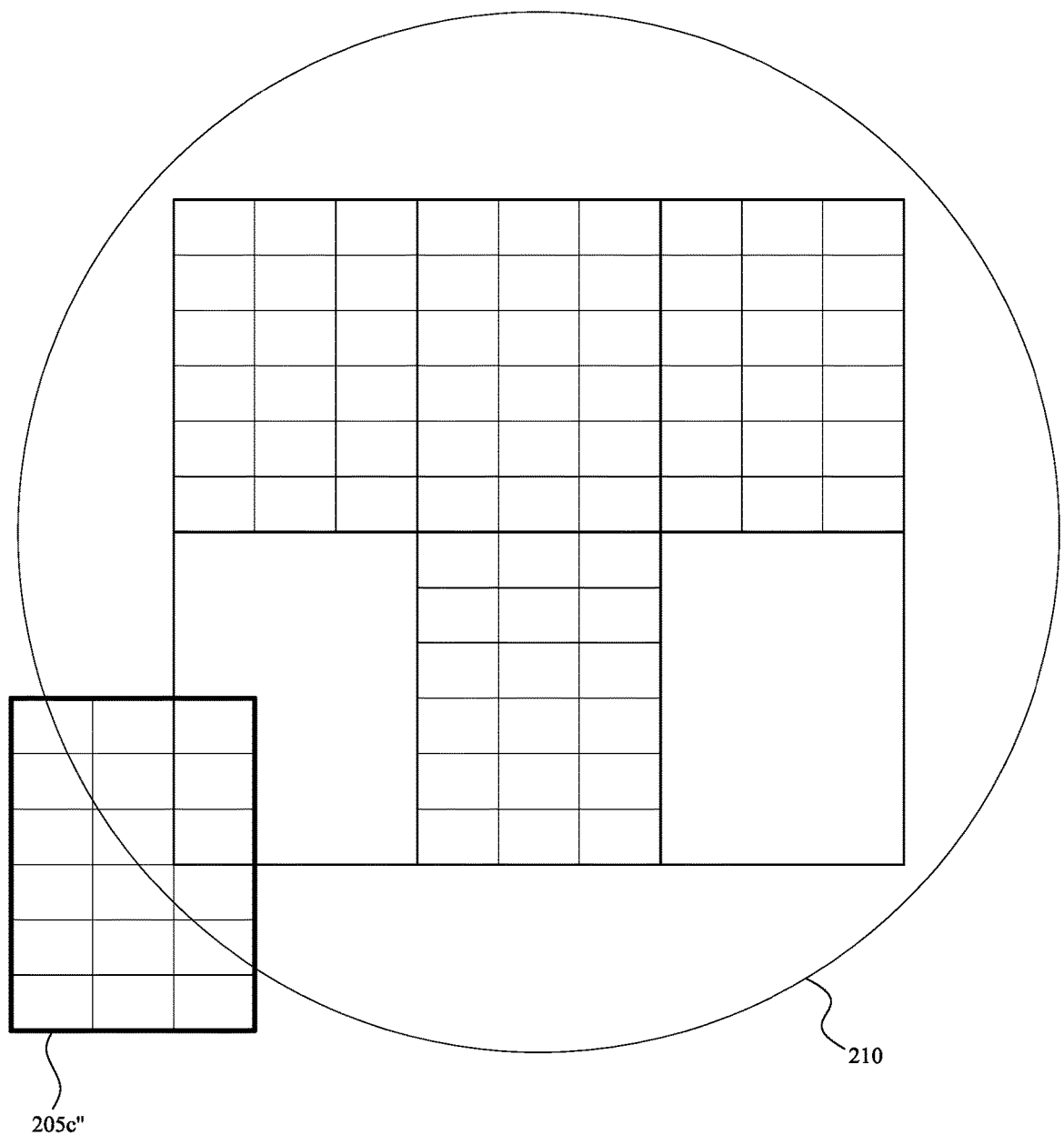
FIG. 56 shows one of various sequential operations in a method of exposing a photoresist layer on a semiconductor substrate according to an embodiment of the present disclosure.
Figure 57:
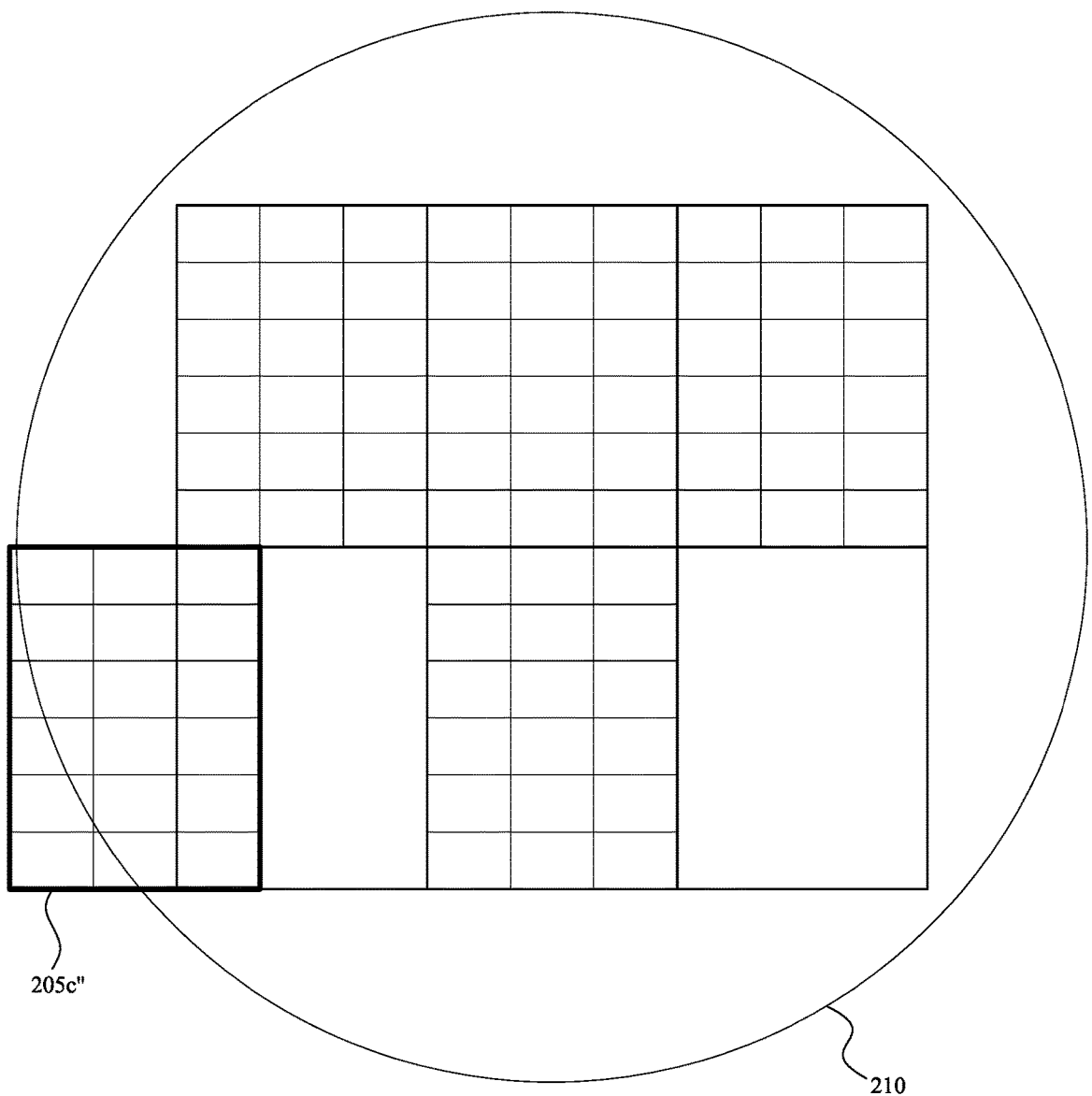
FIG. 57 shows one of various sequential operations in a method of exposing a photoresist layer on a semiconductor substrate according to an embodiment of the present disclosure.
Figure 58:
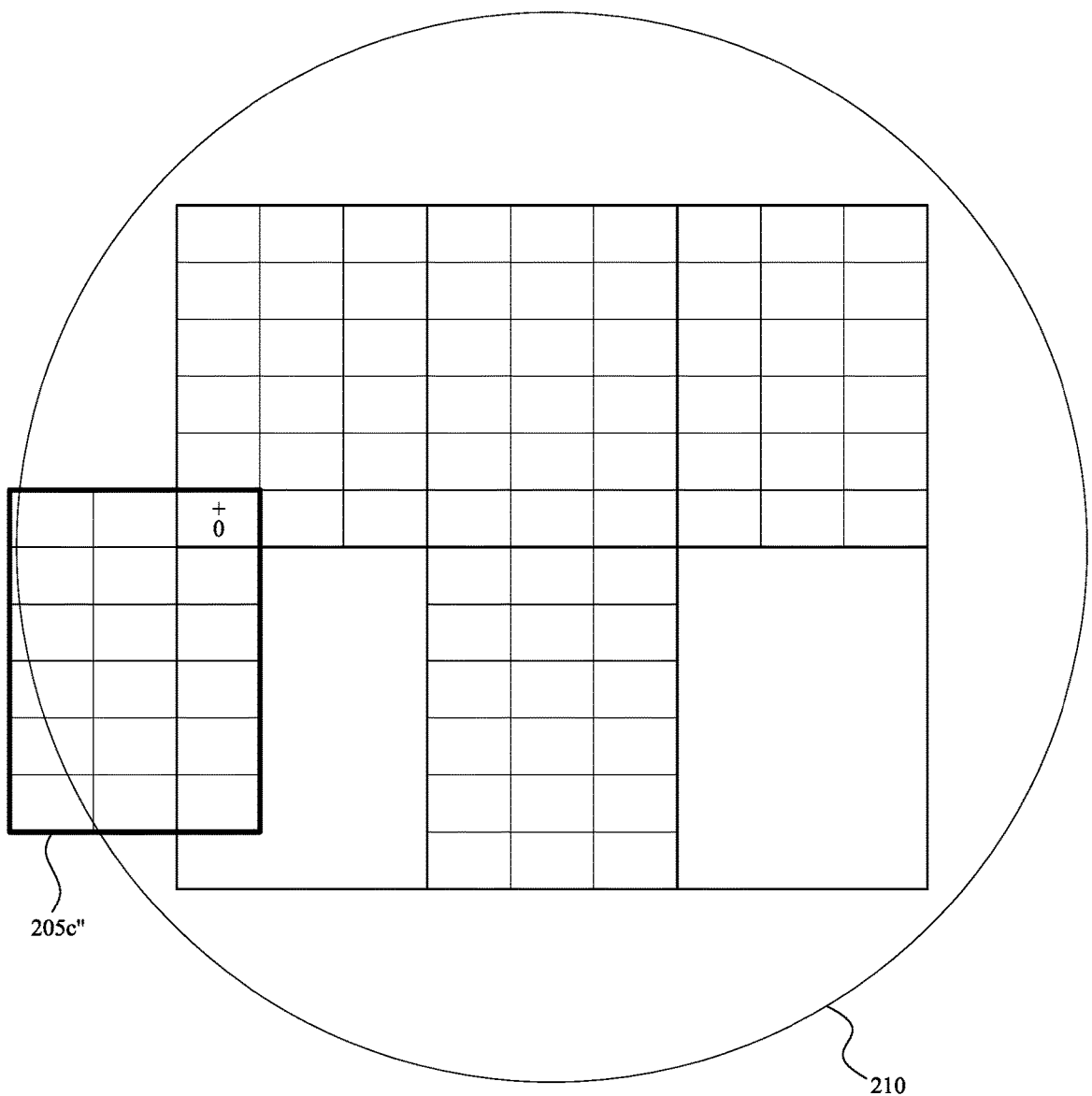
FIG. 58 shows one of various sequential operations in a method of exposing a photoresist layer on a semiconductor substrate according to an embodiment of the present disclosure.

As shown in FIG. 55, the right side column of the mask 205c" is aligned with the left side column of a dies and a top row of the mask 205c" is aligned with a bottom row of dies. In FIG. 56, the mask 205c" is stepped up two die widths relative to the semiconductor substrate 210 and no exposure is performed because the mask 205c" is not positioned over a portion of the wafer to be exposed. Next, the mask 205c" is stepped up three die widths relative to the semiconductor substrate, as shown in FIG. 57 so that an edge of the mask 205c" is adjacent edge of a lower left corner of an exposure field. The mask is subsequently stepped up one die relative to the wafer 210 and the first die in the left side column is exposed to radiation in FIG. 58 using the upper mask area in the right side column of mask 205c". The exposure (0) is below a target focus position (+).

Figure 59:
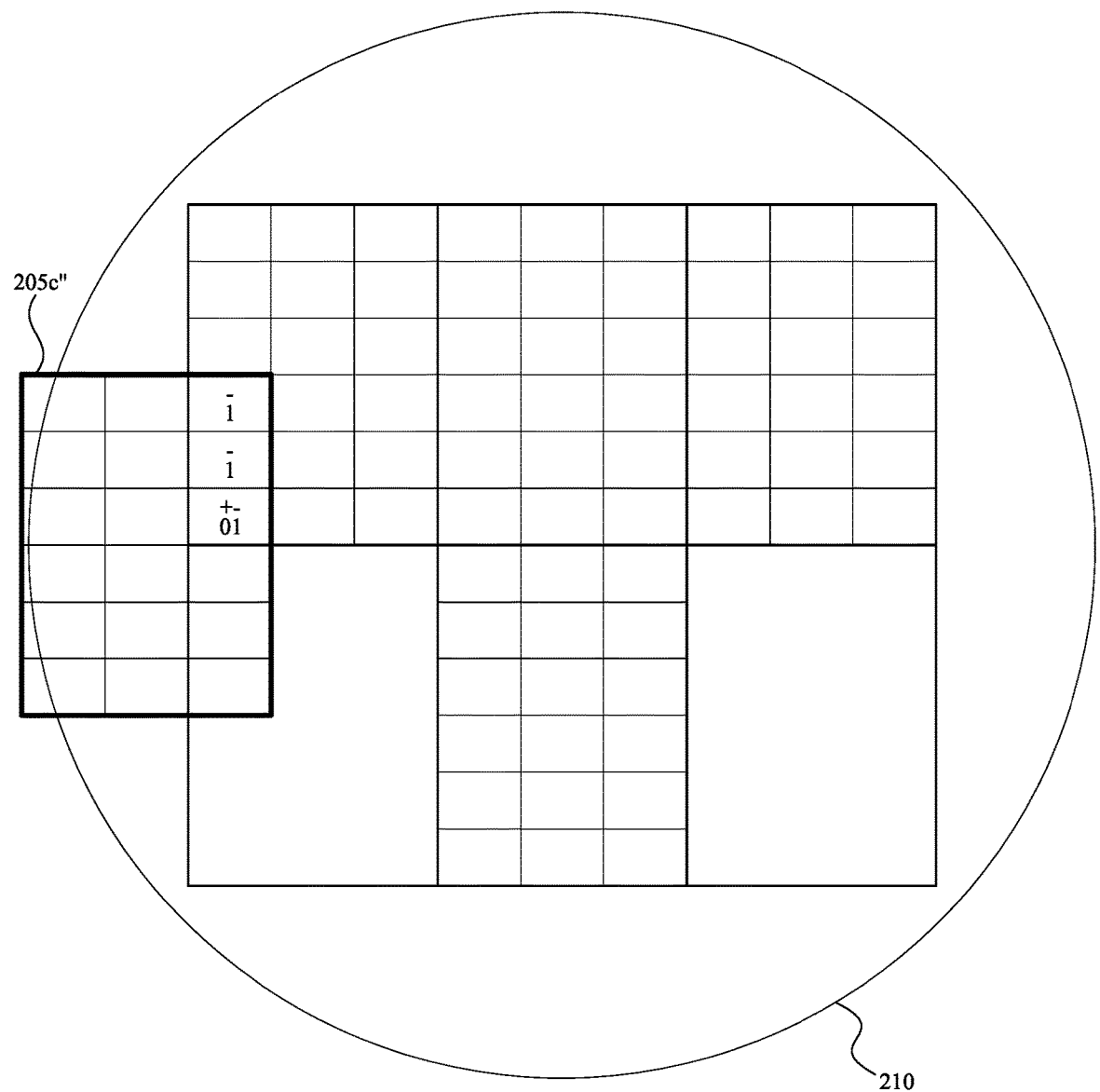
FIG. 59 shows one of various sequential operations in a method of exposing a photoresist layer on a semiconductor substrate according to an embodiment of the present disclosure.

The mask 205c" is subsequently stepped up two die widths relative to the wafer 210 in FIG. 59, and the third die from the bottom of the left side column, the second die, and the first die are exposed using the first, second, and third mask areas from the top of the mask 205c", respectively. The exposure (1) is above a target focus position (−).

Figure 60:
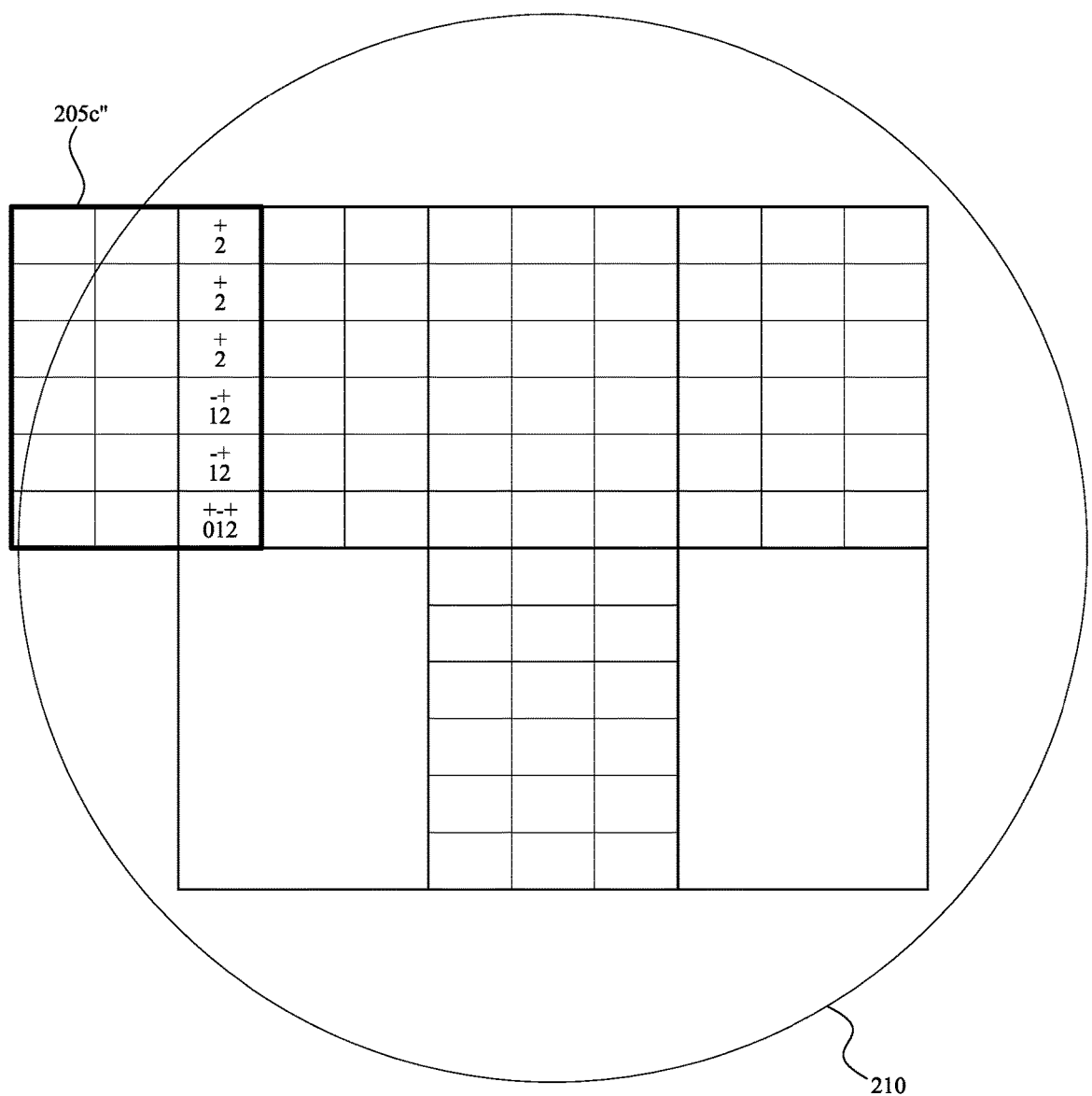
FIG. 60 shows one of various sequential operations in a method of exposing a photoresist layer on a semiconductor substrate according to an embodiment of the present disclosure.

Then in FIG. 60, the mask 205c" is stepped up three die widths relative to the wafer and the six dies in the left most column of the exposure field are exposed using the six mask areas in the right column of the mask 205c". In this embodiment, the numbers indicate to which shots each die are exposed. Where "0" is the first shot, "1" is the second shot, "2" is the third shot, and so on. A negative sign (−) indicates in this die there is an unpaired exposure done at a focus position above the target focus; a positive sign (+) indicates in this die there is an unpaired exposure done at a focus position below the target focus, and a pair of (−) and (+) indicates this die has a pair of exposure doses at a focus position above and below the target focus. An odd number of (−) and (+) indicates the total exposure dose is unpaired. An even number of (−) and (+) indicates the total exposure dose is paired.

Figure 61:
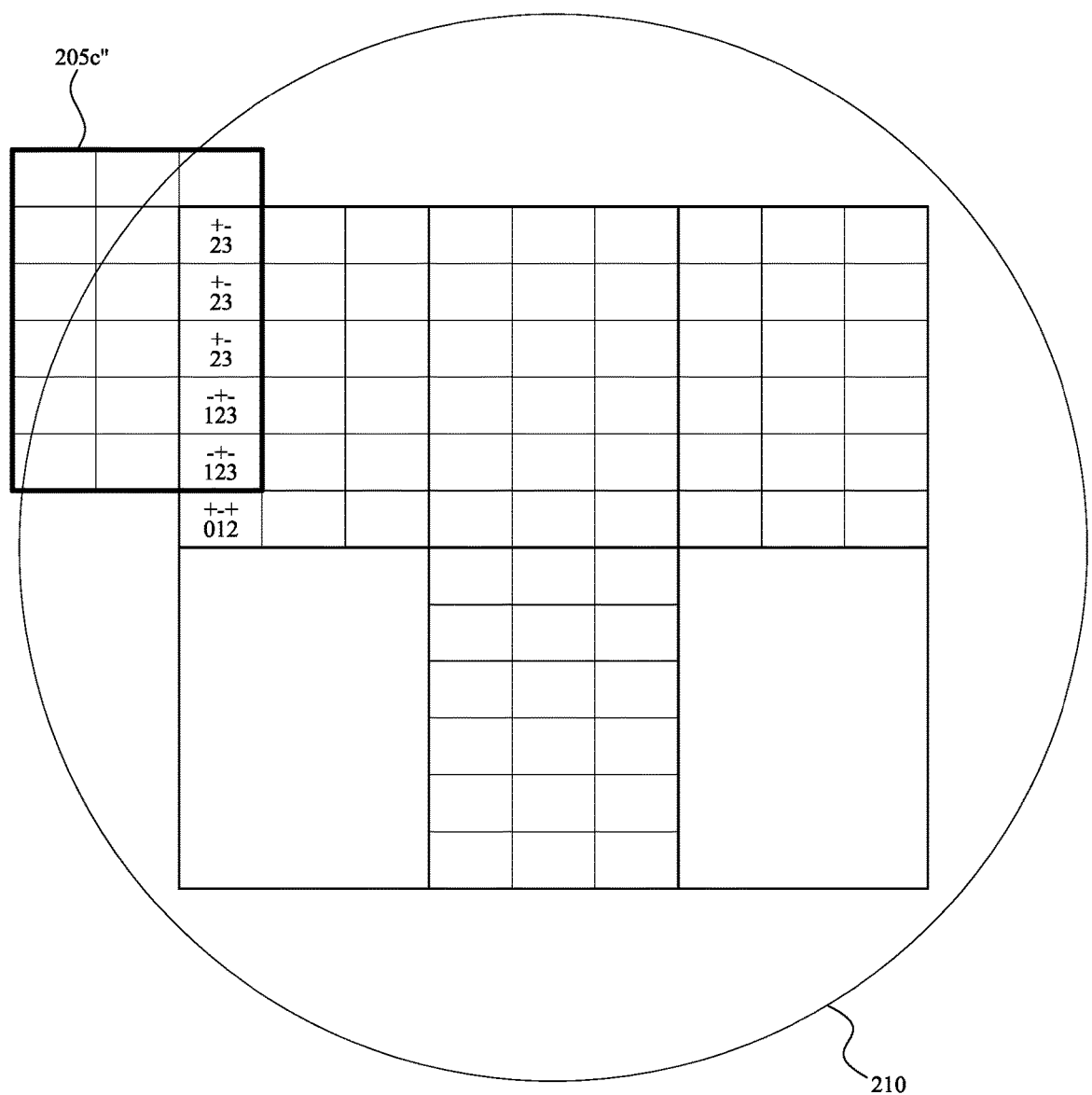
FIG. 61 shows one of various sequential operations in a method of exposing a photoresist layer on a semiconductor substrate according to an embodiment of the present disclosure.

The mask 205c" is then stepped up one die width relative to the wafer 210 in FIG. 61, and the first through fifth dies from the top of the left side (first) column are exposed (3) at a focus position above the target focus (−) using the second through sixth mask areas from the top of the right side of the mask.

Figure 62:
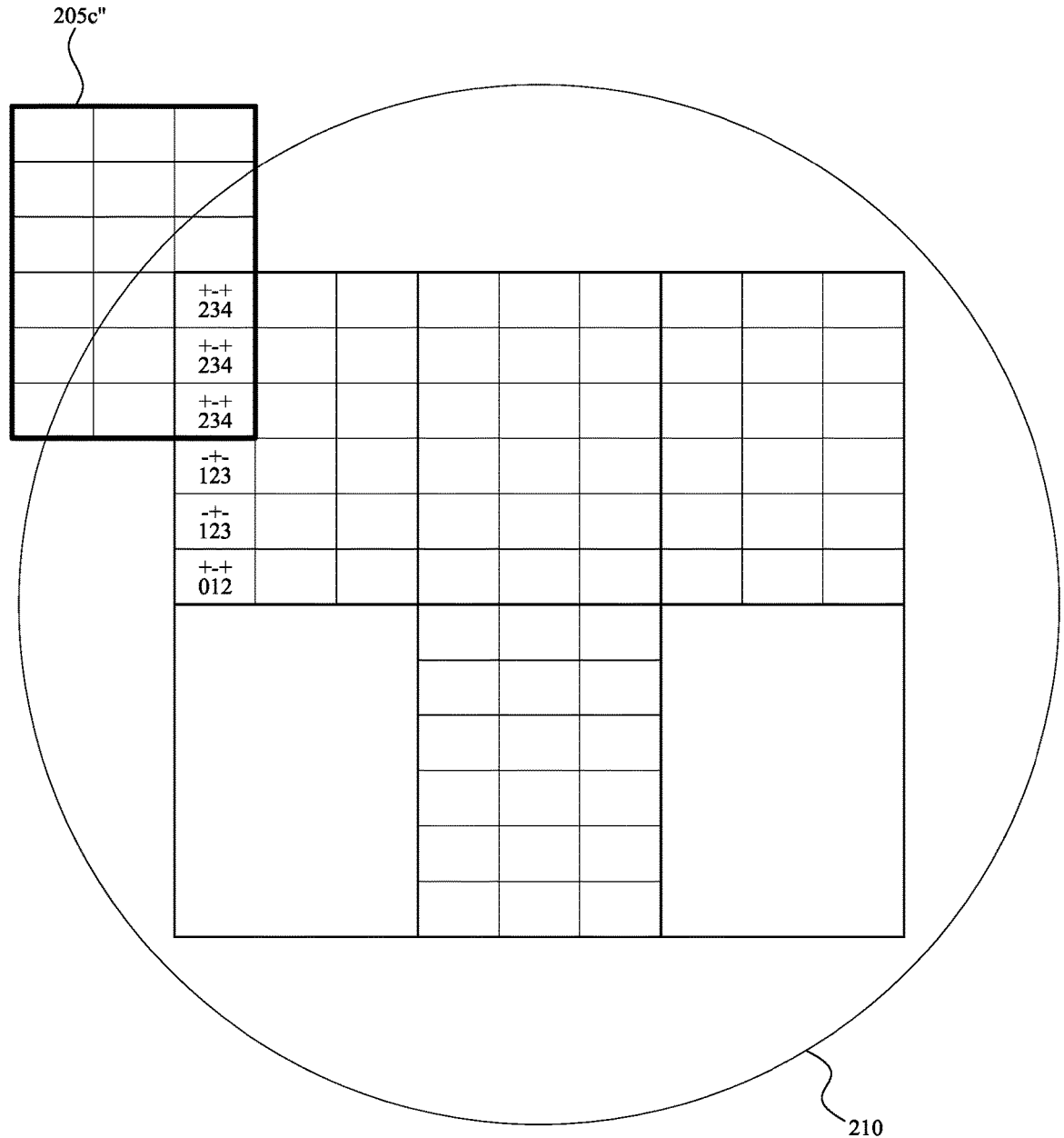
FIG. 62 shows one of various sequential operations in a method of exposing a photoresist layer on a semiconductor substrate according to an embodiment of the present disclosure.

As shown in FIG. 62, the mask 205c" is stepped up two die widths relative to the wafer 210, and the first through third dies from the top of the first column are exposed using the fourth through sixth mask areas, the fifth die is exposed using the second mask area, the fourth die is exposed using the third mask area in the right column of the mask. The focus position of this exposure (4) is below the target focus position (+).

Figure 63:
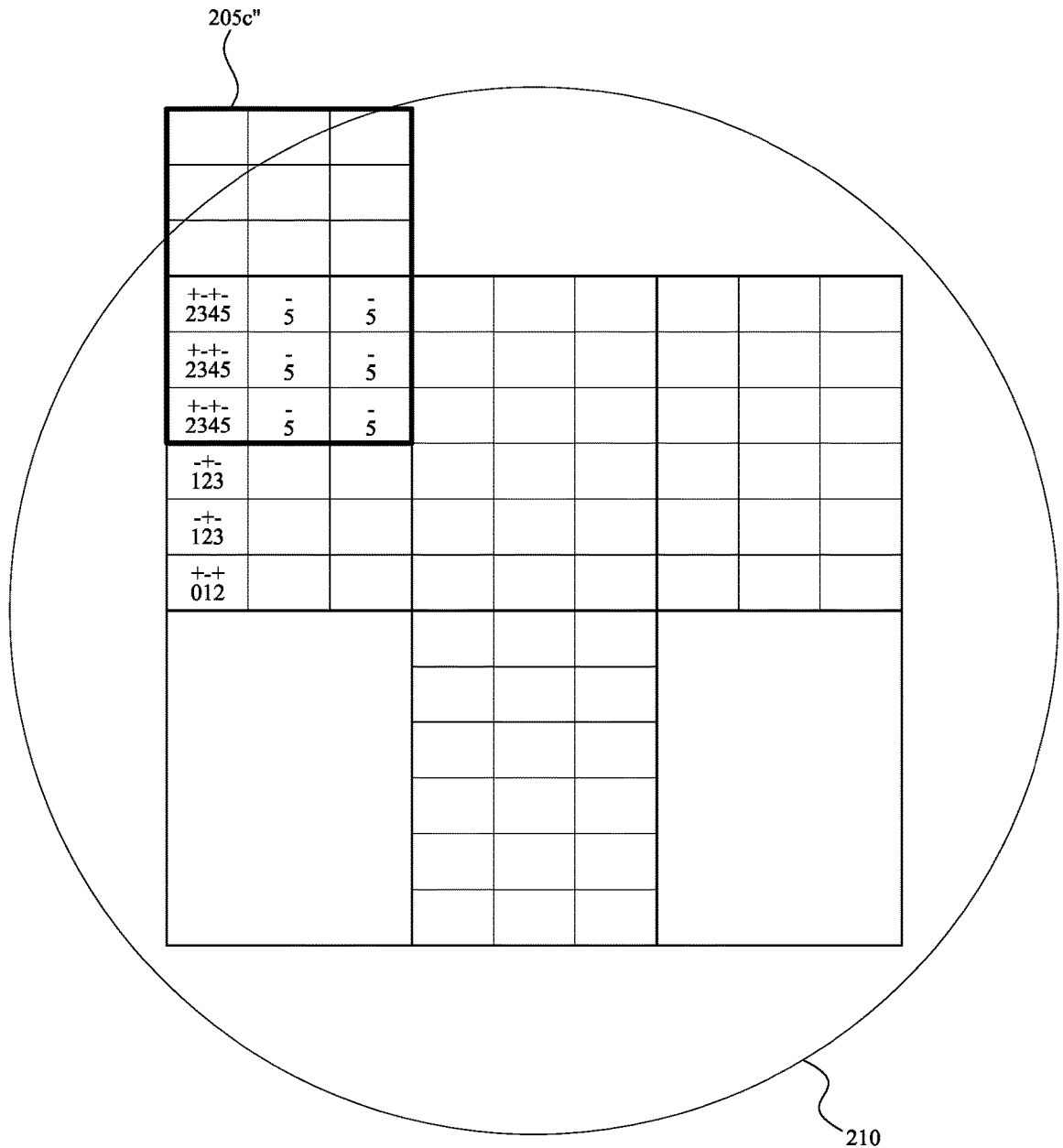
FIG. 63 shows one of various sequential operations in a method of exposing a photoresist layer on a semiconductor substrate according to an embodiment of the present disclosure.

Next, the mask 205c" is stepped two die widths to the right, as shown in FIG. 63, and the top three rows of dies in the exposure field are exposed using the bottom three rows of the mask. The focus position of this exposure (5) is above the target focus position (−).

Figure 64:
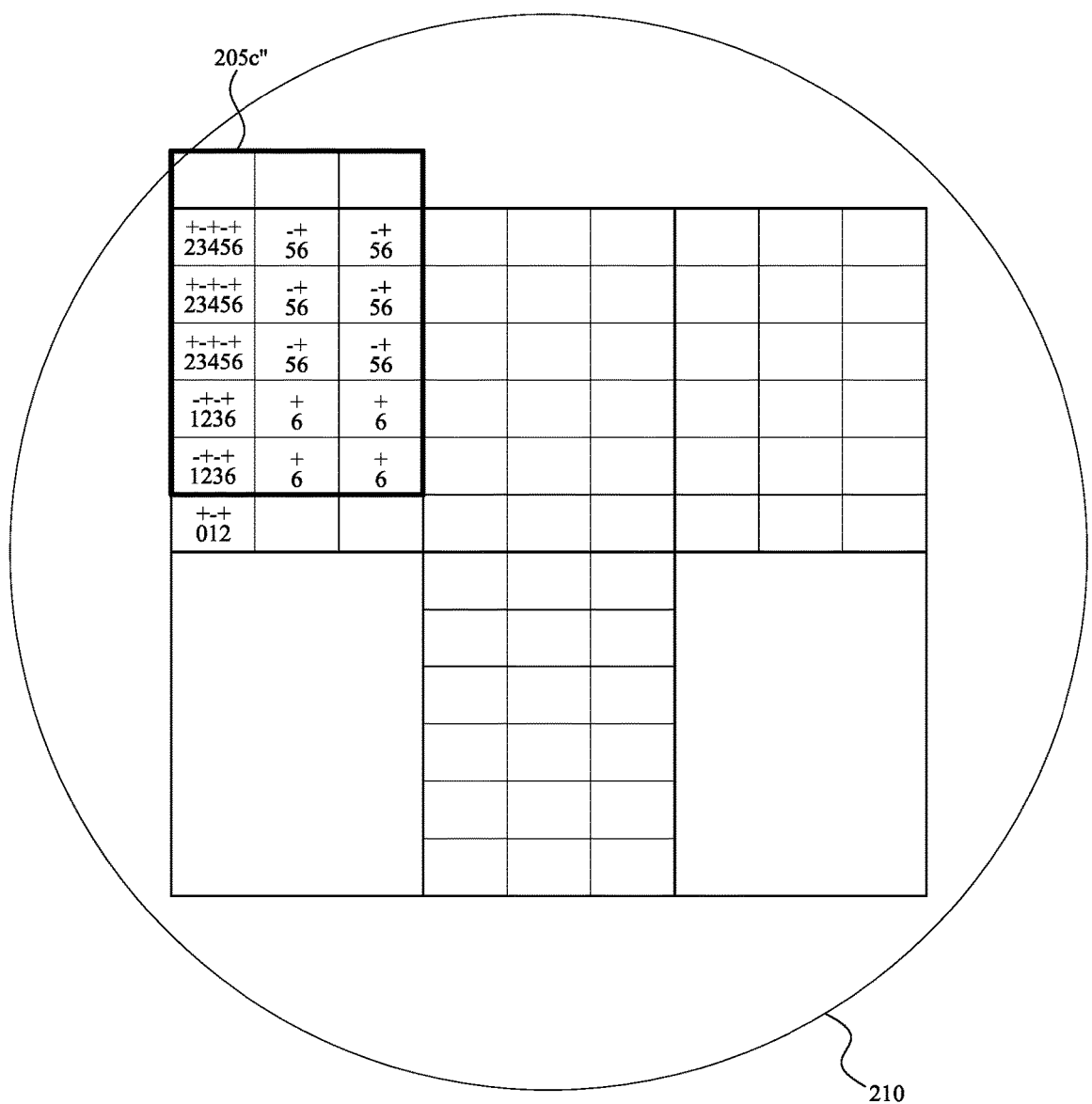
FIG. 64 shows one of various sequential operations in a method of exposing a photoresist layer on a semiconductor substrate according to an embodiment of the present disclosure.

As shown in FIG. 64, the mask 205c" is moved down two die widths relative to the wafer 210, and the top five rows of dies in the exposure field are exposed using the bottom five rows of the mask. The focus position of this exposure (6) is below the target focus (+).

Figure 65:
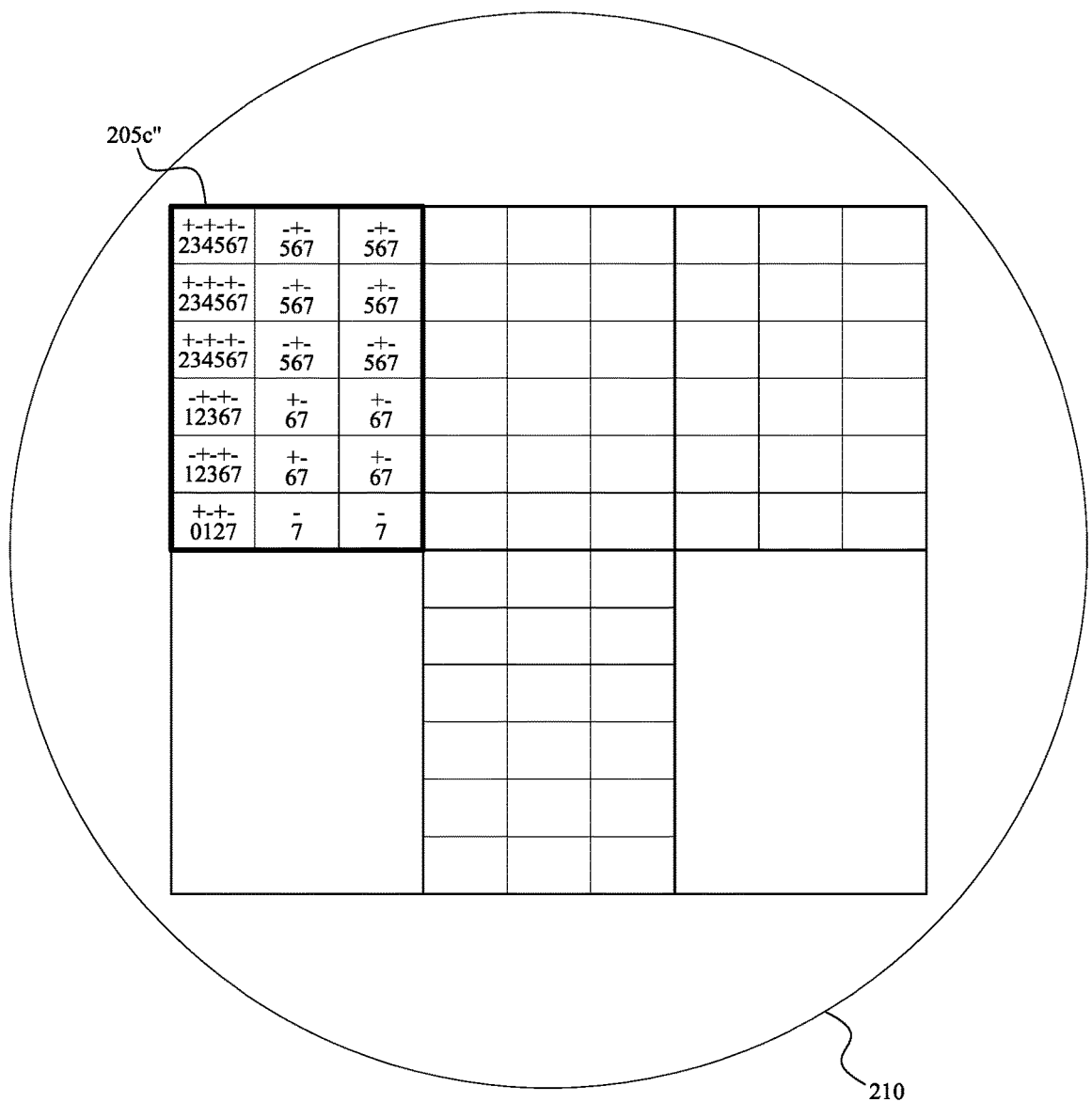
FIG. 65 shows one of various sequential operations in a method of exposing a photoresist layer on a semiconductor substrate according to an embodiment of the present disclosure.

Next, as shown in FIG. 65, the mask 205c" is stepped down one die width and the all three columns and six rows of the mask are used to expose the left side exposure field of the wafer. The focus position of this exposure (7) is above the target focus (−).

Figure 66:
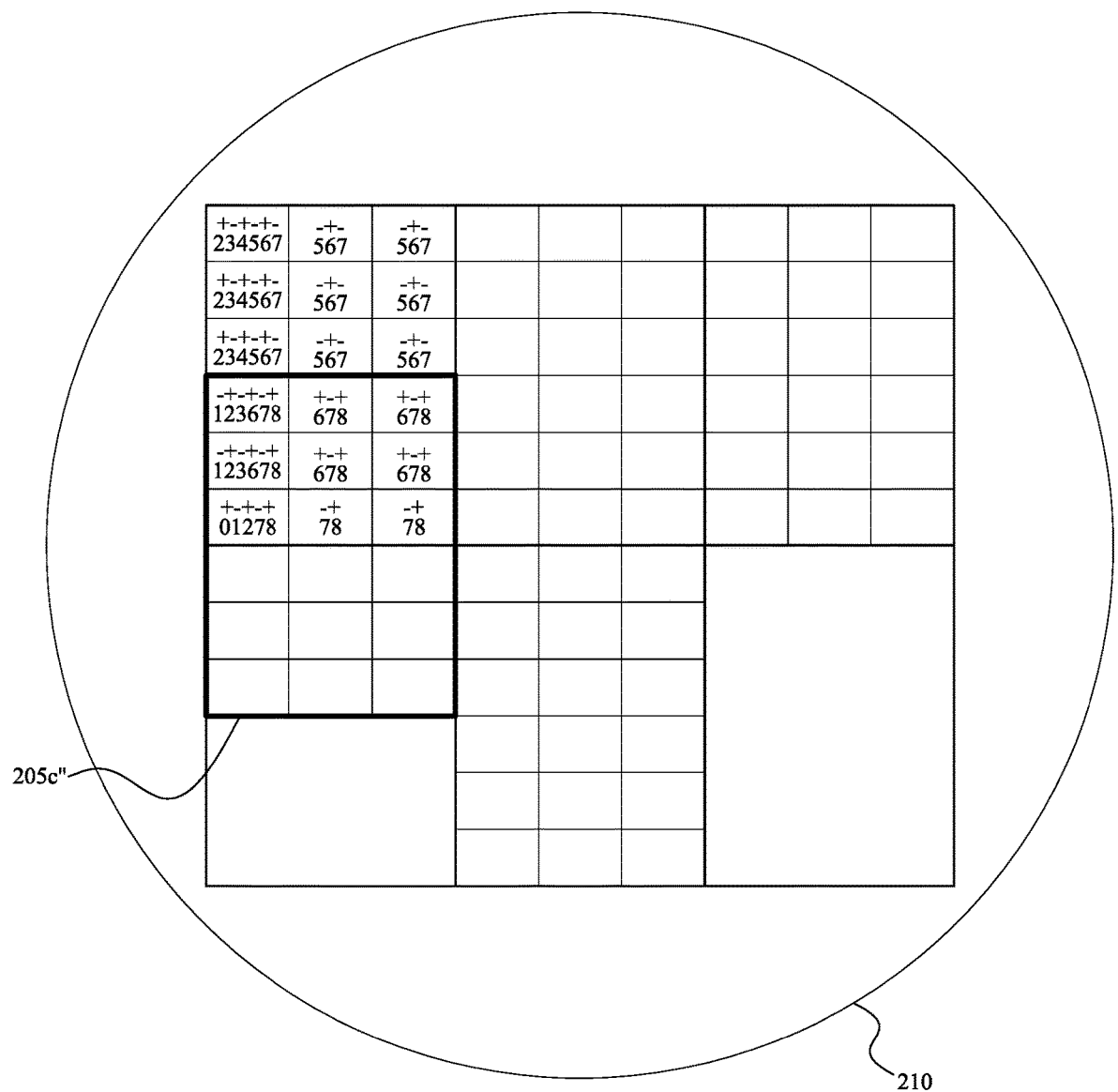
FIG. 66 shows one of various sequential operations in a method of exposing a photoresist layer on a semiconductor substrate according to an embodiment of the present disclosure.

In FIG. 66, the mask 205c" is stepped down three die widths relative to the wafer and the bottom three rows of the left exposure field are exposed using the upper three rows of the mask. The focus position of this exposure (8) is below the target focus (+).

Figure 67:
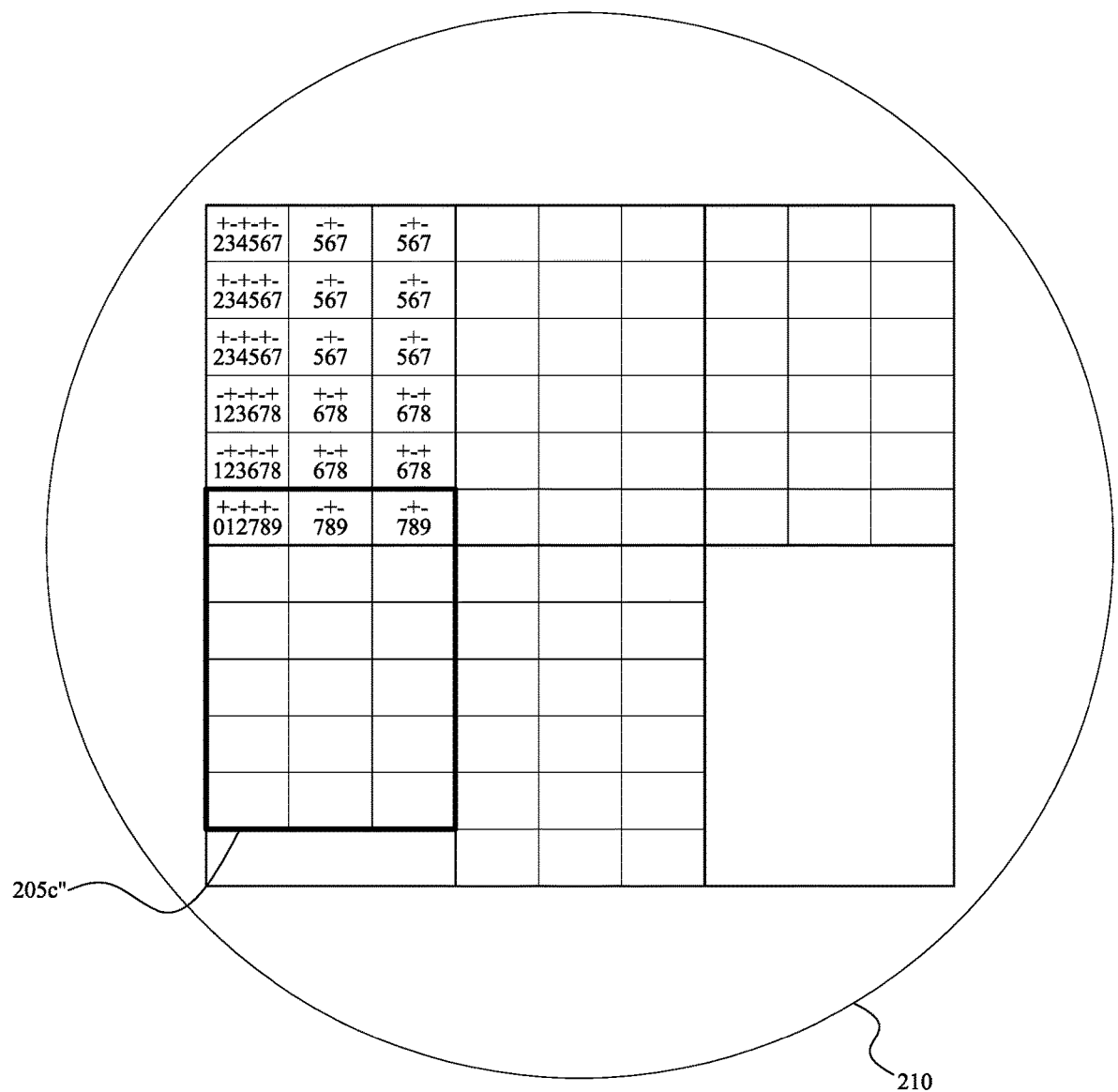
FIG. 67 shows one of various sequential operations in a method of exposing a photoresist layer on a semiconductor substrate according to an embodiment of the present disclosure.

Next, in FIG. 67, the mask 205c" is stepped down two die widths relative to the wafer and the bottom row of the left exposure field is exposed using the upper row of the mask. The focus position of this exposure (9) is above the target focus (−).

Figure 68:
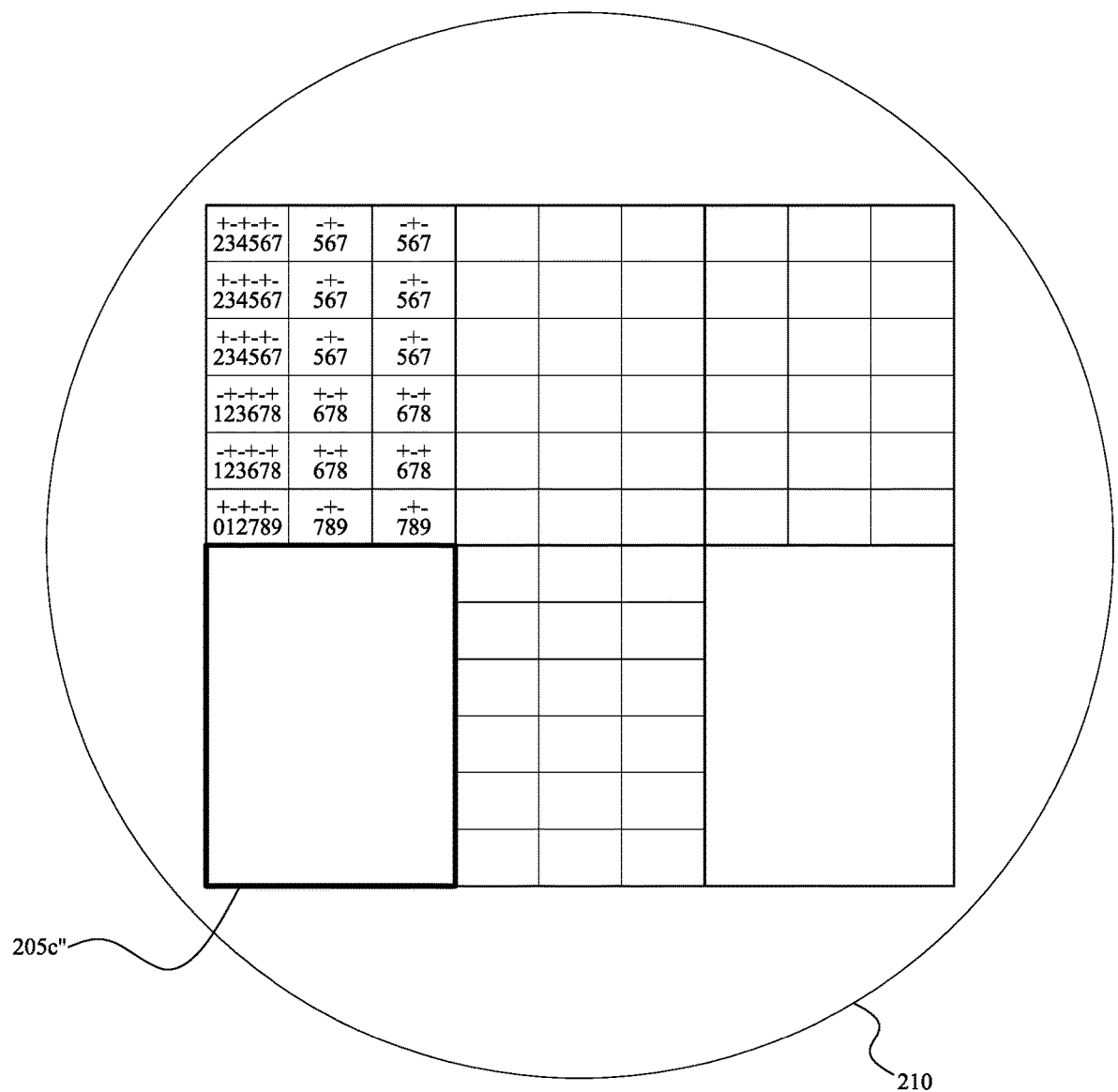
FIG. 68 shows one of various sequential operations in a method of exposing a photoresist layer on a semiconductor substrate according to an embodiment of the present disclosure.
Figure 69:
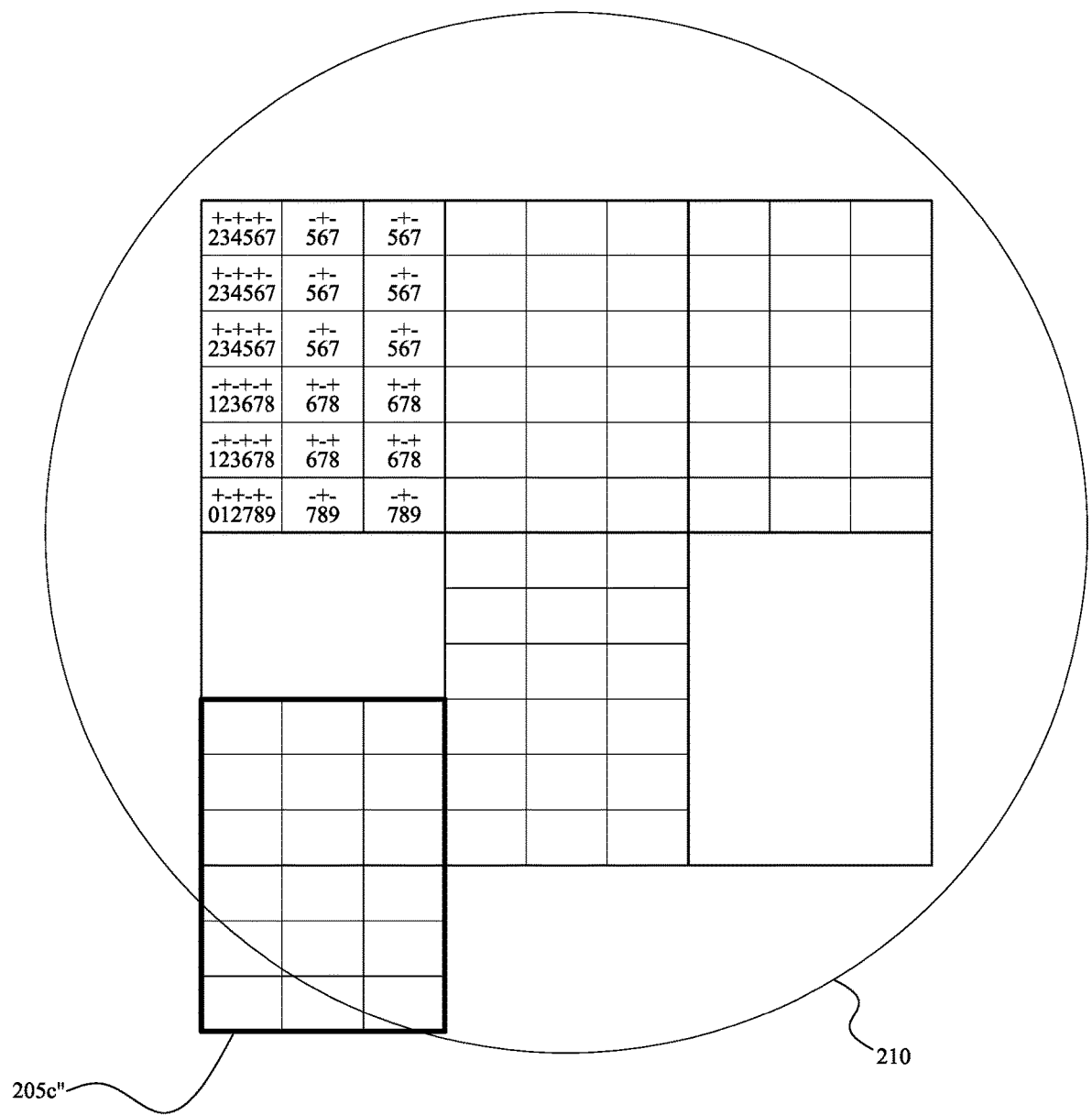
FIG. 69 shows one of various sequential operations in a method of exposing a photoresist layer on a semiconductor substrate according to an embodiment of the present disclosure.
Figure 70:
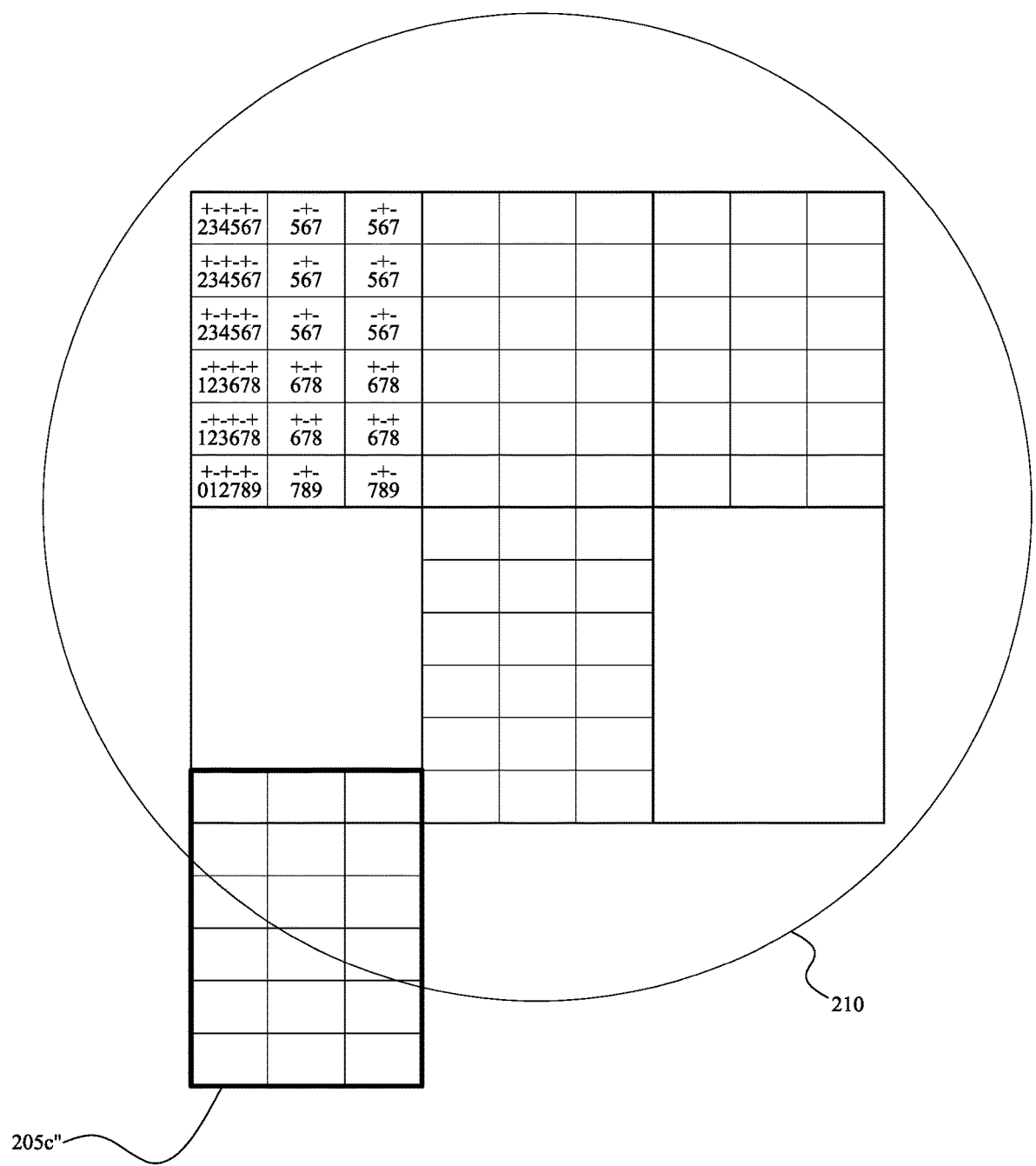
FIG. 70 shows one of various sequential operations in a method of exposing a photoresist layer on a semiconductor substrate according to an embodiment of the present disclosure.

Then, in FIG. 68, the mask 205c" is stepped down one die width. An exposure is not performed because the mask is not positioned over a portion of the wafer to be exposed. The mask 205c" is subsequently stepped down two widths in successive steps, as shown in FIGS. 69 and 70. The upper row of the mask is aligned with and adjacent to the bottom row of the array of dies. No exposures are performed after either of these stepping operations.

Figure 71:
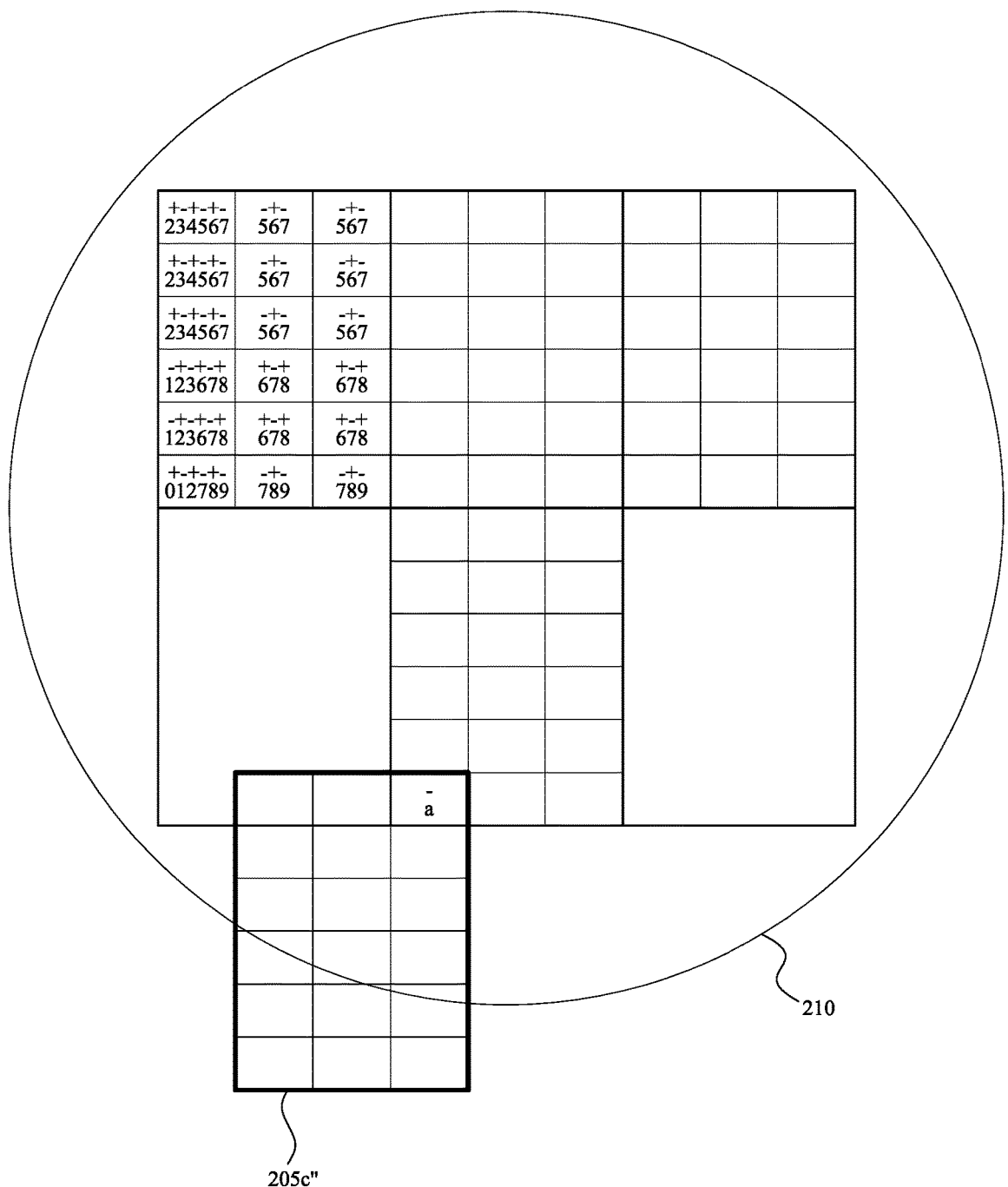
FIG. 71 shows one of various sequential operations in a method of exposing a photoresist layer on a semiconductor substrate according to an embodiment of the present disclosure.
Figure 72:
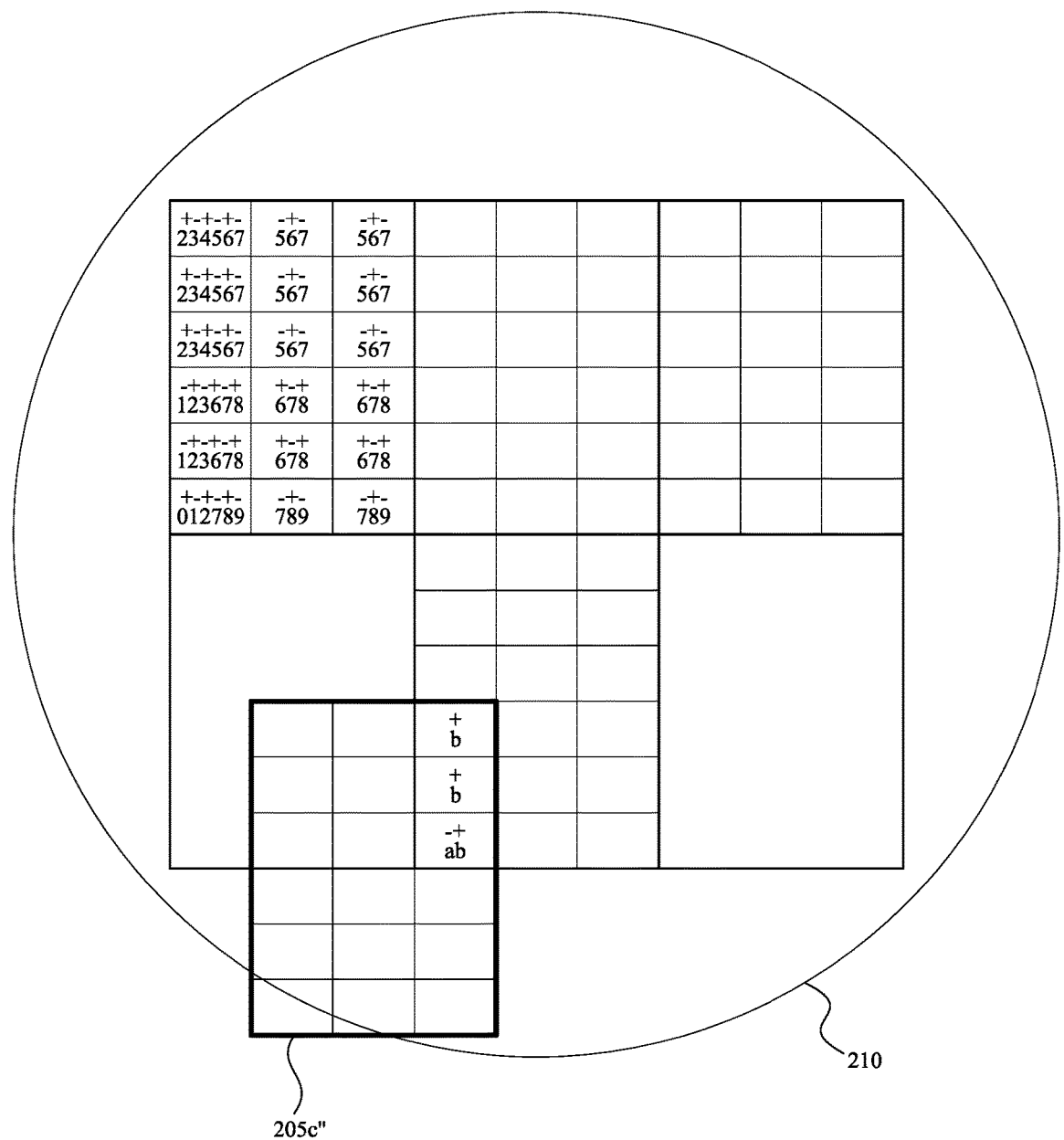
FIG. 72 shows one of various sequential operations in a method of exposing a photoresist layer on a semiconductor substrate according to an embodiment of the present disclosure.
Figure 73:
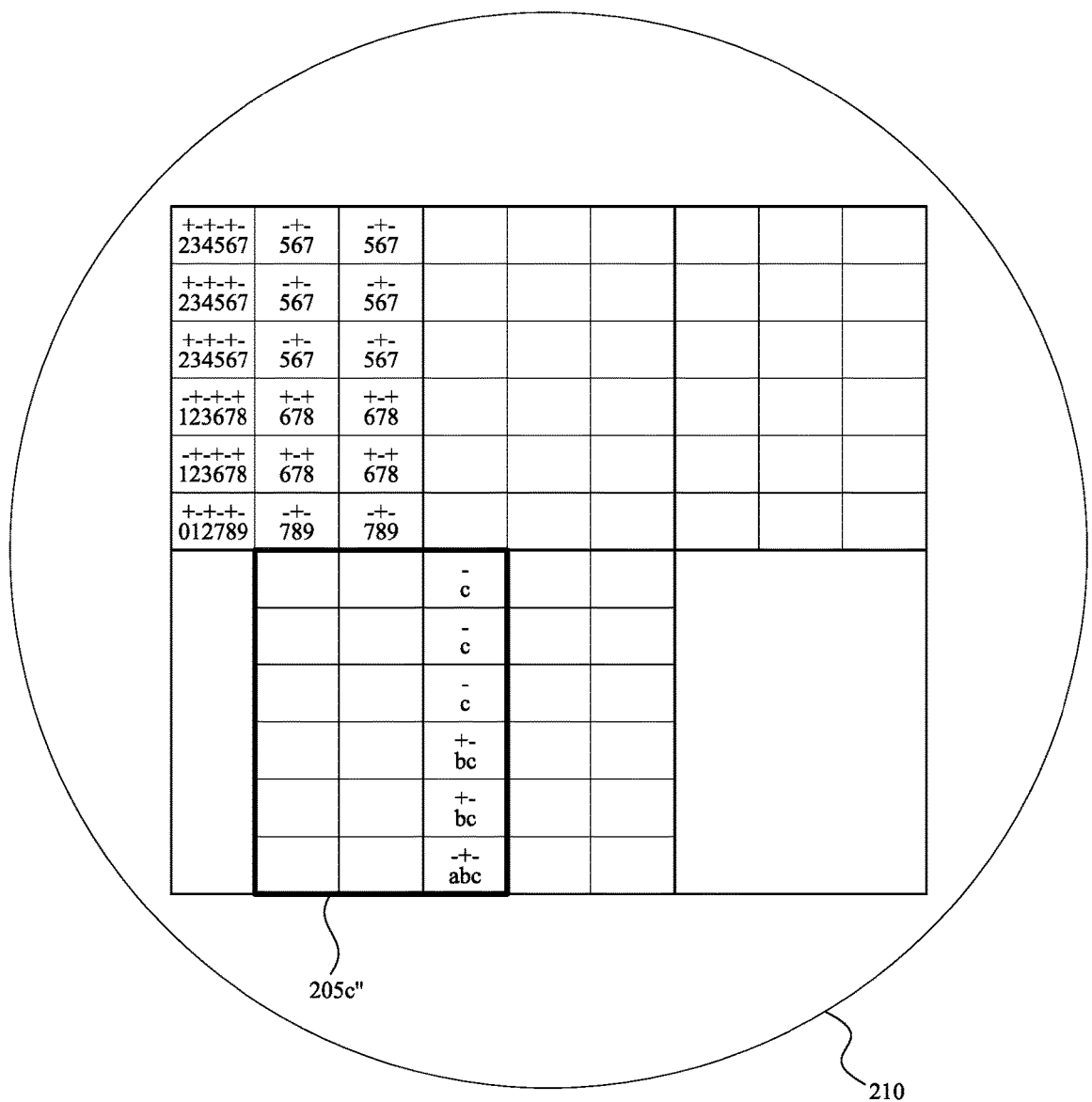
FIG. 73 shows one of various sequential operations in a method of exposing a photoresist layer on a semiconductor substrate according to an embodiment of the present disclosure.
Figure 74:
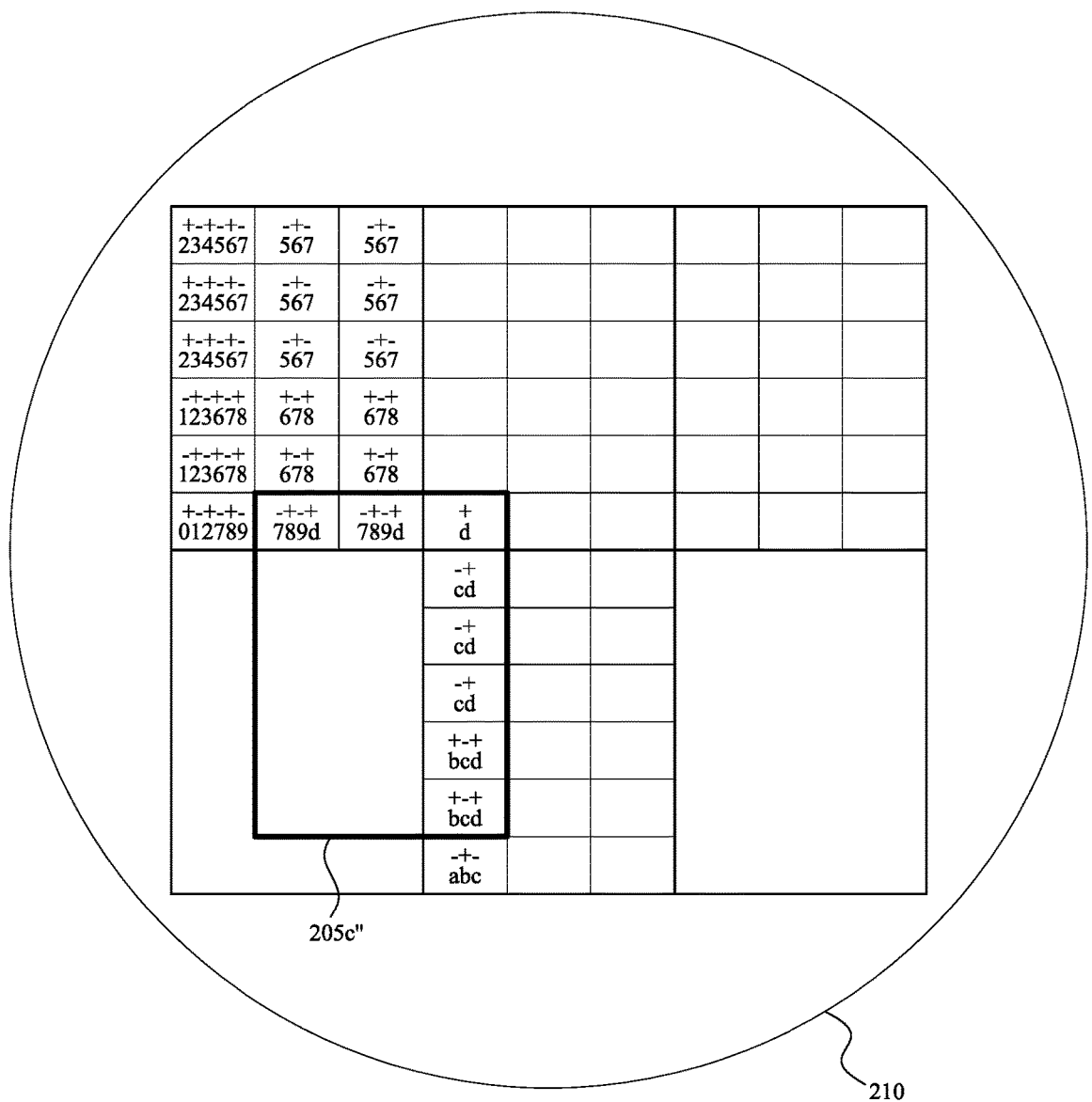
FIG. 74 shows one of various sequential operations in a method of exposing a photoresist layer on a semiconductor substrate according to an embodiment of the present disclosure.
Figure 75:
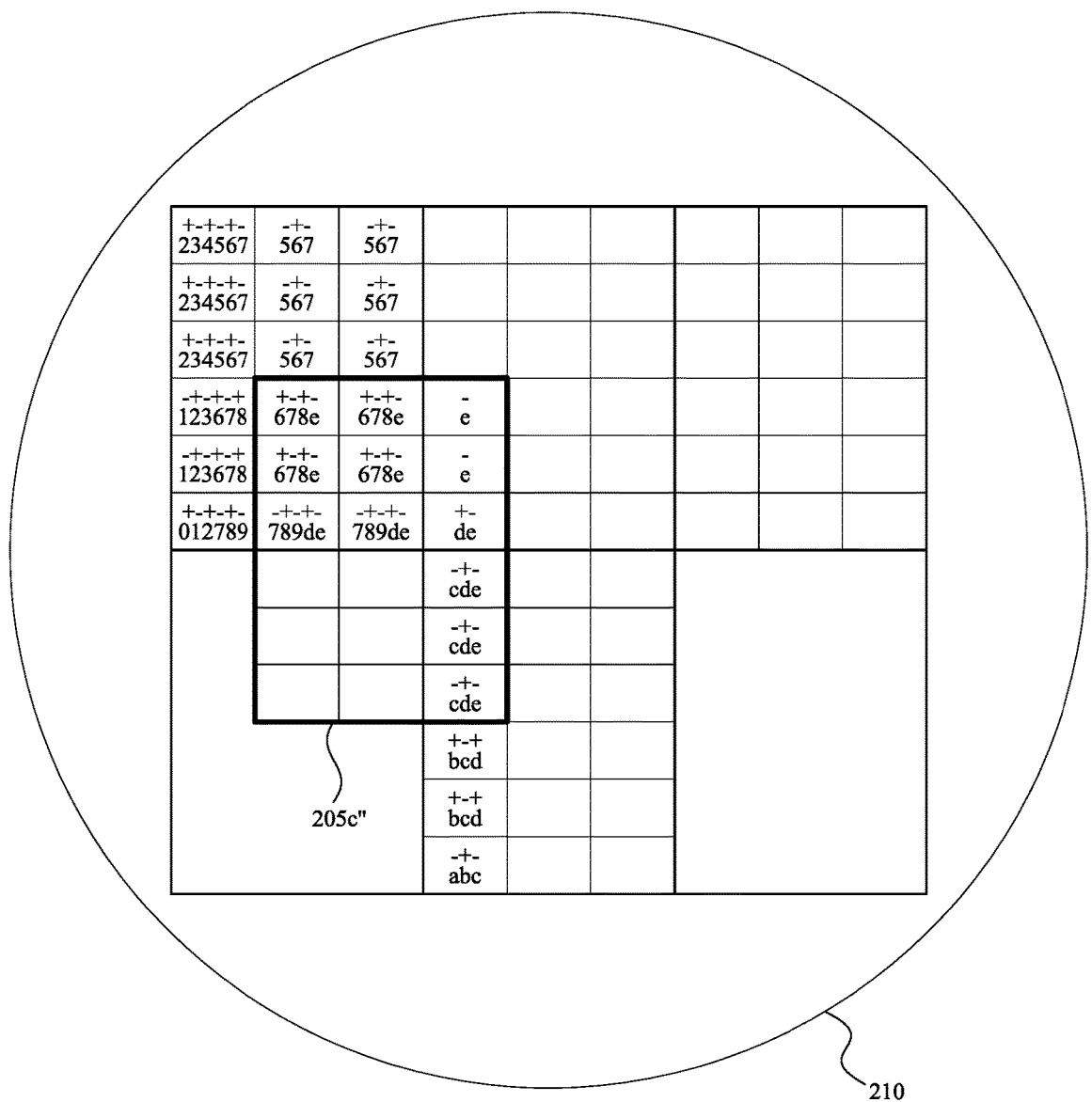
FIG. 75 shows one of various sequential operations in a method of exposing a photoresist layer on a semiconductor substrate according to an embodiment of the present disclosure.
Figure 76:
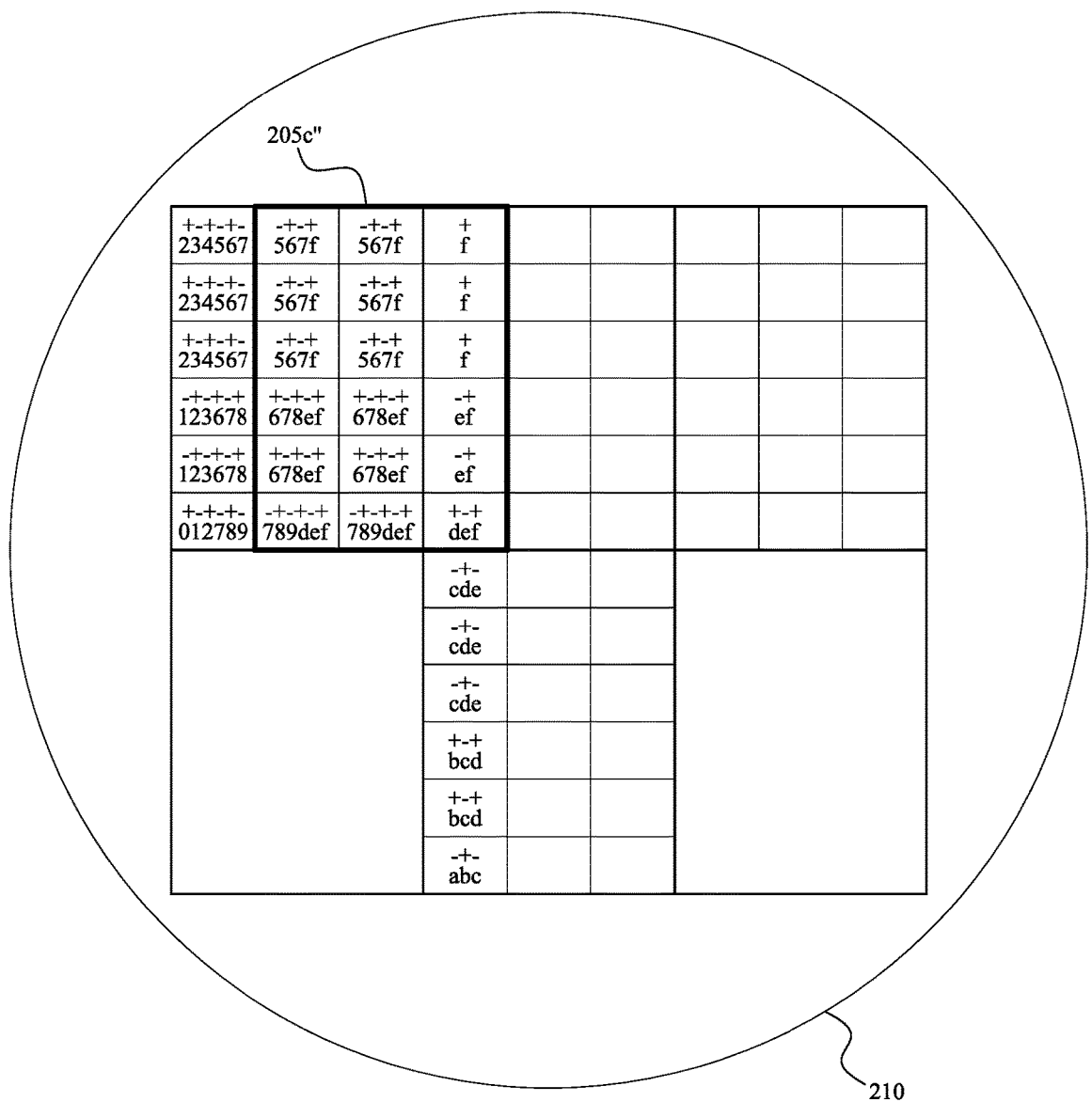
FIG. 76 shows one of various sequential operations in a method of exposing a photoresist layer on a semiconductor substrate according to an embodiment of the present disclosure.
Figure 77:
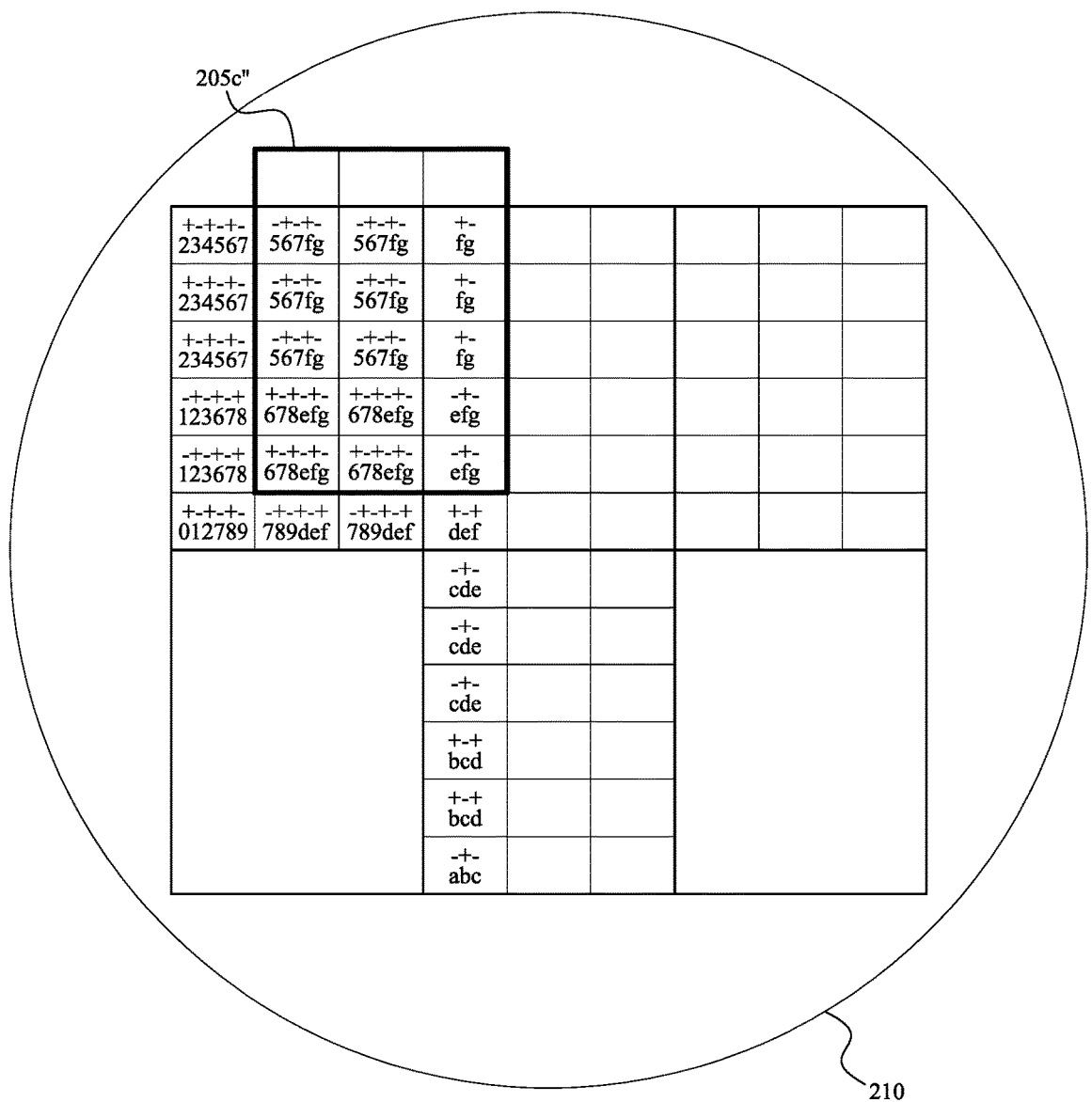
FIG. 77 shows one of various sequential operations in a method of exposing a photoresist layer on a semiconductor substrate according to an embodiment of the present disclosure.
Figure 78:
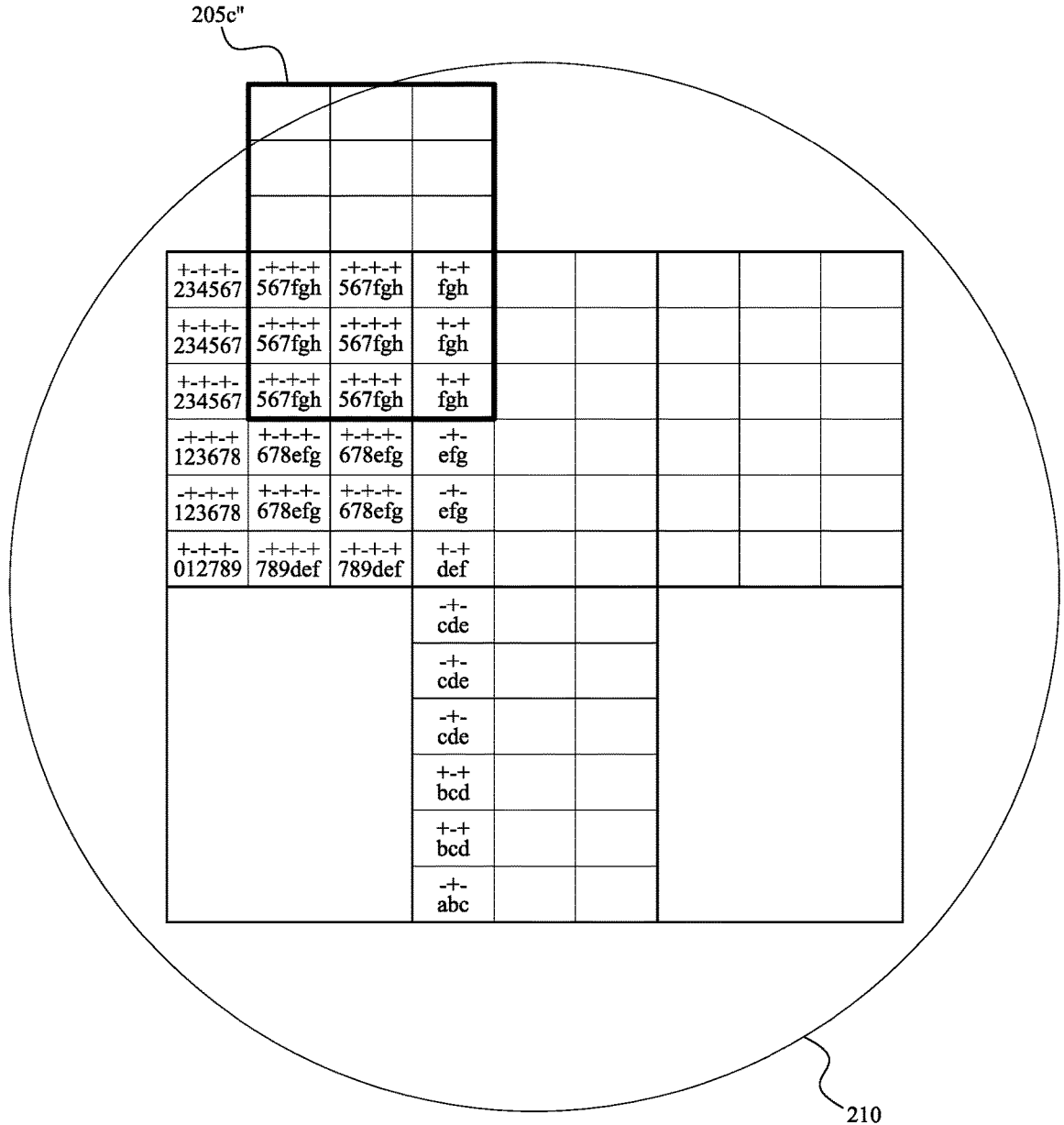
FIG. 78 shows one of various sequential operations in a method of exposing a photoresist layer on a semiconductor substrate according to an embodiment of the present disclosure.

Then, in FIG. 71, the mask 205c" is stepped one die width to the right and the die at the bottom left corner of the exposure field is exposed. The focus position of this exposure (a) is above the target focus (−). In FIGS. 71 to 96, the shot numbers will be designated by successive letters (a-z) because all the single digit numbers have been used.

As shown in FIGS. 72, 73, 74, 75, 76, 77, and 78, an alternating sequence of below focus position and above focus position exposures, combined with an alternating sequence of the two die width step up, three die width step up, and one die width step up is performed.

Figure 79:
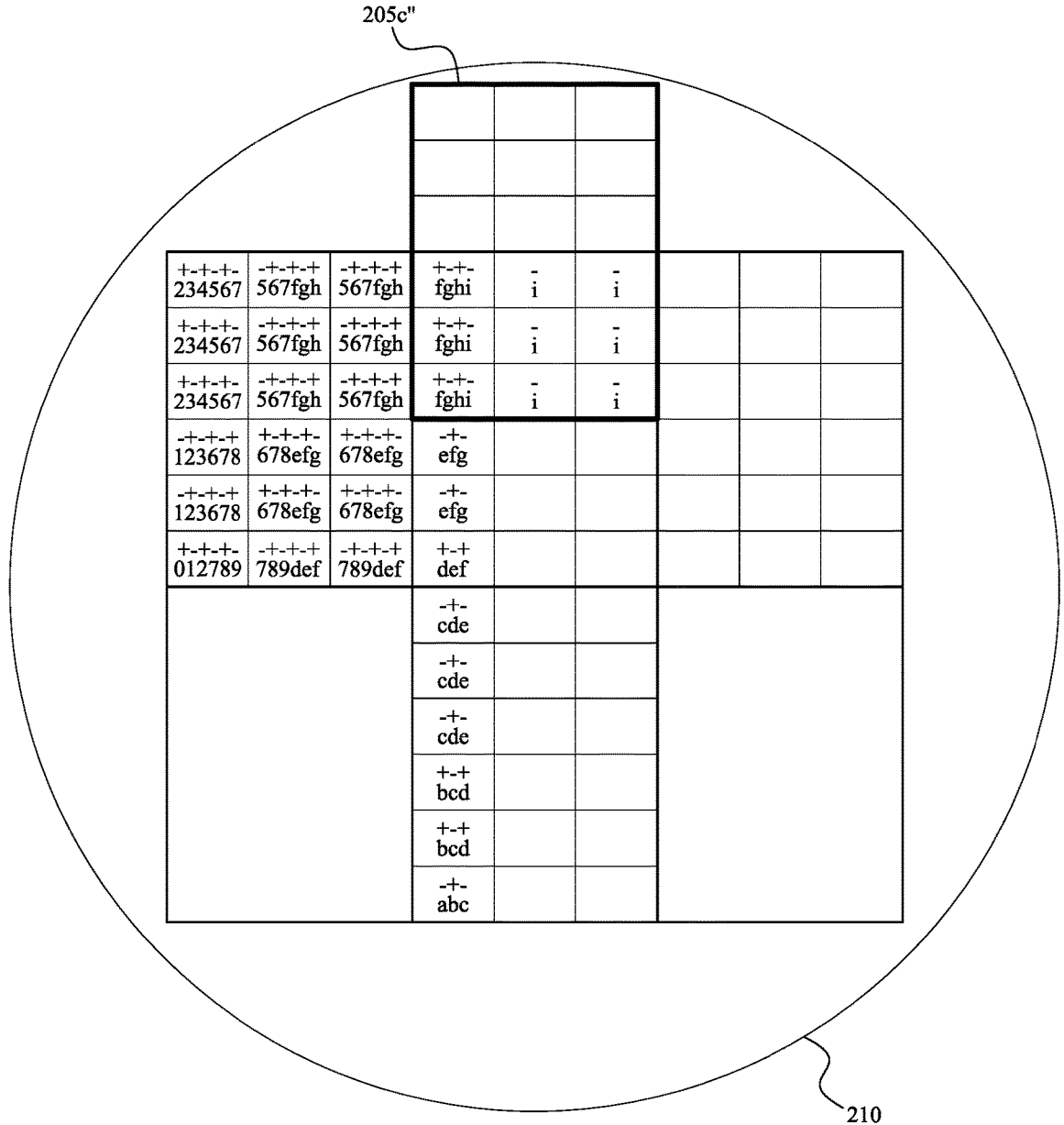
FIG. 79 shows one of various sequential operations in a method of exposing a photoresist layer on a semiconductor substrate according to an embodiment of the present disclosure.
Figure 80:
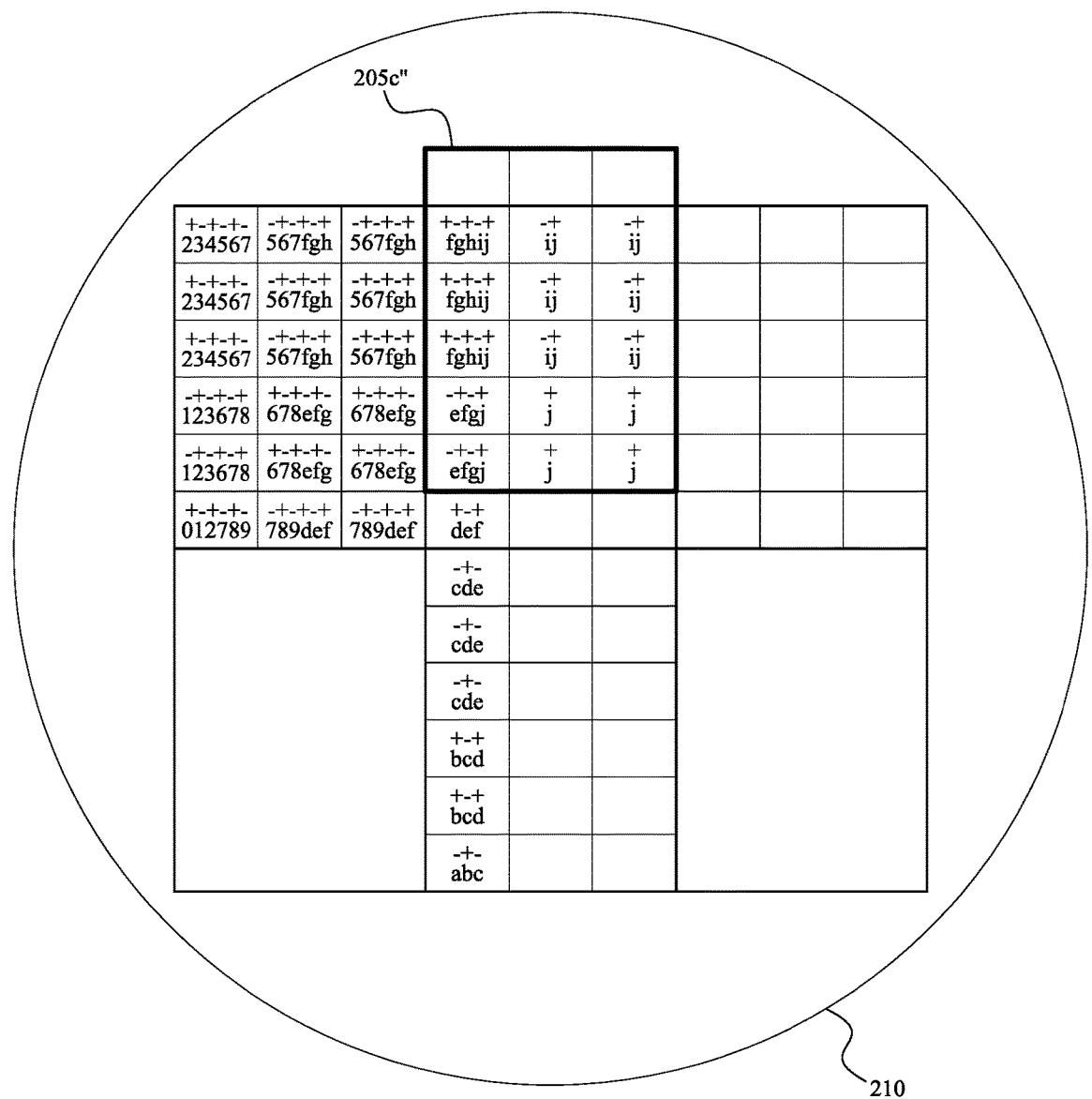
FIG. 80 shows one of various sequential operations in a method of exposing a photoresist layer on a semiconductor substrate according to an embodiment of the present disclosure.
Figure 81:
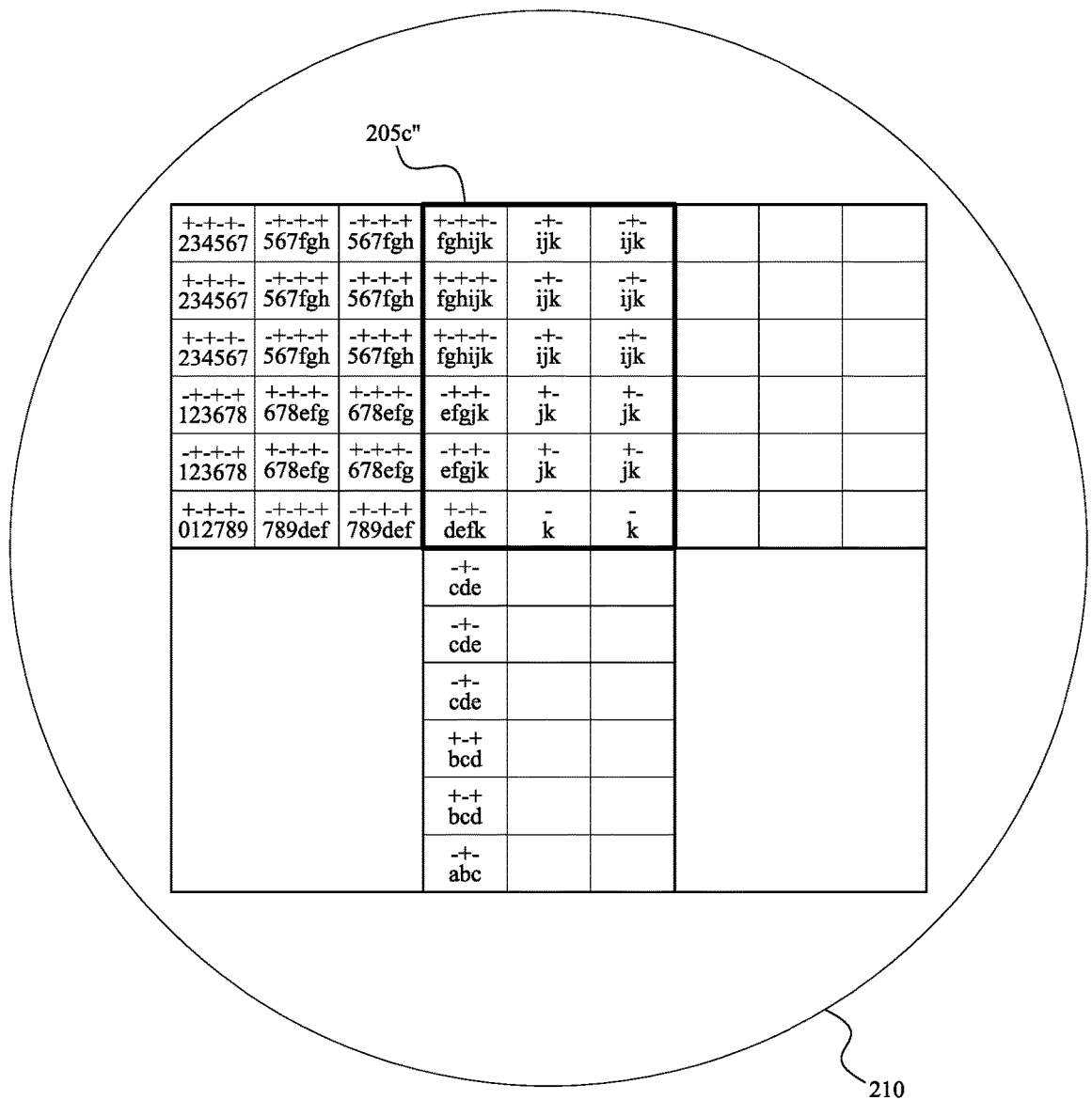
FIG. 81 shows one of various sequential operations in a method of exposing a photoresist layer on a semiconductor substrate according to an embodiment of the present disclosure.
Figure 82:
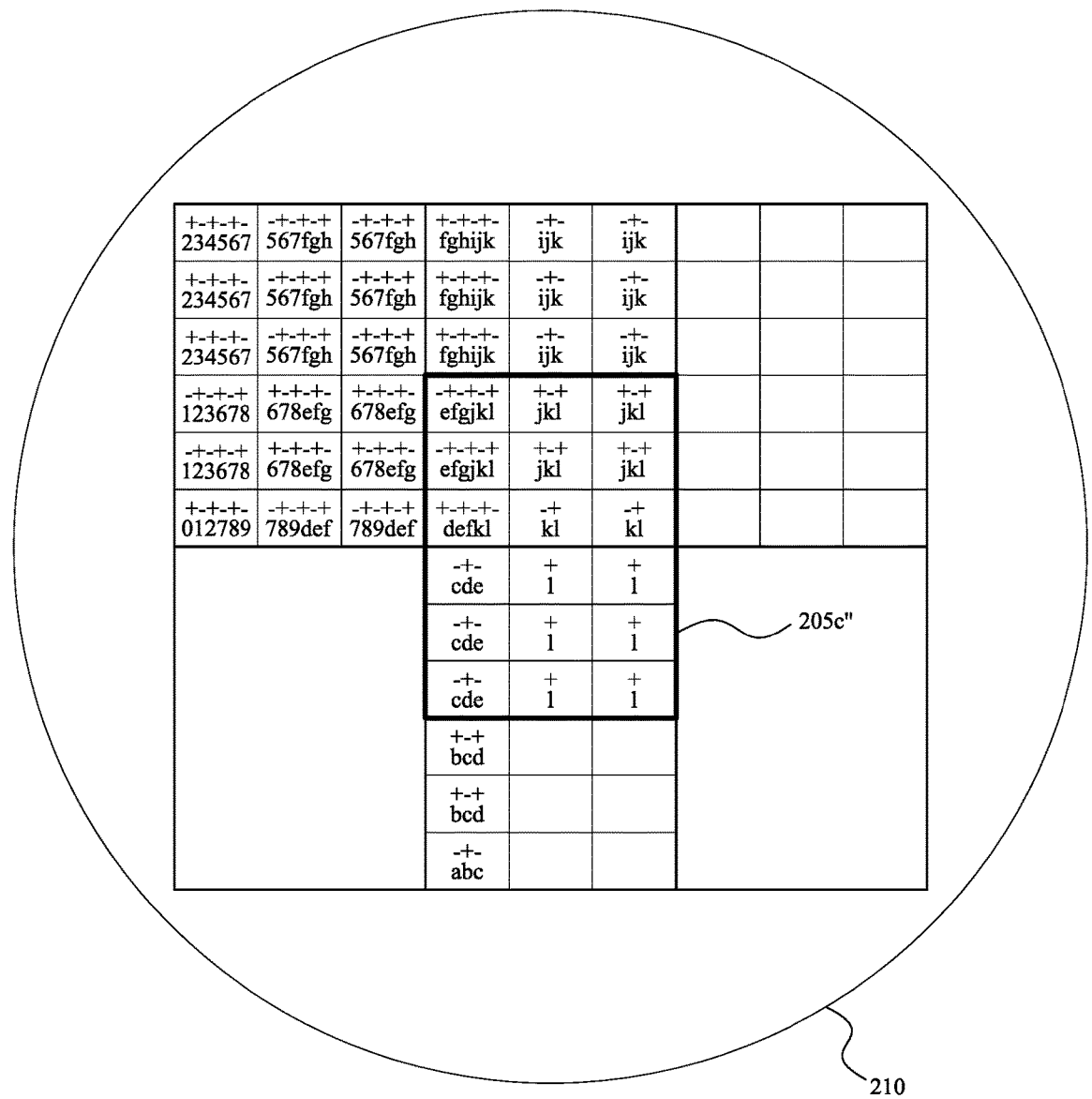
FIG. 82 shows one of various sequential operations in a method of exposing a photoresist layer on a semiconductor substrate according to an embodiment of the present disclosure.
Figure 83:
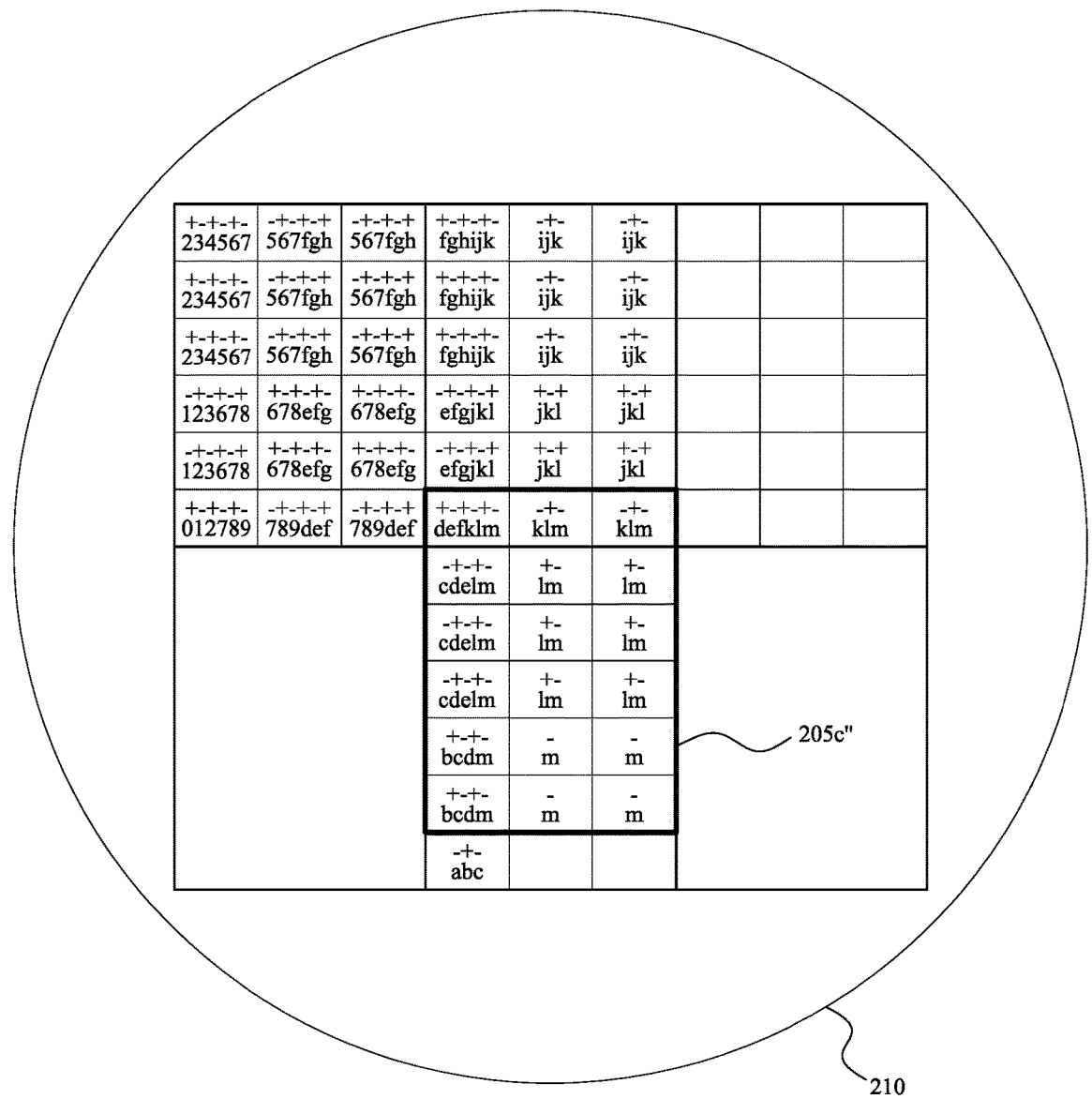
FIG. 83 shows one of various sequential operations in a method of exposing a photoresist layer on a semiconductor substrate according to an embodiment of the present disclosure.
Figure 84:
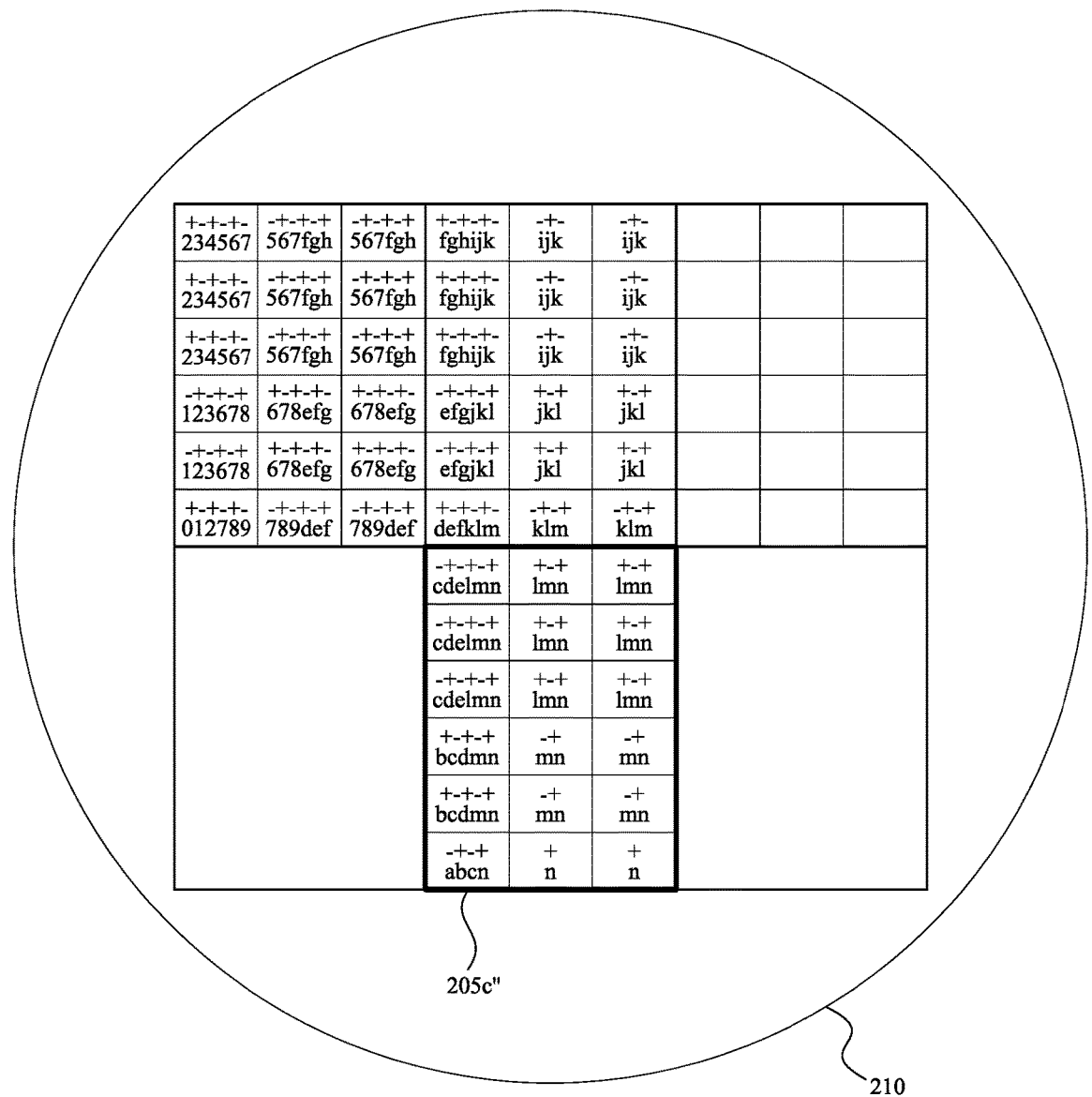
FIG. 84 shows one of various sequential operations in a method of exposing a photoresist layer on a semiconductor substrate according to an embodiment of the present disclosure.
Figure 85:
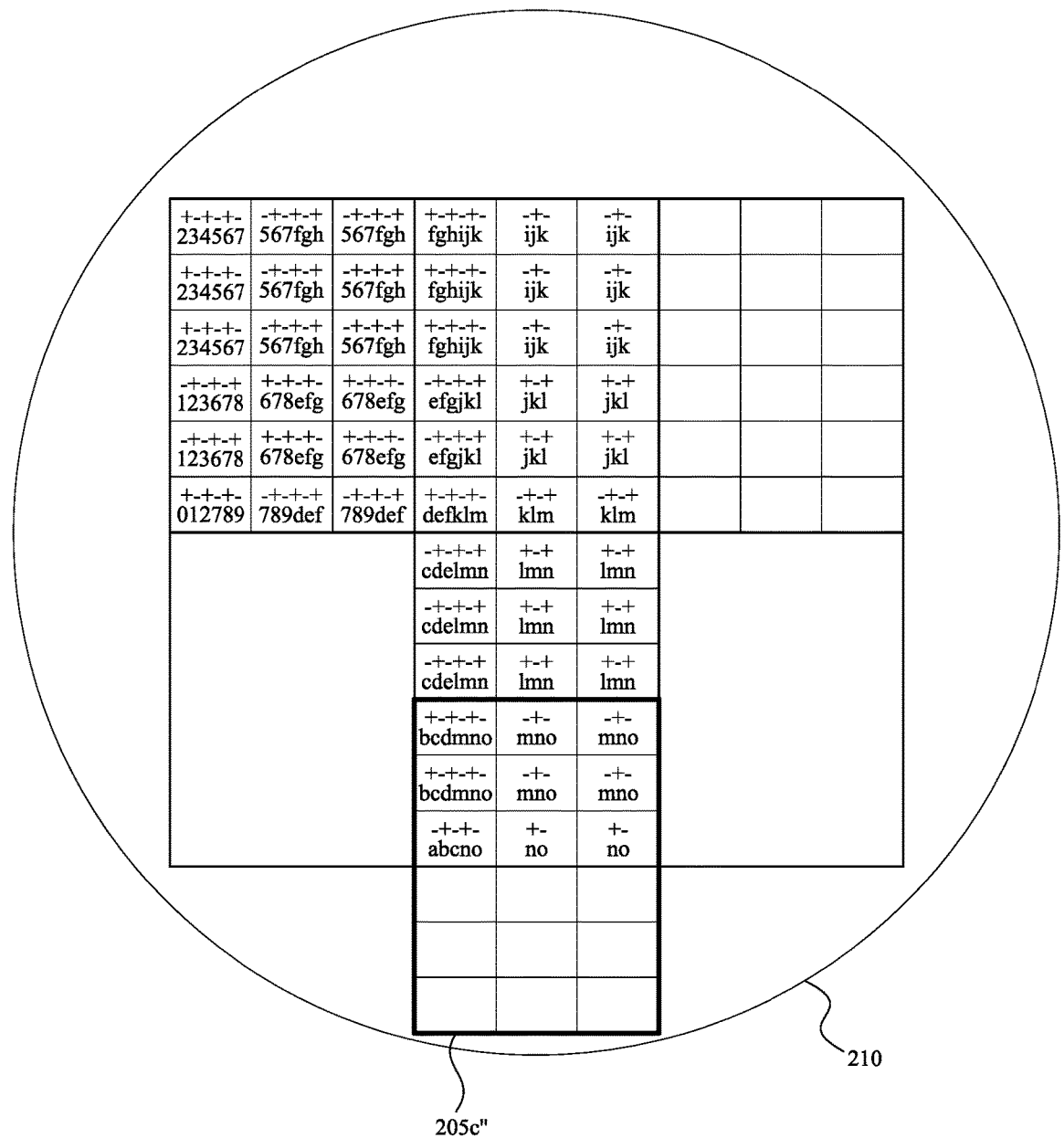
FIG. 85 shows one of various sequential operations in a method of exposing a photoresist layer on a semiconductor substrate according to an embodiment of the present disclosure.
Figure 86:
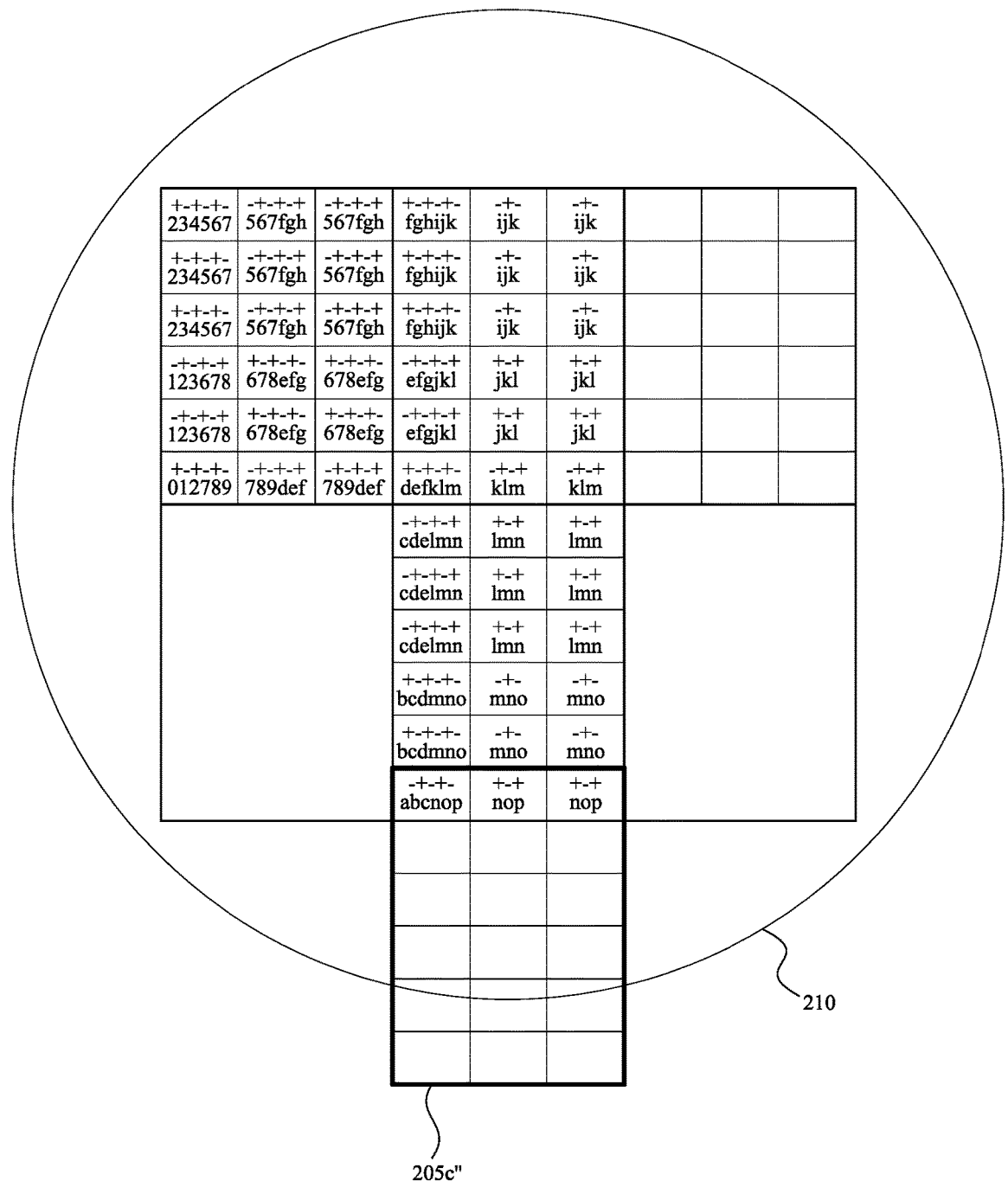
FIG. 86 shows one of various sequential operations in a method of exposing a photoresist layer on a semiconductor substrate according to an embodiment of the present disclosure.
Figure 87:
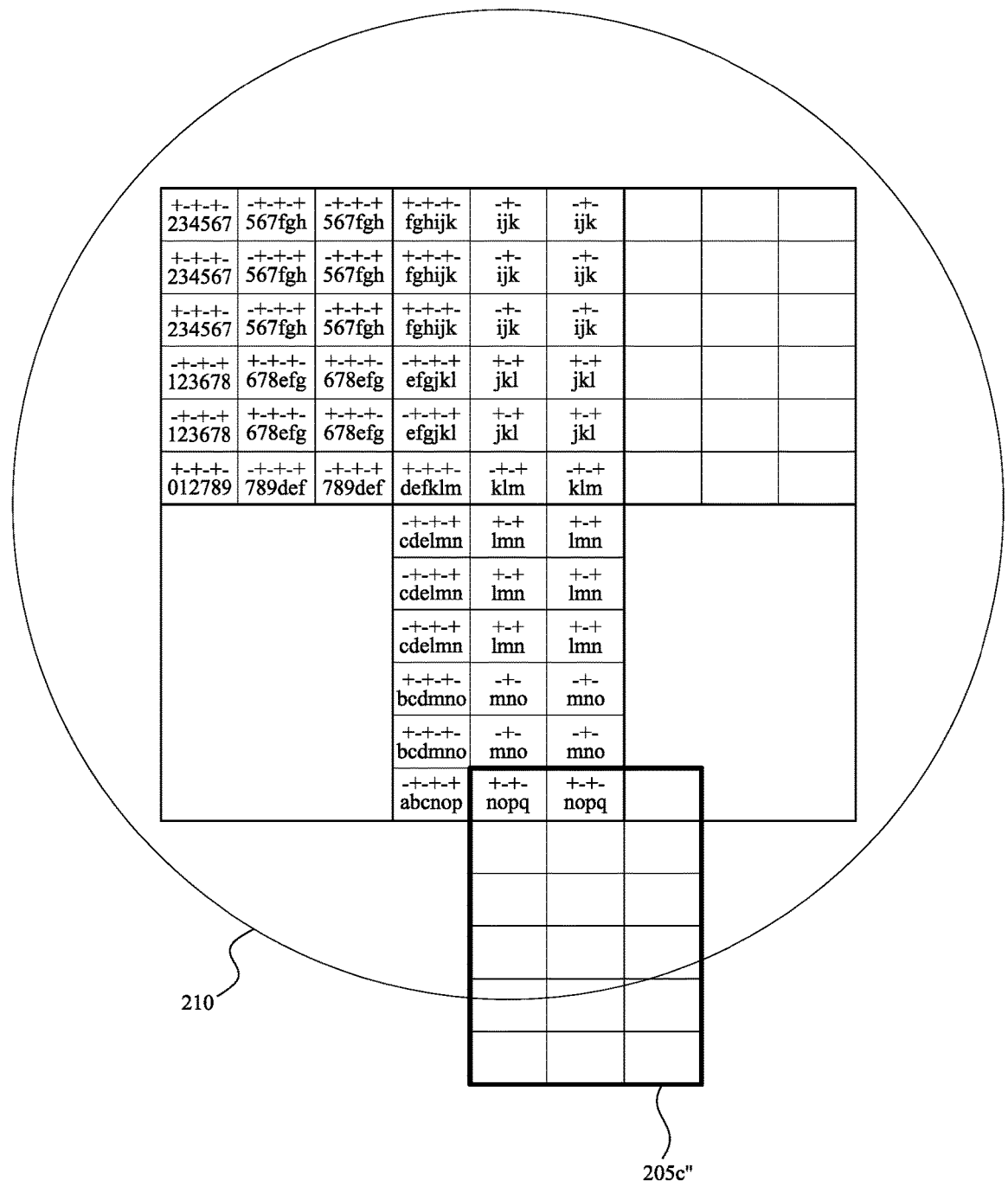
FIG. 87 shows one of various sequential operations in a method of exposing a photoresist layer on a semiconductor substrate according to an embodiment of the present disclosure.
Figure 88:
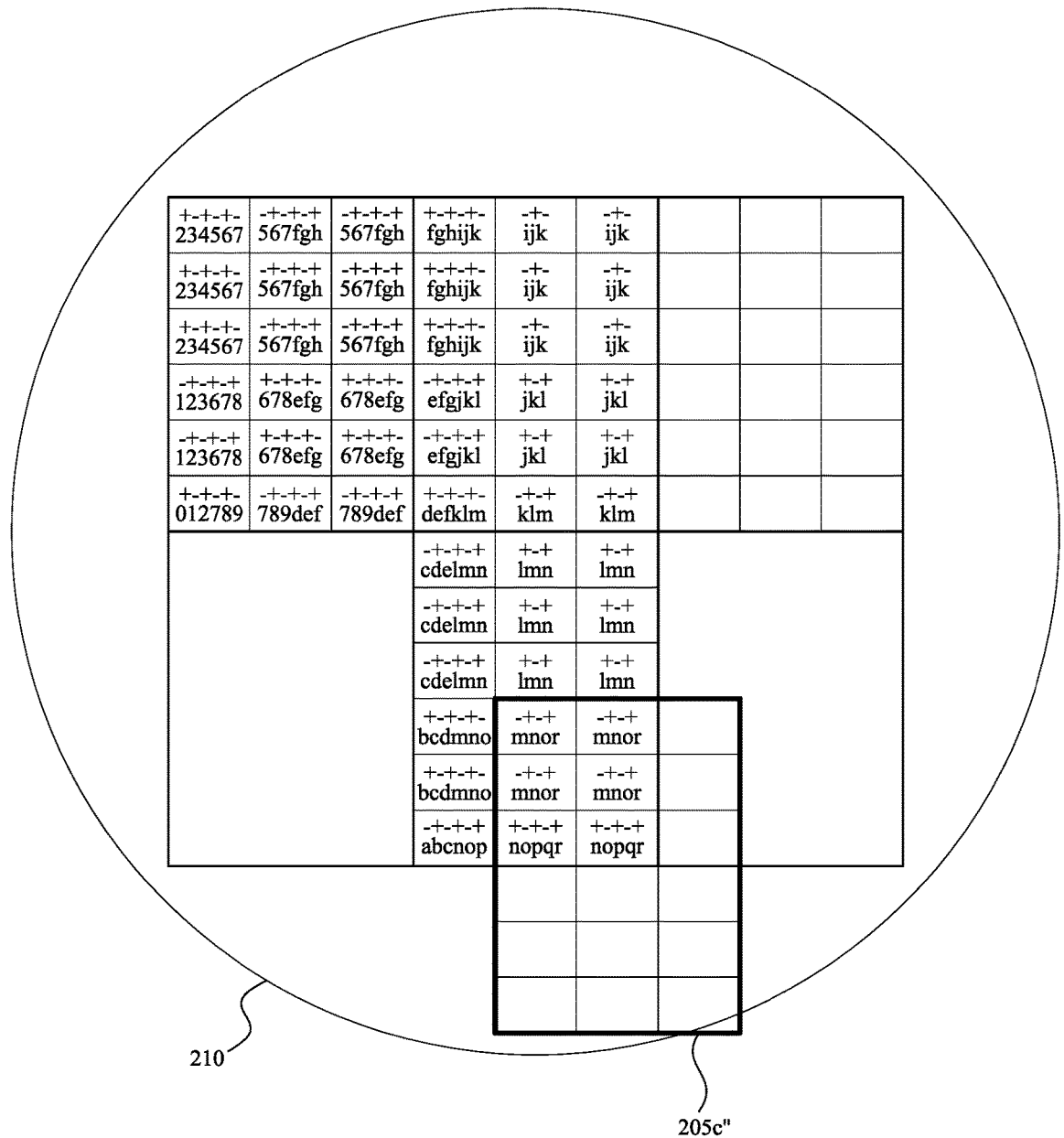
FIG. 88 shows one of various sequential operations in a method of exposing a photoresist layer on a semiconductor substrate according to an embodiment of the present disclosure.
Figure 90:
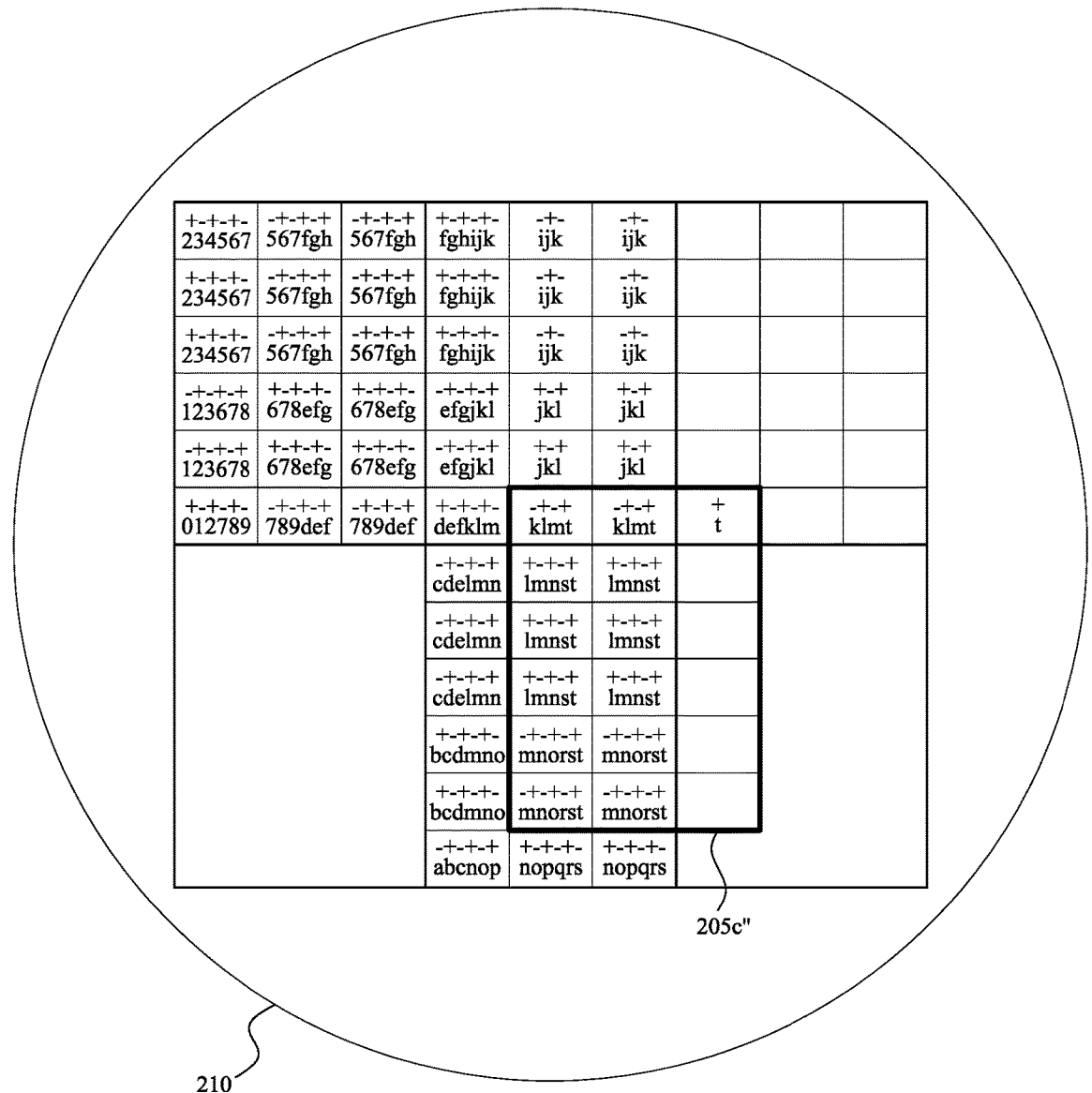
FIG. 90 shows one of various sequential operations in a method of exposing a photoresist layer on a semiconductor substrate according to an embodiment of the present disclosure.
Figure 91:
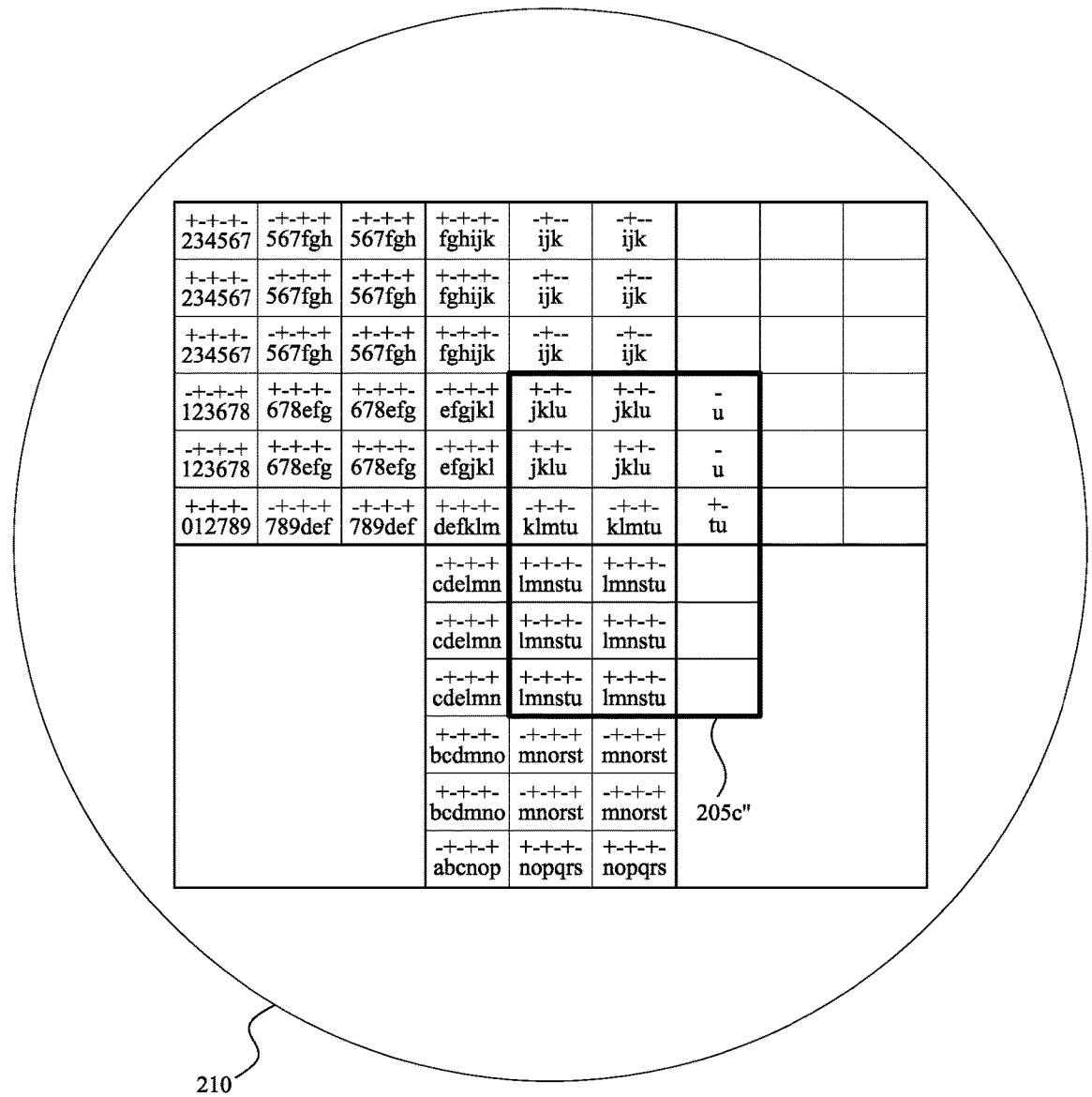
FIG. 91 shows one of various sequential operations in a method of exposing a photoresist layer on a semiconductor substrate according to an embodiment of the present disclosure.
Figure 92:
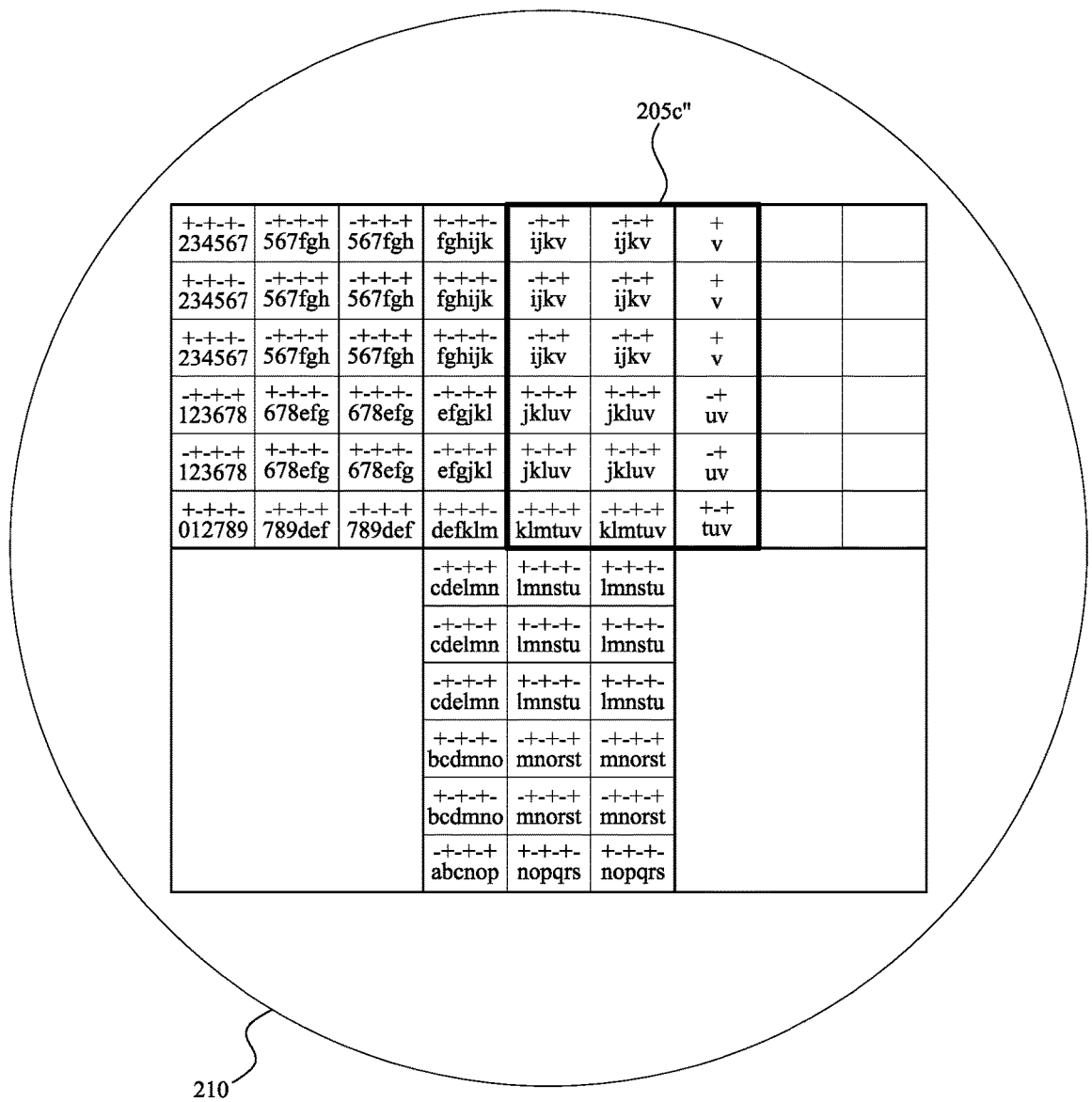
FIG. 92 shows one of various sequential operations in a method of exposing a photoresist layer on a semiconductor substrate according to an embodiment of the present disclosure.
Figure 93:
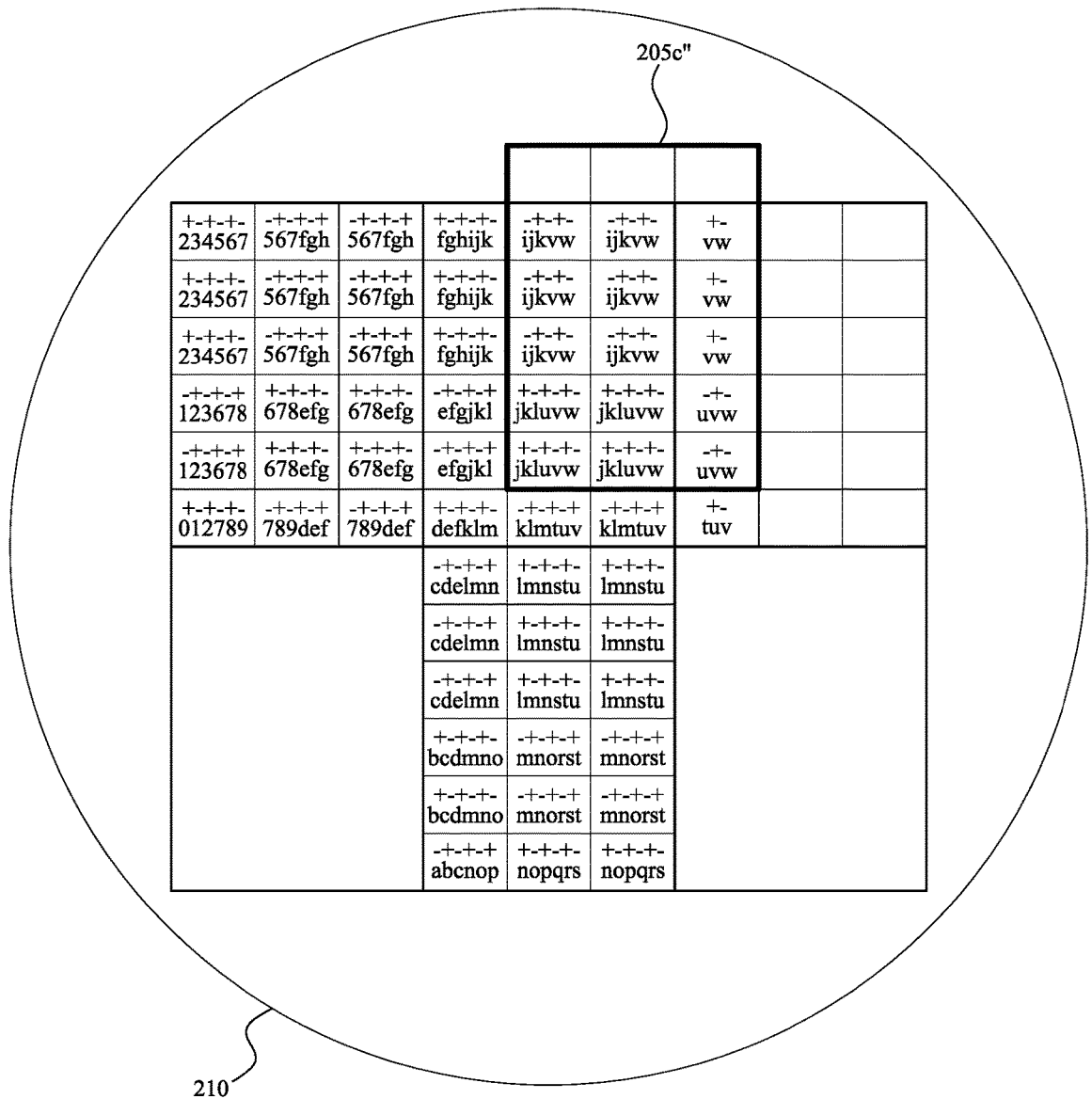
FIG. 93 shows one of various sequential operations in a method of exposing a photoresist layer on a semiconductor substrate according to an embodiment of the present disclosure.
Figure 94:
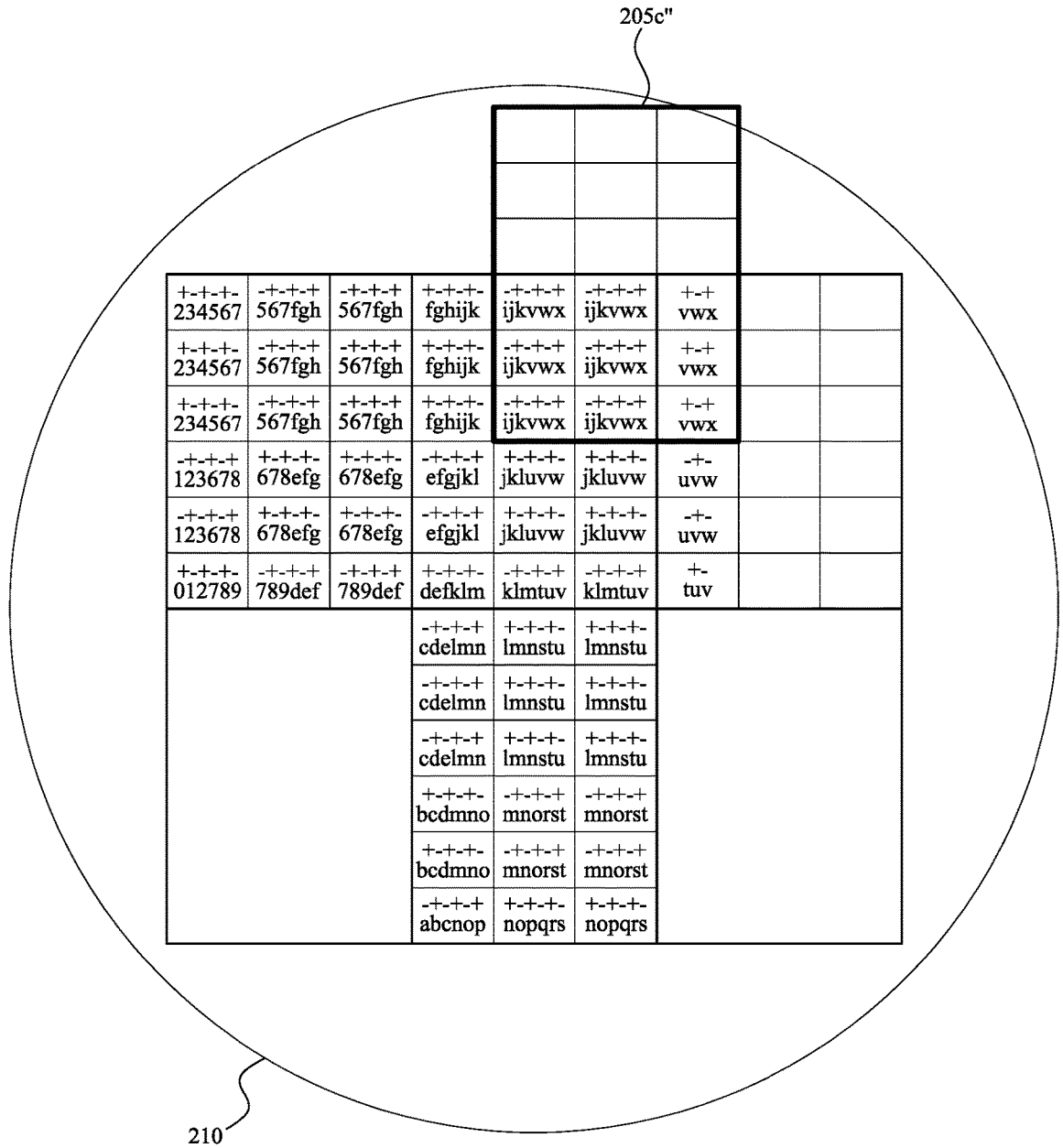
FIG. 94 shows one of various sequential operations in a method of exposing a photoresist layer on a semiconductor substrate according to an embodiment of the present disclosure.

Then, the mask 205c" is stepped two die widths to the right, as shown in FIG. 79, and the top three rows of middle exposure field are exposed. This exposure (i) is above the target focus position (−). Then, as shown in FIGS. 80, 81, 82, 83, 84, 85, and 86, an alternating sequence of below focus position and above focus position exposures, combined with an alternating sequence of the two die width step down, three die width step down, and one die width step down is performed. The mask 205c" is subsequently stepped one die width to the right relative to the semiconductor substrate 210, as shown in FIG. 87, and an exposure is performed. This exposure (q) is above the target focus position (−).

Figure 95:
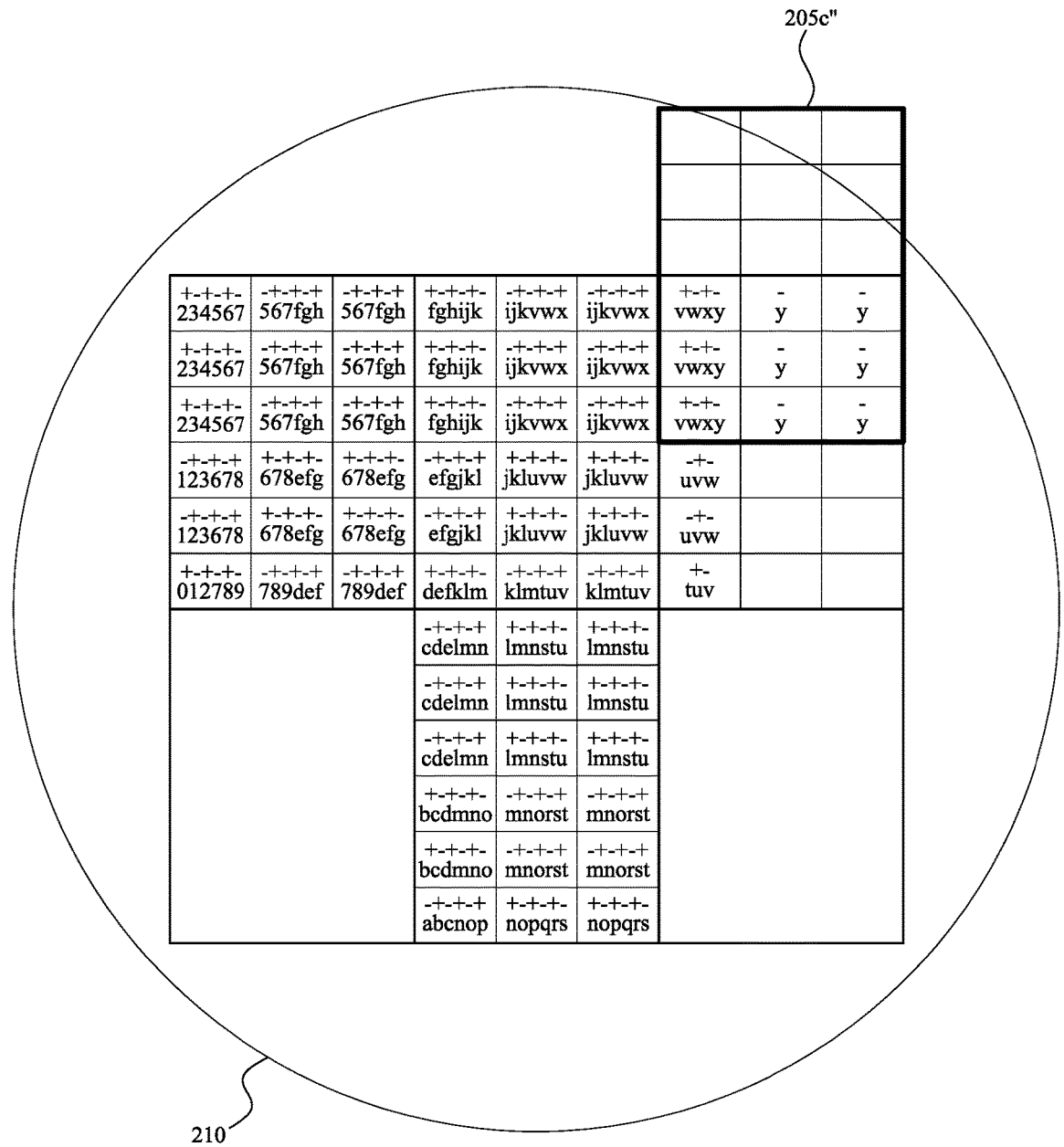
FIG. 95 shows one of various sequential operations in a method of exposing a photoresist layer on a semiconductor substrate according to an embodiment of the present disclosure.
Figure 96:
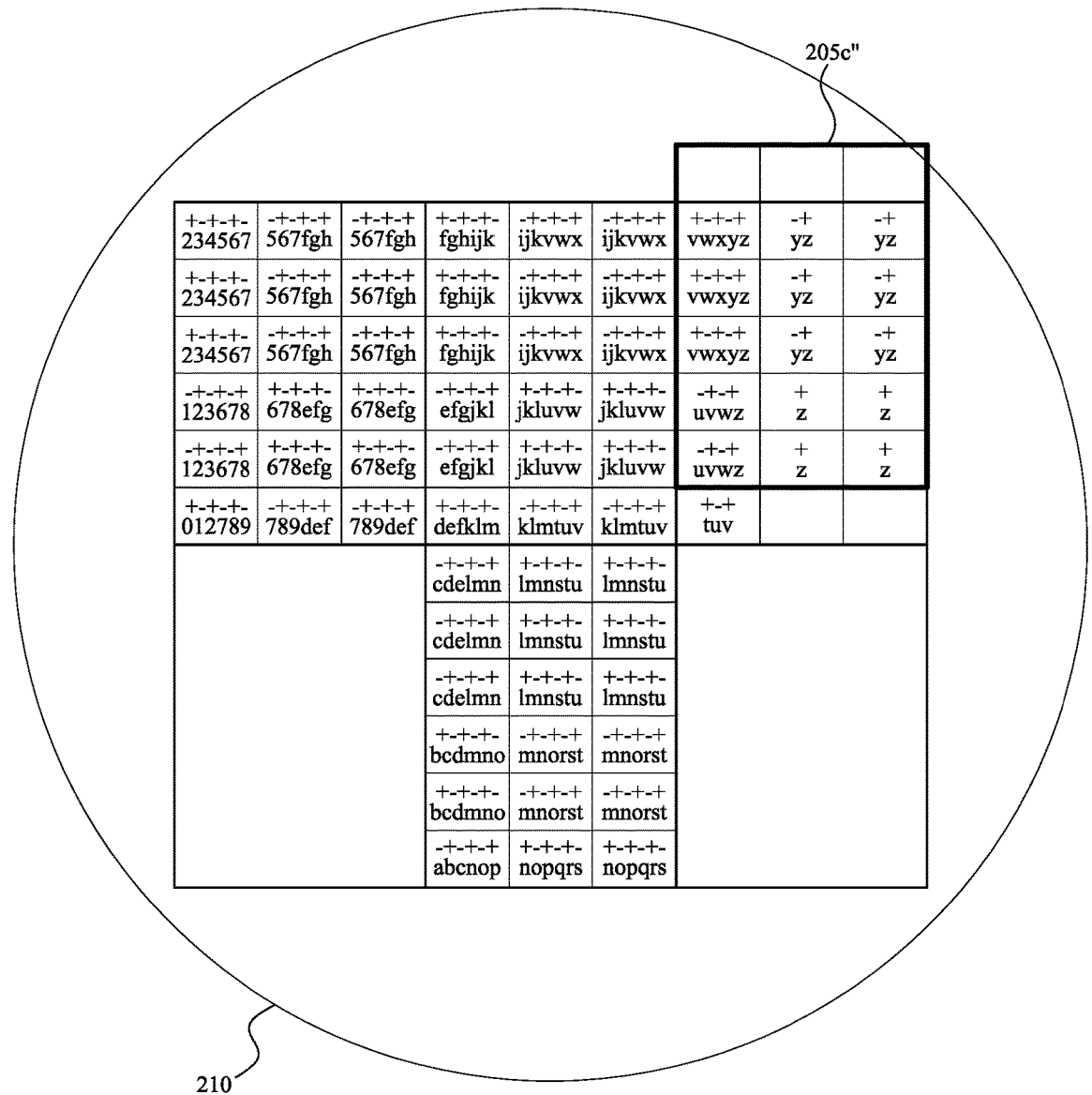
FIG. 96 shows one of various sequential operations in a method of exposing a photoresist layer on a semiconductor substrate according to an embodiment of the present disclosure.
Figure 97:
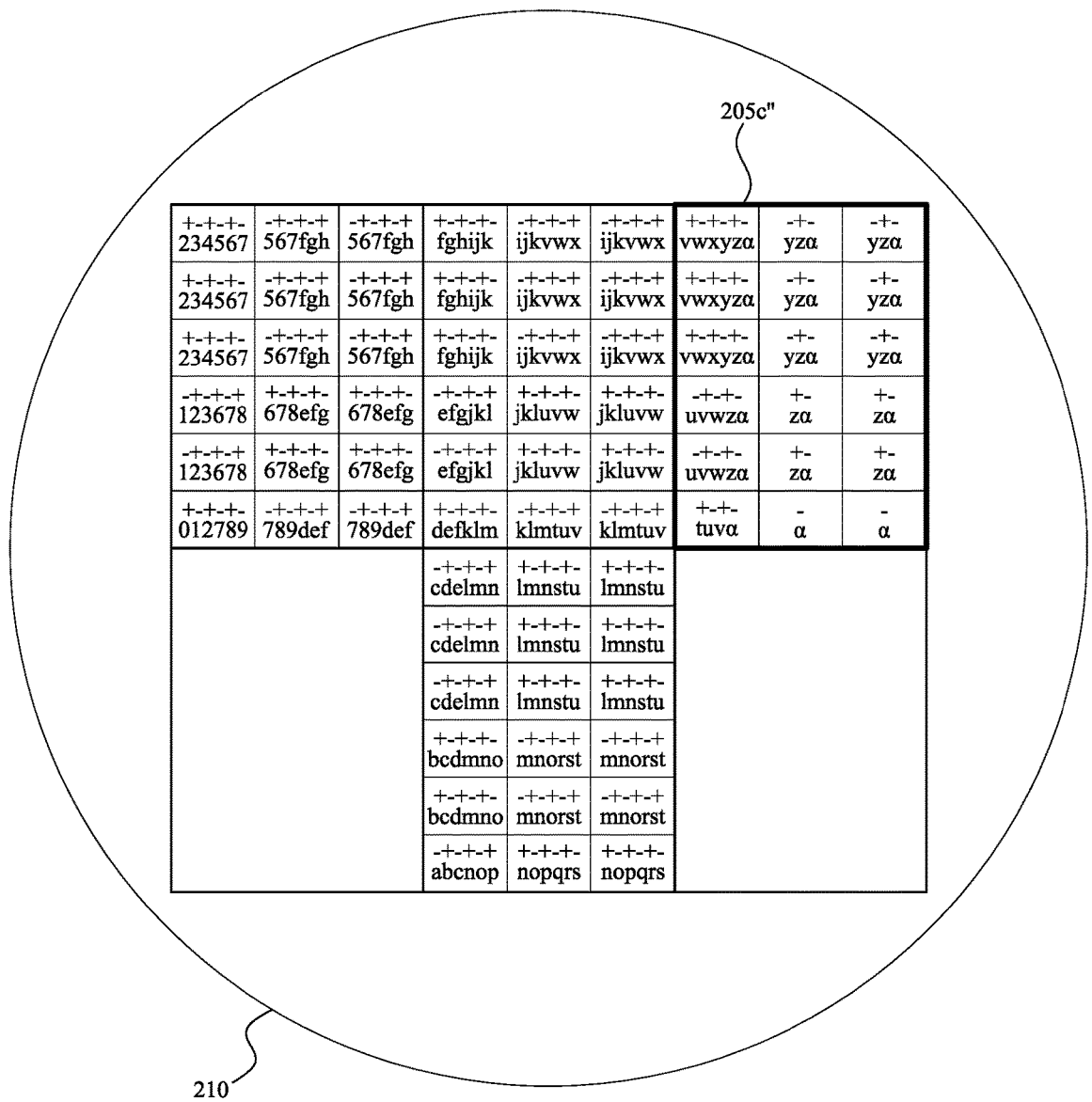
FIG. 97 shows one of various sequential operations in a method of exposing a photoresist layer on a semiconductor substrate according to an embodiment of the present disclosure.
Figure 98:
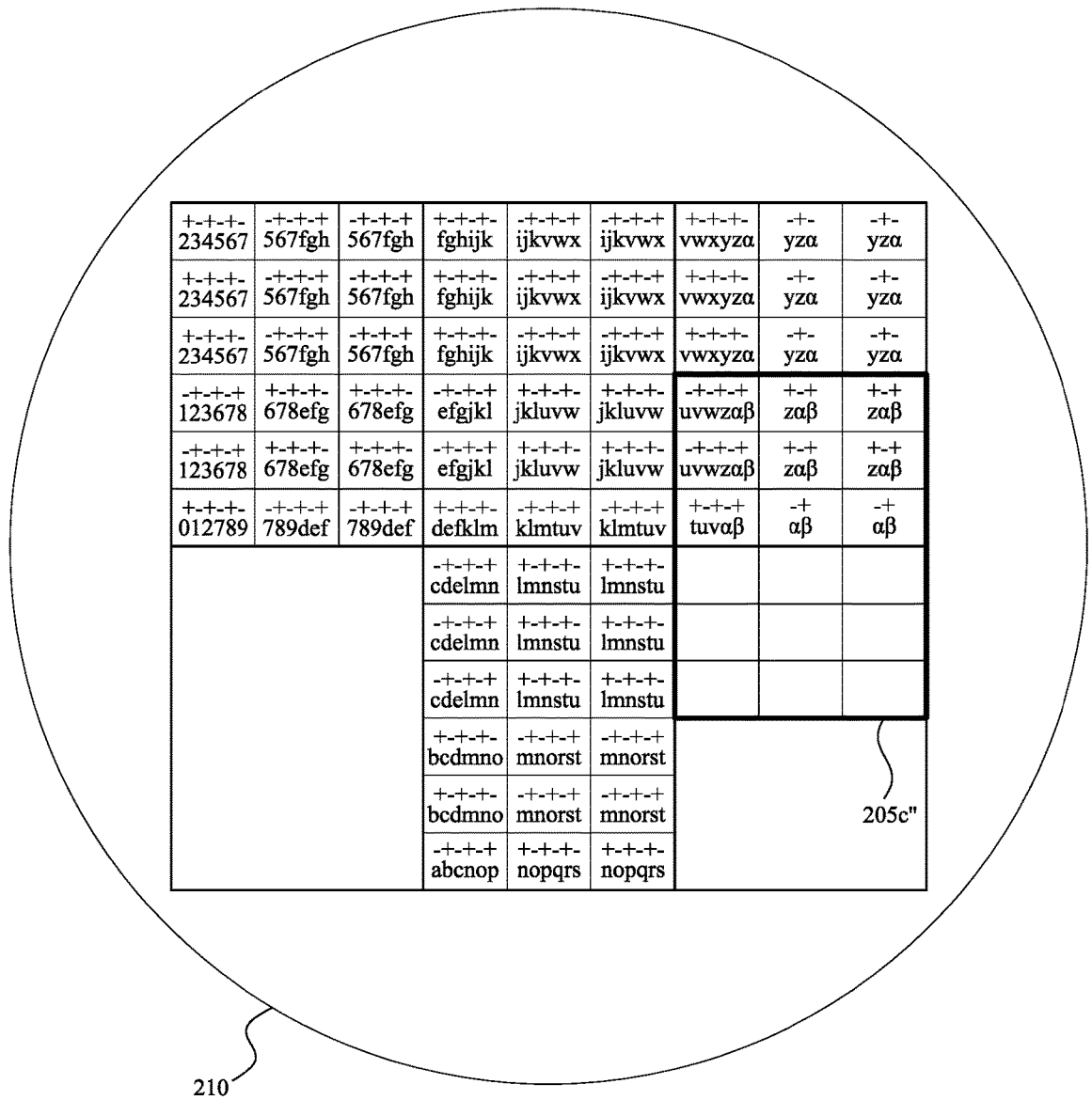
FIG. 98 shows one of various sequential operations in a method of exposing a photoresist layer on a semiconductor substrate according to an embodiment of the present disclosure.
Figure 99:
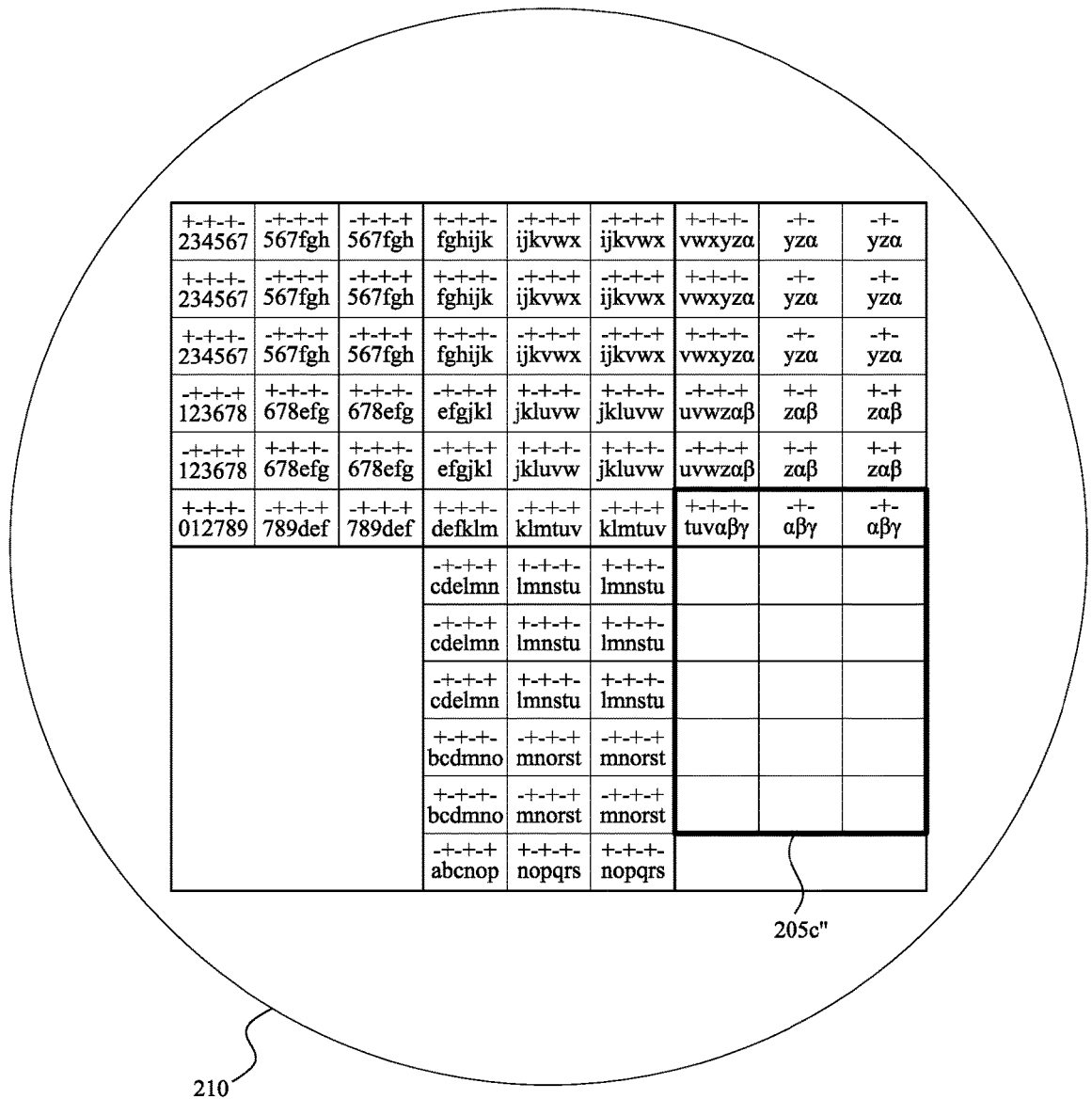
FIG. 99 shows one of various sequential operations in a method of exposing a photoresist layer on a semiconductor substrate according to an embodiment of the present disclosure.

As shown in FIGS. 88, 89, 90, 91, 92, 93, and 94, the alternating sequence of above focus position and below focus position exposures, combined with the alternating sequence of the two die width step up, three die width step up, and one die width step up are performed. Then, the mask 205c" is stepped two die widths to the right and the three uppermost rows of dies in the three leftmost columns are exposed (y) at a focus position above the target focus, as shown in FIG. 95.

Figure 100:
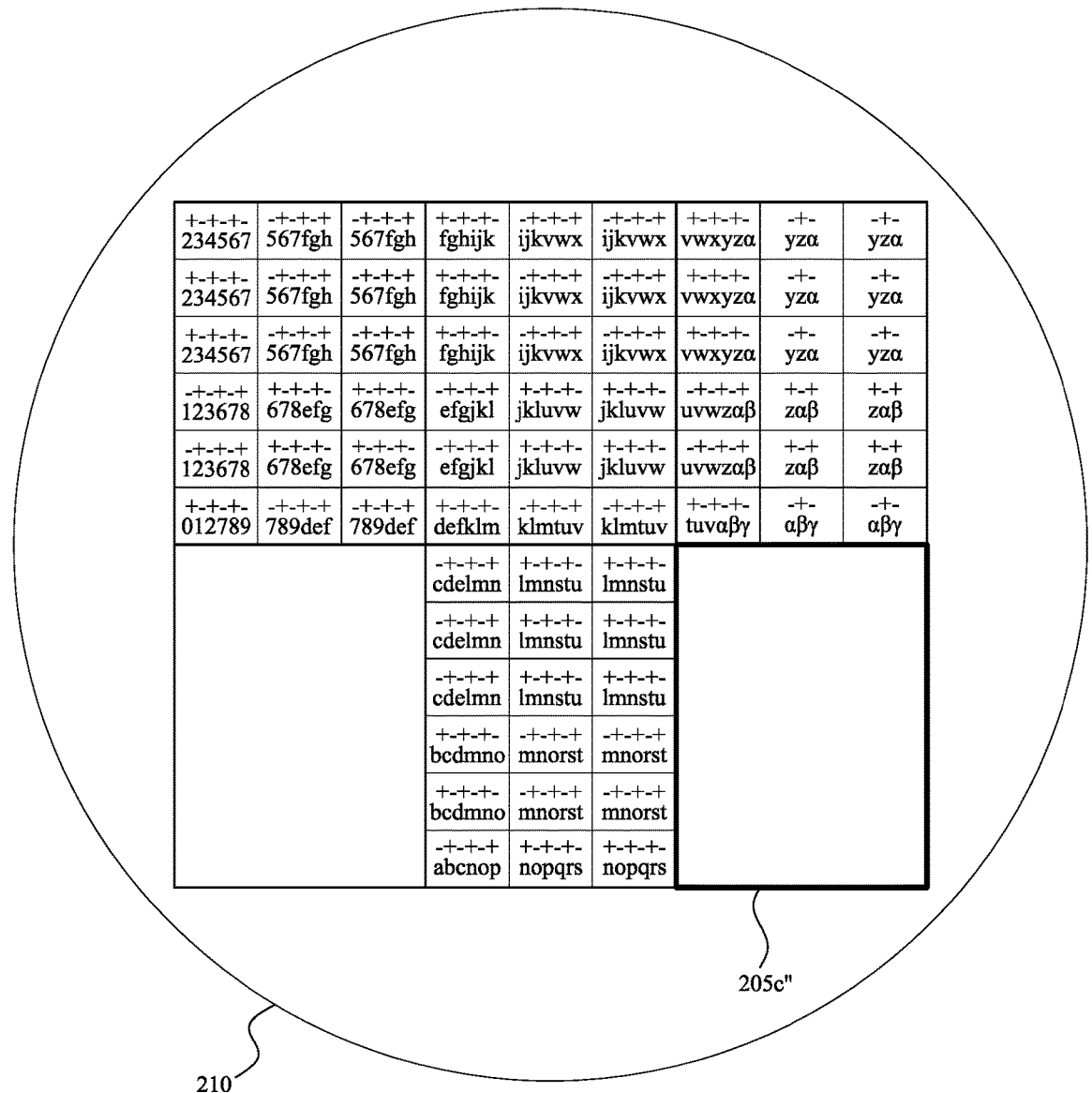
FIG. 100 shows one of various sequential operations in a method of exposing a photoresist layer on a semiconductor substrate according to an embodiment of the present disclosure.

Then, as shown in FIGS. 96, 97, 98, and 99, an alternating sequence of below focus position and above focus position exposures, combined with an alternating sequence of the two die width step down, three die width step down, and one die width step down is performed. The mask 205c" is subsequently stepped one die width down relative to the wafer 210 to be adjacent to the bottom row of the three leftmost columns of dies as shown in FIG. 100. No exposure is performed because the mask is not positioned over a portion of the wafer to be exposed. Starting with the exposure in FIG. 97, Greek letters are used to designate the shot numbers, as the English alphabet letters have all been used.

Figure 101:
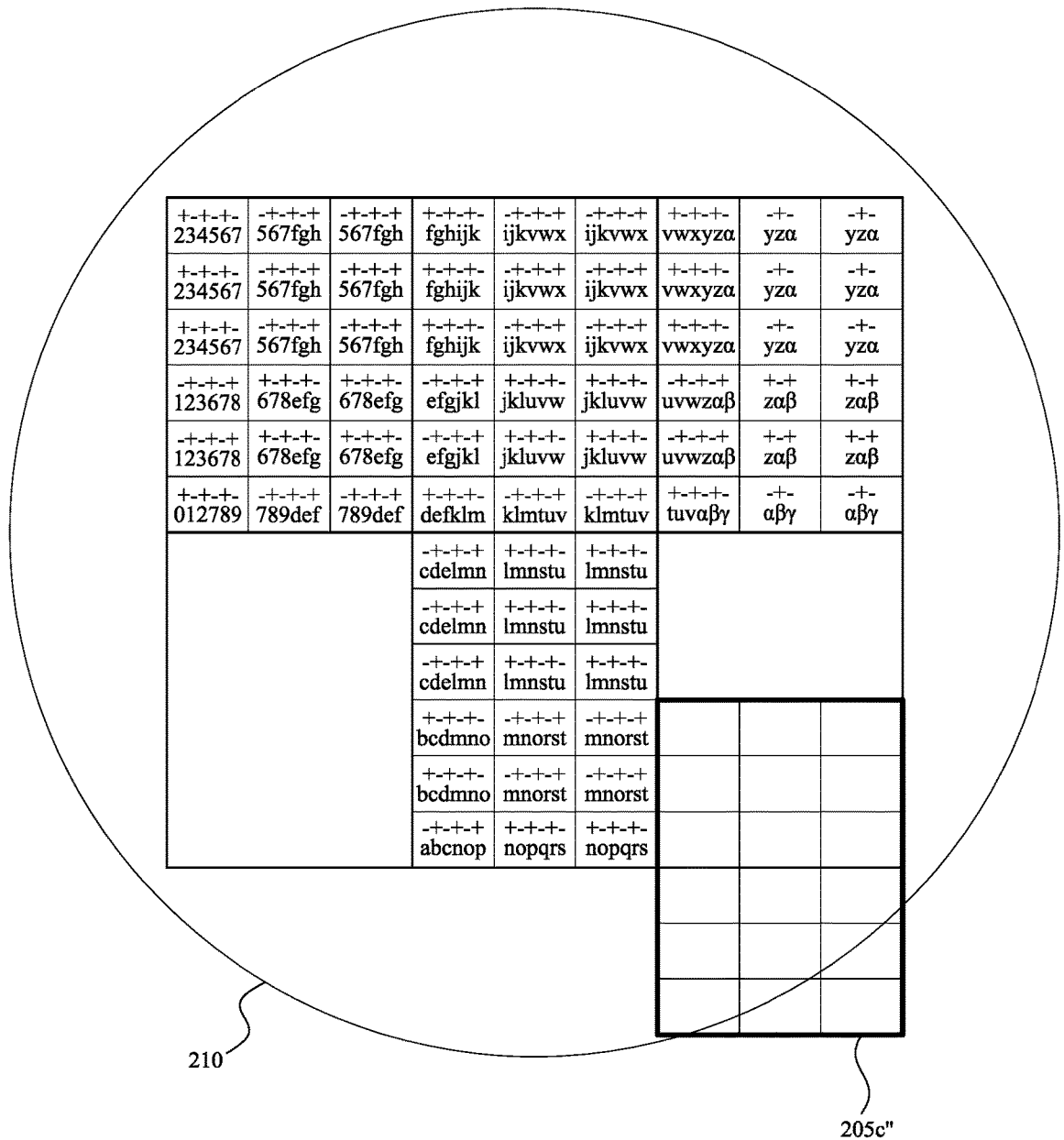
FIG. 101 shows one of various sequential operations in a method of exposing a photoresist layer on a semiconductor substrate according to an embodiment of the present disclosure.
Figure 102:
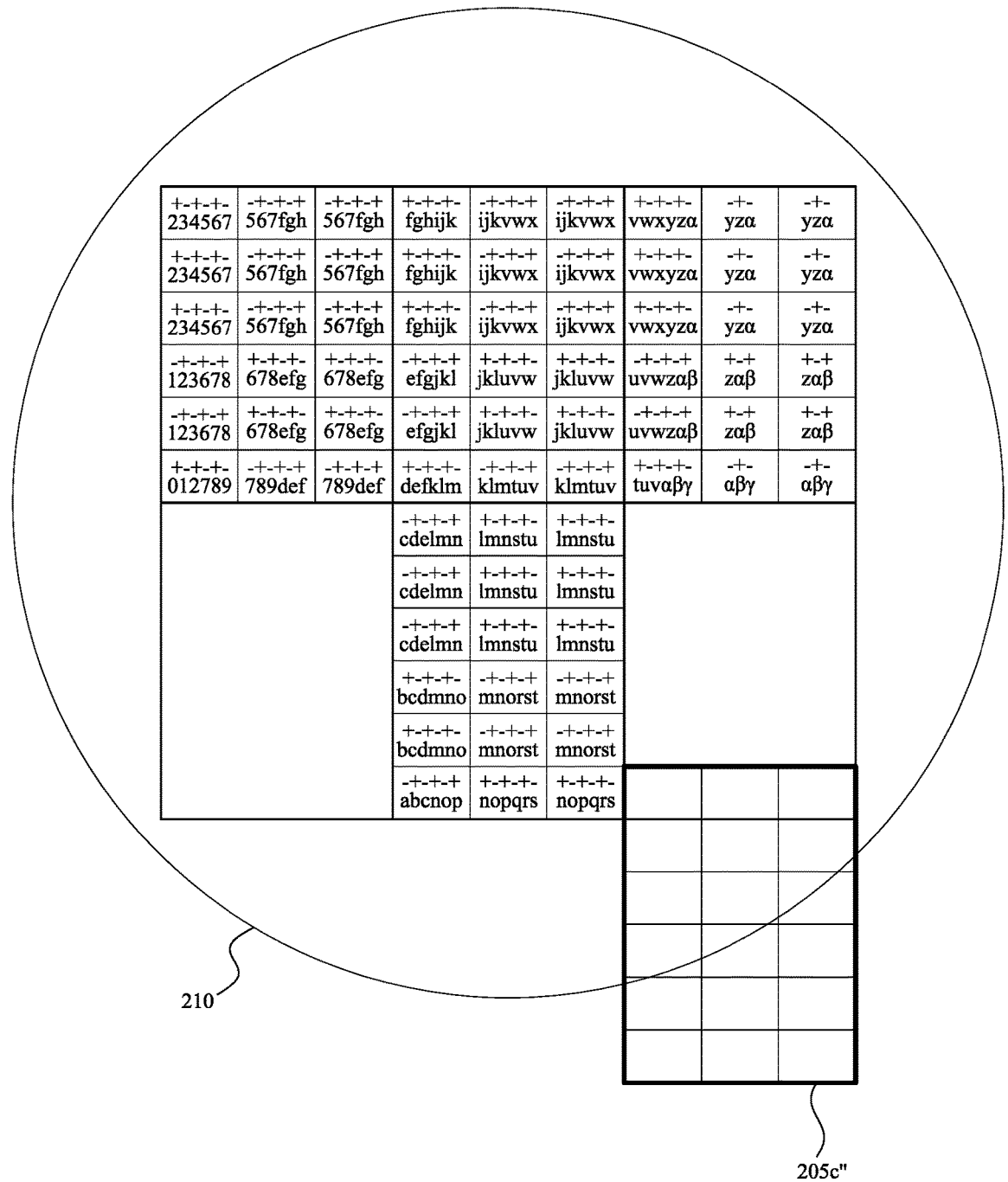
FIG. 102 shows one of various sequential operations in a method of exposing a photoresist layer on a semiconductor substrate according to an embodiment of the present disclosure.
Figure 103:
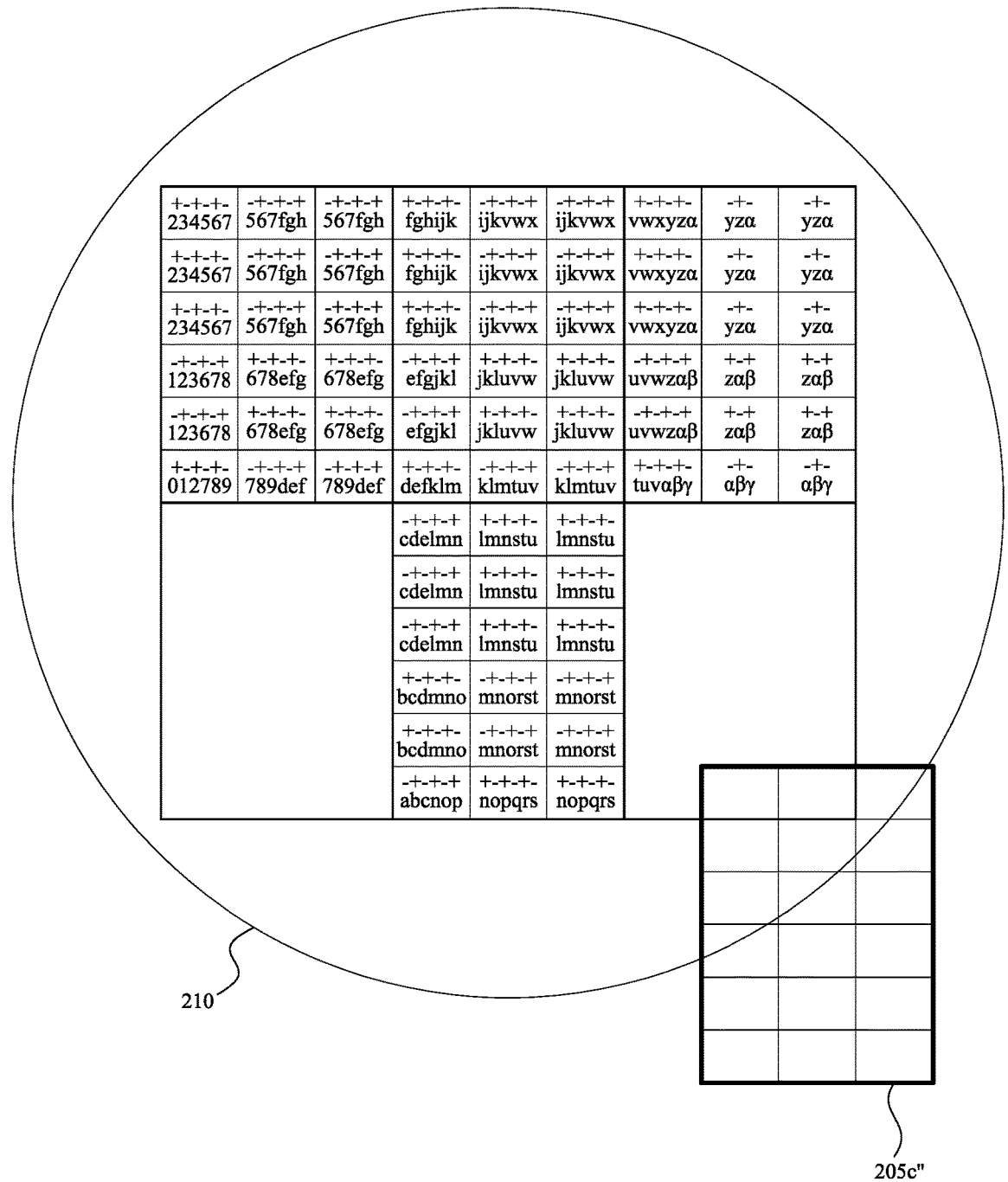
FIG. 103 shows one of various sequential operations in a method of exposing a photoresist layer on a semiconductor substrate according to an embodiment of the present disclosure.
Figure 104:
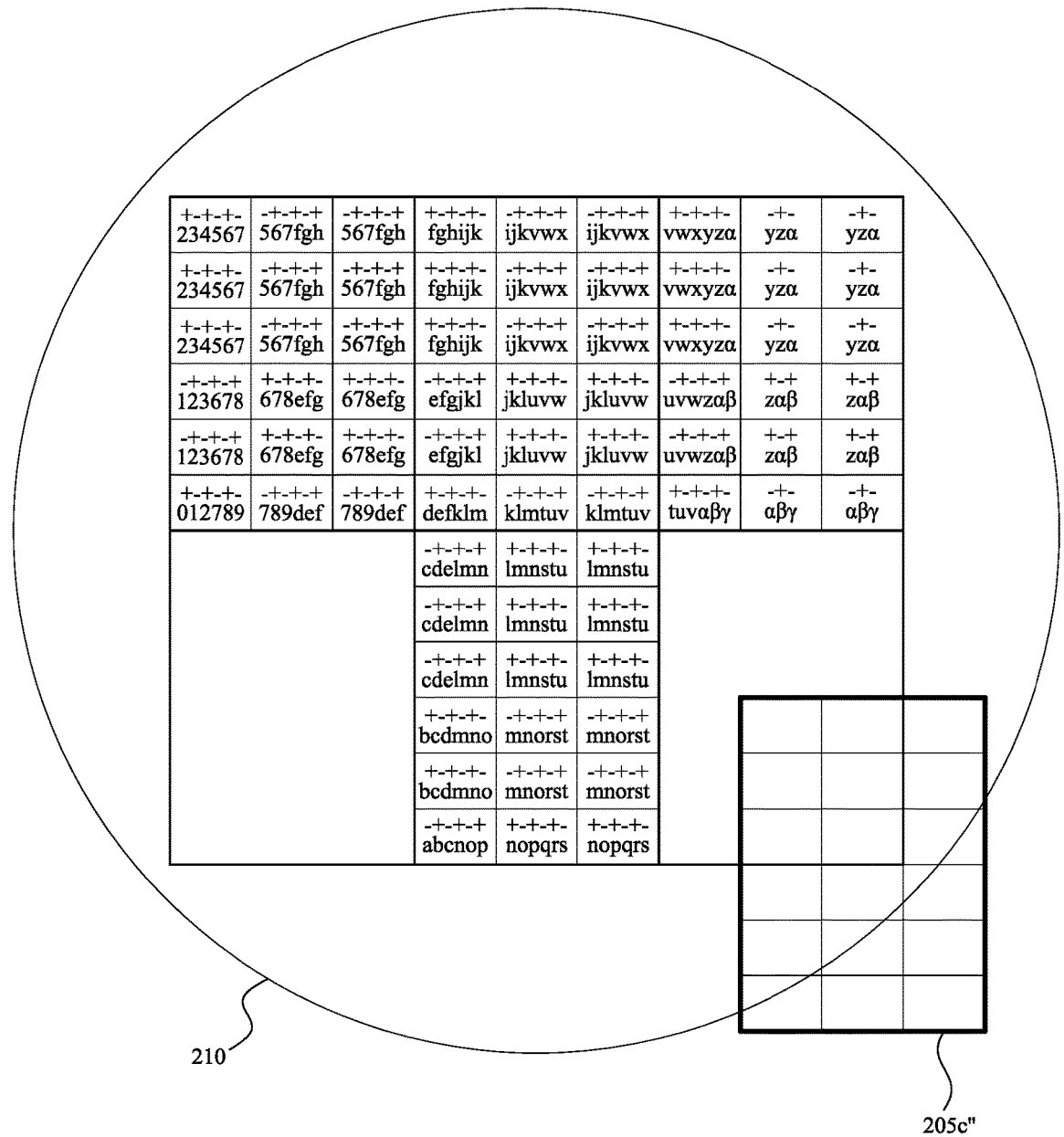
FIG. 104 shows one of various sequential operations in a method of exposing a photoresist layer on a semiconductor substrate according to an embodiment of the present disclosure.

In FIGS. 101 and 102 the mask is stepped downward relative to the wafer 210 three and two die widths, respectively, and no exposures are performed after the stepping operations. Then, the masked is stepped one die width to the right relative to the wafer 210 in FIG. 103. The mask 205c" is then stepped up relative to wafer 210 to the right relative to the semiconductor substrate 210, in two stepping operations of two die widths and three die widths, respectively, as shown in FIGS. 104 and 105, to be adjacent the two rightmost bottom row dies of the rightmost exposure field.

Figure 106:
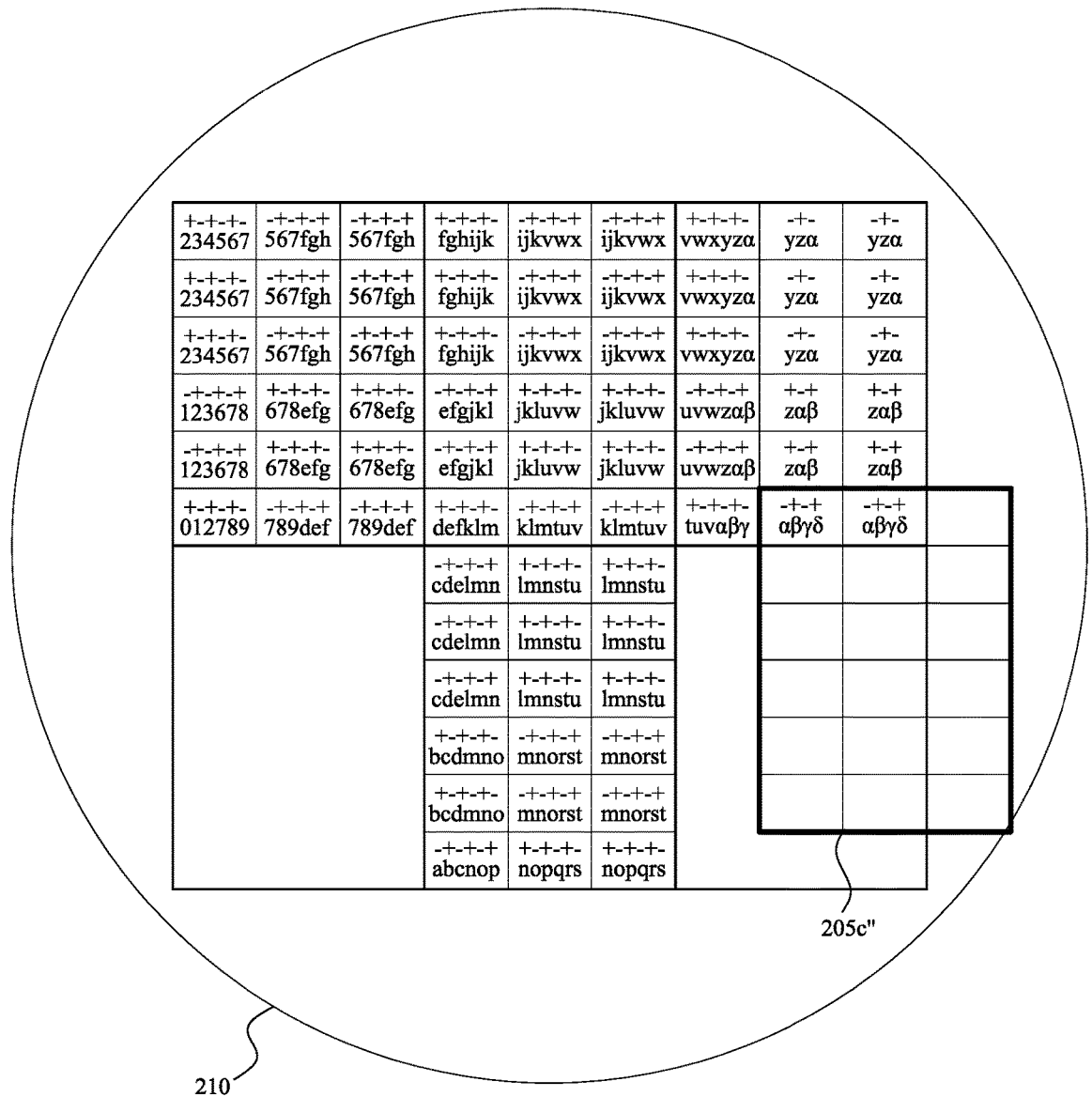
FIG. 106 shows one of various sequential operations in a method of exposing a photoresist layer on a semiconductor substrate according to an embodiment of the present disclosure.
Figure 107:
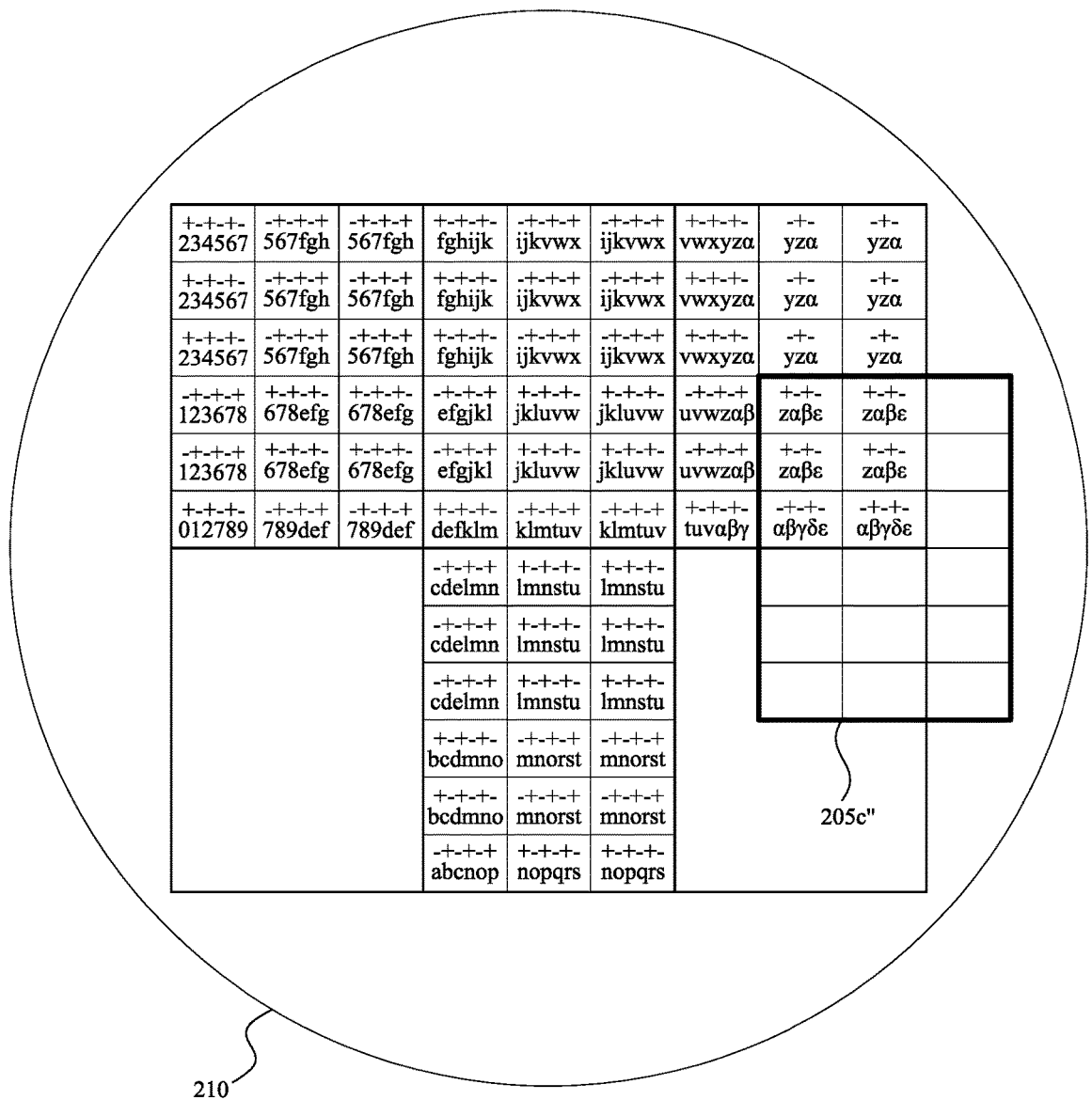
FIG. 107 shows one of various sequential operations in a method of exposing a photoresist layer on a semiconductor substrate according to an embodiment of the present disclosure.
Figure 108:
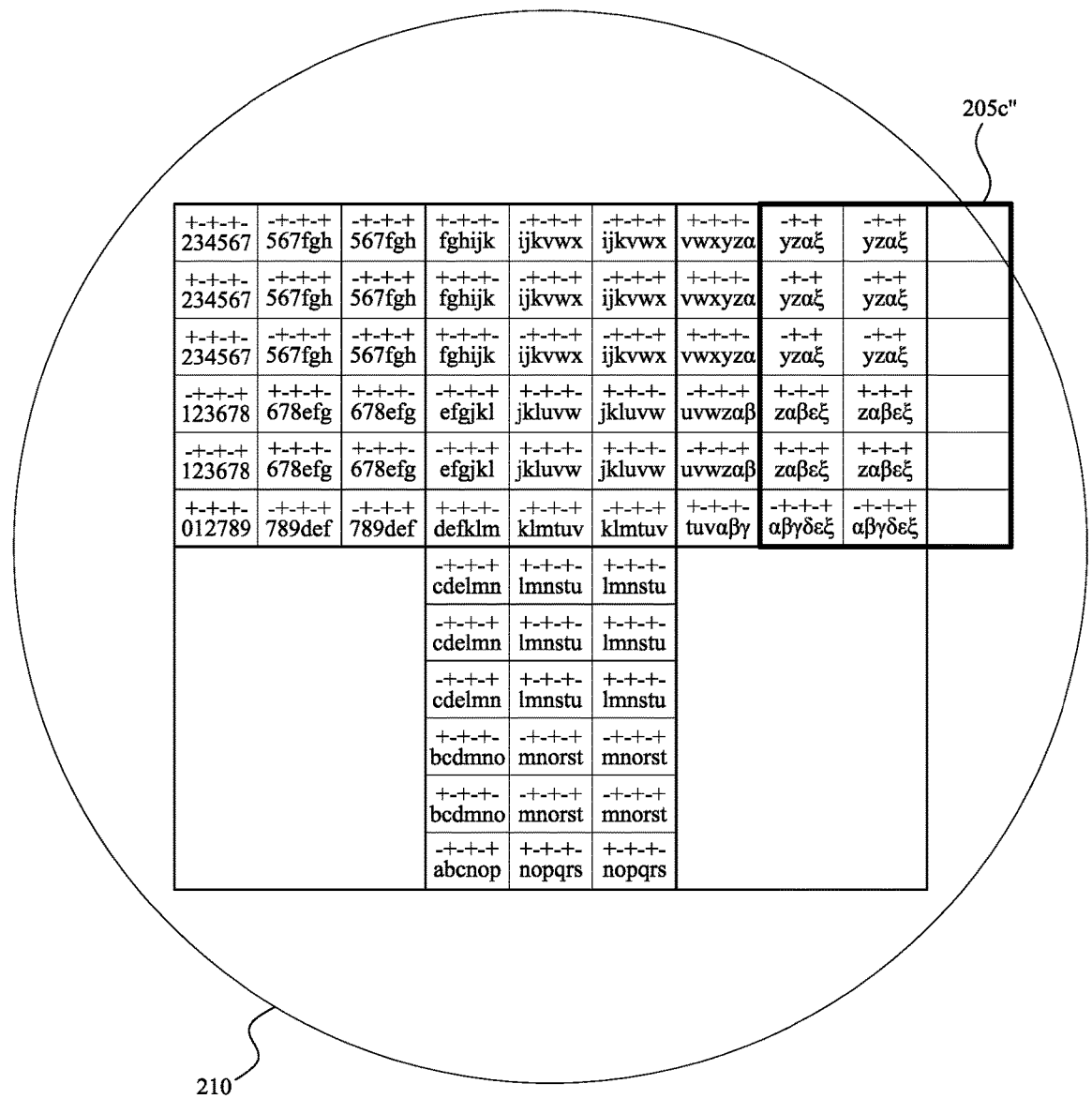
FIG. 108 shows one of various sequential operations in a method of exposing a photoresist layer on a semiconductor substrate according to an embodiment of the present disclosure.
Figure 109:
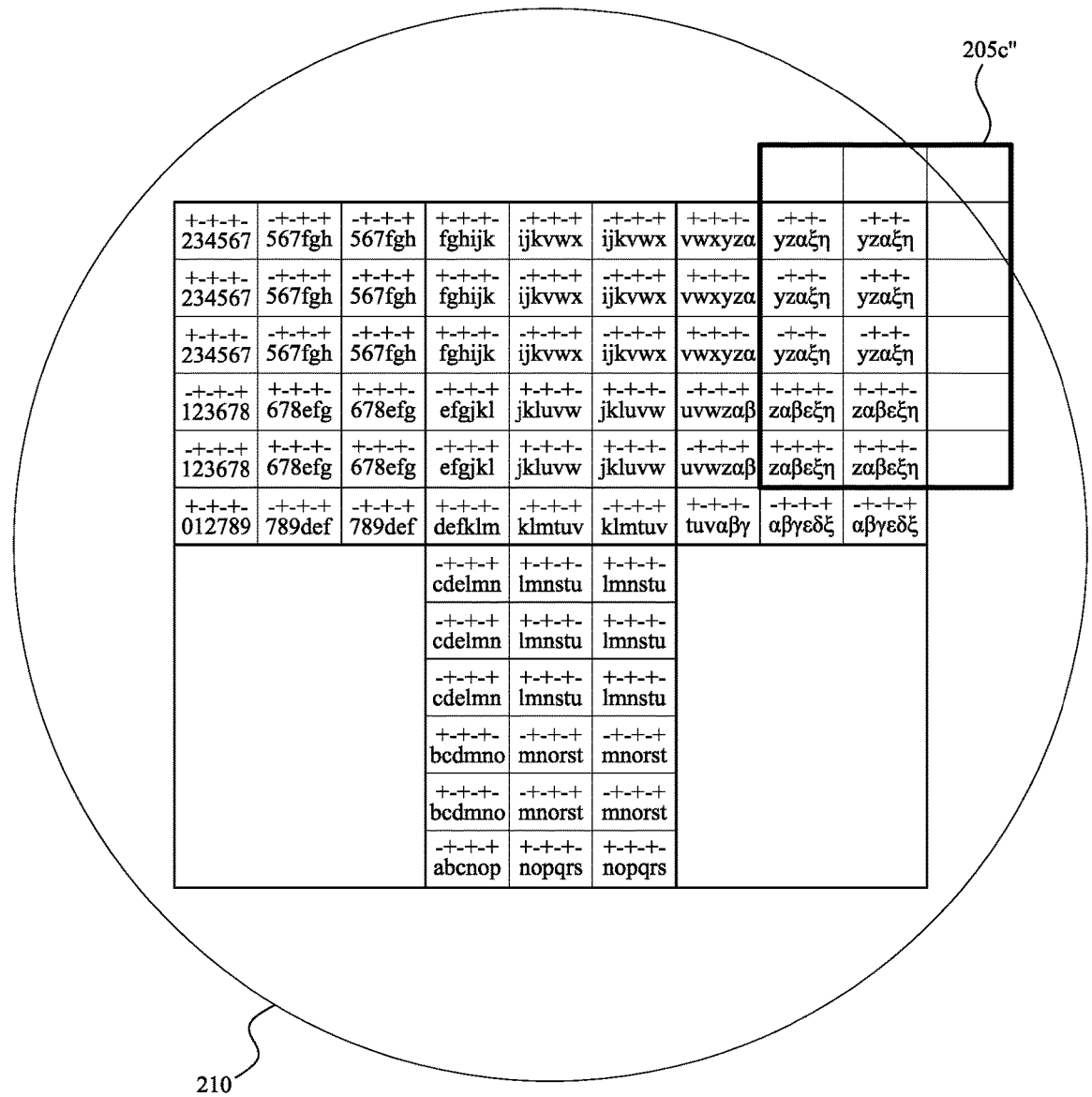
FIG. 109 shows one of various sequential operations in a method of exposing a photoresist layer on a semiconductor substrate according to an embodiment of the present disclosure.

Next, the mask 205c" is stepped one die width in the up direction and an exposure (δ) is performed below the target position (+), as shown in FIG. 106. As shown in FIGS. 107, 108, 109, and 110 the alternating sequence of above focus position and below focus position exposures, combined with the alternating sequence of the two die width step up, three die width step up, and one die width step up are performed.

In this embodiment, the stepping operations alternated between two die width, three die width, and one die width steps between exposures when the mask was moving relative to the wafer along the y axis, and stepping operations alternated between two die width and one die width steps between exposures when the mask was moving relative to the wafer along the x axis. The alternating sequence of above focus position and below focus position exposures, combined with the alternating sequences of stepping was performed until all the dies were exposed a same number of times, and all the above focus position exposures are each paired with a below focus position exposures.

In some embodiments, each die is exposed six times. In other embodiments, the exposure/stepping/exposure operations are arranged so that each die is exposed four times or eight times. In some embodiments, the total accumulated exposure dose each die receives is within about 75% to about 125% of a target exposure dose.

The present disclosure is not limited to the embodiments disclosed, and additional die matrix and mask arrangements are evident to one of skill in the art in view of this disclosure. Further, additional stepping sequences are evident to one of skill in this art in view of this disclosure.

In some embodiments, exposures at the target focus position are performed in addition to exposures above the target focus position and below the target focus position.

In some embodiments, a method of inspecting a photomask is provided. The method includes inspecting a mask including a plurality of the same circuit patterns. The mask is inspected. If a defect is found at a specific location of one of the circuit patterns and not found at the same locations in other same circuit patterns on the mask the mask passes the inspection. If a defect is found in one mask pattern it will not be resolved in the imaged photoresist in some embodiments.

In some embodiments, a mask having a plurality of the same circuit patterns is provided. One of the plurality of the same circuit patterns has a defect at a specific location. The other same circuit patterns do not have the same defect at the same location. The mask is acceptable for use in a photolithography process in some embodiments because the defect on only one of the plurality of same circuit patterns will not be resolved in the imaged photoresist exposed using the mask with the defect.

Although performing the multiple exposures at different focus positions may increase the time it takes to expose all the dies on the wafer, the overall semiconductor device manufacturing method is more efficient because of the decrease in defects and increased device yield provided by embodiments of the disclosure. Multiple exposures of the same portion of a photoresist layer by different portions of a mask having the same circuit pattern prevents defects or contaminant particles formed on a single mask pattern from adversely affecting the pattern formed in the photoresist layer using the mask with the defect or particulate contamination. In addition, performing multiple exposures of the same portion of a photoresist layer at different focus positions above and below the target focus improves the pattern resolution over the height of the pattern feature from the pattern feature base to the upper surface of the pattern feature. Performing the methods of the present disclosure provides improved image log slope (ILS) and improved mask error enhancement factor (MEEF).

An embodiment of the disclosure is a method of manufacturing a semiconductor device, includes coating a photoresist layer on a semiconductor substrate. A target total exposure dose is determined for the photoresist layer. A target focus position is determined for the photoresist layer. A first portion of the photoresist layer is exposed to a first exposure dose of extreme ultraviolet radiation at a first focus position using a first portion of an extreme ultraviolet mask. The semiconductor substrate is moved a first time relative to the extreme ultraviolet mask. The first portion of the photoresist layer is exposed to a second exposure dose of extreme ultraviolet radiation using a second portion of the mask at a second focus position, and a second portion of the photoresist layer is exposed to the second exposure dose at the second focus position using the first portion of the extreme ultraviolet mask. In an embodiment, the method includes moving the semiconductor substrate a second time relative to the mask, and exposing the first portion of the photoresist layer to a third exposure dose of extreme ultraviolet radiation at a third focus position using a third portion of the mask, exposing the second portion of the photoresist layer to the third exposure dose of extreme ultraviolet radiation at the third focus position using the second portion of the mask, and exposing a third portion of the photoresist layer to the third exposure dose at the third focus position using the first portion of the mask. In an embodiment, the method includes moving the semiconductor substrate a fourth time relative to the mask, and exposing the first portion of the photoresist layer to a fourth exposure dose of extreme ultraviolet radiation at a fourth focus position using a fourth portion of the mask, exposing the second portion of the photoresist layer to the fourth exposure dose of extreme ultraviolet radiation at the fourth focus position using the third portion of the mask, exposing a third portion of the photoresist layer to the fourth exposure dose at the fourth focus position using the second portion of the mask, and exposing a fourth portion of the photoresist layer to the fourth exposure dose of extreme ultraviolet radiation at the fourth focus position using the first portion of the mask. In an embodiment, the first portion of the mask, the second portion of the mask, the third portion of the mask, and the fourth portion of the mask each have a same pattern. In an embodiment, the first exposure dose, the second exposure dose, the third exposure dose, and the fourth exposure dose are different. In an embodiment, the first exposure dose and the third exposure dose are same, and the second exposure dose and the fourth exposure dose are same. In an embodiment, the first focus position is above the target focus position, the second focus position is below the target focus position, the third focus position is above the target focus position, and the fourth focus position is below the target focus position. In an embodiment, each of the first exposure dose, the second exposure dose, the third exposure dose, and the fourth exposure dose is less than the target exposure dose. In an embodiment, the method includes performing additional exposure steps such that each portion of the photoresist layer is exposed a same number of times. In an embodiment, a total of all the exposure doses received by each portion of the photoresist layer is equal to the target exposure dose. In an embodiment, the focus position alternates between above the target focus position and below the target focus position.

Another embodiment of the disclosure is a method of manufacturing a semiconductor device, including dividing Nax into p terms, where Nax is a number of dies along an x axis in a die matrix in each exposure field in an exposure field matrix to be delineated on a semiconductor substrate and each of the p terms is at least 1, wherein the x axis is parallel to one edge of a smallest rectangle enclosing the exposure field matrix, called the exposure field matrix enclosure. Nay is divided into q terms, where Nay is a number of dies along a y axis in the die matrix and each of the q terms is at least 1, wherein the y axis is perpendicular to the x axis. A sequence SNx0 is formed by repeating Nbx+1 times the p terms in order, where Nbx is an integer closest to Rx/Fx, where Rx is a size along the x axis of the exposure field matrix enclosure and Fx is an exposure field size along the x axis. A sequence SNx1 is formed by eliminating first and last elements of SNx0, and a sequence SNx is formed by multiplying each element of SNx1 by Dx, where Dx is a die size along the x axis. A sequence SNxr is formed by reversing an order of SNx. A sequence SNy0 is formed by repeating Nby+1 times the q terms in order, where Nby is an integer closest to Ry/Fy, where Ry is a size along the y axis of the exposure field matrix enclosure and Fy is an exposure field size along the y axis. A sequence SNy1 is formed by eliminating first and last elements of SNy0. A sequence SNy is formed by multiplying each element of SNy1 by Dy, where Dy is a die size along the y axis. A sequence SNyr is formed by reversing an order of SNy. p*(Nbx+1)−2 stepping operations are performed in a third direction and first sequence exposure/stepping/exposure operations and second sequence exposure/stepping/exposure operations are performed alternately between any two adjacent stepping operations as well as before a first stepping operation and after a last stepping operation. A distance of each stepping operation in order follows the sequence SNx. The first sequence exposure/stepping/exposure operations include q*(Nby+1)−2 stepping operations in a first direction and one exposure operation between any two adjacent stepping operations as well as before a first stepping operation and after a last stepping operation, where the distance of each stepping operation in order follows the sequence SNy. The first exposure operation in the first sequence exposure/stepping/exposure operations exposes Nax_1*Nay_1 dies in a corner of an exposure field in a corner of the exposure field matrix enclosure. The second sequence exposure/stepping/exposure operations include q*(Nby+1)−2 stepping operations in a second direction and one exposure operation between any two adjacent stepping operations as well as before a first stepping operation and after a last stepping operation. The distance of each stepping operation in order follows the sequence SNyr. In an embodiment, focus settings of all exposure operations in order alternate between Fo−dF and Fo+dF, where Fo is an optimum focus position, Fo−dF is a focus position above the optimum focus position, and Fo+dF is a focus position below the optimum focus position. In an embodiment, a total exposure dose accumulated in each die is within 0.9*Eo to 1.1*Eo, where Eo is an optimum exposure dose. In an embodiment, the method includes skipping exposure operations for missing exposure fields in the exposure field matrix enclosure. In an embodiment, the method includes merging stepping operations from after a previous exposure operation to before a subsequent exposure operation into one stepping operation which moves directly from a previous exposure location to a subsequent exposure location. In an embodiment, both the exposure field corner and the exposure field matrix enclosure corner are lower left corners as viewed in plan view, the first direction is in the +y direction, the second direction is in the −y direction, and the third direction is in the +x direction. In an embodiment, both the exposure field corner and the exposure field matrix enclosure corner are upper left corners as viewed in plan view, the first direction is in the −y direction, the second direction is in the +y direction, and the third direction is in the +x direction. In an embodiment, both the exposure field corner and the exposure field matrix enclosure corner are lower right corners as viewed in plan view, the first direction is in the +y direction, the second direction is in the −y direction, and the third direction is in the −x direction. In an embodiment, both the exposure field corner and the exposure field matrix enclosure corner are upper right corners as viewed in plan view, the first direction is in the −y direction, the second direction is in the +y direction, and the third direction is in the −x direction.

Another embodiment of the disclosure is a method of manufacturing a semiconductor device including dividing Nax into p terms, where Nax is a number of dies along an x axis in a die matrix in each exposure field in an exposure field matrix to be delineated on a semiconductor substrate and each of the p terms is at least 1, wherein the x axis is parallel to one edge of a smallest rectangle enclosing the exposure field matrix, called the exposure field matrix enclosure. Nay is divided into q terms, where Nay is a number of dies along a y axis in the die matrix and each of the q terms is at least 1, wherein the y axis is perpendicular to the x axis. A sequence SNx0 is formed by repeating Nbx+1 times the p terms in order, where Nbx is an integer closest to Rx/Fx, where Rx is a size along the x axis of the exposure field matrix enclosure and Fx is an exposure field size along the x axis. A sequence SNx1 is formed by eliminating first and last elements of SNx0. A sequence SNx is formed by multiplying each element of SNx1 by Dx, where Dx is a die size along the x axis, and a sequence SNxr is formed by reversing an order of SNx. A sequence SNy0 is formed by repeating Nby+1 times the q terms in order, where Nby is an integer closest to Ry/Fy, where Ry is a size along the y axis of the exposure field matrix enclosure and Fy is an exposure field size along the y axis. A sequence SNy1 is formed by eliminating first and last elements of SNy0. A sequence SNy is formed by multiplying each element of SNy1 by Dy, where Dy is a die size along the y axis. A sequence SNyr is formed by reversing an order of SNy. q*(Nby+1)−2 stepping operations are performed in a third direction and first sequence exposure/stepping/exposure operations and second sequence exposure/stepping/exposure operations are performed alternately between any two adjacent stepping operations as well as before a first stepping operation and after a last stepping operation. The distance of each stepping operation in order follows the sequence SNy. The first sequence exposure/stepping/exposure operations include p*(Nbx+1)−2 stepping operations in a first direction and one exposure operation between any two adjacent stepping operations as well as before a first stepping operation and after a last stepping operation, where a distance of each stepping operation in order follows the sequence SNx. The first exposure operation in the first sequence exposure/stepping/exposure operations exposes Nax_1*Nay_1 dies in a corner of an exposure field in a corner of the exposure field matrix enclosure. The second sequence exposure/stepping/exposure operations include p*(Nbx+1)−2 stepping operations in a second direction and one exposure operation between any two adjacent stepping operations as well as before a first stepping operation and after a last stepping operation. A distance of each stepping operation in order follows the sequence SNxr. In an embodiment, focus settings of all exposure operations in order alternate between Fo−dF and Fo+dF, where Fo is an optimum focus position, Fo−dF is a focus position above the optimum focus position, and Fo+dF is a focus position below the optimum focus position. In an embodiment, a total exposure dose accumulated in each die is within 0.9*Eo to 1.1*Eo, where Eo is an optimum exposure dose. In an embodiment, the method includes skipping exposure operations for missing exposure fields in the exposure field matrix enclosure. In an embodiment, the method includes merging stepping operations from after a previous exposure operation to before a subsequent exposure operation into one stepping operation which moves directly from a previous exposure location to a subsequent exposure location. In an embodiment, both the exposure field corner and the exposure field matrix enclosure corner are lower left corners as viewed in plan view, the first direction is in the +x direction, the second direction is in the −x direction, and the third direction is in the +y direction. In an embodiment, both the exposure field corner and the exposure field matrix enclosure corner are upper left corners as viewed in plan view, the first direction is in the +x direction, the second direction is in the −x direction, and the third direction is in the −y direction. In an embodiment, both the exposure field corner and the exposure field matrix enclosure corner are lower right corners as viewed in plan view, the first direction is in the −x direction; the second direction is in the +x direction, and the third direction is in the +y direction. In an embodiment, both the exposure field corner and the exposure field matrix enclosure corner are upper right corners as viewed in plan view, the first direction is in the −x direction, the second direction is in the +x direction, and the third direction is in the −y direction.

Another embodiment of the disclosure is a method of manufacturing a semiconductor device, including placing a semiconductor substrate on a wafer stage, wherein the semiconductor substrate has a photoresist layer disposed thereon. A target total exposure dose for the photoresist layer is determined. A target distance separating the photoresist layer from an extreme ultraviolet mask is determined. A first portion of the photoresist layer is exposed to a first exposure dose of extreme ultraviolet radiation using a first portion of the extreme ultraviolet mask, wherein the photoresist layer and the extreme ultraviolet mask are separated by a first distance. The semiconductor substrate is laterally stepped a first time relative to the extreme ultraviolet mask. A distance between the semiconductor substrate and the extreme ultraviolet mask is changed so that the photoresist layer and the extreme ultraviolet mask are separated by a second distance. The first portion of the photoresist layer is exposed to a second exposure dose of extreme ultraviolet radiation using a second portion of the mask, and a second portion of the photoresist layer is exposed to the second exposure dose using the first portion of the mask. In an embodiment, the method includes laterally stepping the semiconductor substrate a second time relative to the mask, changing the distance between the semiconductor substrate and the mask so that the photoresist layer and the mask are separated by a third distance, exposing the first portion of the photoresist layer to a third exposure dose of extreme ultraviolet radiation using a third portion of the mask, exposing the second portion of the photoresist layer to the third exposure dose of extreme ultraviolet radiation using the second portion of the mask, and exposing a third portion of the photoresist layer to the third exposure dose using the first portion of the mask. In an embodiment, the method includes laterally stepping the semiconductor substrate a third time relative to the mask, changing the distance between the semiconductor substrate and the mask so that the photoresist layer and the extreme ultraviolet mask are separated by a fourth distance, and exposing the first portion of the photoresist layer to a fourth exposure dose of extreme ultraviolet radiation using a fourth portion of the mask, exposing the second portion of the photoresist layer to the fourth exposure dose of extreme ultraviolet radiation using the third portion of the mask, exposing a third portion of the photoresist layer to the fourth exposure dose using the second portion of the mask, and exposing a fourth portion of the photoresist layer to the fourth exposure dose of extreme ultraviolet radiation using the first portion of the mask. In an embodiment, the first portion of the mask, the second portion of the mask, the third portion of the mask, and the fourth portion of the mask each have a same pattern. In an embodiment, the first distance is greater than the target distance, the second distance is less than the target distance, the third distance is greater than the target distance, and the fourth distance is less than the target distance. In an embodiment, the distance between the photoresist layer and the mask is changed by raising or lowering the wafer stage. In an embodiment, a mean distance of the first distance, the second distance, the third distance, and the fourth distance is the target distance. In an embodiment, a total of all the exposure doses received by each portion of the photoresist layer is equal to the target expose dose.

Another embodiment of the disclosure is a method of manufacturing a semiconductor device, including in sequence: placing a semiconductor substrate on a wafer stage, wherein the semiconductor substrate has a photoresist layer disposed thereon and exposing a first portion of the photoresist layer to a first exposure dose of extreme ultraviolet radiation using a first portion of an extreme ultraviolet mask. The semiconductor substrate is then moved relative to the extreme ultraviolet mask followed by exposing the first portion of the photoresist layer to a second exposure dose of extreme ultraviolet radiation using a second portion of the mask, and exposing a second portion of the photoresist layer to the second exposure dose using the first portion of the mask. Next, the semiconductor substrate is moved relative to the extreme ultraviolet mask followed by exposing the first portion of the photoresist layer to a third exposure dose of extreme ultraviolet radiation using a third portion of the mask, exposing the second portion of the photoresist layer to the third exposure dose of extreme ultraviolet radiation using the second portion of the mask, and exposing a third portion of the photoresist layer to the third exposure dose using the first portion of the mask. Then the semiconductor substrate is moved relative to the mask followed by exposing the first portion of the photoresist layer to a fourth exposure dose of extreme ultraviolet radiation using a fourth portion of the mask, exposing the second portion of the photoresist layer to the fourth exposure dose of extreme ultraviolet radiation using the third portion of the mask, exposing a third portion of the photoresist layer to the fourth exposure dose using the second portion of the mask, and exposing a fourth portion of the photoresist layer to the fourth exposure dose of extreme ultraviolet radiation using the first portion of the mask. The first exposure dose, the second exposure dose, third exposure dose, and fourth exposure dose are each one quarter of a target total exposure dose. In an embodiment, moving the semiconductor substrate relative to the mask includes laterally moving the semiconductor substrate relative to the mask. In an embodiment, moving the semiconductor substrate relative to the mask includes moving the semiconductor substrate closer to or further away from the mask. In an embodiment, moving the semiconductor substrate relative to the mask includes tilting the semiconductor substrate relative to the mask. In an embodiment, the first portion of the mask, the second portion of the mask, the third portion of the mask, and the fourth portion of the mask each have a same pattern.

Another embodiment of the disclosure is a photolithography apparatus, including a radiation source, and a mask configured to modify radiation from the radiation source so that the radiation exposes a photoresist layer disposed on a semiconductor substrate in a patternwise manner. A wafer stage is configured to support the semiconductor substrate. A controller is configured to: determine a target total exposure dose for the photoresist layer, determine a target focus position for the photoresist layer, control an exposure of a first portion of the photoresist layer to a first exposure dose of radiation at a first focus position using a first portion of the mask, control moving of the semiconductor substrate relative to the mask, and control an exposure of the first portion of the photoresist layer to a second exposure dose of radiation using a second portion of the mask at a second focus position, and an exposure of a second portion of the photoresist layer to the second exposure dose at the second focus position using the first portion of the mask. In an embodiment, the mask is a reflective extreme ultraviolet mask. In an embodiment, the wafer stage is configured to move closer to and further away from the mask. In an embodiment, the controller is configured to control movement of the wafer stage. In an embodiment, the wafer stage is configured to move laterally with respect to the mask. In an embodiment, the controller is configured to control movement of the wafer stage. In an embodiment, the radiation source is an extreme ultraviolet radiation source. In an embodiment, the controller is configured to control an exposure of the first portion of the photoresist layer to a third exposure dose of radiation at a third focus position using a third portion of the mask, an exposure of the second portion of the photoresist layer to the third exposure dose of radiation at the third focus position using the second portion of the mask, and an exposure of a third portion of the photoresist layer to the third exposure dose at the third focus position using the first portion of the mask. In an embodiment, the controller is further configured to control an exposure of the first portion of the photoresist layer to a fourth exposure dose of extreme ultraviolet radiation at a fourth focus position using a fourth portion of the mask, an exposure of the second portion of the photoresist layer to the fourth exposure dose of extreme ultraviolet radiation at the fourth focus position using the third portion of the mask, an exposure of a third portion of the photoresist layer to the fourth exposure dose at the fourth focus position using the second portion of the mask, and an exposure of a fourth portion of the photoresist layer to the fourth exposure dose of extreme ultraviolet radiation at the fourth focus position using the first portion of the mask. In an embodiment, the first portion of the mask, the second portion of the mask, the third portion of the mask, and the fourth portion of the mask each have a same pattern. In an embodiment, the controller is further configured to control additional exposure steps such that each portion of the photoresist layer is exposed a same number of times.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography apparatus, comprising:
   a radiation source;
   a photomask;
   a wafer stage configured to support a semiconductor substrate; and
   a controller,
   wherein the controller is configured to:
      determine a target total exposure dose for a photoresist layer;
      determine a target distance separating the photoresist layer from the photomask;
      control an exposure of a first portion of the photoresist layer to a first exposure dose of radiation at a first distance separating the photoresist layer and the photomask;
      control laterally moving of the semiconductor substrate relative to the photomask;
      control changing a distance separating the photoresist layer and the photomask; and
      control an exposure of the first portion of the photoresist layer to a second exposure dose of radiation using a second portion of the photomask at a second distance separating the photoresist layer and the photomask, and an exposure of a second portion of the photoresist layer to the second exposure dose of radiation at the second distance using the first portion of the photomask.

2. The photolithography apparatus of claim 1, wherein the photomask is a reflective extreme ultraviolet mask.

3. The photolithography apparatus of claim 1, wherein the wafer stage is further configured to move closer to and further away from the photomask.

4. The photolithography apparatus of claim 1, wherein the wafer stage is further configured to move laterally with respect to the photomask.

5. The photolithography apparatus of claim 1, wherein the controller is further configured to control movement of the wafer stage.

6. The photolithography apparatus of claim 1, wherein the controller is further configured to control an exposure of the first portion of the photoresist layer to a third exposure dose of radiation at a third distance separating the photoresist layer and the photomask using a third portion of the photomask, an exposure of the second portion of the photoresist layer to the third exposure dose of radiation at the third distance separating the photoresist layer and the photomask using the second portion of the photomask, and an exposure of a third portion of the photoresist layer to the third exposure dose of radiation at the third distance separating the photoresist layer and the photomask using the first portion of the photomask.

7. The photolithography apparatus of claim 6, wherein the controller is further configured to control an exposure of the first portion of the photoresist layer to a fourth exposure dose of radiation at a fourth distance separating the photoresist layer and the photomask using a fourth portion of the photomask, an exposure of the second portion of the photoresist layer to the fourth exposure dose of radiation at the fourth distance separating the photoresist layer and the photomask using the third portion of the photomask, an exposure of a third portion of the photoresist layer to the fourth exposure dose of radiation at the fourth distance separating the photoresist layer and the photomask using the second portion of the photomask, and an exposure of a fourth portion of the photoresist layer to the fourth exposure dose of radiation at the fourth distance separating the photoresist layer and the photomask using the first portion of the photomask.

8. The photolithography apparatus of claim 7, wherein the first portion of the photomask, the second portion of the photomask, the third portion of the photomask, and the fourth portion of the photomask each have a same pattern.

9. A photolithography apparatus, comprising:
a radiation source;
an extreme ultraviolet reflective mask;
a wafer stage configured to support a semiconductor substrate; and
a controller,
wherein the controller is configured to:
control an exposure of a first portion of a photoresist layer on the semiconductor substrate to a first exposure dose of radiation at a first focus position using a first portion of the mask;
control moving of the semiconductor substrate relative to the mask;
control an exposure of the first portion of the photoresist layer to a second exposure dose of radiation using a second portion of the mask, and an exposure of a second portion of the photoresist layer to the second exposure dose using the first portion of the mask;
control an exposure of the first portion of the photoresist layer to a third exposure dose of radiation using a third portion of the mask, an exposure of the second portion of the photoresist layer to the third exposure dose of radiation using the second portion of the mask, and an exposure of a third portion of the photoresist layer to the third exposure dose of radiation using the first portion of the mask; and
control an exposure of the first portion of the photoresist layer to a fourth exposure dose of radiation using a fourth portion of the mask, an exposure of the second portion of the photoresist layer to the fourth exposure dose of radiation using the third portion of the mask, an exposure of the third portion of the photoresist layer to the fourth exposure dose of radiation using the second portion of the mask, and an exposure of a fourth portion of the photoresist layer to the fourth exposure dose of radiation using the first portion of the mask.

10. The photolithography apparatus of claim 9, wherein the wafer stage is further configured to move closer to and further away from the mask.

11. The photolithography apparatus of claim 9, wherein the wafer stage is further configured to move laterally with respect to the mask.

12. The photolithography apparatus of claim 9, wherein the controller is further configured to control movement of the wafer stage.

13. A method of manufacturing a semiconductor device, comprising:
coating a photoresist layer on a semiconductor substrate;
determining a target total exposure dose for the photoresist layer;
determining a target focus position for the photoresist layer;
exposing a first portion of the photoresist layer to a first exposure dose of extreme ultraviolet radiation at a first focus position using a first portion of an extreme ultraviolet mask;
a first moving of the semiconductor substrate relative to the extreme ultraviolet mask; and
exposing the first portion of the photoresist layer to a second exposure dose of extreme ultraviolet radiation using a second portion of the extreme ultraviolet mask at a second focus position, and exposing a second portion of the photoresist layer to the second exposure dose at the second focus position using the first portion of the extreme ultraviolet mask.

14. The method according to claim 13, further comprising:
a second moving of the semiconductor substrate relative to the extreme ultraviolet mask; and
exposing the first portion of the photoresist layer to a third exposure dose of extreme ultraviolet radiation using a third portion of the mask at a third focus position, exposing the second portion of the photoresist layer to the third exposure dose of extreme ultraviolet radiation using the second portion of the mask at the third focus position, and exposing a third portion of the photoresist layer to the third exposure dose of extreme ultraviolet radiation using the first portion of the mask at the third focus position.

15. The method according to claim 14, further comprising:
a third moving of the semiconductor substrate relative to the extreme ultraviolet mask; and
exposing the first portion of the photoresist layer to a fourth exposure dose of extreme ultraviolet radiation using a fourth portion of the mask at a fourth focus position, exposing the second portion of the photoresist layer to the fourth exposure dose of extreme ultraviolet radiation using the third portion of the mask at the fourth focus position, exposing the third portion of the photoresist layer to the fourth exposure dose of extreme ultraviolet radiation using the second portion of the mask at the fourth focus position, and exposing a fourth portion of the photoresist layer to the fourth exposure dose of extreme ultraviolet radiation using the first portion of the mask at the fourth focus position.

16. The method according to claim 15, wherein the first portion of the mask, the second portion of the mask, the third portion of the mask, and the fourth portion of the mask each have a same pattern.

17. The method according to claim 15, wherein a total of all the exposure doses of extreme ultraviolet radiation received by each portion of the photoresist layer is equal to the target total exposure dose.

18. The method according to claim 13, wherein the first moving of the semiconductor substrate relative to the extreme ultraviolet mask includes laterally moving the semiconductor substrate relative to the mask.

19. The method according to claim 13, wherein the first moving of the semiconductor substrate relative to the extreme ultraviolet mask includes moving the semiconductor substrate closer to or further away from the mask.

20. The method according to claim 13, wherein the first moving of the semiconductor substrate relative to the mask includes tilting the semiconductor substrate relative to the mask.

* * * * *